US009651863B2

(12) United States Patent
Takizawa et al.

(10) Patent No.: US 9,651,863 B2
(45) Date of Patent: May 16, 2017

(54) PATTERN FORMING METHOD, ACTIVE LIGHT SENSITIVE OR RADIATION SENSITIVE RESIN COMPOSITION, RESIST FILM, METHOD FOR MANUFACTURING ELECTRONIC DEVICE, AND ELECTRONIC DEVICE

(71) Applicant: FUJIFILM Corporation, Tokyo (JP)

(72) Inventors: Hiroo Takizawa, Haibara-gun (JP); Shuji Hirano, Haibara-gun (JP); Natsumi Yokokawa, Haibara-gun (JP); Wataru Nihashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/881,400

(22) Filed: Oct. 13, 2015

(65) Prior Publication Data

US 2016/0041465 A1 Feb. 11, 2016

Related U.S. Application Data

(63) Continuation of application No. PCT/JP2014/061929, filed on Apr. 30, 2014.

(30) Foreign Application Priority Data

May 2, 2013 (JP) ................................ 2013-097187
Apr. 3, 2014 (JP) ................................ 2014-076865

(51) Int. Cl.

| | |
|---|---|
| ***G03F 7/004*** | (2006.01) |
| ***G03F 7/038*** | (2006.01) |
| ***C11D 11/00*** | (2006.01) |
| ***H01L 21/027*** | (2006.01) |
| ***C08F 220/18*** | (2006.01) |
| ***C08F 212/14*** | (2006.01) |
| ***C08F 220/26*** | (2006.01) |
| ***G03F 7/039*** | (2006.01) |
| ***G03F 7/32*** | (2006.01) |
| ***C08F 12/22*** | (2006.01) |
| ***G03F 7/20*** | (2006.01) |
| *C08F 216/14* | (2006.01) |

(52) U.S. Cl.

CPC .............. *G03F 7/038* (2013.01); *C08F 12/22* (2013.01); *C08F 212/14* (2013.01); *C08F 220/18* (2013.01); *C08F 220/26* (2013.01); *C11D 11/0047* (2013.01); *G03F 7/004* (2013.01); *G03F 7/039* (2013.01); *G03F 7/20* (2013.01); *G03F 7/2004* (2013.01); *G03F 7/2037* (2013.01); *G03F 7/32* (2013.01); *G03F 7/325* (2013.01); *H01L 21/0275* (2013.01); *C08F 216/14* (2013.01)

(58) Field of Classification Search

CPC .......... G03F 7/004; G03F 7/038; G03F 7/039; G03F 7/20; G03F 7/2004; G03F 7/2037; G03F 7/32; G03F 7/325; H01L 21/0275; C08F 220/26; C08F 220/18; C11D 11/0047

USPC ..... 430/270.1, 913, 434, 435, 322, 325, 329

See application file for complete search history.

(56) References Cited

U.S. PATENT DOCUMENTS

| | | | | |
|---|---|---|---|---|
| 6,887,645 | B2 | 5/2005 | Uenishi et al. | |
| 8,329,379 | B2 | 12/2012 | Ito et al. | |
| 8,546,063 | B2 | 10/2013 | Tsubaki et al. | |
| 8,911,930 | B2 | 12/2014 | Enomoto et al. | |
| 9,291,898 | B2 * | 3/2016 | Yokokawa ............ | G03F 7/0002 |
| 2002/0132193 | A1 * | 9/2002 | Iwata ...................... | G03F 7/322 430/325 |
| 2011/0159433 | A1 | 6/2011 | Takahashi et al. | |
| 2011/0236826 | A1 * | 9/2011 | Hatakeyama ........... | C07C 69/54 430/270.1 |
| 2012/0183893 | A1 * | 7/2012 | Watanabe ............. | G03F 7/0045 430/5 |
| 2012/0308938 | A1 * | 12/2012 | Furukawa ............... | G03F 7/327 430/325 |
| 2013/0337385 | A1 | 12/2013 | Furukawa et al. | |
| 2014/0193749 | A1 | 7/2014 | Takizawa et al. | |
| 2015/0253673 | A1 * | 9/2015 | Iwato ........................ | G03F 7/40 430/18 |

FOREIGN PATENT DOCUMENTS

| | | | |
|---|---|---|---|
| EP | 2 530 525 | B1 | 2/2014 |
| EP | 2530525 | B1 | 2/2014 |
| JP | 2002-148806 | A | 5/2002 |
| JP | 2008-268935 | A | 11/2008 |
| JP | 2010-85971 | A | 4/2010 |
| JP | 2010217884 | A | 9/2010 |
| JP | 2010-256856 | A | 11/2010 |
| JP | 2011-123469 | A | 6/2011 |
| JP | 5056974 | B1 | 10/2012 |
| JP | 2013-76991 | A | 4/2013 |
| KR | 10-2012-0135069 | A | 12/2012 |
| WO | 2012/114963 | A1 | 8/2012 |

OTHER PUBLICATIONS

Machine translation of JP 2010-217884 (no date).*
International Search Report for PCT/JP2014/061929 dated Jun. 3, 2014 [PCT/ISA/210].
Written Opinion for PCT/JP2014/061929 dated Jun. 3, 2014 [PCT/ISA/237].
International Preliminary Report on Patentability and Written Opinion, dated Nov. 3, 2015, issued in corresponding International Application No. PCT/JP2014/061929, 9 pages in English and Japanese.
Office Action dated Aug. 30, 2016 from the Japanese Patent Office in counterpart Japanese Application No. 2014-076865.
Office Action dated Mar. 1, 2017 in counterpart Korean Application No. 10-2015-7029647.

* cited by examiner

*Primary Examiner* — Amanda C Walke
(74) *Attorney, Agent, or Firm* — Sughrue Mion, PLLC

(57) ABSTRACT

The pattern forming method includes (1) forming a film using an active light sensitive or radiation sensitive resin composition, (2) exposing the film to active light or radiation, and (3) developing the exposed film using a developer including an organic solvent, in which the active light sensitive or radiation sensitive resin composition contains a resin (A) having a group which generates a polar group by being decomposed due to the action of an acid, the resin (A) has a phenolic hydroxyl group and/or a phenolic hydroxyl group protected with a group leaving due to the action of an acid, and the developer including the organic solvent contains an additive which forms at least one interaction of an ionic bond, a hydrogen bond, a chemical bond, and a dipole interaction, with the polar group.

22 Claims, No Drawings

PATTERN FORMING METHOD, ACTIVE LIGHT SENSITIVE OR RADIATION SENSITIVE RESIN COMPOSITION, RESIST FILM, METHOD FOR MANUFACTURING ELECTRONIC DEVICE, AND ELECTRONIC DEVICE

CROSS-REFERENCE TO RELATED APPLICATIONS

This application is a Continuation of PCT International Application No. PCT/JP2014/61929, filed on Apr. 30, 2014, which claims priority under 35 U.S.C. §119(a) to Japanese Patent Application No. 2013-097187, filed on May 2, 2013 and Japanese Patent Application No. 2014-076865, filed on Apr. 3, 2014. Each of the above application(s) is hereby expressly incorporated by reference, in its entirety, into the present application.

BACKGROUND OF THE INVENTION

1. Field of the Invention

The present invention relates to a pattern forming method using a developer including an organic solvent, which is suitably used in an ultra microlithography process in manufacturing an ultra LSI or a high-capacity microchip or other photofabrication processes, an active light sensitive or radiation sensitive resin composition, a resist film, a method for manufacturing an electronic device using these, and an electronic device. In more detail, the present invention relates to a pattern forming method using a developer including an organic solvent, which can be suitably used in fine processing of a semiconductor element using an electron beam or EUV light (wavelength: around 13 nm), an active light sensitive or radiation sensitive resin composition, a resist film, a method for manufacturing an electronic device using these, and an electronic device.

2. Description of the Related Art

In the related art, fine processing by lithography using a photoresist composition has been performed in the manufacturing process of semiconductor devices such as IC and LSI. In recent years, with higher integration of integrated circuits, ultra fine patterns have been required to be formed in a sub-micron region or a quarter-micron region. Accordingly, exposure wavelengths tend to be shortened, for example, from g-line to i-line, and to a KrF excimer laser light. Furthermore, at present, lithography using an electron beam, X-rays, or EUV light, in addition to the excimer laser light, is also being developed.

Lithography using an electron beam, X-rays, or EUV light is positioned as a next generation or next after next generation pattern forming technology, and a resist composition having high sensitivity and high-resolution is desired.

In particular, for shortening the wafer processing time, sensitivity improvement is a very important issue, but when trying to improve sensitivity, the pattern shape or the resolving power represented by the limit resolution line width decreases. Therefore, development of a resist composition which satisfies these properties at the same time has been strongly desired.

High sensitivity, and high resolution and a favorable pattern shape are in a trade-off relationship, and how to satisfy these at the same time is very important.

In general, there are two types of the active light sensitive or radiation sensitive resin composition, that is, a "positive type" in which a pattern is formed by solubilizing the exposed portion with respect to an alkali developer by exposure to radiation using a resin poorly soluble or insoluble in the alkali developer, and a "negative type" in which a pattern is formed by poorly solubilizing or insolubilizing the exposed portion with respect to an alkali developer by exposure to radiation using a resin soluble in the alkali developer.

As the active light sensitive or radiation sensitive resin composition suitable for a lithography process using an electron beam, X-rays, or EUV light, from the viewpoint of high sensitivity, a chemical amplification positive resist composition using mainly an acid catalytic reaction has been considered, and a chemical amplification positive resist composition consisting of a phenolic resin (hereinafter, abbreviated as "(phenolic) acid decomposable resin") which is insoluble or poorly soluble in an alkali developer, and has properties of becoming soluble by the action of an acid, as a main component, and an acid generator is effectively used.

On the other hand, in the manufacture of a semiconductor element or the like, formation of patterns having various shapes such as a line, a trench, and a hole is required. To meet the requirement for formation of patterns having various shapes, development of not only a positive type active light sensitive or radiation sensitive resin composition but also a negative type active light sensitive or radiation sensitive resin composition has also been performed (for example, refer to JP2002-148806A and JP2008-268935A).

In formation of an ultra fine pattern, further reduction in resolving power decrease and further improvement of the pattern shape have been demanded.

To solve this problem, the use of a resin having a photoacid generator on the polymer main chain or the side chain has been studied (JP2010-85971A and JP2010-256856A). In addition, a method of developing an acid decomposable resin using a developer other than an alkali developer (refer to JP2010-217884A and JP2011-123469A), a method of developing a PAG-supported acid decomposable resin using a developer other than an alkali developer (refer to WO2012/114963A), or a method of developing an acid decomposable resin using an organic-based developer prepared by adding a nitrogen-containing compound has also been proposed (JP5056974B).

SUMMARY OF THE INVENTION

However, with miniaturization of patterns in recent years, in an ultra fine region (for example, a region having a line width of 50 nm or less), a pattern forming method which satisfies high sensitivity, high resolution, and film loss reduction performance at the same time to a very high level has been required, and there was still room for improvement in the pattern forming methods in the related art.

An object of the present invention is to solve the problems in performance improvement techniques in fine processing of a semiconductor element using active light or radiation, and is to provide a pattern forming method which satisfies high sensitivity, high resolution (high resolving power, and the like), and film loss reduction performance at the same time to a very high level, an active light sensitive or radiation sensitive resin composition, a resist film, a method for manufacturing an electronic device using these, and an electronic device.

It was found that the above problems are achieved by the following configurations.

[1] A pattern forming method including (1) forming a film using an active light sensitive or radiation sensitive resin composition, (2) exposing the film to active light or radiation, and (3) developing the exposed film using a developer including an organic solvent, in which the active light sensitive or radiation sensitive resin composition contains a resin (A) having a group which generates a polar group by being decomposed due to the action of an acid, the resin (A) has a phenolic hydroxyl group and/or a phenolic hydroxyl group protected with a group leaving due to the action of an acid, and the developer including the organic solvent contains an additive which forms at least one interaction of an ionic bond, a hydrogen bond, a chemical bond, and a dipole interaction with the polar group.

[2] The pattern forming method according to [1], in which the resin (A) has a repeating unit represented by General Formula (I) described below.

[3] The pattern forming method according to [1] or [2], in which the resin (A) further has a repeating unit having a group which is decomposed due to the action of an acid, and the repeating unit is a repeating unit represented by any one of General Formulas (V) and (4) described below.

[4] The pattern forming method according to [2] or [3], in which a part of the repeating unit represented by General Formula (I) is a repeating unit represented by General Formula (3) described below.

[5] The pattern forming method according to [4], in which $R_3$ in General Formula (3) is a group having 2 or more carbon atoms.

[6] The pattern forming method according to [4], in which $R_3$ in General Formula (3) is a group represented by General Formula (3-2) described below.

[7] The pattern forming method according to [3], in which the repeating unit represented by General Formula (V) is a repeating unit represented by General Formula (II-1) described below.

[8] The pattern forming method according to [7], in which $R_{11}$ and $R_{12}$ in General Formula (II-1) are connected to each other to form a ring.

[9] The pattern forming method according to any one of [2] to [8], in which the bond between $X_4$ and $L_4$ in General Formula (I) is a single bond.

[10] The pattern forming method according to any one of [2] to [9], in which the content of the repeating unit represented by General Formula (I) in which all of $Y_2$'s are hydrogen atoms is 10 mol % to 40 mol % of the entirety of repeating units in the resin (A).

[11] The pattern forming method according to any one of [1] to [10], in which the active light sensitive or radiation sensitive resin composition further includes a compound (B) that generates an acid by active light or radiation.

[12] The pattern forming method according to [11], in which the compound (B) that generates an acid by active light or radiation in [11] is a compound that generates an acid having a size of 240 $Å^3$ or greater.

[13] The pattern forming method according to any one of [1] to [12], in which an electron beam or extreme ultraviolet rays are used as the active light or radiation.

Moreover, the pattern forming method according to any one of [1] to [13] preferably further includes a rinsing step (step of washing a film using a rinse liquid including an organic solvent) after a developing step.

[14] An active light sensitive or radiation sensitive resin composition which is provided to the pattern forming method according to any one of [1] to [13].

[15] A resist film which is formed of the active light sensitive or radiation sensitive resin composition according to [14].

[16] A method for manufacturing an electronic device, including the pattern forming method according to any one of [1] to [13].

[17] An electronic device manufactured by the method for manufacturing an electronic device according to [16].

According to the present invention, a pattern forming method which satisfies high sensitivity, high resolution (high resolving power, and the like), and film loss reduction performance at the same time to a very high level, an active light sensitive or radiation sensitive resin composition, a resist film, a method for manufacturing an electronic device using these, and an electronic device can be provided.

DESCRIPTION OF THE PREFERRED EMBODIMENTS

Hereinafter, embodiments of the invention will be described in detail.

Regarding the description of a group (atomic group) in the present specification, when the description does not indicate whether a group is substituted or unsubstituted, the description includes both the group having a substituent and the group not having a substituent. For example, "alkyl group" includes not only an alkyl group (an unsubstituted alkyl group) which does not have a substituent, but also an alkyl group (a substituted alkyl group) which has a substituent.

The term "active light" or "radiation" in the present specification refers to, for example, a bright line spectrum of a mercury lamp, far-ultraviolet rays represented by an excimer laser, extreme ultraviolet rays (EUV light), X-rays, an electron beam (EB), and the like. The light in the present invention refers to the active light or the radiation.

In addition, the term "exposure" in the present specification includes not only the exposure performed using a mercury lamp, far-ultraviolet rays represented by an excimer laser, extreme ultraviolet rays, X-rays, or EUV light, but also drawing performed using a particle beam such as an electron beam, an ion beam, or the like, unless otherwise specified.

A pattern forming method of the present invention includes (1) forming a film using an active light sensitive or radiation sensitive resin composition, (2) exposing the film to active light or radiation, and (3) developing the exposed film using a developer (hereinafter, as necessary, referred to as "organic-based developer") including an organic solvent.

Furthermore, the active light sensitive or radiation sensitive resin composition contains a resin (A) having a group which generates a polar group by being decomposed due to the action of an acid, the resin (A) has a phenolic hydroxyl group and/or a phenolic hydroxyl group protected with a group leaving due to the action of an acid, and the developer including the organic solvent contains an additive which forms at least one interaction of an ionic bond, a hydrogen bond, a chemical bond, and a dipole interaction with the polar group.

Examples of the active light or the radiation include infrared light, visible light, ultraviolet light, far-ultraviolet light, X-rays, and an electron beam. The active light or the radiation, for example, more preferably has a wavelength of 250 nm or less, in particular, 220 nm or less. Examples of the active light or the radiation include a KrF excimer laser (248 nm), an ArF excimer laser (193 nm), an $F_2$ excimer laser (157 nm), X-rays, and an electron beam. Preferable examples of the active light or the radiation include a KrF excimer laser, an ArF excimer laser, an electron beam, X-rays, and EUV light. An electron beam, X-rays, or EUV light is more preferable.

According to the pattern forming method of the present invention, a pattern forming method which satisfies high sensitivity, high resolution, and film loss reduction performance at the same time to a very high level, and an active light sensitive or radiation sensitive resin composition, a resist film, a method for manufacturing an electronic device using these, and an electronic device can be provided. In particular, in a case where the active light or the radiation is an electron beam, X-rays, or EUV light, the effects are significant. The reason for this is not clear, however, it seems to be as follows.

In the pattern forming method of the present invention, it is probable that when a resin (A) has an aromatic ring such as a phenolic hydroxyl group, in an exposed portion, secondary electrons are sufficiently emitted, and thus, sensitivity becomes high.

In addition, for EUV exposure, out of band light (leaked light generated in a region of ultraviolet light having a wavelength of 100 nm to 400 nm) deteriorates the surface roughness of a resist film, and as a result, reduction in resolution or deterioration of film loss due to a bridge pattern or disconnection of a pattern is likely to be caused. However, it is probable that the aromatic ring functions as an internal filter for absorbing the out of band light, and due to this, resolution becomes high and film loss reduction performance becomes excellent.

For example, it is expected that an extremely fine pattern (for example, pattern having a line width of 50 nm or less) should be able to be favorably formed by a pattern forming method in which exposure is performed by an electron beam or extreme ultraviolet rays.

However, for example, in a case where a line and space pattern having a line width of 50 nm or less and a ratio between the line width and the space width of 1:1 is formed, stronger capillary force is likely to be generated in the fine space formed at the time of development. Therefore, when a developer is discharged from the space, the capillary force is applied to the side wall of the pattern having a fine line width. In a case where a positive pattern is formed by an alkali developer, the affinity between the pattern having a resin as a main component and the alkali developer tends to be decreased, and thus, the capillary force applied to the side wall of the pattern is increased, and collapse of the pattern is likely to occur. On the other hand, in a case where a negative pattern is formed by an organic-based developer, as in the present invention, the affinity between the pattern having a resin as a main component and the organic-based developer tends to be increased, and the contact angle of the developer on the pattern side wall is increased, and thus the capillary force can be reduced. As a result, it is probable that pattern collapse is prevented, and high resolution can be achieved (marginal resolving power is excellent).

It is probable that when a specific additive (nitrogen-containing compound or the like) is added to the organic-based developer, due to the interaction such as salt formation or the like between an acidic group such as a carboxylic acid generated in the exposed portion and a nitrogen-containing compound in the organic-based developer, the exposed portion becomes more insoluble with respect to the organic-based developer. As a result, it is probable that the film loss can be reduced, the resolution and the sensitivity can be improved due to improvement of the contrast, and the contact angle of the resist side surface is increased by the interaction such as salt formation, and due to this, collapse of the formed pattern is prevented, and the resolution is improved.

Furthermore, the phenolic hydroxyl group represented by hydroxystyrene also seems to interact with the nitrogen-containing compound, and thus, the film loss reduction, the resolution improvement, and the high sensitivity can be more significantly achieved.

Hereinafter, the pattern forming method of the present invention will be described in detail.

<Pattern Forming Method>

The pattern forming method according to the present invention includes (1) forming a film (resist film) using the composition described in Step (1), (2) exposing the film to an active light or radiation, and (3) developing the exposed film using an organic-based developer. This method preferably further includes (4) rinsing the developed film using a rinse liquid, for the reason of superior effects of the present invention.

The present invention also relates to the resist film formed by using the composition described in (1).

After film formation, before an exposure step, a prebake (PB) step is also preferably included. In addition, after an exposure step and before a developing step, a post exposure bake (PEB) step is also preferably included.

Both the PB step and the PEB step are preferably performed at a heating temperature of 40° C. to 130° C., more preferably at a heating temperature of 50° C. to 120° C., and still more preferably at a heating temperature of 60° C. to 110° C. In particular, in a case where the PEB step is performed at a low temperature of 60° C. to 90° C., exposure latitude (EL) and resolving power can be significantly improved.

In addition, the heating time is preferably 30 seconds to 300 seconds, more preferably 30 seconds to 180 seconds, and still more preferably 30 seconds to 90 seconds.

In the pattern forming method according to the present invention, a step of forming a film formed of a composition on a substrate, a step of exposing the film, a heating step, and a developing step can be performed by methods generally known in the art.

The light source used in the above-described exposure is preferably extreme ultraviolet rays (EUV light) or an electron beam (EB).

Liquid immersion exposure may be performed on the film formed using the composition according to the present invention. Thus, the resolution can be further improved. Although the liquid immersion medium used is not particularly limited as long as it is liquid having a higher refractive index than air, pure water is preferable.

In this case, a hydrophobic resin may be added to the composition in advance, or after a film is formed, a topcoat may be provided thereon. Moreover, the performance required for the topcoat and the method of use thereof are explained in Chapter 7 in "Process and Ingredient of Immersion Lithography" published by CMC Publishing Co., Ltd.

When the top coat is peeled off after exposure, a developer may be used, or a separate peeling agent may be used. As the peeling agent, a solvent which hardly penetrates into a film is preferable. From the viewpoint of being capable of performing a peeling step simultaneously with a developing treatment step of a film, the topcoat can be preferably peeled off with a developer.

The substrate on which a film is formed, in the present invention, is not particularly limited. As the substrate, a substrate which is generally used in a step of manufacturing a semiconductor such as IC, a step of manufacturing a circuit board for liquid crystal or a thermal head, or a lithography step of photofabrication can be used. Examples of such a substrate include inorganic substrates such as silicon, SiN, and $SiO_2$, and coated inorganic substrates such as SOG. As necessary, an organic antireflection film may be formed between a film and a substrate.

Examples of the organic-based developer include developers which include a polar solvent such as a ketone-based solvent, an ester-based solvent, an alcohol-based solvent, an amide-based solvent, or an ether-based solvent, or include a hydrocarbon-based solvent. In addition, mixed solvents thereof may be used.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methyl cyclohexanone, phenyl acetone, methyl ethyl ketone, methyl isobutyl ketone, methyl amyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, amyl acetate, isoamyl acetate, n-pentyl acetate, propylene glycol monomethyl ether acetate, propylene glycol monoethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl propionate, methyl 3-methoxypropionate (MMP), ethyl propionate, ethyl 3-ethoxypropionate (EEP), and propyl propionate. In particular, an acetic acid alkyl ester such as methyl acetate, butyl acetate, ethyl acetate, isopropyl acetate, or amyl acetate, or a propionic acid alkyl ester such as methyl propionate, ethyl propionate, or propyl propionate is preferable.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol, and n-decanol; glycols such as ethylene glycol, diethylene glycol, and triethylene glycol; and glycol ethers such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include dioxane and tetrahydrofuran, in addition to glycol ethers described above.

Examples of the amide-based solvent include N-methyl-2-pyrrolidone, N,N-dimethyl acetamide, N,N-dimethyl formamide, hexamethylphosphoric triamide, and 1,3-dimethyl-2-imidazolidinone.

Examples of the hydrocarbon-based solvent include aromatic hydrocarbon-based solvents such as toluene, xylene, and anisole, and aliphatic hydrocarbon-based solvents such as pentane, hexane, octane, and decane.

The above solvents may be used in combination of two or more types thereof. In addition, within a range capable of exhibiting sufficient performance, the above solvents may be used in combination with a solvent other than the above solvents and/or water. Here, the water content of the entirety of the developer is preferably less than 10% by mass, and the developer more preferably does not contains water substantially. That is, the developer is preferably a developer formed of substantially only an organic solvent. Even in this case, the developer can include a surfactant described below. In addition, in this case, the developer may include inevitable impurities derived from the atmosphere.

The amount of the organic solvent used with respect to the developer is preferably 80% by mass or greater to less than 100% by mass, more preferably 90% by mass or greater to less than 100% by mass, and still more preferably 95% by mass or greater to less than 100%, with respect to the total amount of the developer.

In particular, the organic solvent included in the developer is preferably at least one selected from a ketone-based solvent, an ester-based solvent, an alcohol-based solvent, amide-based solvent, and an ether-based solvent.

The vapor pressure of the organic-based developer is preferably 5 kPa or lower, more preferably 3 kPa or lower, and particularly preferably 2 kPa or lower at 20° C. When the vapor pressure of the developer is 5 kPa or lower, evaporation of the developer on the substrate or in a development cup is suppressed, the temperature uniformity in the wafer surface is improved, and as a result, the dimensional uniformity in the wafer surface is improved.

Specific examples of the developer having a vapor pressure of 5 kPa or lower include ketone-based solvents such as 1-octanone, 2-octanone, 1-nonanone, 2-nonanone, 4-heptanone, 2-hexanone, diisobutyl ketone, cyclohexanone, methyl cyclohexanone, phenyl acetone, and methyl isobutyl ketone; ester-based solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate, and propyl lactate; alcohol-based solvents such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol, and n-decanol; glycol-based solvents such as ethylene glycol, diethylene glycol, and triethylene glycol; glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxy methyl butanol; ether-based solvents such as tetrahydrofuran; amide-based solvents such as N-methyl-2-pyrrolidone, N,N-dimethyl acetamide, and N,N-dimethyl formamide; aromatic hydrocarbon-based solvents such as toluene and xylene; and aliphatic hydrocarbon-based solvents such as octane and decane.

Specific examples of the developer having a vapor pressure of 2 kPa or lower include ketone-based solvents such as 1-octanone, 2-octanone, 1-nonanone, 2-nonanone, 4-heptanone, 2-hexanone, diisobutyl ketone, cyclohexanone, methyl cyclohexanone, and phenyl acetone; ester-based solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate, and propyl lactate; alcohol-based solvents such as n-butyl alcohol, sec-butyl alcohol, tert-butyl alcohol, isobutyl alcohol, n-hexyl alcohol, 4-methyl-2-pentanol, n-heptyl alcohol, n-octyl alcohol, and n-decanol; glycol-based solvents such as ethylene glycol, diethylene glycol, and triethylene glycol; glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxy methyl butanol; amide-based solvents such as N-methyl-2-pyrrolidone, N,N-dimethyl acetamide, and N,N-dimethyl formamide; aromatic hydrocarbon-based solvents such as xylene; and aliphatic hydrocarbon-based solvents such as octane and decane.

In the pattern forming method of the present invention, the organic-based developer contains a specific additive.

(Additives)

From the viewpoint of being used in the step, additive is a compound which is capable of forming at least one interaction among an ionic bond, a hydrogen bond, a chemical bond, and a dipole interaction with a polar group which the resin (A) generates by action of an acid. As described above, when the resin (A) and an additive form a predetermined interaction, the solubility of the resin (A) is changed, and thus, film loss is less likely to occur. The ionic bond means an electrostatic interaction between a cation and an anion, and also includes salt formation and the like.

From the viewpoint of excellent effects of the present invention, as the additive, at least one selected from the group consisting of an onium salt compound, a nitrogen-containing compound, and a phosphorus-based compound is exemplified.

Each compound will be described in detail below.

(Onium Salt Compound)

The onium salt compound means a compound having an onium salt structure. Moreover, the onium salt structure refers to a salt structure produced by a coordinate bond which an organic component and a Lewis base form. The onium salt compound forms an interaction mainly with the above-described polar group by an ionic bond. For example, in a case where the polar group is a carboxyl group, the cation of the onium salt compound forms an electrostatic interaction with the carboxyl-derived carboxyl anion ($COO^-$) (forms an ionic bond).

The type of the onium salt structure is not particularly limited, and examples thereof include structures of an ammonium salt, a phosphonium salt, an oxonium salt, a sulfonium salt, a selenonium salt, a carbonium salt, a diazonium salt, and an iodonium salt, having a cation structure shown below.

In addition, as the cation in the onium salt structure, a cation having a positive charge on the heteroatom of a heteroaromatic ring is also included. Examples of such an onium salt include a pyridinium salt and an imidazolium salt.

Moreover, in the present specification, the above pyridinium salt and imidazolium salt are also included as an aspect of an ammonium salt.

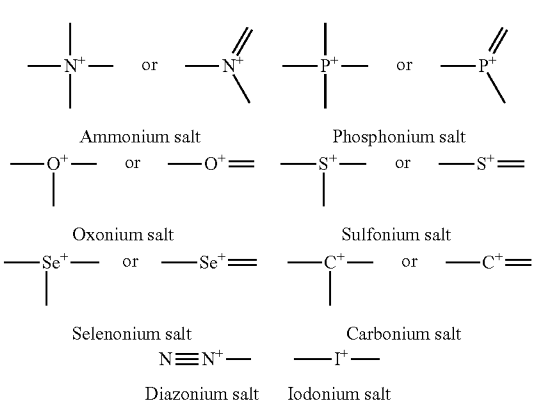

The onium salt compound may be a polyvalent onium salt compound having two or more onium ion atoms on one molecule, from the viewpoint of superior effects of the present invention. As the polyvalent onium salt compound, a compound in which two or more cations are connected by a covalent bond is preferable.

Examples of the polyvalent onium salt compound include a diazonium salt, an iodonium salt, a sulfonium salt, an ammonium salt, and a phosphonium salt. Among these, from the viewpoint of superior effects of the present invention, a diazonium salt, an iodonium salt, a sulfonium salt, or an ammonium salt is preferable, and an ammonium salt is more preferable from the viewpoint of stability.

In addition, the anion included in the onium salt compound (onium salt structure) may be any anion, and the anion may be a monovalent ion or may be a polyvalent ion.

Examples of the monovalent anion include a sulfonate anion, a formate anion, a carboxylate anion, a sulfinate anion, a boron anion, a halide ion, a phenol anion, an alkoxy anion, and a hydroxide ion. Examples of the divalent anion include an oxalate ion, a phthalate ion, a maleate ion, a fumarate ion, a tartrate ion, a malate ion, a lactate ion, a sulfate ion, a diglycolate ion, and 2,5-furandicarboxylate ion.

More specific examples of the monovalent anion include $Cl^-$, $Br^-$, $I^-$, $AlCl_4^-$, $Al_2Cl_7^-$, $BF_4^-$, $PF_6^-$, $ClO_4^-$, $NO_3^-$, $CH_3COO^-$, $CF_3COO^-$, $CH_3SO_3^-$, $CF_3SO_3^-$, $(CF_3SO_2)_2N^-$, $(CF_3SO_2)_3C^-$, $AsF_6^-$, $SbF_6^-$, $NbF_6^-$, $TaF_6^-$, $F(HF)_n^-$, $(CN)_2N^-$, $C_4F_9SO_3^-$, $(C_2F_5SO_2)_2N^-$, $C_3F_7COO^-$, $(CF_3SO_2)(CF_3CO)N^-$, $C_9H_{19}COO^-$, $(CH_3)_2PO_4^-$, $(C_2H_5)_2PO_4^-$, $C_2H_5OSO_3^-$, $C_6H_{13}OSO_3^-$, $C_8H_{17}OSO_3^-$, $CH_3(OC_2H_4)_2OSO_3^-$, $C_6H_4(CH_3)SO_3^-$, $(C_2F_5)_3PF_3^-$, $CH_3CH(OH)COO^-$, $B(C_6F_5)_4^-$, $FSO_3^-$, $C_6H_5O^-$, $(CF_3)_2CHO^-$, $(CF_3)_3CHO^-$, $C_6H_3(CH_3)_2O^-$, and $C_2H_5OC_6H_4COO^-$.

Among these, a sulfonate anion, a carboxylate anion, a bis(alkylsulfonyl)amide anion, a tris(alkylsulfonyl)methide anion, $BF_4^-$, $PF_6^-$, $SbF_6^-$, or the like is preferable, and an organic anion containing a carbon atom is more preferable.

Specific examples of cations included in the onium salt structure are exemplified below.

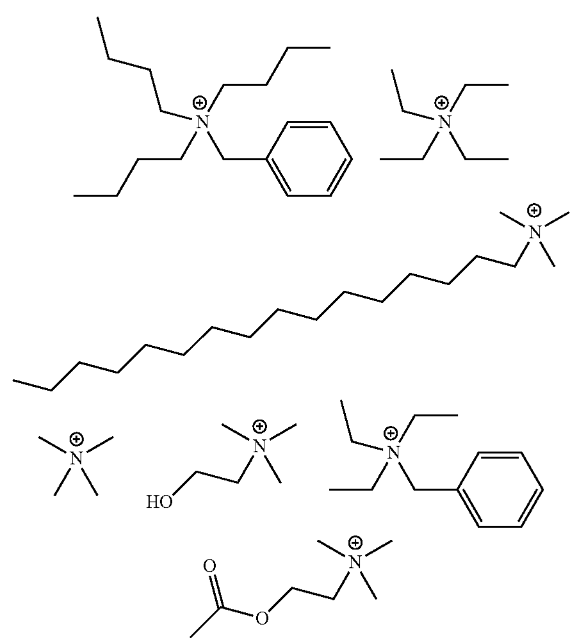

-continued
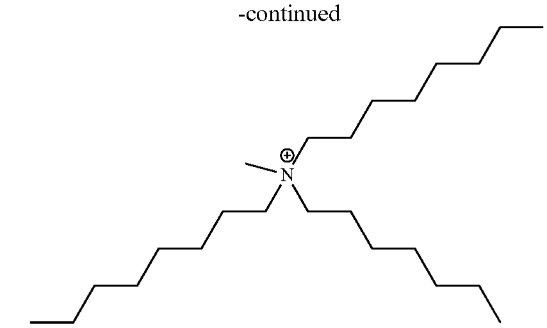
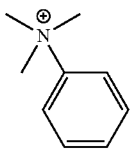
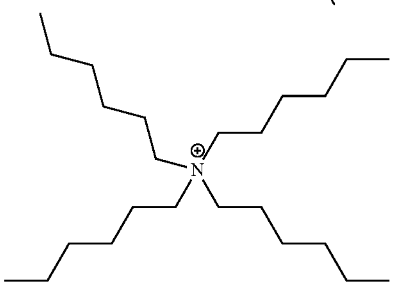
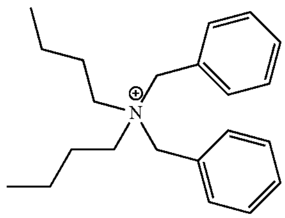
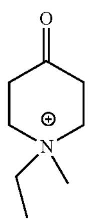
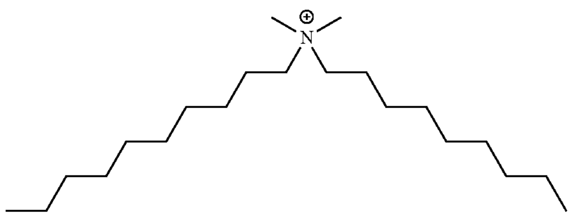
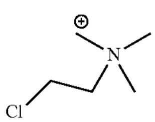
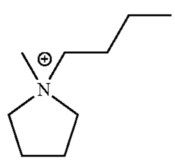
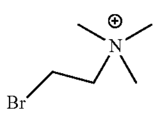
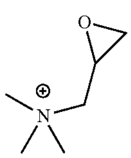
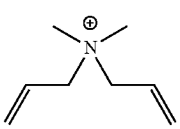
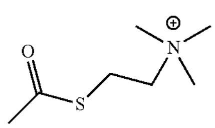
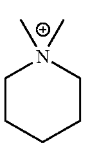
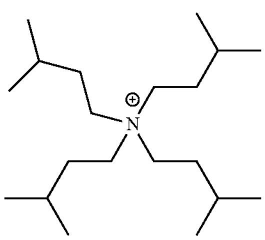
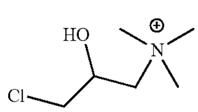
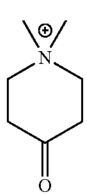
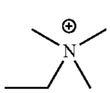
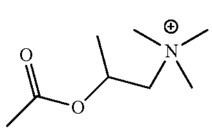
-continued
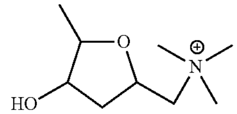
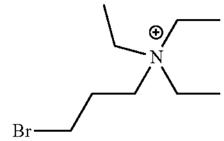
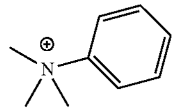
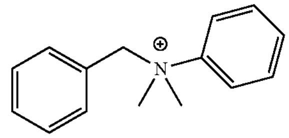
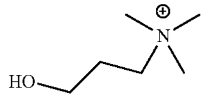
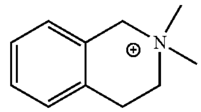
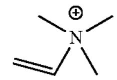
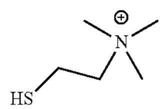
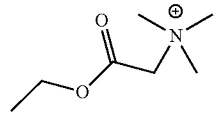
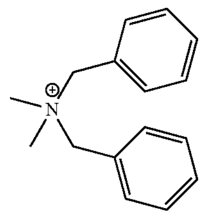
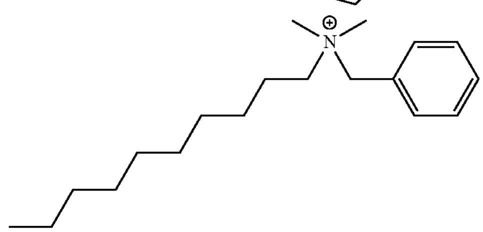
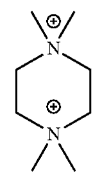
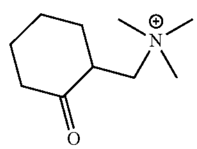
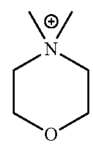
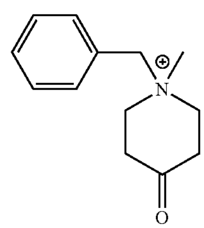
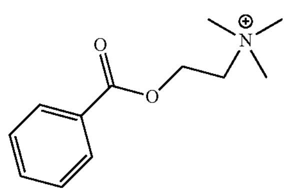
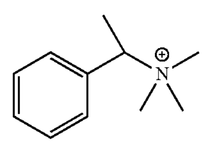
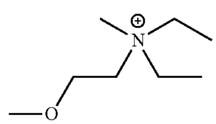
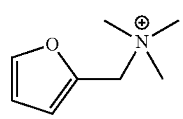
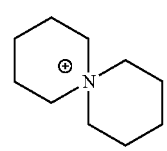
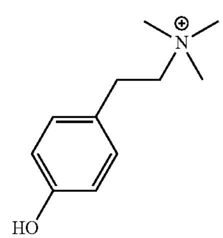
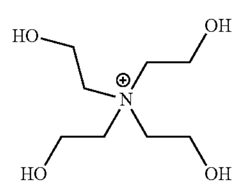

-continued
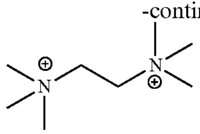
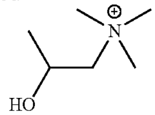
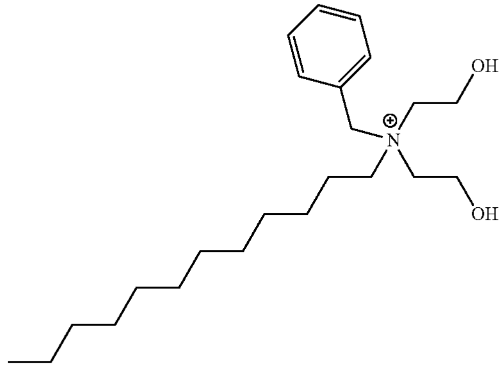
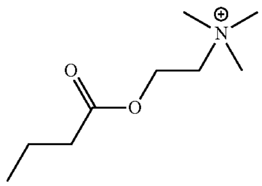
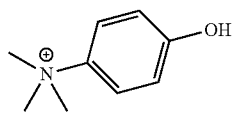
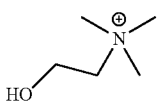
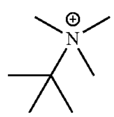
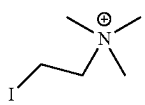
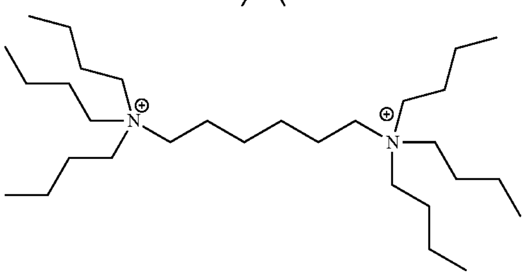
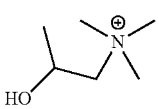
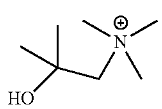
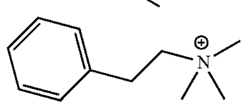
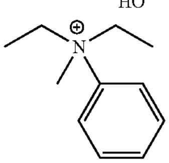
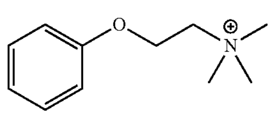
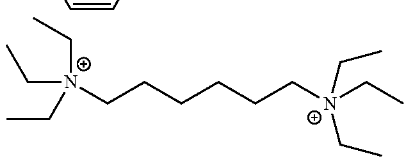
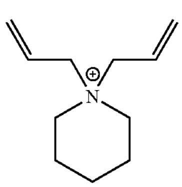
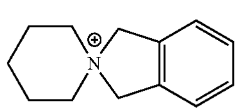
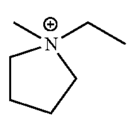
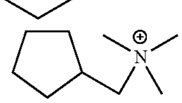
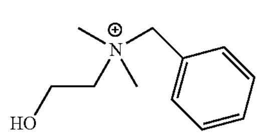
-continued
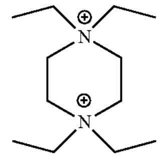
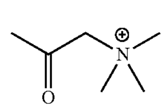
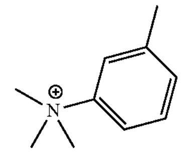
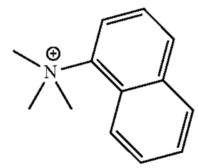
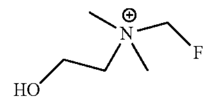
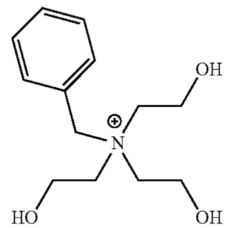
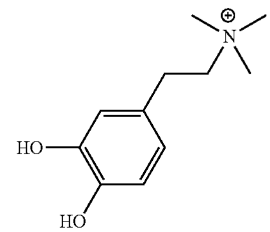
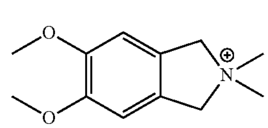
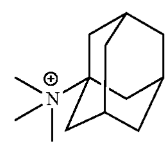
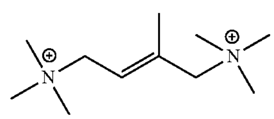
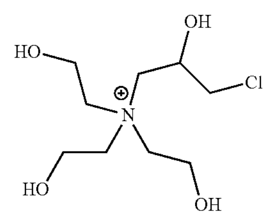
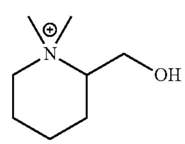
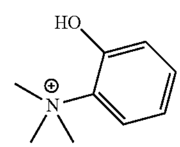
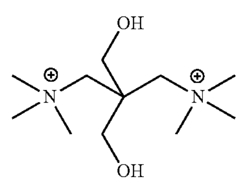
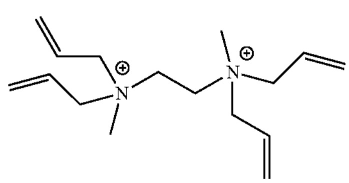
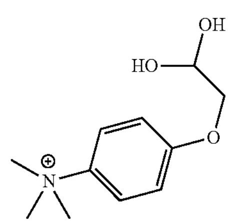
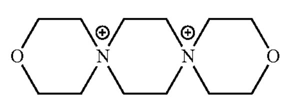
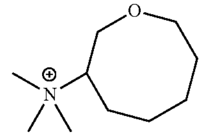

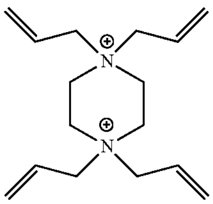
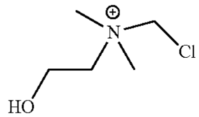
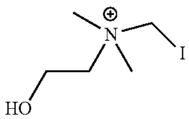
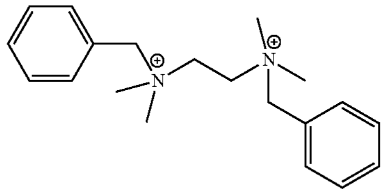
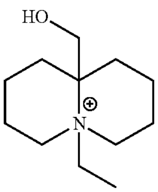
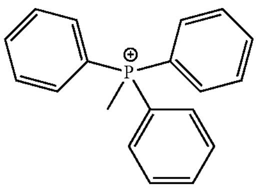
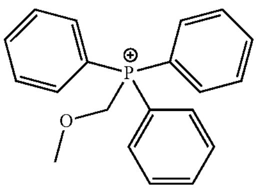
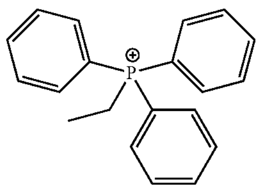
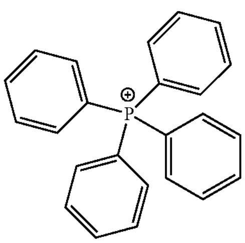
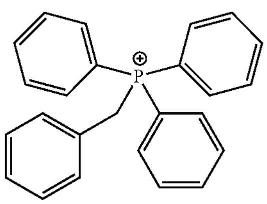
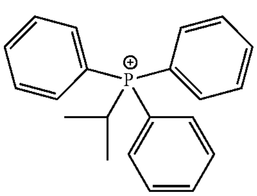
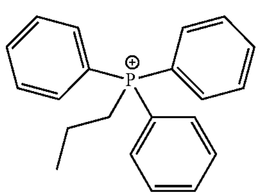
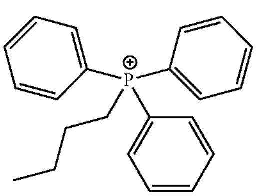
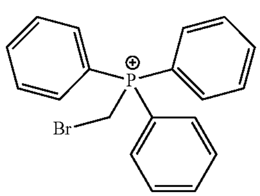
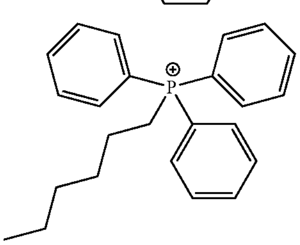
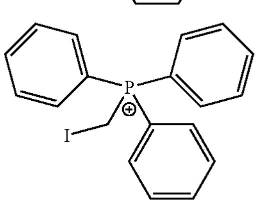
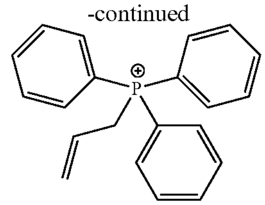
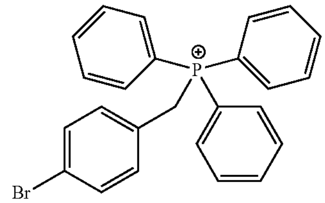
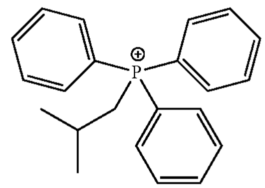
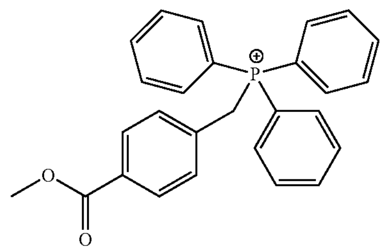
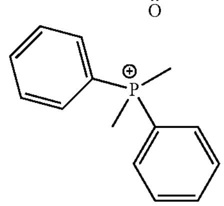
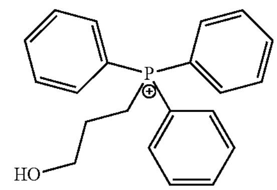
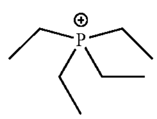
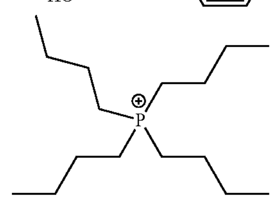
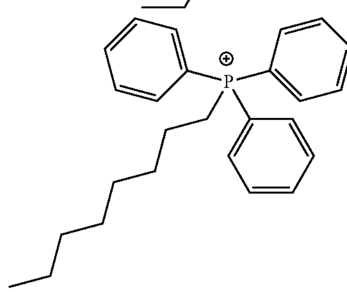
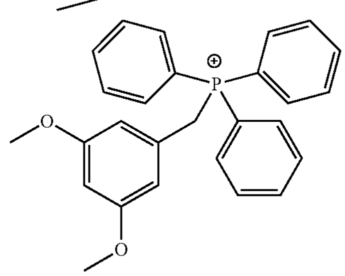
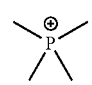

-continued
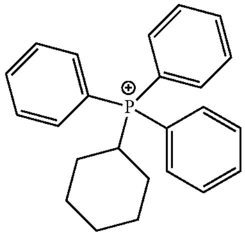
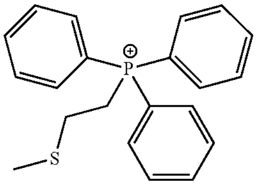
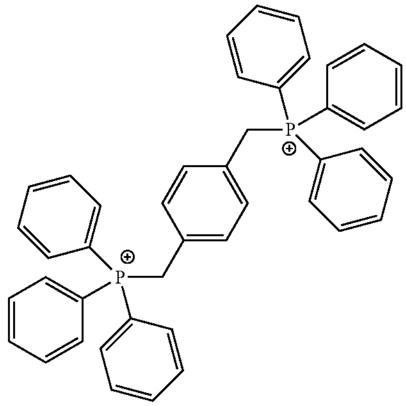
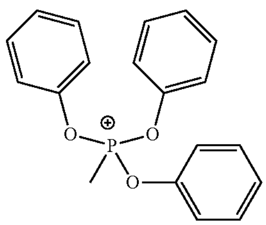
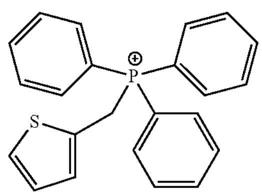
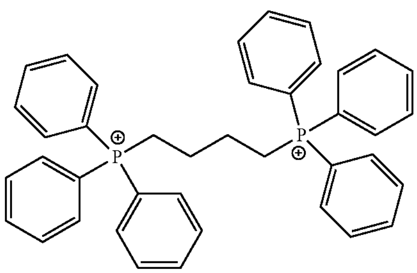
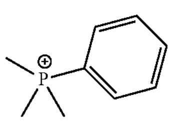
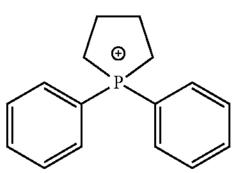
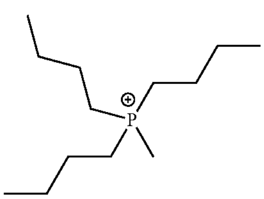
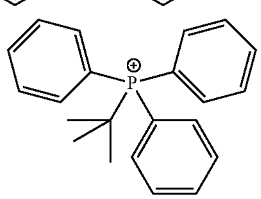
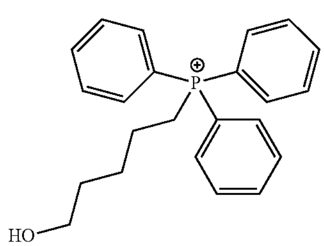
-continued
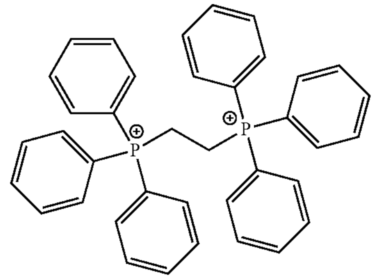
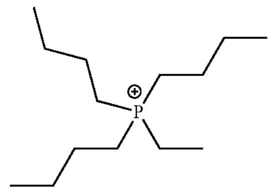
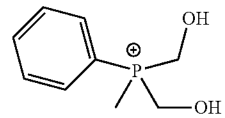
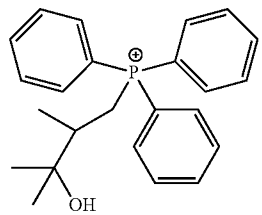
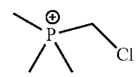
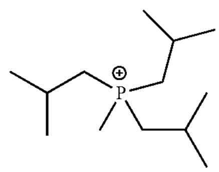
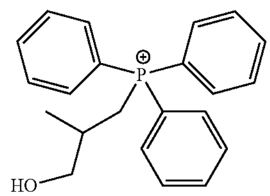
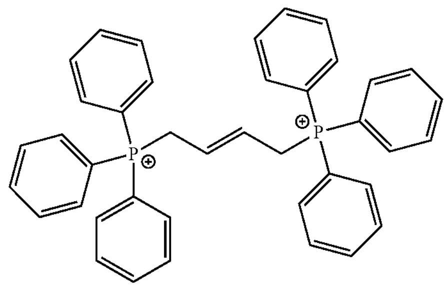
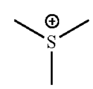
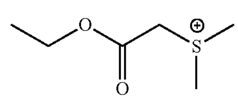
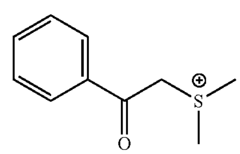
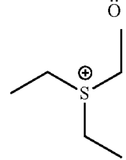
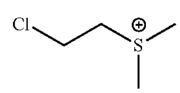
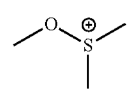
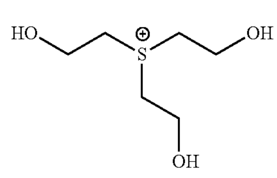
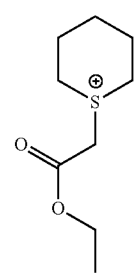

-continued
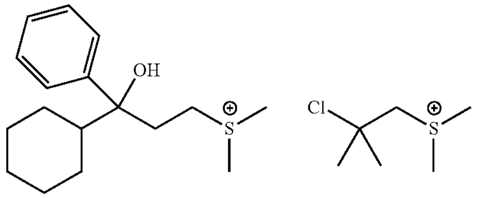
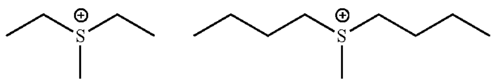
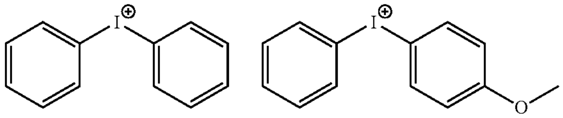
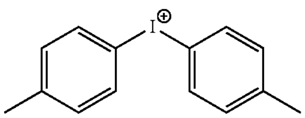
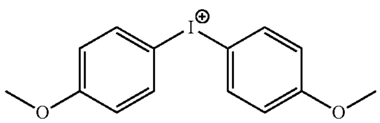
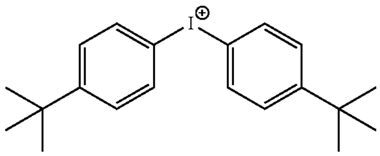
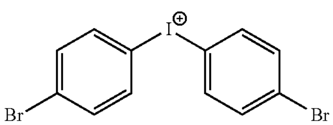
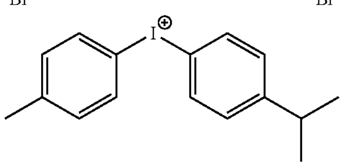
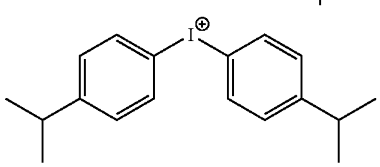
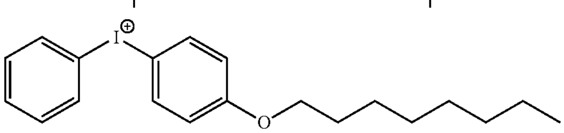
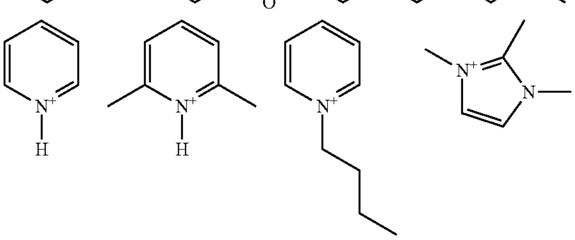
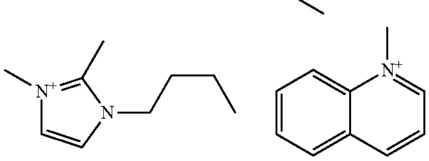
-continued
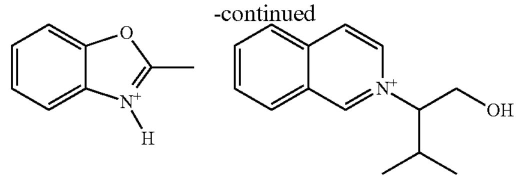
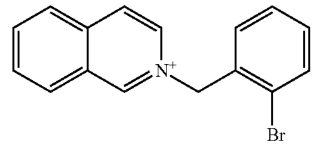 [SMILES: Brc1ccccc1C[n+]1ccc2ccccc2c1]
Specific examples of anions included in the onium salt structure are exemplified below.
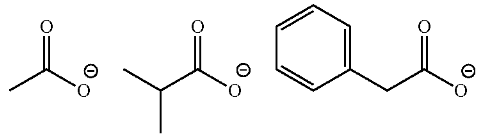
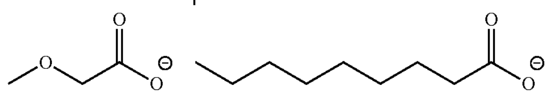
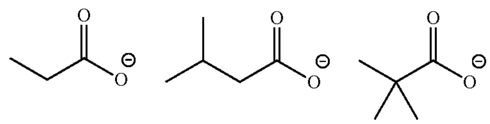
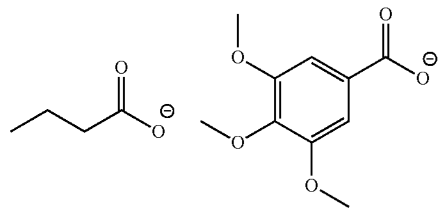
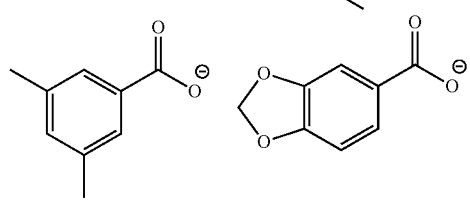
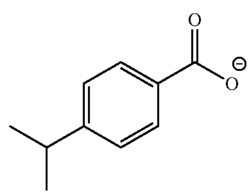
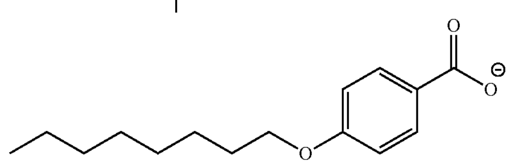
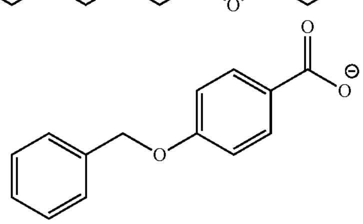

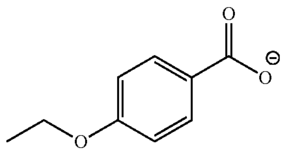
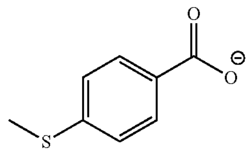
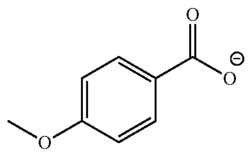
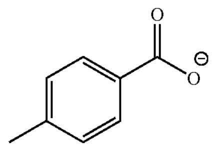
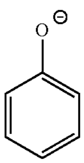
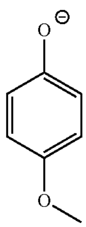
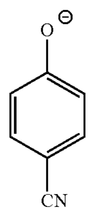
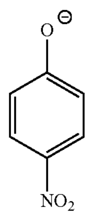
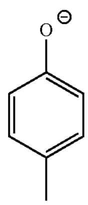
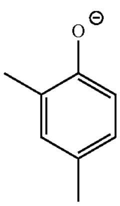
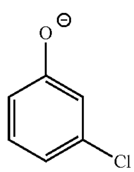
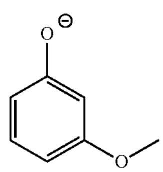
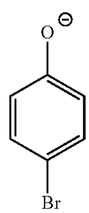
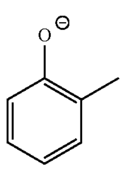
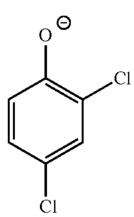
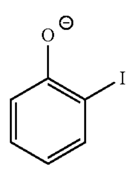
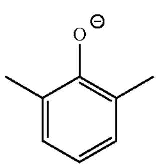
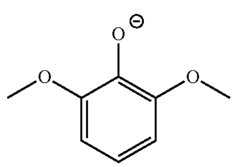
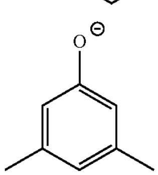
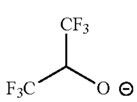
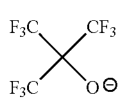
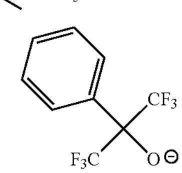
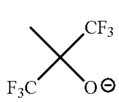
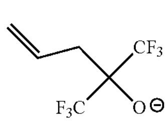
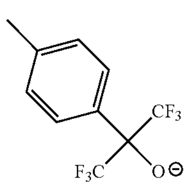
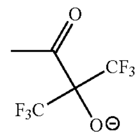
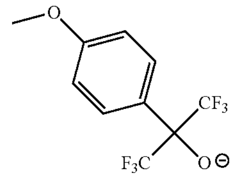
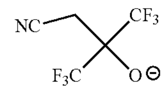
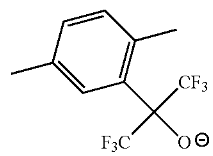
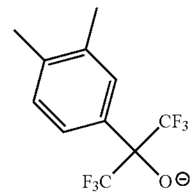
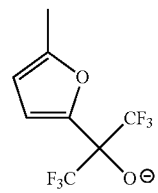
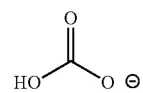
Specific examples of the onium salt structure are exemplified below.
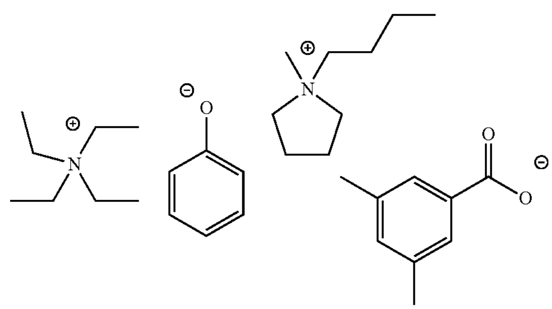
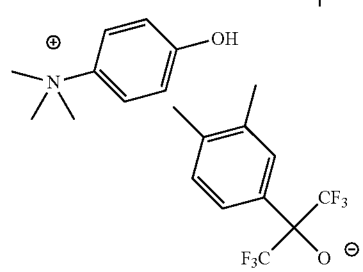
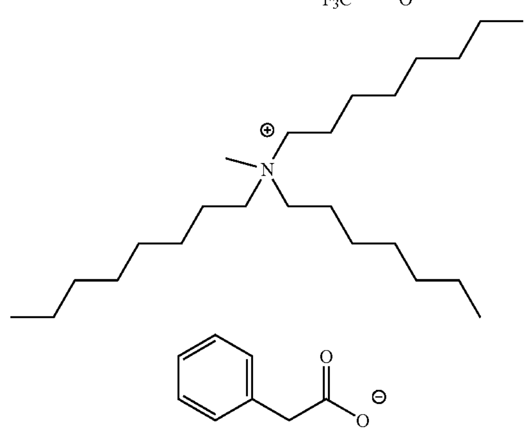

-continued
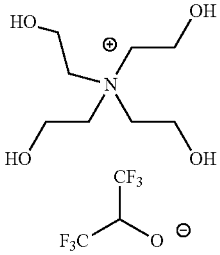
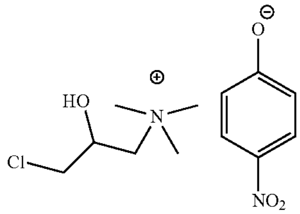
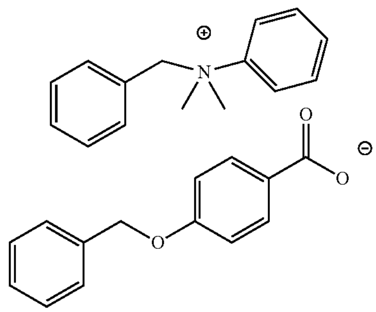
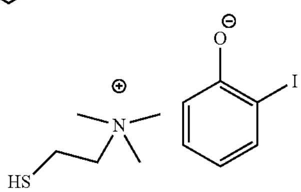
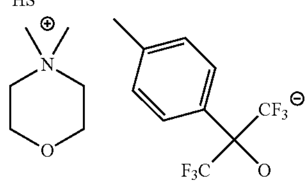
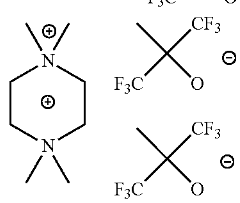
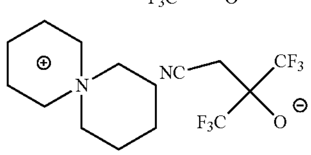
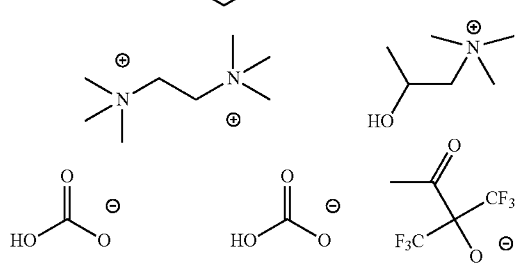
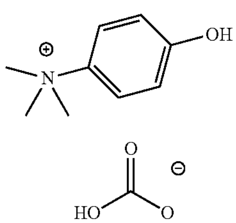
-continued
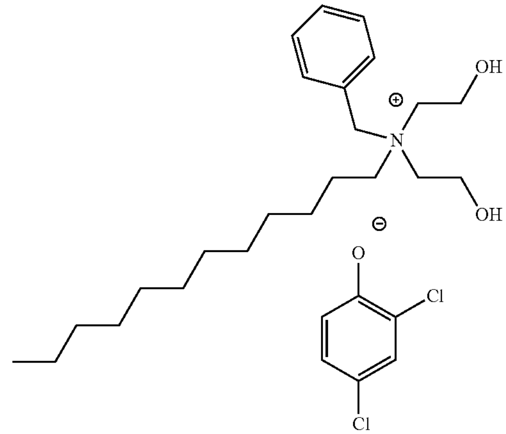
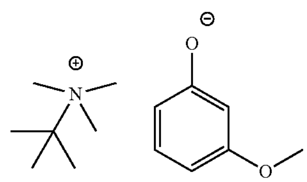
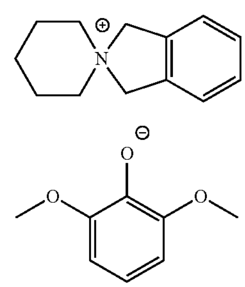
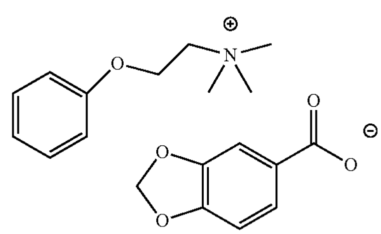
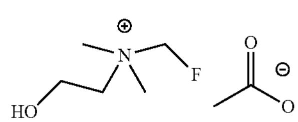
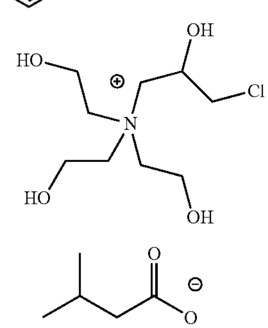

-continued
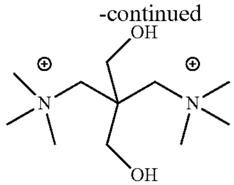
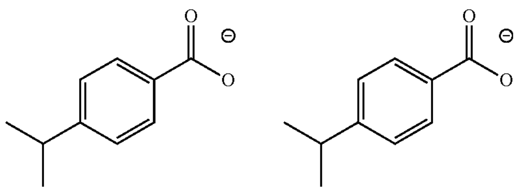
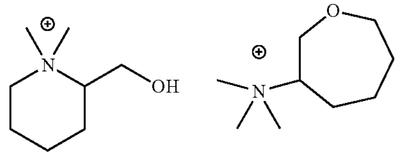
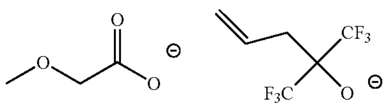
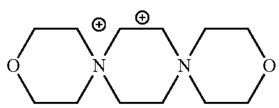
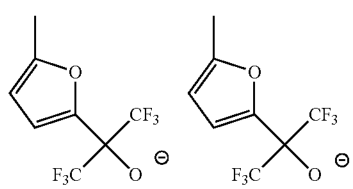
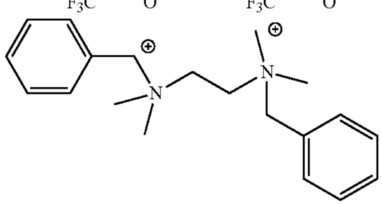
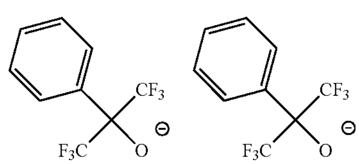
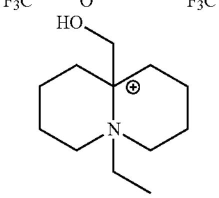
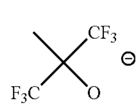
-continued
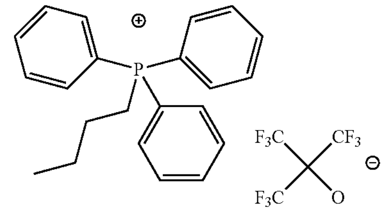
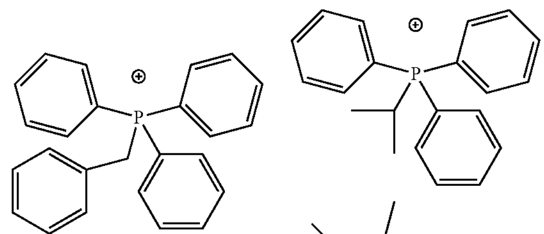
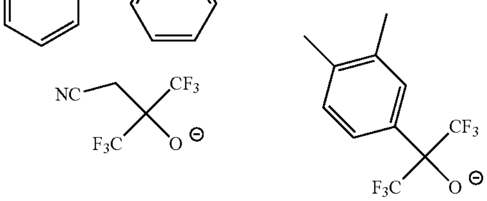
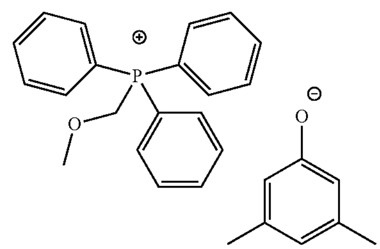
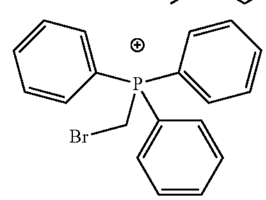
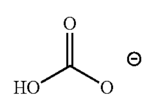
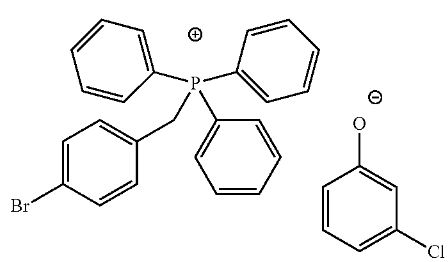
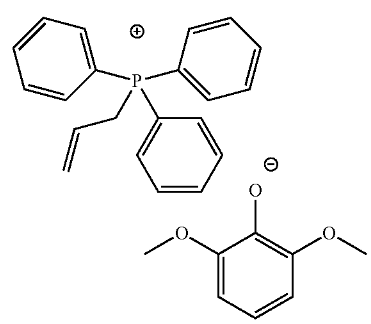

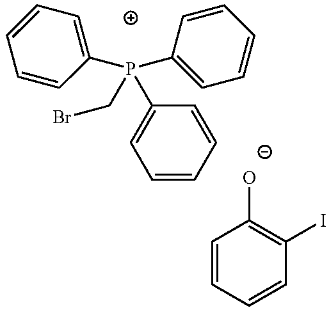
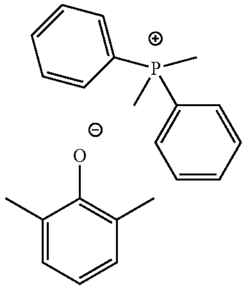
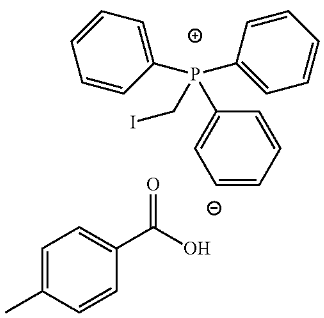
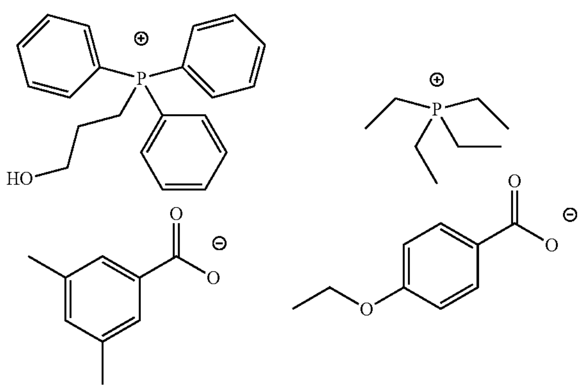
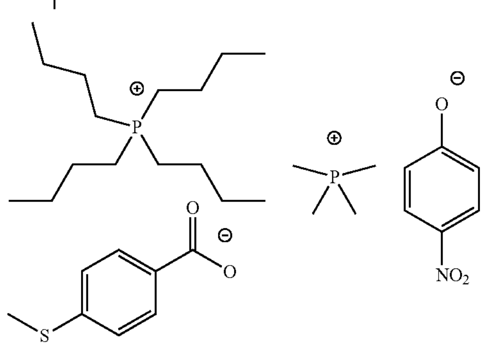
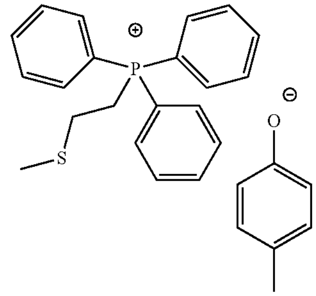
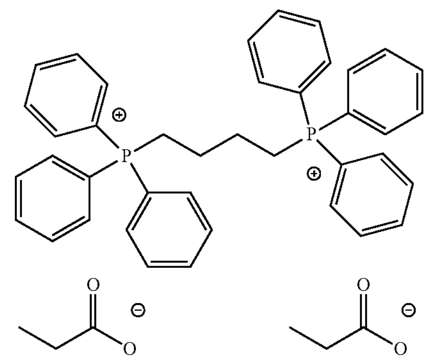
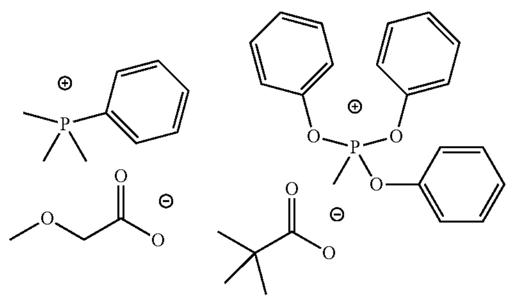
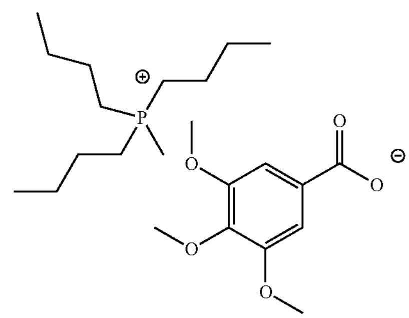
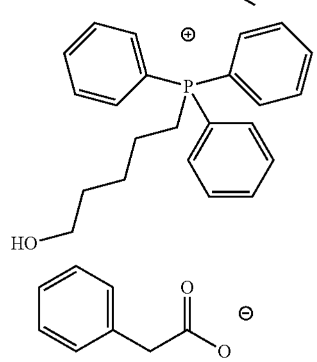

-continued
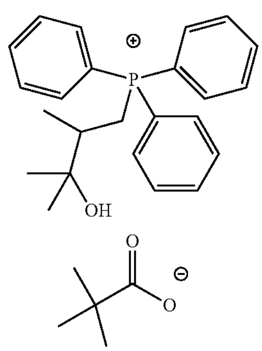
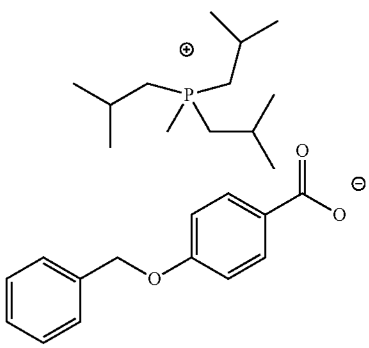
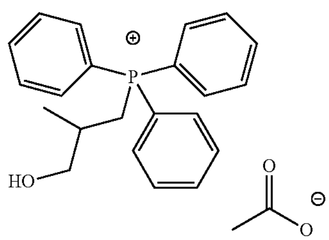
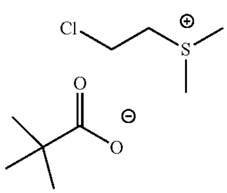
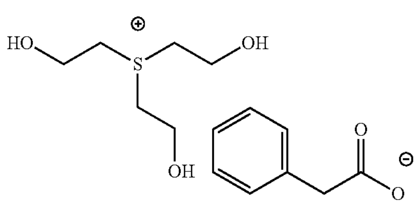
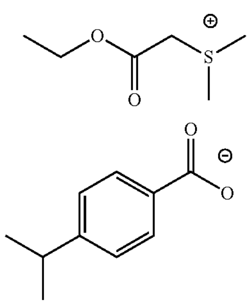
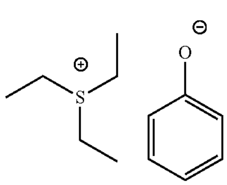
-continued
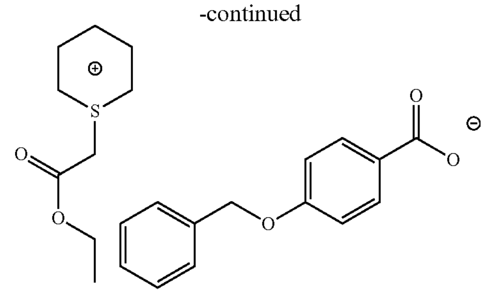
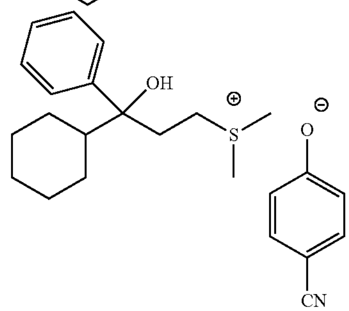
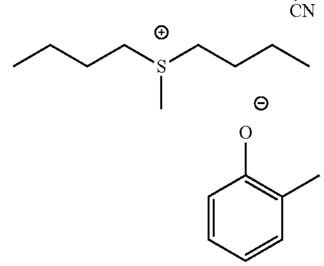
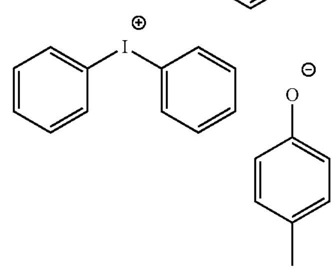
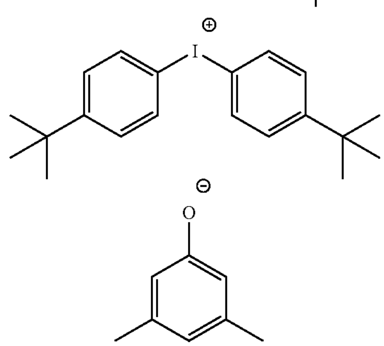
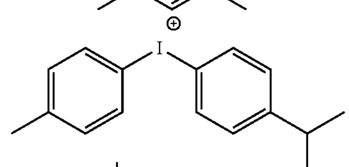
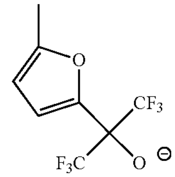

-continued

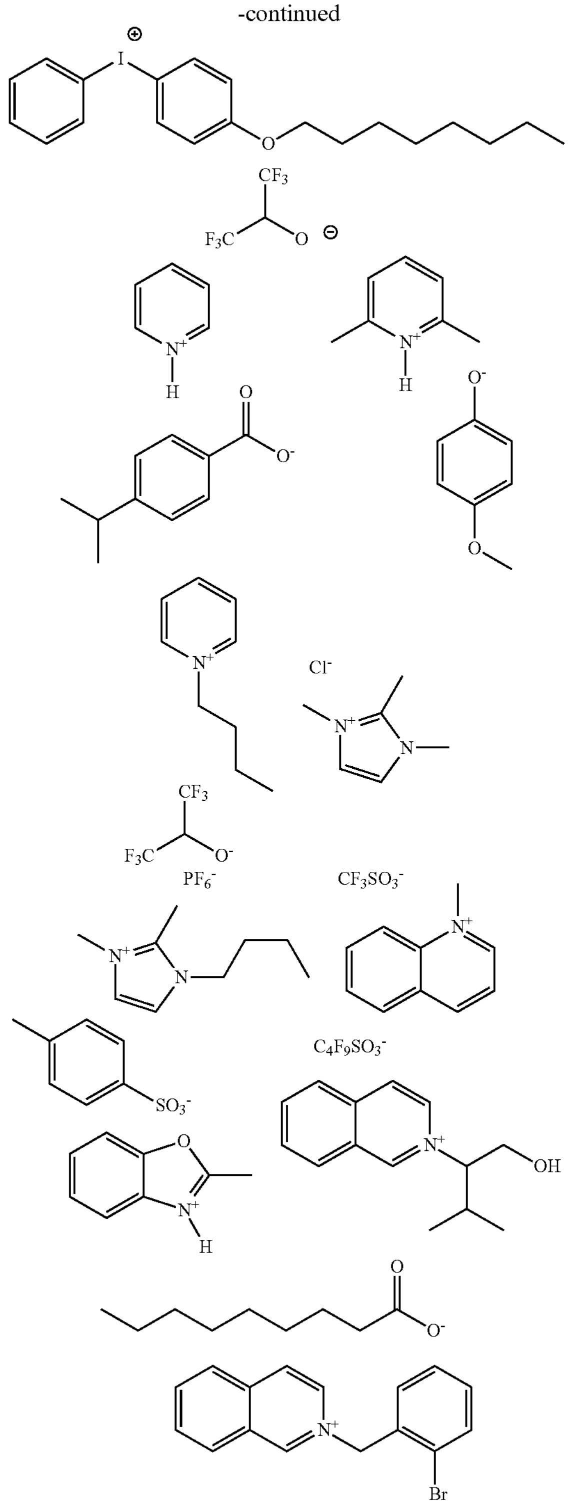

Examples of a suitable aspect of the onium salt compound include at least one selected from the group consisting of the onium compound represented by Formula (1-1) and the onium salt compound represented by Formula (1-2), from the viewpoint of superior effects of the present invention.

The onium salt compound represented by Formula (1-1) may be used alone, or two or more types thereof may be used in combination. The onium salt compound represented by Formula (1-2) may be used alone, or two or more types thereof may be used in combination. The onium salt compound represented by Formula (1-1) and the onium salt compound represented by Formula (1-2) may be used in combination.

$$M^{+}\!\!-\!\!(R)_n \quad X^{-} \qquad \text{Formula (1-1)}$$

$$L\!\!-\!\!\left[M^{+}\!\!-\!\!(R)_m\right]_2 \quad 2X^{-} \qquad \text{Formula (1-2)}$$

In Formula (1-1), M represents a nitrogen atom, a phosphorus atom, a sulfur atom, or an iodine atom. Among these, from the viewpoint of superior effects of the present invention, a nitrogen atom is preferable.

Each of R's independently represents a hydrogen atom, an aliphatic hydrocarbon group which may include a heteroatom, an aromatic hydrocarbon group which may include a heteroatom, or a group obtained by combining two or more types thereof.

The aliphatic hydrocarbon group may be linear, branched, or cyclic. In addition, although the number of carbon atoms included in the aliphatic hydrocarbon group is not particularly limited, the number of carbon atoms is preferably 1 to 15, and more preferably 1 to 5, from the viewpoint of superior effects of the present invention.

Examples of the aliphatic hydrocarbon group include an alkyl group, a cycloalkyl group, an alkene group, an alkyne group, or a group obtained by combining two or more types thereof.

A heteroatom may be included in the aliphatic hydrocarbon group. That is, the aliphatic hydrocarbon group may be a heteroatom-containing hydrocarbon group. Although the type of heteroatom contained is not particularly limited, as the heteroatom, a halogen atom, an oxygen atom, a nitrogen atom, a sulfur atom, a selenium atom, and a tellurium atom are exemplified. For example, the above heteroatom is included as an aspect of —$Y_1$H, —$Y_1$—, —N($R_a$)—, —C(=$Y_2$)—, —CON($R_b$)—, —C(=$Y_3$)$Y_4$—, —$SO_t$—, —$SO_2$N($R_c$)—, a halogen atom, or a group obtained by combining two or more types thereof.

Each of $Y_1$ to $Y_4$ is independently selected from the group consisting of an oxygen atom, a sulfur atom, a selenium atom, and a tellurium atom. Among these, an oxygen atom or a sulfur atom is preferable from the viewpoint of ease in handleability.

Each of $R_a$, $R_b$, and $R_c$ is independently selected from a hydrogen atom or a hydrocarbon group having 1 to 20 carbon atoms.

t represents an integer of 1 to 3.

Although the number of carbon atoms included in the aromatic hydrocarbon group is not particularly limited, the number of carbon atoms is preferably 6 to 20, and more preferably 6 to 10, from the viewpoint of superior effects of the present invention.

Examples of the aromatic hydrocarbon group include a phenyl group and a naphthyl group.

A heteroatom may be included in the aromatic hydrocarbon group. The aspect in which a heteroatom is included is as described above. Moreover, in a case where a heteroatom is included in the aromatic hydrocarbon group, an aromatic heterocyclic group may be configured.

Examples of the suitable aspect of R include an alkyl group which may include a heteroatom, an alkene group which may include a heteroatom, a cycloalkyl group which may include a heteroatom, and an aryl group which may include a heteroatom, from the viewpoint of superior effects of the present invention.

A plurality of R's may be bonded to each other to form a ring. Although the type of ring formed is not particularly limited, examples thereof can include a 5- or 6-membered cyclic structure.

The formed ring may have aromaticity, and for example, the cation of the onium salt compound represented by Formula (1-1) may be the pyridinium ring represented by the following Formula (10). Furthermore, a heteroatom may be included in a part of the formed ring, and for example, the cation of the onium salt compound represented by Formula (1-1) may be the imidazolium ring represented by the following Formula (11).

R's in Formulas (10) and (11) have the same meaning as that in Formula (1-1).

In Formulas (10) and (11), each of Rv's independently represents a hydrogen atom or an alkyl group. A plurality of Rv's may be bonded to each other to form a ring.

Formula (10)

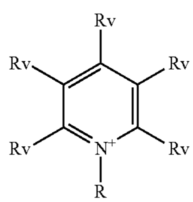

Formula (11)

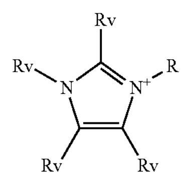

$X^-$ represents a monovalent anion. The definition of the monovalent anion is as described above.

In Formula (1-1), n represents an integer of 2 to 4. In a case where M is a nitrogen atom or a phosphorus atom, n represents 4, in a case where M is a sulfur atom, n represents 3, and in a case where M is a iodine atom, n represents 2.

R and $X^-$ in Formula (1-2) have the same meaning as that in Formula (1-1). In Formula (1-2), two $X^-$'s are included.

L represents a divalent connecting group. Examples of the divalent connecting group include a substituted or unsubstituted divalent aliphatic hydrocarbon group (for example, an alkylene group such as a methylene group, an ethylene group, or a propylene group, which preferably has 1 to 8 carbon atoms), a substituted or unsubstituted divalent aromatic hydrocarbon group (for example, a phenylene group which preferably has 6 to 12 carbon atoms), —O—, —S—, —$SO_2$—, —N(R)— (R: alkyl group), —CO—, —NH—, —COO—, —CONH—, and a group (for example, an alkyleneoxy group, an alkyleneoxycarbonyl group, or an alkylene carbonyloxy group) obtained by combining two or more types thereof.

Among these, L is preferably a divalent aliphatic hydrocarbon group or a divalent aromatic hydrocarbon group, from the viewpoint of superior effects of the present invention.

In Formula (1-2), each of m's independently represents an integer of 1 to 3. In a case where M is a nitrogen atom or a phosphorus atom, m represents 3, in a case where M is a sulfur atom, m represents 2, and in a case where M is a iodine atom, m represents 1.

Examples of other suitable aspects of the onium salt compound include a polymer having an onium salt, from the viewpoint of superior effects of the present invention. The polymer having an onium salt means a polymer having an onium salt structure on a side chain or the main chain. In particular, a polymer having a repeating unit having an onium salt structure is preferable.

The definition of the onium salt structure is as described above, and the definitions of a cation and an anion are also as described above.

Examples of a suitable aspect of the polymer having an onium salt include a polymer having a repeating unit represented by Formula (5-1), from the viewpoint of superior effects of the present invention.

Formula (5-1)

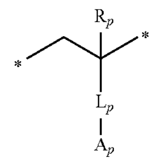

Formula (1-1)

$$M^{+}\!-\!(R)_n \quad X^-$$

Formula (1-2)

$$L\!\left[M^{+}\!-\!(R)_m\right]_2 \quad 2X^-$$

In Formula (5-1), $R_p$ represents a hydrogen atom or an alkyl group. Although the number of carbon atoms included in the alkyl group is not particularly limited, the number is preferably 1 to 20, and more preferably 1 to 10, from the viewpoint of superior effects of the present invention.

$L_p$ represents a divalent connecting group. The divalent connecting group represented by $L_p$ has the same meaning as that of L represented by Formula (1-2).

Among these, $L_p$ is preferably an alkylene group, an arylene group, —COO—, or a group obtained by combining two or more types thereof (-arylene group-alkylene group-, —COO-alkylene group-, or the like), and an alkylene group is more preferable, from the viewpoint of superior effects of the present invention.

$A_p$ represents a residue obtained by removing one hydrogen atom from the onium salt represented by any one of Formulas (1-1) and (1-2). The residue refers to a group having a structure capable of bonding to $L_p$, which is obtained by pulling one hydrogen atom out of any position in a structural formula representing an onium salt. Typically, the residue refers to a group having a structure capable of bonding to $L_p$, which is obtained by pulling one hydrogen atom in R out.

The definition of each group in Formulas (1-1) and (1-2) is as described above.

Although the content of the repeating unit represented by Formula (5-1) in a polymer is not particularly limited, the content is preferably 30 mol % to 100 mol %, and more preferably 50 mol % to 100 mol %, with respect to the entirety of repeating units in the polymer, from the viewpoint of superior effects of the present invention.

Although the weight average molecular weight of the polymer is not particularly limited, the weight average molecular weight is preferably 1000 to 30000, and more preferably 1000 to 10000, from the viewpoint of superior effects of the present invention.

Examples of a suitable aspect of the repeating unit represented by Formula (5-1) include the repeating unit represented by Formula (5-2).

Formula (5-2)

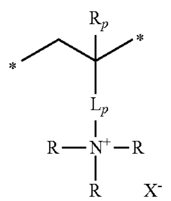

In Formula (5-2), $R_p$ and $L_p$ have the same meaning as that in Formula (5-1), and R and $X^-$ have the same meaning as that in Formula (1-1).

Furthermore, examples of a suitable aspect of the repeating unit represented by Formula (5-2) include the repeating units represented by Formulas (5-3) to (5-5).

Formula (5-3)

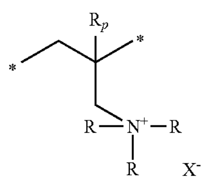

Formula (5-4)

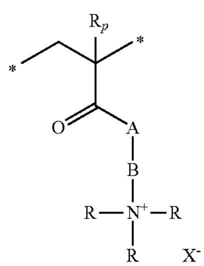

Formula (5-5)

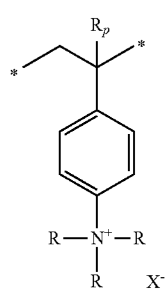

In Formula (5-3), $R_p$ has the same meaning as that in Formula (5-1), and R and $X^-$ have the same meaning as that in Formula (1-1).

In Formula (5-4), $R_p$ has the same meaning as that in Formula (5-1), and R and $X^-$ have the same meaning as that in Formula (1-1).

A represents —O—, —NH—, or —NR—. R has the same meaning as that of R in Formula (1-1).

B represents an alkylene group.

In Formula (5-5), $R_p$ has the same meaning as that in Formula (5-1), and R and $X^-$ have the same meaning as that in Formula (1-1).

(Nitrogen-Containing Compound)

A nitrogen-containing compound means a compound including a nitrogen atom. In the present specification, the onium salt compound is not included in the nitrogen-containing compound. The nitrogen-containing compound mainly forms an interaction between a nitrogen atom in the compound and the above-described polar group. For example, in a case where the polar group is a carboxyl group, this carboxyl group interacts with a nitrogen atom in the nitrogen-containing compound to form a salt.

Examples of the nitrogen-containing compound include a compound represented by the following General Formula (6).

Formula (6)

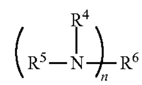

In General Formula (6), each of $R^4$ and $R^5$ independently represents a hydrogen atom, a hydroxyl group, a formyl group, an alkoxy group, an alkoxycarbonyl group, a chain hydrocarbon group having 1 to 30 carbon atoms, an alicyclic hydrocarbon group having 3 to 30 carbon atoms, an aromatic hydrocarbon group having 6 to 14 carbon atoms, or a group obtained by combining two or more of these groups. $R^6$ represents a hydrogen atom, a hydroxyl group, a formyl group, an alkoxy group, an alkoxycarbonyl group, an n-valent chain hydrocarbon group having 1 to 30 carbon atoms, an n-valent alicyclic hydrocarbon group having 3 to 30 carbon atoms, an n-valent aromatic hydrocarbon group having 6 to 14 carbon atoms, or an n-valent group obtained by combining two or more of these groups. n is an integer of 1 or greater. Here, when n is 2 or greater, a plurality of $R^4$'s and $R^5$'s may be the same or different, respectively. In addition, any two of $R^4$ to $R^6$ may be bonded to form a ring structure together with the nitrogen atom to which $R^4$ to $R^6$ are bonded.

Examples of the chain hydrocarbon group having 1 to 30 carbon atoms represented by $R^4$ or $R^5$ include a methyl group, an ethyl group, an n-propyl group, an i-propyl group, an n-butyl group, a 2-methyl propyl group, a 1-methyl propyl group, and a t-butyl group.

Examples of the alicyclic hydrocarbon group having 3 to 30 carbon atoms represented by $R^4$ or $R^6$ include a cyclopropyl group, a cyclopentyl group, a cyclohexyl group, an adamantyl group, and a norbornyl group.

Examples of the aromatic hydrocarbon group having 6 to 14 carbon atoms represented by $R^4$ or $R^6$ include a phenyl group, a tolyl group, and a naphthyl group.

Examples of the group obtained by combining two or more types these groups represented by $R^4$ or $R^5$ include an aralkyl group having 6 to 12 carbon atoms, such as a benzyl group, a phenethyl group, a naphthyl methyl group, or a naphthyl ethyl group.

Examples of the n-valent chain hydrocarbon group having 1 to 30 carbon atoms represented by $R^6$ include a group excluding (n−1) hydrogen atoms from the same group as the group exemplified as the chain hydrocarbon group having 1 to 30 carbon atoms represented by $R^4$ or $R^5$.

Examples of the alicyclic hydrocarbon group having 3 to 30 carbon atoms represented by $R^6$ include a group excluding (n−1) hydrogen atoms from the same group as the group exemplified as the alicyclic hydrocarbon group having 3 to 30 carbon atoms represented by $R^4$ or $R^5$.

Examples of the aromatic hydrocarbon group having 6 to 14 carbon atoms represented by $R^6$ include a group excluding (n−1) hydrogen atoms from the same group as the group exemplified as the aromatic hydrocarbon group having 6 to 14 carbon atoms represented by $R^4$ or $R^5$.

Examples of the group obtained by combining two or more type of the groups represented by $R^6$ include a group excluding (n−1) hydrogen atoms from the same group as the group exemplified as the group obtained by combining two or more types of these group, represented by $R^4$ or $R^5$.

The group represented by $R^4$ to $R^6$ may be substituted. Specific examples of the substituent include a methyl group, an ethyl group, a propyl group, an n-butyl group, a t-butyl group, a hydroxyl group, a carboxy group, a halogen atom, and an alkoxy group. Examples of the halogen atom include a fluorine atom, a chlorine atom, and a bromine atom. In addition, examples of the alkoxy group include a methoxy group, an ethoxy group, a propoxy group, and a butoxy group.

Examples of the compound represented by Formula (6) include a (cyclo)alkyl amine compound, a nitrogen-containing heterocyclic compound, an amide group-containing compound, and a urea compound.

Examples of the (cyclo)alkyl amine compound include a compound having one nitrogen atom, a compound having two nitrogen atoms, and a compound having three or more nitrogen atoms.

Examples of the (cyclo)alkyl amine compound having one nitrogen atom include mono(cyclo)alkyl amines such as n-hexyl amine, n-heptyl amine, n-octyl amine, n-nonyl amine, 1-amino decane, and cyclohexyl amine;

di(cyclo)alkyl amines such as di-n-butyl amine, di-n-pentyl amine, di-n-hexyl amine, di-n-heptyl amine, di-n-octyl amine, di-n-nonyl amine, di-n-decyl amine, cyclohexyl methyl amine, and dicyclohexyl amine; tri(cyclo)alkyl amines such as triethyl amine, tri-n-propyl amine, tri-n-butyl amine, tri-n-pentyl amine, tri-n-hexyl amine, tri-n-heptyl amine, tri-n-octyl amine, tri-n-nonyl amine, tri-n-decyl amine, cyclohexyl dimethyl amine, methyl dicyclohexyl amine, and tricyclohexyl amine;

substituted alkyl amines such as triethanol amine; and aromatic amines such as aniline, N-methyl aniline, N,N-dimethyl aniline, 2-methyl aniline, 3-methyl aniline, 4-methyl aniline, N,N-dibutyl aniline, 4-nitro aniline, diphenyl amine, triphenyl amine, naphthyl amine, 2,4,6-tri-tert-butyl-N-methyl aniline, N-phenyl diethanol amine, 2,6-diisopropyl aniline, 2-(4-aminophenyl)-2-(3-hydroxyphenyl) propane, and 2-(4-aminophenyl)-2-(4-hydroxyphenyl) propane.

Examples of the (cyclo)alkyl amine compound having two nitrogen atoms include ethylene diamine, tetramethyl ethylene diamine, tetramethylene diamine, hexamethylene diamine, 4,4'-diaminodiphenyl methane, 4,4'-diaminodiphenyl ether, 4,4'-diaminobenzophenone, 4,4'-diaminodiphenyl amine, 2,2-bis(4-aminophenyl) propane, 2-(3-aminophenyl)-2-(4-aminophenyl) propane, 1,4-bis[1-(4-aminophenyl)-1-methyl ethyl]benzene, 1,3-bis[1-(4-aminophenyl)-1-methyl ethyl]benzene, bis(2-dimethylaminoethyl)ether, bis (2-diethylaminoethyl)ether, 1-(2-hydroxyethyl)-2-imidazolidinone, 2-quinoxalinol, and N,N,N',N'-tetrakis(2-hydroxypropyl)ethylene diamine.

Examples of the (cyclo)alkyl amine compound having three or more nitrogen atoms include polymers such as polyethyleneimine, polyallylamine, and 2-dimethylaminoethyl acrylamide.

Examples of the nitrogen-containing heterocyclic compound include a nitrogen-containing aromatic heterocyclic compound and a nitrogen-containing aliphatic heterocyclic compound.

Examples of the nitrogen-containing aromatic heterocyclic compound include imidazoles such as imidazole, 4-methyl imidazole, 4-methyl-2-phenyl imidazole, benzimidazole, 2-phenyl benzimidazole, 1-benzyl-2-methyl imidazole, and 1-benzyl-2-methyl-1H-imidazole; and pyridines such as pyridine, 2-methyl pyridine, 4-methyl pyridine, 2-ethyl pyridine, 4-ethyl pyridine, 2-phenyl pyridine, 4-phenyl pyridine, 2-methyl-4-phenyl pyridine, nicotine, nicotinic acid, nicotinic acid amide, quinoline, 4-hydroxyquinoline, 8-oxyquinoline, acridine, and 2,2',6',2"-terpyridine.

Examples of the nitrogen-containing aliphatic heterocyclic compound include piperazines such as piperazine and 1-(2-hydroxyethyl)piperazine; and pyrazine, pyrazole, pyridazine, quinazoline, purine, pyrrolidine, proline, piperidine, piperidine ethanol, 3-piperidino-1,2-propanediol, morpholine, 4-methyl morpholine, 1-(4-morpholinyl)ethanol, 4-acetyl morpholine, 3-(N-morpholino)-1,2-propanediol, 1,4-dimethyl piperazine, and 1,4-diazabicyclo[2.2.2]octane.

Examples of the amide group-containing compound include

N-t-butoxycarbonyl group-containing amino compounds such as N-t-butoxycarbonyl di-n-octyl amine, N-t-butoxycarbonyl di-n-nonyl amine, N-t-butoxycarbonyl di-n-decyl amine, N-t-butoxycarbonyl dicyclohexyl amine, N-t-butoxycarbonyl-1-adamantyl amine, N-t-butoxycarbonyl-2-adamantyl amine, N-t-butoxycarbonyl-N-methyl-1-adamantyl amine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxy piperidine, N-t-butoxycarbonyl pyrrolidine, N-t-butoxycarbonyl piperazine, N,N-di-t-butoxycarbonyl-1-adamantyl amine, N,N-di-t-butoxycarbonyl-N-methyl-1-adamantyl amine, N-t-butoxycarbonyl-4,4'-diaminodiphenyl methane, N,N'-di-t-butoxycarbonyl hexamethylene diamine, N,N,N',N'-tetra-t-butoxycarbonyl hexamethylene diamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenyl methane, N-t-butoxycarbonyl benzimidazole, N-t-butoxycarbonyl-2-methyl benzimidazole, and N-t-butoxycarbonyl-2-phenyl benzimidazole; and formamide, N-methyl formamide, N,N-dimethyl formamide, acetamide, N-methyl acetamide, N,N-dimethyl acetamide, propionamide, benzamide, pyrrolidone, N-methyl pyrrolidone, N-acetyl-1-adamantyl amine, and tris(2-hydroxyethyl) isocyanurate.

Examples of the urea compound include urea, methyl urea, 1,1-dimethyl urea, 1,3-dimethyl urea, 1,1,3,3-tetramethyl urea, 1,3-diphenyl urea, and tri-n-butyl thiourea.

Among these, the (cyclo)alkyl amine compound or the nitrogen-containing aliphatic heterocyclic compound is preferable, and 1-amino decane, di-n-octyl amine, tri-n-octyl amine, tetramethyl ethylene diamine, N,N-dibutyl aniline, or proline is more preferable.

As a suitable aspect of the nitrogen-containing compound, a nitrogen-containing compound (polyvalent nitrogen-containing compound) including a plurality (two or more) of nitrogen atoms is preferable. In particular, an aspect including 3 or more is preferable, and an aspect including 4 or more is more preferable.

In addition, examples of other suitable aspects of the nitrogen-containing compound include a compound represented by Formula (3), from the viewpoint of superior effects of the present invention.

Formula (3)

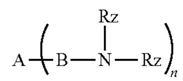

In Formula (3), A represents a single bond or an n-valent organic group.

Preferable specific examples of A can include a single bond, a group represented by the following Formula (1A), a group represented by the following Formula (1B), (1A)

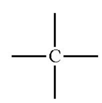

(1B)

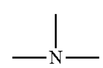

—NH—, —$NR_W$—, —O—, —S—, a carbonyl group, an alkylene group, an alkenylene group, an alkynylene group, a cycloalkylene group, an aromatic group, a heterocyclic group, and an n-valent organic group formed of a group obtained by combining two or more types thereof. Here, in the above formula, $R_w$ represents an organic group, and preferably an alkyl group, an alkylcarbonyl group, or an alkylsulfonyl group. In the above combination, heteroatoms are not connected to each other.

Among these, an aliphatic hydrocarbon group (an alkylene group, an alkenylene group, an alkynylene group, or a cycloalkylene group), the group represented by Formula (1B), —NH —, or —NR— is preferable.

Here, the alkylene group, the alkenylene group, or the alkynylene group preferably has 1 to 40 carbon atoms, more preferably 1 to 20 carbon atoms, and still more preferably 2 to 12 carbon atoms. The alkylene group may be linear or branched, and may have a substituent. The cycloalkylene group preferably has 3 to 40 carbon atoms, more preferably 3 to 20 carbon atoms, and still more preferably 5 to 12 carbon atoms. The cycloalkylene group may be monocyclic or polycyclic, and may have a substituent on the ring.

The aromatic group may be monocyclic or polycyclic, and also include a nonbenzene-based aromatic group. Examples of the monocyclic aromatic group can include a benzene residue, a pyrrole residue, a furan residue, a thiophene residue, and an indole residue, and examples of the polycyclic aromatic group can include a naphthalene residue, an anthracene residue, a tetracene residue, a benzofuran residue, and a benzothiophene residue. The aromatic group may have a substituent.

The n-valent organic group may have a substituent, and there is not particularly limited to the type thereof, and examples thereof can include an alkyl group, an alkoxy group, an alkyl carbonyl group, an alkyl carbonyloxy group, an alkyloxycarbonyl group, an alkenyl group, an alkenyloxy group, an alkenyl carbonyl group, an alkenyl carbonyloxy group, an alkenyloxy carbonyl group, an alkynyl group, an alkynyleneoxy group, an alkynylene carbonyl group, an alkynylene carbonyloxy group, an alkynyleneoxy carbonyl group, an aralkyl group, an aralkyloxy group, an aralkyl carbonyl group, an aralkyl carbonyloxy group, an aralkyloxy carbonyl group, a hydroxyl group, an amide group, a carboxyl group, a cyano group, and a fluorine atom.

B represents a single bond, an alkylene group, a cycloalkylene group, or an aromatic group, and the alkylene group, the cycloalkylene group, and the aromatic group may have a substituent. Here, the description of the alkylene group, the cycloalkylene group, and the aromatic group is as described above.

However, both A and B do not represent a single bond at the same time in any cases.

Each of $R_z$'s independently represents a hydrogen atom, an aliphatic hydrocarbon group which may include a heteroatom, or an aromatic hydrocarbon group which may include a heteroatom.

Examples of the aliphatic hydrocarbon group include an alkyl group, an alkenyl group, and an alkynyl group. Although the number of carbon atoms included in the aliphatic hydrocarbon group is not particularly limited, the number of carbon atoms is preferably 1 to 20, and more preferably 1 to 10, from the viewpoint of superior effects of the present invention.

Examples of the aromatic hydrocarbon group include a phenyl group and a naphthyl group.

A heteroatom may be included in the aliphatic hydrocarbon group and the aromatic hydrocarbon group. The definition and a suitable aspect of a heteroatom are the same as the same definition and the suitable aspect of the heteroatom described in Formula (1-1).

A substituent (for example, a functional group such as a hydroxyl group, a cyano group, an amino group, a pyrrolidino group, a piperidino group, a morpholino group, or an oxo group; an alkoxy group; or a halogen atom) may be included in the aliphatic hydrocarbon group and the aromatic hydrocarbon group.

n represents an integer of 2 to 8, and preferably an integer of 3 to 8.

Moreover, the compound represented by Formula (3) preferably has three or more nitrogen atoms. In the aspect, in a case where n is 2, at least one nitrogen atom is included in A. "A nitrogen atom is included in A" means that at least one selected from the group represented by Formula (1B), —NH—, and —$NR_w$— is included in A.

The compounds represented by Formula (3) are exemplified below.
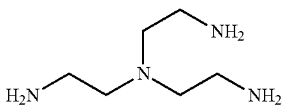
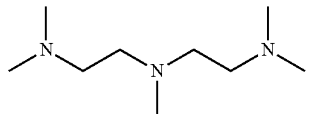
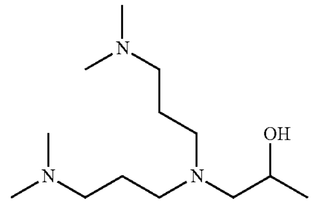
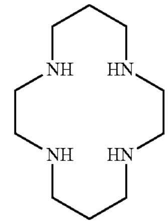
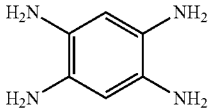
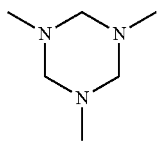
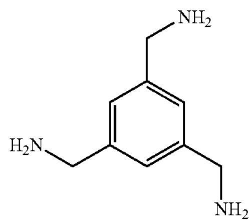
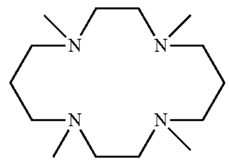
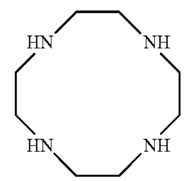
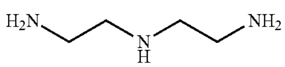
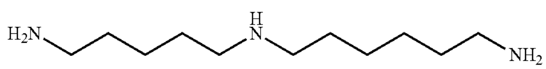
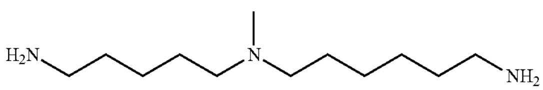
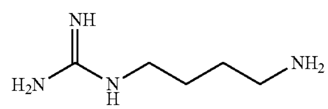
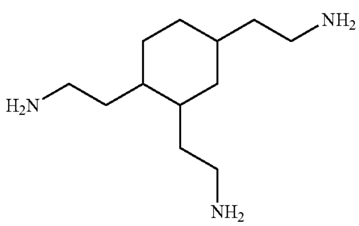
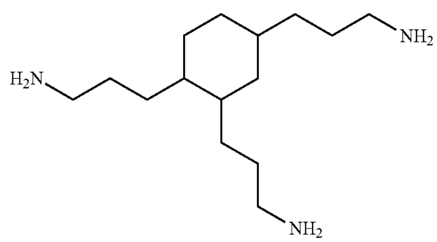
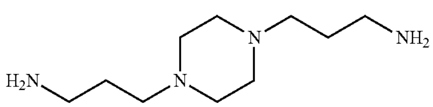
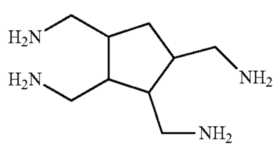
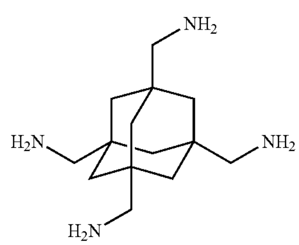
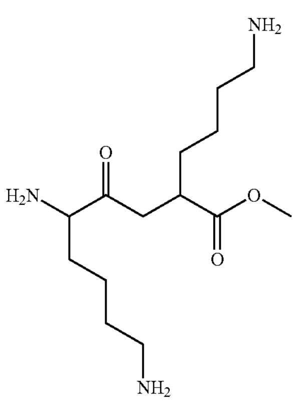
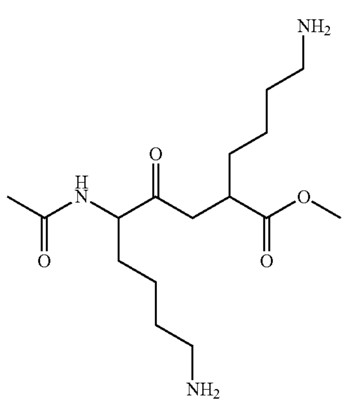
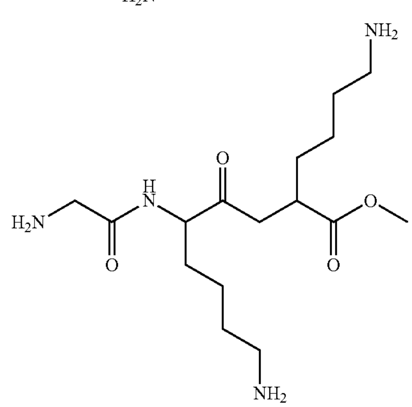

-continued
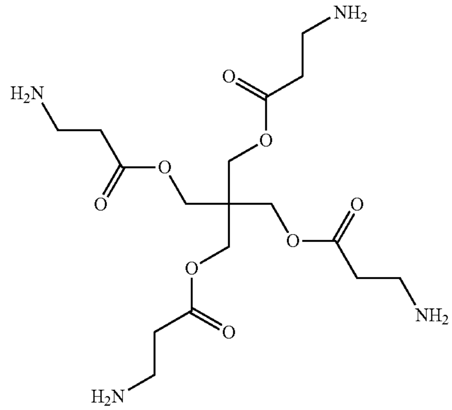
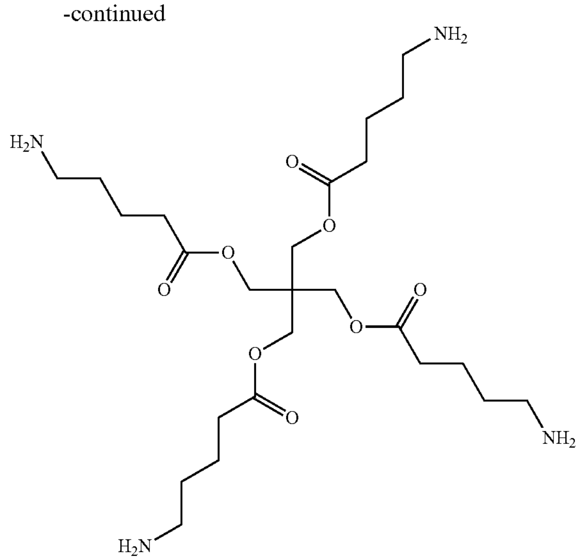
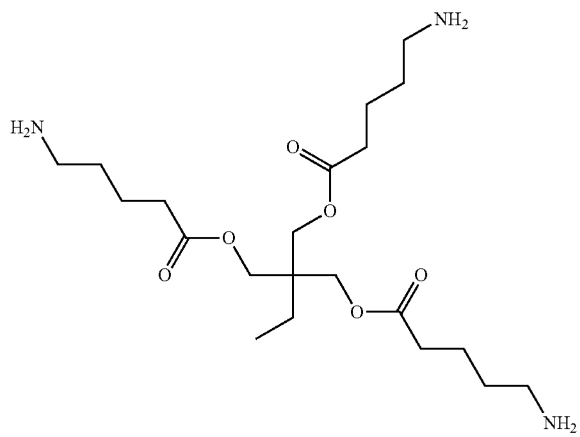
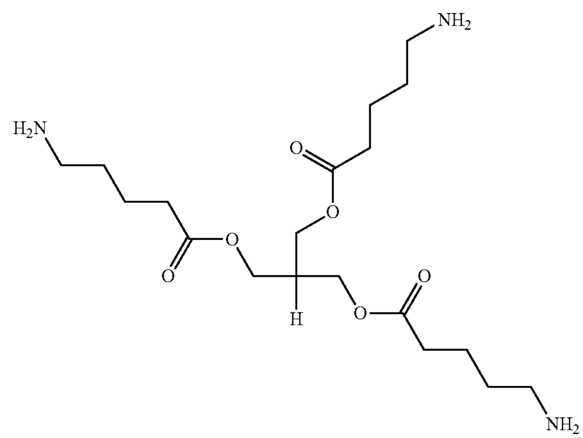
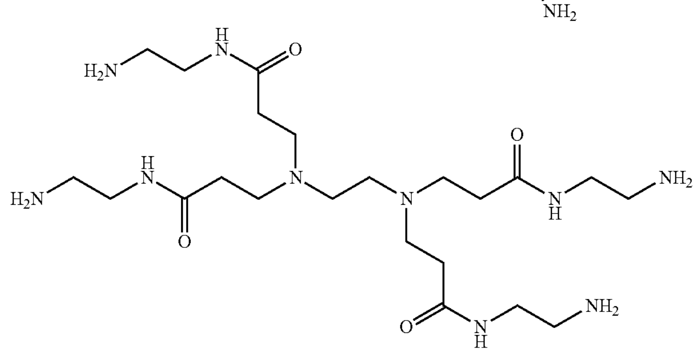
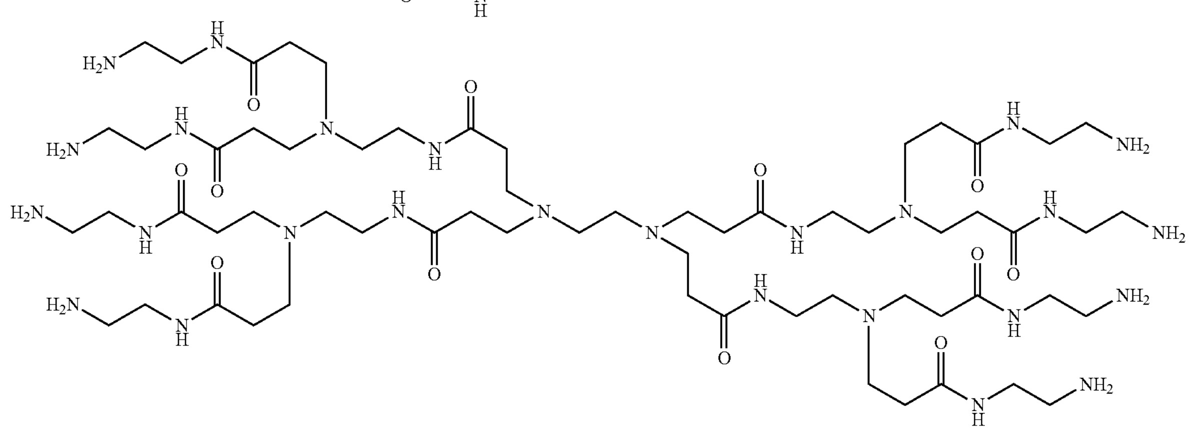

Preferable examples of other suitable aspects of the nitrogen-containing compound include a polymer having an amino group, from the viewpoint of superior effects of the present invention. In the present specification, the "amino group" is a concept that includes a primary amino group, a secondary amino group, and a tertiary amino group. Moreover, cyclic secondary amino groups such as a pyrrolidino group, a piperidino group, a piperazino group, and hexahydrotriazino group are also included in the secondary amino group.

The amino group may be included in any one of the main chain and a side chain of a polymer.

Specific examples of a side chain in a case where the amino group is included in a part of the side chain are shown below. ·※· represents a connecting portion with a polymer.

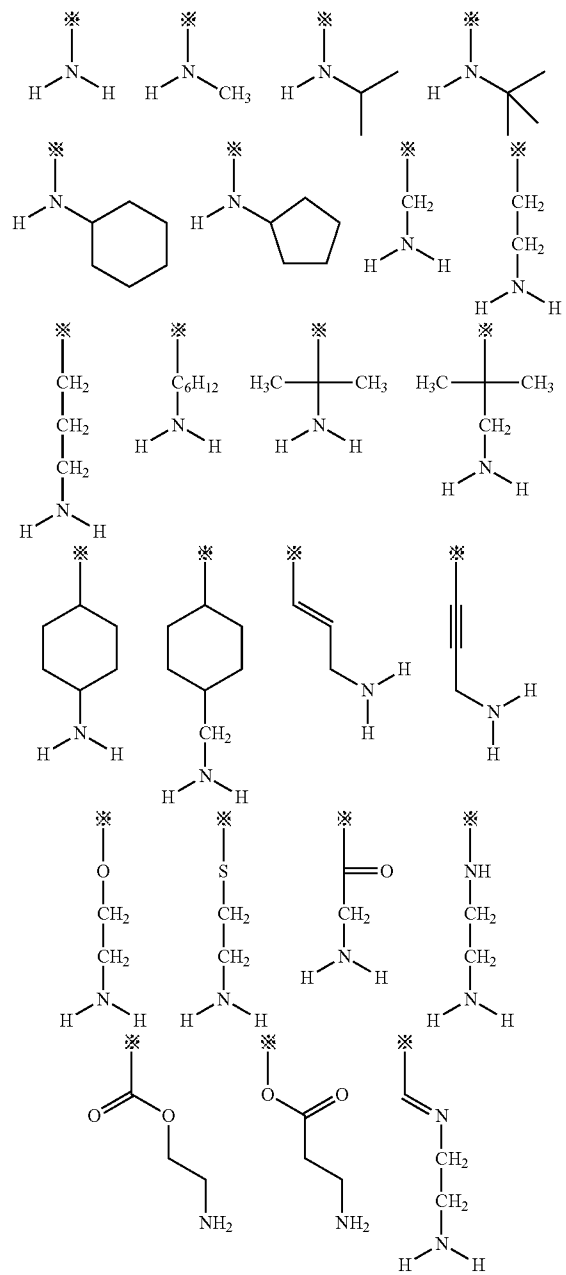

-continued

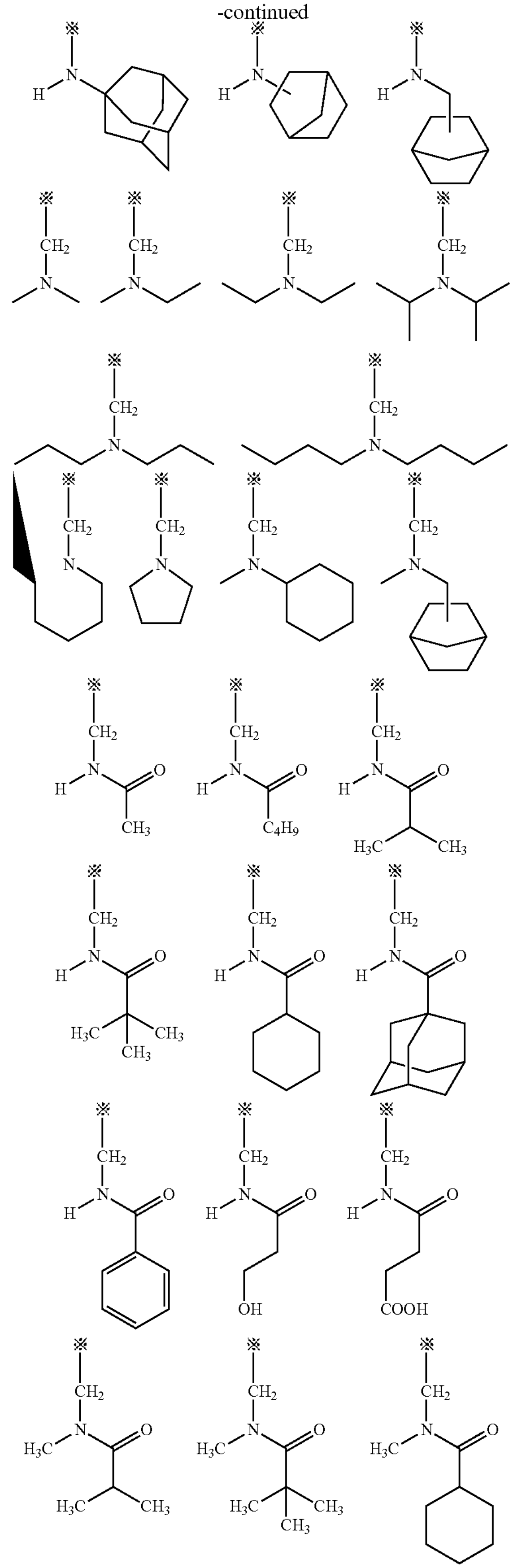

-continued

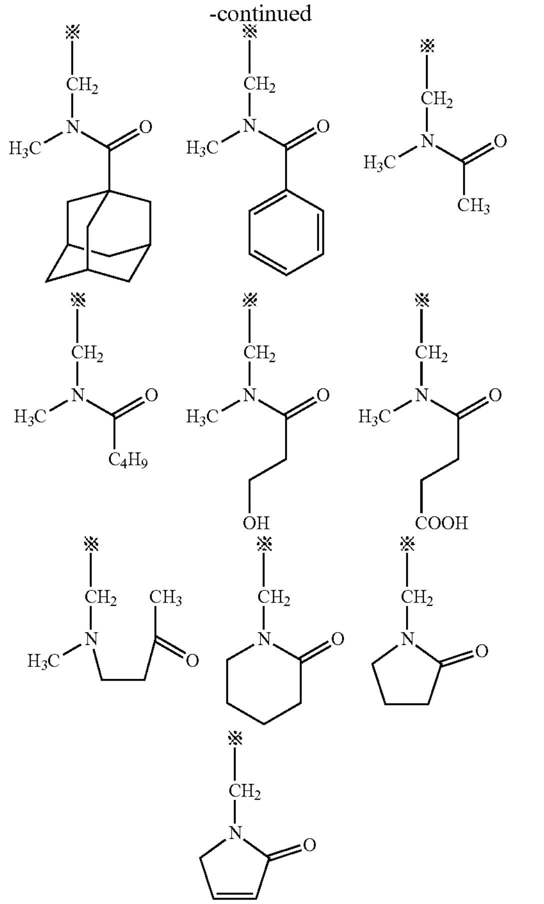

Examples of the polymer having the above-described amino group include polyallyl amine, polyethylene imine, polyvinyl pyridine, polyvinyl imidazole, polypyrimidine, polytriazole, polyquinoline, polyindole, polypurine, polyvinyl pyrrolidone, and polybenzimidazole.

Examples of a suitable aspect of the polymer having an amino group include a polymer having a repeating unit represented by Formula (2).

Formula (2)

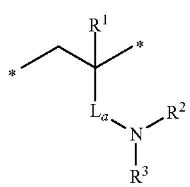

In Formula (2), $R^1$ represents a hydrogen atom or an alkyl group. Although the number of carbon atoms included in the alkyl group is not particularly limited, the number is preferably 1 to 4, and more preferably 1 to 2, from the viewpoint of superior effects of the present invention.

Each of $R^2$ and $R^3$ independently represents a hydrogen atom, an alkyl group which may include a heteroatom, a cycloalkyl group which may include a heteroatom, or an aromatic group which may include a heteroatom.

Although the number of carbon atoms included in the alkyl group and the cycloalkyl group is not particularly limited, the number is preferably 1 to 20, and more preferably 1 to 10.

Examples of the aromatic group include an aromatic hydrocarbon group and an aromatic heterocyclic group.

A heteroatom may be included in the alkyl group, the cycloalkyl group, and the aromatic group. The definition and a suitable aspect of a heteroatom are the same as the definition and the suitable aspect of the heteroatom described in Formula (1-1).

In addition, a substituent (for example, a functional group such as a hydroxyl group, a cyano group, an amino group, a pyrrolidino group, a piperidino group, a morpholino group, or an oxo group; an alkoxy group; or a halogen atom) may be included in the alkyl group, the cycloalkyl group, and the aromatic group.

$L_a$ represents a divalent connecting group. The divalent connecting group represented by $L_a$ has the same definition as that of L represented by Formula (1-2).

Among these, $L_a$ is preferably an alkylene group, an arylene group, —COO—, or a group obtained by combining two or more types thereof (-arylene group-alkylene group-, —COO-alkylene group-, or the like), and an alkylene group is more preferable, from the viewpoint of superior effects of the present invention.

Moreover, the group represented by each of $R^1$ to $R^3$ and the divalent connecting group represented by $L_a$ may be further substituted with a substituent (for example, a hydroxyl group).

The repeating units represented by Formula (2) are exemplified below.

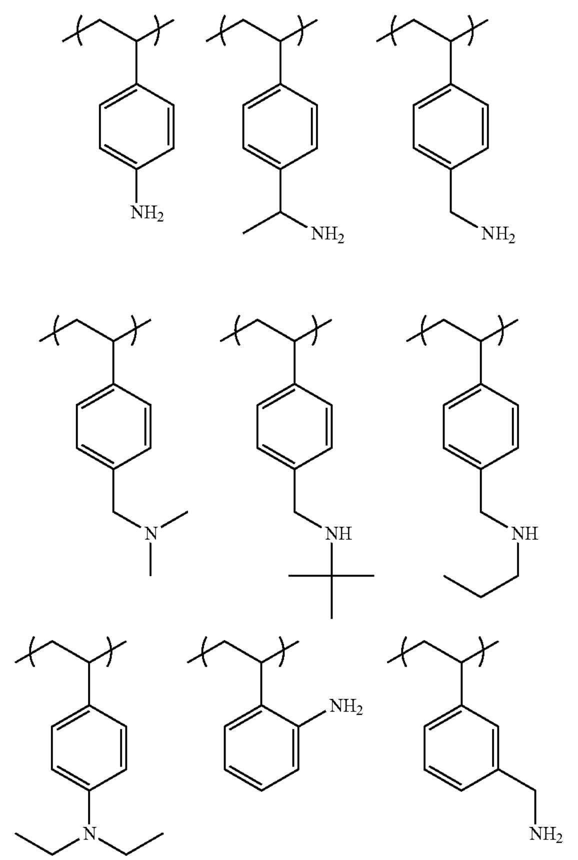

-continued

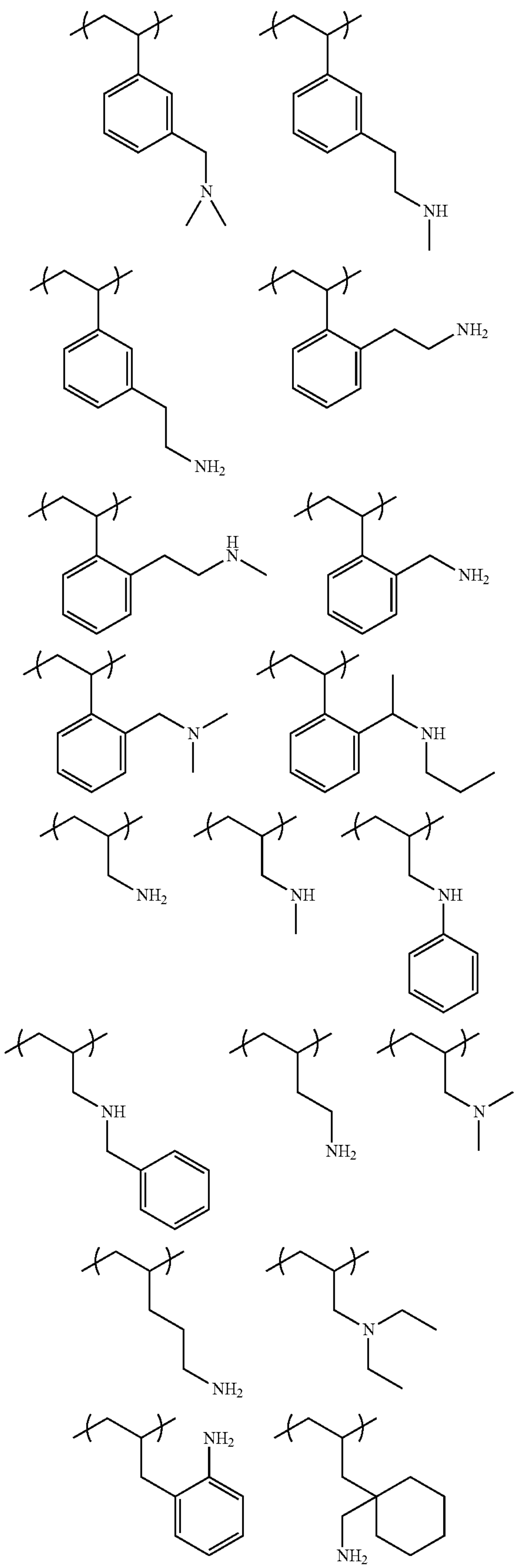

-continued

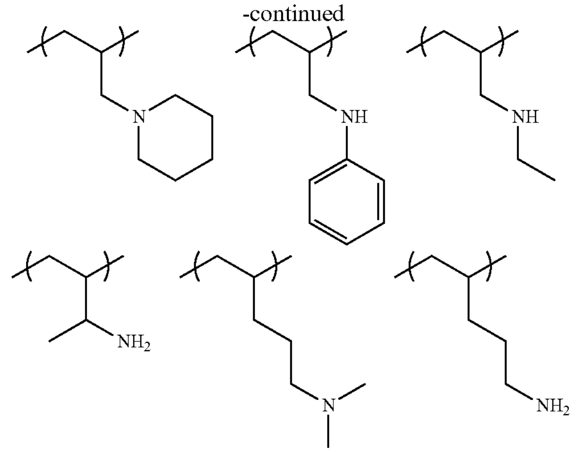

Although the content of the repeating unit represented by Formula (2) in a polymer is not particularly limited, the content is preferably 40 mol % to 100 mol %, and more preferably 70 mol % to 100 mol %, with respect to the entirety of repeating units in the polymer, from the viewpoint of superior effects of the present invention.

Moreover, repeating units other than the repeating unit represented by Formula (2) may be included in the polymer.

Although the weight average molecular weight of a polymer having an amino group is not particularly limited, the weight average molecular weight is preferably 1000 to 30000, and more preferably 1000 to 10000, from the viewpoint of superior effects of the present invention.

(Phosphorus-Based Compound)

The phosphorus-based compound is a compound including —P<(phosphorus atom). The onium salt compound is not included in the phosphorus-based compound. The phosphorus-based compound mainly forms an interaction between a phosphorus atom in the compound and the above-described polar group. For example, in a case where the polar group is a carboxyl group, this carboxyl group interacts with a phosphorus atom in the phosphorus-based compound to form a salt.

At least one phosphorus atom may be included in the phosphorus-based compound, or a plurality (two or more) of phosphorus atoms may be included in the phosphorus-based compound.

Although the molecular weight of the phosphorus-based compound is not particularly limited, the molecular weight is preferably 70 to 500, and more preferably 70 to 300, from the viewpoint of superior effects of the present invention.

Examples of a suitable aspect of the phosphorus-based compound preferably include a phosphorus-based compound selected from the group consisting of the compound represented by the following Formula (4-1) and the compound represented by the following Formula (4-2), from the viewpoint of superior effects of the present invention.

Formula (4-1)

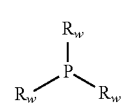

-continued

Formula (4-2)

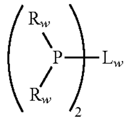

In Formulas (4-1) and (4-2), each of $R_w$'s independently represents an aliphatic hydrocarbon group which may include a heteroatom, an aromatic hydrocarbon group which may include a heteroatom, or a group selected from the group consisting of groups obtained by combining two or more types thereof.

The aliphatic hydrocarbon group may be linear, branched, or cyclic. In addition, although the number of carbon atoms included in the aliphatic hydrocarbon group is not particularly limited, the number of carbon atoms is preferably 1 to 15, and more preferably 1 to 5, from the viewpoint of superior effects of the present invention.

Examples of the aliphatic hydrocarbon group include an alkyl group, a cycloalkyl group, an alkene group, an alkyne group, or a group obtained by combining two or more types thereof.

Although the number of carbon atoms included in the aromatic hydrocarbon group is not particularly limited, the number of carbon atoms is preferably 6 to 20, and more preferably 6 to 10, from the viewpoint of superior effects of the present invention.

Examples of the aromatic hydrocarbon group include a phenyl group and a naphthyl group.

A heteroatom may be included in the aliphatic hydrocarbon group and the aromatic hydrocarbon group. The definition and a suitable aspect of a heteroatom are the same as the definition and the suitable aspect of the heteroatom described in Formula (1-1). Moreover, as the heteroatom, oxygen is preferably included, and is preferably included as an aspect of —O—.

$L_w$ represents a divalent connecting group. Examples of the divalent connecting group include a substituted or unsubstituted divalent aliphatic hydrocarbon group (which preferably has 1 to 8 carbon atoms. For example, an alkylene group such as a methylene group, an ethylene group, or a propylene group), a substituted or unsubstituted divalent aromatic hydrocarbon group (which preferably has 6 to 12 carbon atoms. For example, an arylene group), —O—, —S—, —$SO_2$—, —N(R)— (R: alkyl group), —CO—, —NH—, —COO—, —CONH—, and a group (for example, an alkyleneoxy group, an alkyleneoxycarbonyl group, or an alkylene carbonyloxy group) obtained by combining two or more types thereof are included.

Among these, a divalent aliphatic hydrocarbon group or a divalent aromatic hydrocarbon group is preferable, from the viewpoint of superior effects of the present invention.

Specific examples of the phosphorus-based compound are exemplified below.

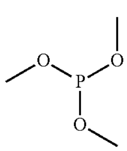

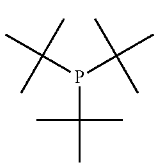

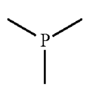

-continued

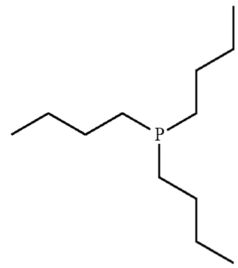

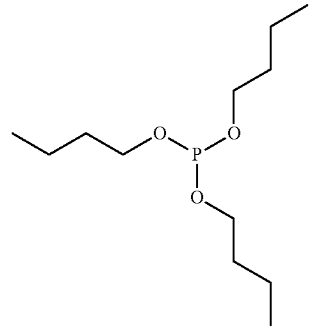

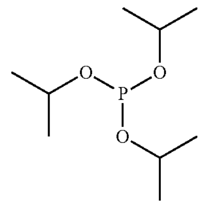

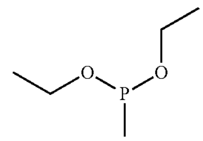

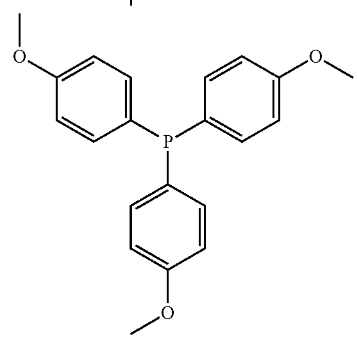

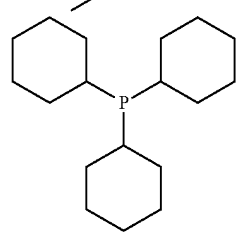

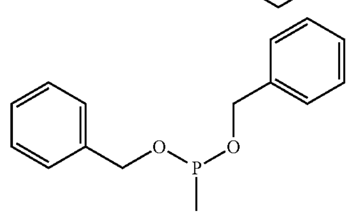

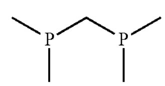

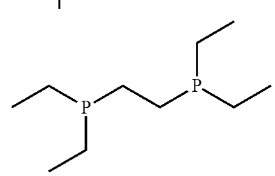

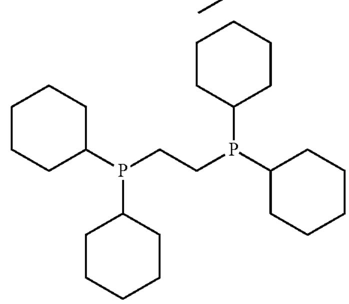

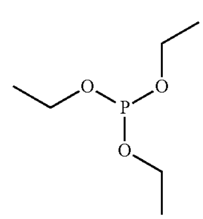

-continued

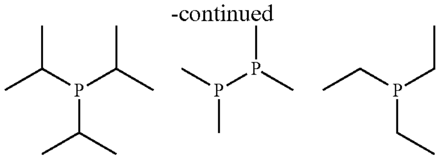

Although the total amount of the additives described above in a developer is not particularly limited, the total amount is preferably 0.1% by mass to 5% by mass, more preferably 1% by mass to 5% by mass, and still more preferably 1% by mass to 3% by mass, with respect to the total amount of the developer, from the viewpoint of superior effects of the present invention. In the present invention, as the additives described above, only one type of compound may be used, or two or more types of compound having different chemical structures may be used.

A suitable amount of a surfactant can be added to the developer, as necessary.

The surfactant is not particularly limited, and for example, an ionic or nonionic fluorine-based surfactant and/or a silicon-based surfactant can be used. Examples of the fluorine-based surfactant and/or the silicon-based surfactant include surfactants described in JP1987-36663A (JP-562-36663A), JP1986-226746A (JP-561-226746A), JP1986-226745A (JP-61-226745A), JP1987-170950A (JP-62-170950A), JP1988-34540A (JP-63-34540A), JP1995-230165A (JP-H7-230165A), JP1996-62834A (JP-H8-62834A), JP1997-54432A (JP-H9-54432A), and JP1997-5988A (JP-H9-5988A), and the specifications of U.S. Pat. No. 5,405,720A, U.S. Pat. No. 5,360,692A, U.S. Pat. No. 5,529,881A, U.S. Pat. No. 5,296,330A, U.S. Pat. No. 5,436,098A, U.S. Pat. No. 5,576,143A, U.S. Pat. No. 5,294,511A, and U.S. Pat. No. 5,824,451A. The surfactant is preferably nonionic. As the nonionic surfactant, a fluorine-based surfactant or a silicon-based surfactant is more preferably used.

The amount added of the surfactant is typical 0.001% by mass to 5% by mass, preferably 0.005% by mass to 2% by mass, and more preferably 0.01% by mass to 0.5% by mass, with respect to the total amount of developer.

Examples of the developing method include a method in which a substrate is dipped in a bath filled with a developer for a predetermined period of time (dipping method), a method in which developing is performed by placing a developer on the substrate surface by surface tension and by holding stationary for a predetermined period of time (puddle method), a method in which a developer is sprayed onto a substrate surface (spray method), and a method in which a substrate is spun at a constant rate, and a developer discharge nozzle is then scanned across the substrate at a constant rate while a developer is discharged continuously on the substrate from the nozzle (dynamic dispensing method).

The above-described various developing methods include a step of discharging a developer toward a resist film from a developing nozzle of a developing device, the discharge pressure (flow rate per unit area of a developer to be discharged) of a developer to be discharged is preferably 2 mL/sec/mm$^2$ or less, more preferably 1.5 mL/sec/mm$^2$ or less, and still more preferably 1 mL/sec/mm$^2$ or less. Although the lower limit of the flow rate is not particularly limited, in consideration of throughput, 0.2 mL/sec/mm$^2$ or greater is preferable.

When the discharge pressure of a developer to be discharged is within the above range, the defects of the pattern resulting from a resist residue after development can be significantly reduced.

Details of the mechanism are not clear, however, it is considered that this is probably because, when the discharge pressure is within the above range, the pressure applied to the resist film by the developer decreases, or unexpected scraping or collapsing of the composition film and/or the pattern is suppressed.

Moreover, the discharge pressure (mL/sec/mm$^2$) of a developer is a value at the developing nozzle exit in the developing device.

Examples of the method of adjusting the discharge pressure of a developer include a method of adjusting the discharge pressure using a pump and a method of adjusting the pressure by supply from a pressure tank.

In addition, after a step of performing development, while replacing with another solvent, a step of stopping the development may be performed.

The pattern forming method according to the present invention preferably further includes a rinsing step (step of washing a film using a rinse liquid including an organic solvent) after a developing step.

The rinse liquid used in the rinsing step is not particularly limited as long as it does not dissolve the pattern after development, and a solution including a general organic solvent can be used.

Examples of the rinse liquid include a rinse liquid including at least one type of organic solvent selected from a hydrocarbon-based solvent, a ketone-based solvent, an ester-based solvent, an alcohol-based solvent, an amide-based solvent, and an ether-based solvent. The rinse liquid more preferably includes at least one type of organic solvent selected from a ketone-based solvent, an ester-based solvent, an alcohol-based solvent, or an amide-based solvent, and still more preferably includes an alcohol-based solvent or an ether-based solvent.

The rinse liquid more preferably includes a monohydric alcohol, and more preferably includes a monohydric alcohol having 5 or more carbon atoms.

These monohydric alcohols may be linear, branched, or cyclic. Examples of these monohydric alcohols include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, and 4-octanol. Examples of the monohydric alcohol having 5 or more carbon atoms include 1-hexanol, 2-hexanol, 4-methyl-2-pentanol, 1-pentanol, and 3-methyl-1-butanol.

Respective components described above may be used in combination of two or more types thereof, and may be used in combination with an organic solvent other than the components described above.

The water content of the rinse liquid is preferably 10% by mass or less, more preferably 5% by mass or less, and still more preferably 3% by mass or less. That is, the amount of an organic solvent used with respect to the rinse liquid is preferably 90% by mass to 100% by mass, more preferably 95% by mass to 100% by mass, and still more preferably 97% by mass to 100%, with respect to the total amount of the rinse liquid. When the water content of the rinse liquid is less than 10% by mass, more favorable development characteristics are obtained.

The vapor pressure of the rinse liquid is preferably 0.05 kPa to 5 kPa, more preferably 0.1 kPa to 5 kPa, and still more preferably 0.12 kPa to 3 kPa, at 20° C. When the vapor pressure of the rinse liquid is 0.05 kPa to 5 kPa, the temperature uniformity in the wafer surface is improved, swelling due to penetration of the rinse liquid is suppressed, and the dimensional uniformity in the wafer surface is improved.

Moreover, a suitable amount of a surfactant may be added to the rinse liquid.

In the rinsing step, the developed wafer is washed with the above-described rinse liquid. The method of washing treatment is not particularly limited, and examples thereof include a method in which a rinse liquid is discharged continuously onto a substrate while the substrate is spun at a constant rate (spin coating method), a method in which a substrate is dipped in a bath filled with a rinse liquid for a predetermined period of time (dipping method), and a method in which a rinse liquid is sprayed onto a substrate surface (spray method). Among these, it is preferable that after a washing treatment is performed by the spin coating method, and then, a rinse liquid is removed from the substrate by rotating the substrate at a rotation speed of 2000 rpm to 4000 rpm.

The pattern forming method of the present invention can further include a step (alkali development step) of forming a resist pattern by performing development using an alkali aqueous solution. Thus, a finer pattern can be formed.

In the present invention, a portion having weak exposure intensity is removed in an organic solvent development step, and a portion having strong exposure intensity is also removed by performing the alkali development step. Since pattern formation is performed without dissolving only a region having intermediate exposure intensity by the multiple development process performing development multiple times in this manner, a finer pattern than usual can be formed (the same mechanism as that in paragraph "0077" of JP2008-292975A).

Although the alkali development can be performed either before or after a step of developing using a developer including an organic solvent, the alkali development is more preferably performed before the organic solvent development step.

Although the type of alkali developer is not particularly limited, typical, an aqueous solution of tetramethylammonium hydroxide is used. A suitable amount of an alcohol and/or a surfactant may be added to the alkali developer.

The alkali concentration of the alkali developer is typically 0.1% by mass to 20% by mass. The pH of the alkali developer is typically 10.0 to 15.0. As the alkali developer, 2.38% by mass tetramethylammonium hydroxide aqueous solution is particularly preferably used.

In a case where a rinse treatment is performed after development using an alkali developer, as the rinse liquid, pure water is typically used. A suitable amount of a surfactant may be added to the rinse liquid.

The pattern obtained by the pattern forming method of the present invention, in general, is suitably used as an etching mask or the like of a semiconductor device, but can also be used in other applications. Examples of other applications include guide pattern formation in DSA (Directed Self-Assembly) (for example, refer to ACS Nano Vol. 4 No. 8 Page 4815 to 4823) and use as so-called a core of a spacer process (for example, refer to JP 1991-270227A (JP-H3-270227A) and JP2013-164509A).

In addition, the present invention also relates to a method for manufacturing an electronic device including the pattern forming method of the present invention described above and an electronic device manufactured by the manufacturing method.

The electronic device of the present invention is suitably mounted on electrical and electronic equipment (home electric appliances, OA and media-related equipment, optical equipment, communication equipment, or the like).

<Active light Sensitive or Radiation Sensitive Resin Composition>

The active light sensitive or radiation sensitive resin composition capable of being used in the present invention will be described below.

The active light sensitive or radiation sensitive resin composition according to the present invention is used in negative type development (development in which, when exposed, solubility is decreased with respect to a developer, the exposed portion remains as a pattern, and the unexposed portion is removed). That is, the active light sensitive or radiation sensitive resin composition according to the present invention can be used as an active light sensitive or radiation sensitive resin composition for organic solvent development used in development using a developer including an organic solvent. Here, "for organic solvent development" means an application to be subjected to a step of developing using a developer including at least an organic solvent.

Thus, the present invention also relates to the active light sensitive or radiation sensitive resin composition which is provided to the pattern forming method according to the present invention described above.

The active light sensitive or radiation sensitive resin composition of the present invention is typically a resist composition, and a negative resist composition (that is, resist composition for organic solvent development) is preferable since particularly significant effects can be obtained. The composition according to the present invention is typically a chemical amplification resist composition.

The composition used in the present invention contains the resin (A) having a group which generates a polar group by being decomposed due to the action of an acid.

Furthermore, the composition used in the present invention preferably include a compound (B) that generates an acid by active light or radiation, a basic compound (C), and a solvent (D), and may further include at least one of a hydrophobic resin (E), a surfactant (F), and other additives (G).

These respective components will be described below.

Resin (A) Having Group which Generates Polar Group by being Decomposed Due to Action of Acid "The resin (A) having a group which generates a polar group by being decomposed due to the action of an acid" is a resin (hereinafter, referred to as "resin (A)") of which the solubility with respect to an organic solvent due to the action of an acid is reduced, and has "a phenolic hydroxyl group" and/or "a phenolic hydroxyl group protected with a group leaving due to the action of an acid" on the main chain or a side chain of the resin, or both the main chain and a side chain.

Moreover, in the present invention, the term "phenolic hydroxyl group" is a generic term that includes not only "a phenol in a narrow sense" formed by substituting a hydrogen atom in a benzene ring with a hydroxyl group (—OH group) but also "phenol in a broad sense" formed by substituting a hydrogen atom in the structure of an aromatic ring such as a naphthalene ring with a hydroxyl group (—OH group), in which the hydroxyl group exhibits acidic properties.

The property of "the solubility with respect to an organic solvent due to the action of an acid is reduced" in the resin (A) may be secured by "a phenolic hydroxyl group protected with a group leaving due to the action of an acid" since "a phenolic hydroxyl group" is a polar group, or separately from this, may be secured by a group (acid-decomposable group) which generates a polar group by being decomposed due to the action of an acid.

Moreover, hereinafter, the repeating unit having a group (acid-decomposable group) which generates a polar group by being decomposed due to the action of an acid is referred to as "repeating unit (a)" in some cases. The repeating unit (a) includes "a phenolic hydroxyl group protected with a group leaving due to the action of an acid".

The resin (A) preferably has the repeating unit (a) having an acid-decomposable group.

The definition of the polar group is the same as that described in the section of the repeating unit (c) described later, and examples of the polar group generated by decomposition of an acid-decomposable group include an alkali soluble group, an amino group, and acidic group, and an alkali soluble group is preferable.

The alkali soluble group is not particularly limited as long as it is a group which is solubilized in an alkali developer, and preferable examples thereof include a phenolic hydroxyl group, a carboxylic acid group, a sulfonic acid group, a fluorinated alcohol group, a sulfonamide group, a sulfonylimide group, an (alkylsulfonyl)(alkylcarbonyl) methylene group, an (alkylsulfonyl)(alkylcarbonyl) imido group, a bis(alkylcarbonyl) methylene group, a bis(alkylcarbonyl) imido group, a bis(alkylsulfonyl) methylene group, a bis (alkylsulfonyl) imido group, a tris(alkylcarbonyl) methylene group, and a tris(alkylsulfonyl) methylene group, and more preferable examples thereof include acidic groups (groups which dissociate in 2.38% by mass tetramethylammonium hydroxide aqueous solution, used as a developer for a resist in the related art) such as a carboxylic acid group, a fluorinated alcohol group (preferably, hexafluoroisopropanol), a phenolic hydroxyl group, and a sulfonic acid group.

The preferable acid-decomposable group is a group in which a hydrogen atom is substituted with a group leaving due to an acid.

Examples of the group leaving due to an acid can include —$C(R_{36})(R_{37})(R_{38})$, —$C(R_{36})(R_{37})(OR_{39})$, and —$C(R_{01})(R_{02})(OR_{39})$.

In the formula, each of $R_{36}$ to $R_{39}$ independently represents an alkyl group, a cycloalkyl group, an aryl group, a group obtained by combining an alkylene group and an aryl group, or an alkenyl group. $R_{36}$ and $R_{37}$ may be bonded to each other to form a ring.

Each of $R_{01}$ and $R_{02}$ independently represents a hydrogen atom, an alkyl group, a cycloalkyl group, an aryl group, a group obtained by combining an alkylene group and an aryl group, or an alkenyl group.

The acid-decomposable group is preferably a cumyl ester group, an enol ester group, an acetal ester group, and a tertiary alkyl ester group.

As the resin (A) having a phenolic hydroxyl group and/or a phenolic hydroxyl group protected with a group leaving due to the action of an acid, for example, a resin having the repeating unit represented by the following General Formula (I) is preferable.

(I)

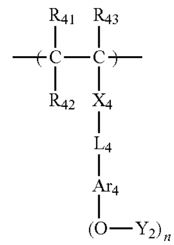

In General Formula (I), each of $R_{41}$, $R_{42}$, and $R_{43}$ independently represents a hydrogen atom, an alkyl group, a halogen atom, a cyano group, or an alkoxycarbonyl group. Here, $R_{42}$ may be bonded to $Ar_4$ to form a ring, and $R_{42}$ in this case represents a single bond or an alkylene group. $X_4$ represents a single bond, —COO—, or —$CONR_{64}$—, and, in the case of forming a ring with $R_{42}$, represents a trivalent connecting group. $R_{64}$ represents a hydrogen atom or an alkyl group. $L_4$ represents a single bond or an alkylene group. $Ar_4$ represents an (n+1) valent aromatic ring group, and, in the case of being bonded to $R_{42}$ to form a ring, represents an (n+2) valent aromatic ring group. n represents an integer of 1 to 4. $Y_2$ represents a hydrogen atom or a group leaving due to an action of an acid, and, in a case where n is 2 or greater, each of $Y_2$'s independently represents a hydrogen atom or a group leaving due to the action of an acid.

Specific examples of an alkyl group, a cycloalkyl group, a halogen atom, or an alkoxycarbonyl group, represented by each of $R_{41}$, $R_{42}$, and $R_{43}$ in Formula (I), or substituents which these groups may have are the same as those described for each group represented by $R_{51}$, $R_{52}$, and $R_{53}$ in General Formula (V) described below.

$Ar_4$ represents an (n+1) valent aromatic ring group. The bivalent aromatic ring group in a case where n is 1 may have a substituent, and preferable examples thereof include arylene groups having 6 to 18 carbon atoms such as a phenylene group, a tolylene group, a naphthylene group, and an anthracenylene group, and aromatic ring groups including a hetero ring, such as thiophene, furan, pyrrole, benzothiophene, benzofuran, benzopyrrole, triazine, imidazole, benzimidazole, triazole, thiadiazole, and thiazole.

Suitable specific examples of the (n+1) valent aromatic group in a case where n is an integer of 2 or greater can include a group obtained by excluding arbitrary (n−1) hydrogen atoms from a specific example described above of the divalent aromatic ring group.

The (n+1) valent aromatic ring group may further have a substituent.

Examples of the substituent which the alkyl group, the cycloalkyl group, the alkoxycarbonyl group, the alkylene group, or the (n+1) valent aromatic ring group described above can have include alkoxy groups such as an alkyl group, a methoxy group, an ethoxy group, a hydroxyethoxy group, a propoxy group, a hydroxypropoxy group, and a butoxy group, and aryl groups such as a phenyl group, represented by each of $R_{51}$ to $R_{53}$ in General Formula (V) described below.

Examples of the alkyl group represented by $R_{64}$ in —$CONR_{64}$— ($R_{64}$ represents a hydrogen atom or an alkyl group) represented by $X_4$ include the same as the alkyl group represented by each of $R_{61}$ to $R_{63}$.

$X_4$ is preferably a single bond, —COO—, or —CONH—, and more preferably a single bond or —COO—.

Examples of the alkylene group in $L_4$ include an alkylene group having 1 to 8 carbon atoms such as a methylene group, an ethylene group, a propylene group, a butylene group, a hexylene group, or an octylene group, which preferably may have a substituent.

$Ar_4$ is more preferably an aromatic ring group having 6 to 18 carbon atoms which may have a substituent, and particularly preferably a benzene ring group, a naphthalene ring group, or a biphenylene ring group.

The repeating unit represented by Formula (I) preferably has a hydroxystyrene structure. That is, $Ar_4$ is preferably a benzene ring group.

In General Formula (I), each of $X_4$ and $L_4$ is preferably a single bond.

Each of n $Y_2$'s independently represents a hydrogen atom or a group leaving due to the action of an acid.

Examples of $Y_2$ which is a group leaving due to the action of an acid can include —C($R_{36}$)($R_{37}$)($R_{38}$), —C(═O)—O—C($R_{36}$)($R_{37}$)($R_{38}$), —C($R_{01}$)($R_{02}$)($OR_{39}$), —C($R_{01}$)($R_{02}$)—C(═O)—O—C($R_{36}$)($R_{37}$)($R_{38}$), and —CH($R_{36}$)(Ar).

In the formula, each of $R_{36}$ to $R_{39}$ independently represents an alkyl group, a cycloalkyl group, an aryl group, a group obtained by combining an alkylene group and an aryl group, or an alkenyl group. $R_{36}$ and $R_{37}$ may be bonded to each other to form a ring.

Each of $R_{01}$ and $R_{02}$ independently represents a hydrogen atom, an alkyl group, a cycloalkyl group, an aryl group, a group obtained by combining an alkylene group and an aryl group, or an alkenyl group.

Examples of the repeating unit represented by General Formula (I) can include the repeating unit represented by the following General Formula (I'), which is a repeating unit having a "phenolic hydroxyl group" (that is, all of $Y_2$'s are hydrogen atoms).

(I')

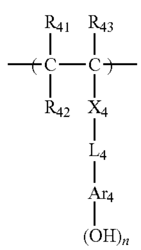

$R_{41}$, $R_{42}$, $R_{43}$, $X_4$, $L_4$, $Ar_4$, and n in Formula (I') have the same meaning as $R_{41}$, $R_{42}$, $R_{43}$, $X_4$, $L_4$, $Ar_4$, and n in Formula (I), respectively.

Specific examples of the repeating unit represented by General Formula (I') will be described below, but the present invention is not limited thereto. In the formula, a represents 1 or 2.

(B-1)

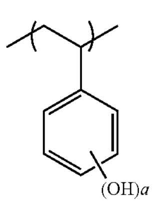

-continued (B-2)

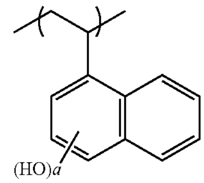

(B-3)

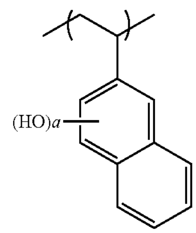

(B-4)

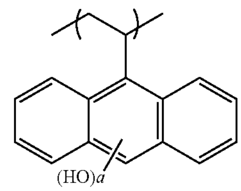

(B-5)

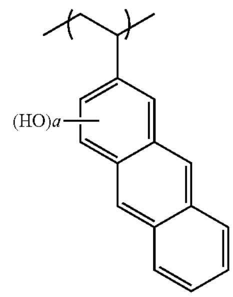

(B-6)

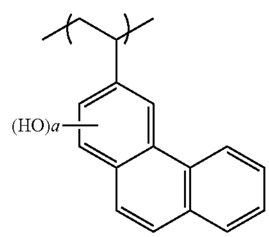

(B-7)

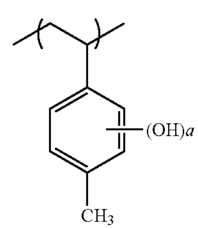

(B-8)

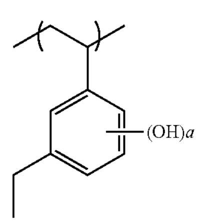

-continued
(B-9)
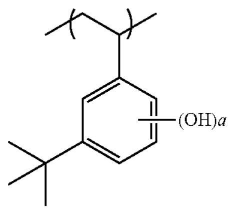
(B-10)
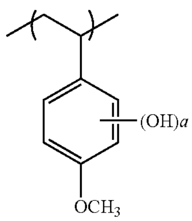
(B-11)
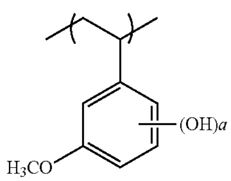
(B-12)
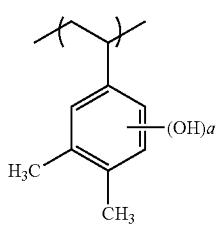
(B-13)
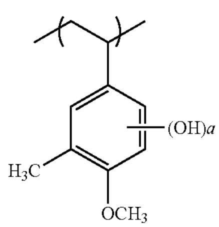
(B-14)
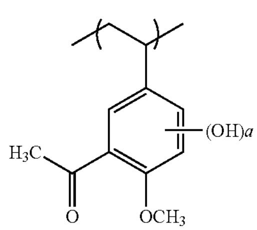
(B-15)
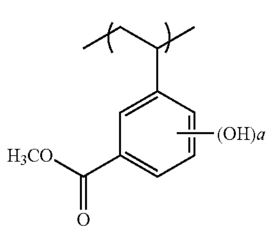
-continued
(B-16)
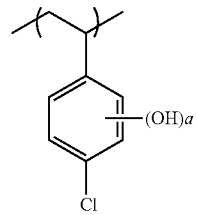
(B-17)
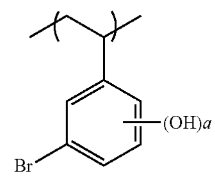
(B-18)
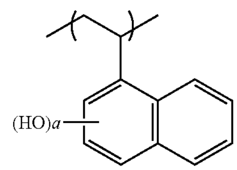
(B-19)
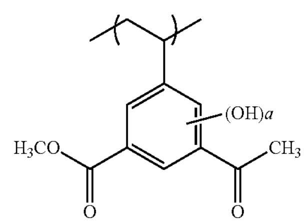
(B-20)
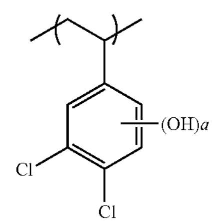
(B-21)
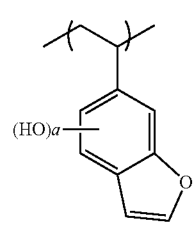
(B-22)
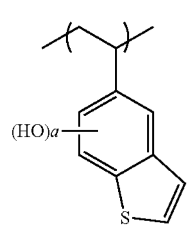

-continued (B-23)

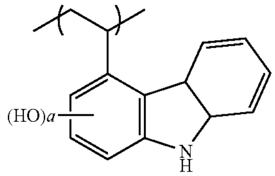

(B-24)

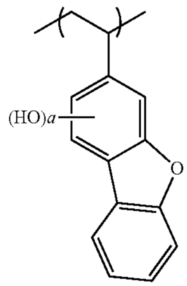

(B-25)

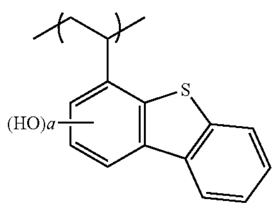

(B-26)

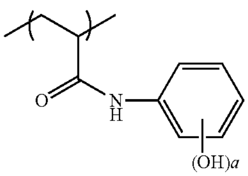

(B-27)

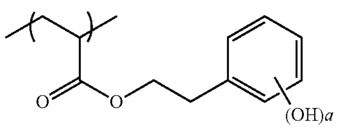

(B-28)

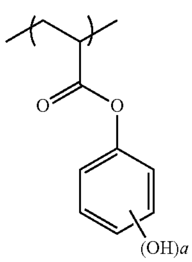

(B-29)

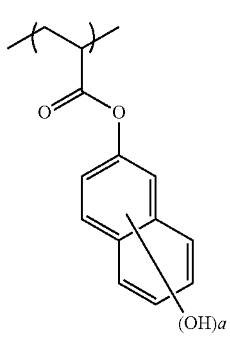

-continued (B-30)

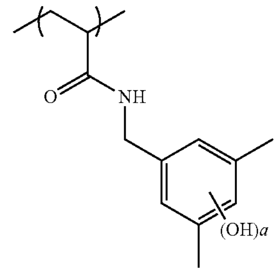

The resin (A) may include two or more types of repeating unit (I').

The content of the repeating unit (I') in the resin (A) is preferably large from the viewpoint of enhancing the sensitivity by the increase in the secondary electron generation amount at the time of exposure described above and strengthening of an interaction with the additive in the present invention, and the content should not be so great from the viewpoint of ensuring the contrast by increasing the amount of the repeating units (a) having an acid-decomposable group. For this reason, the content of the repeating unit (I') in the resin (A) is preferably 5 mol % to 80 mol %, more preferably 10 mol % to 60 mol %, still more preferably 10 mol % to 40 mol %, and particularly preferably 20 mol % to 40 mol %, with respect to the entirety of repeating units in the resin (A).

In addition, examples of the repeating unit represented by General Formula (I) can include the repeating unit represented by the following General Formula (VI), which is a repeating unit having "a phenolic hydroxyl group protected with a group leaving due to the action of an acid" (that is, at least one of $Y_2$'s is a group leaving due to the action of an acid). Moreover, the repeating unit is the repeating unit (a).

(VI)

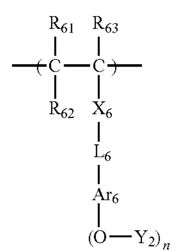

In General Formula (VI), each of $R_{61}$, $R_{62}$, and $R_{63}$ independently represents a hydrogen atom, an alkyl group, a cycloalkyl group, a halogen atom, a cyano group, or an alkoxycarbonyl group. Here, $R_{62}$ may be bonded to $Ar_6$ to form a ring, and $R_{62}$ in this case represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents an (n+1) valent aromatic ring group, and, in the case of being bonded to $R_{62}$ to form a ring, represents an (n+2) valent aromatic ring group.

In a case where n is 2 or greater, each of $Y_2$'s independently represents a hydrogen atom or a group leaving due to the action of an acid. Here, at least one of $Y_2$'s represents a group leaving due to the action of an acid.

n represents an integer of 1 to 4.

General Formula (VI) will be described in more detail.

$R_{61}$ to $R_{63}$ in General Formula (VI) have the same meaning as $R_{51}$, $R_{52}$, and $R_{53}$ in the following General Formula (V), respectively, and the preferable ranges thereof are also the same.

In a case where $R_{62}$ represents an alkylene group, examples of the alkylene group include an alkylene group having 1 to 8 carbon atoms such as a methylene group, an ethylene group, a propylene group, a butylene group, a hexylene group, and an octylene group, which preferably may have a substituent.

Examples of the alkyl group represented by $R_{64}$ in —CONR$_{64}$— ($R_{64}$ represents a hydrogen atom or an alkyl group) represented by $X_6$ include the same as the alkyl group represented by each of $R_{61}$ to $R_{63}$.

$X_6$ is preferably a single bond, —COO—, or —CONH—, and more preferably a single bond or —COO—.

Examples of the alkylene group in $L_6$ include an alkylene group having 1 to 8 carbon atoms such as a methylene group, an ethylene group, a propylene group, a butylene group, a hexylene group, and an octylene group, which preferably may have a substituent. A ring formed by bonding of $R_{62}$ and $L_6$ is particularly preferably 5- or 6-membered ring.

$Ar_6$ represents an (n+1) valent aromatic ring group. The bivalent aromatic ring group in a case where n is 1 may have a substituent, and preferable examples thereof include an arylene group having 6 to 18 carbon atoms such as a phenylene group, a tolylene group, and a naphthylene group, and bivalent aromatic ring groups including a hetero ring, such as thiophene, furan, pyrrole, benzothiophene, benzofuran, benzopyrrole, triazine, imidazole, benzimidazole, triazole, thiadiazole, or thiazole.

Suitable specific examples of the (n+1) valent aromatic ring group in a case where n is an integer of 2 or greater can include a group obtained by excluding arbitrary (n−1) hydrogen atoms from a specific example described above of the divalent aromatic ring group.

The (n+1) valent aromatic ring group may further have a substituent.

Examples of the substituent which the alkyl group, the cycloalkyl group, the alkoxycarbonyl group, the alkylene group, or the (n+1) valent aromatic ring group described above can have include the same specific examples as those of the substituent which each group represented by $R_{51}$ to $R_{53}$ in General Formula (V) described below can have.

n is preferably 1 or 2, and more preferably 1.

Each of n $Y_2$'s independently represents a hydrogen atom or a group leaving due to the action of an acid. Here, at least one of n $Y_2$'s represents a group leaving due to the action of an acid.

Examples of $Y_2$ which is a group leaving due to the action of an acid can include —C($R_{36}$)($R_{37}$)($R_{38}$), —C(═O)—O—C($R_{36}$)($R_{37}$)($R_{38}$), —C($R_{01}$)($R_{02}$)(O$R_{39}$), —C($R_{01}$)($R_{02}$)—C(═O)—O—C($R_{36}$)($R_{37}$)($R_{38}$), and —CH($R_{36}$)(Ar).

In the formula, each of $R_{36}$ to $R_{39}$ independently represents an alkyl group, a cycloalkyl group, an aryl group, a group obtained by combining an alkylene group and an aryl group, or an alkenyl group. $R_{36}$ and $R_{37}$ may be bonded to each other to form a ring.

Each of $R_{01}$ and $R_{02}$ independently represents a hydrogen atom, an alkyl group, a cycloalkyl group, an aryl group, a group obtained by combining an alkylene group and an aryl group, or an alkenyl group.

Ar represents an aryl group.

The alkyl group represented by each of $R_{36}$ to $R_{39}$, $R_{01}$, and $R_{02}$ may be linear or branched, and is preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group represented by each of $R_{36}$ to $R_{39}$, $R_{01}$, and $R_{02}$ may be monocyclic or polycyclic. The monocyclic type is preferably a cycloalkyl group having 3 to 10 carbon atoms, and examples thereof can include a cyclopropyl group, a cyclobutyl group, a cyclopentyl group, a cyclohexyl group, and a cyclooctyl group. The polycyclic type is preferably a cycloalkyl group having 6 to 20 carbon atoms, and examples thereof can include an adamantyl group, a norbornyl group, an isobornyl group, a camphanyl group, a dicyclopentyl group, an α-pinene group, a tricyclodecanyl group, a tetracyclododecyl group, and an androstanyl group. Moreover, some of the carbon atoms in a cycloalkyl group may be substituted with a heteroatom such as an oxygen atom.

The aryl group represented by each of $R_{36}$ to $R_{39}$, $R_{01}$, $R_{02}$, and Ar is preferably an aryl group having 6 to 10 carbon atoms, and examples thereof include aryl groups such as a phenyl group, a naphthyl group, and an anthryl group, and bivalent aromatic ring groups including a hetero ring, such as thiophene, furan, pyrrole, benzothiophene, benzofuran, benzopyrrole, triazine, imidazole, benzimidazole, triazole, thiadiazole, and thiazole.

A group obtained by combining an alkylene group and an aryl group represented by each of $R_{36}$ to $R_{39}$, $R_{01}$, and $R_{02}$ is preferably an aralkyl group having 7 to 12 carbon atoms, and examples thereof can include a benzyl group, a phenethyl group, and naphthylmethyl group.

The alkenyl group represented by each of $R_{36}$ to $R_{39}$, $R_{01}$, and $R_{02}$ is preferably an alkenyl group having 2 to 8 carbon atoms, and examples thereof can include a vinyl group, an allyl group, a butenyl group, and a cyclohexenyl group.

A ring formed by bonding of $R_{36}$ and $R_{37}$ to each other may be monocyclic or polycyclic. The monocyclic type preferably has a cycloalkyl structure having 3 to 10 carbon atoms, and examples thereof can include a cyclopropane structure, a cyclobutane structure, a cyclopentane structure, a cyclohexane structure, a cycloheptane structure, and a cyclooctane structure. The polycyclic type preferably has a cycloalkyl structure having 6 to 20 carbon atoms, and examples thereof can include an adamantane structure, a norbornane structure, a dicyclopentane structure, a tricyclodecane structure, and a tetracyclododecane structure. Moreover, some of the carbon atoms in a cycloalkyl structure may be substituted with a heteroatom such as an oxygen atom.

Each of the groups described above represented by $R_{36}$ to $R_{39}$, $R_{01}$, $R_{02}$, and Ar may have a substituent, and examples of the substituent can include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, and nitro group, and the substituent preferably has 8 or more carbon atoms.

$Y_2$ which is a group leaving due to the action of an acid more preferably has the structure represented by the following General Formula (VI-A).

(VI-A)

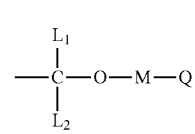

Here, each of $L_1$ and $L_2$ independently represents a hydrogen atom, an alkyl group, a cycloalkyl group, an aryl group, or a group obtained by combining an alkylene group and an aryl group.

M represents a single bond or a divalent connecting group.

Q represents an alkyl group, a cycloalkyl group which may include a heteroatom, an aryl group which may include a heteroatom, an amino group, an ammonium group, a mercapto group, a cyano group, or an aldehyde group.

At least two of Q, M, and $L_1$ may be bonded to each other to form a ring (preferably, 5- or 6-membered ring).

The alkyl group represented by $L_1$ or $L_2$ is, for example, an alkyl group having 1 to 8 carbon atoms, and specifically, preferable examples thereof can include a methyl group, an ethyl group, a propyl group, an n-butyl group, a sec-butyl group, a hexyl group, and an octyl group.

The cycloalkyl group represented by $L_1$ or $L_2$ is, for example, a cycloalkyl group having 3 to 15 carbon atoms, and specifically, preferable examples thereof can include a cyclopentyl group, a cyclohexyl group, a norbornyl group, and an adamantyl group.

The aryl group represented by $L_1$ or $L_2$ is, for example, an aryl group having 6 to 15 carbon atoms, and specifically, preferable examples thereof can include a phenyl group, a tolyl group, a naphthyl group, and anthryl group.

A group obtained by combining an alkylene group and an aryl group represented by $L_1$ or $L_2$ has, for example, 6 to 20 carbon atoms, and examples thereof include aralkyl groups such as a benzyl group and a phenethyl group.

Examples of the divalent connecting group represented by M include alkylene groups (for example, a methylene group, an ethylene group, a propylene group, a butylene group, a hexylene group, and an octylene group), cycloalkylene groups (for example, a cyclopentylene group, a cyclohexylene group, and adamantylene group), alkenylene groups (for example, an ethenylene group, a propenylene group, and a butenylene group), divalent aromatic ring groups (for example, a phenylene group, a tolylene group, and a naphthylene group), —S—, —O—, —CO—, $—SO_2—$, $—N(R_0)—$, and divalent connecting groups obtained by combining a plurality of these. $R_0$ is a hydrogen atom or an alkyl group (which is, for example, an alkyl group having 1 to 8 carbon atoms, and specifically, a methyl group, an ethyl group, a propyl group, an n-butyl group, a sec-butyl group, a hexyl group, or an octyl group).

The alkyl group represented by Q is the same as each group represented by $L_1$ or $L_2$ described above.

In the cycloalkyl group which may include a heteroatom and the aryl group which may include a heteroatom, represented by Q, examples of a cycloalkyl group which does not include a heteroatom and an aryl group which does not include a heteroatom include the cycloalkyl group and the aryl group represented by $L_1$ or $L_2$ described above, and each of the cycloalkyl group and the aryl group preferably has 3 to 15 carbon atoms.

Examples the cycloalkyl group including a heteroatom and the aryl group including a heteroatom include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole, or pyrrolidone, and the cycloalkyl group and the aryl group are not limited thereto as long as, in general, the groups have a structure (a ring formed by carbon and a heteroatom or a ring formed by heteroatoms) called a hetero ring.

As a ring formed by bonding of at least two of Q, M, and $L_1$ to each other, a case where at least two of Q, M, and $L_1$ are bonded to each other to form, for example, a propylene group or a butylene group, and as a result, a 5- or 6-membered ring containing an oxygen atom is formed is exemplified.

Each of the groups represented by $L_1$, $L_2$, M, and Q in General Formula (VI-A) may have a substituent, and examples thereof include a substituent described as a substituent which each of $R_{36}$ to $R_{39}$, $R_{01}$, $R_{02}$, and Ar described above may have, and the substituent preferably has 8 or less carbon atoms.

The group represented by -M-Q is preferably a group which is configured of 1 to 30 carbon atoms.

The repeating unit represented by General Formula (VI) is preferably the repeating unit represented by the following General Formula (3).

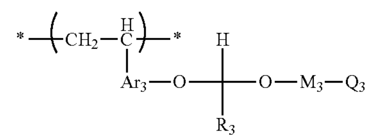

(3)

In General Formula (3), $Ar_3$ represents an aromatic ring group.

$R_3$ represents an alkyl group, a cycloalkyl group, an aryl group, an aralkyl group, an alkoxy group, an acyl group, or a heterocyclic group.

$M_3$ represents a single bond or a divalent connecting group.

$Q_3$ represents an alkyl group, a cycloalkyl group, an aryl group, or a heterocyclic group.

At least two of $Q_3$, $M_3$, and $R_3$ may be bonded to each other to form a ring.

The aromatic ring group represented by $Ar_3$ is the same as $Ar_6$ in General Formula (VI) in a case where n in General Formula (VI) is 1, and more preferably a phenylene group or a naphthylene group, and still more preferably a phenylene group.

$Ar_3$ may have a substituent, and examples of substituents which $Ar_3$ can have include the same substituents as substituents which $Ar_6$ in General Formula (VI) can have.

The alkyl group or the cycloalkyl group represented by $R_3$ has the same meaning as the alkyl group or the cycloalkyl group represented by each of $R_{36}$ to $R_{39}$, $R_{01}$, and $R_{02}$ described above.

The aryl group represented by $R_3$ has the same meaning as the aryl group represented by each of $R_{36}$ to $R_{39}$, $R_{01}$, and $R_{02}$ described above, and the preferable range thereof is also the same.

The aralkyl group represented by $R_3$ is preferably an aralkyl group having 7 to 12 carbon atoms, and examples thereof can include a benzyl group, a phenethyl group, and naphthylmethyl group.

The alkyl group portion in the alkoxy group represented by $R_3$ is the same as the alkyl group represented by each of $R_{36}$ to $R_{39}$, $R_{01}$, and $R_{02}$ described above, and the preferable range thereof is also the same.

Examples of the acyl group represented by $R_3$ include an aliphatic acyl group having 1 to 10 carbon atoms such as a formyl group, an acetyl group, a propionyl group, a butyryl group, an isobutyryl group, a valeryl group, a pivaloyl group, a benzoyl group, or a naphthoyl group, and the acyl group is preferably an acetyl group or a benzoyl group.

Examples of the heterocyclic group represented by $R_3$ include the cycloalkyl group including a heteroatom and the aryl group including a heteroatom, described above, and the heterocyclic group is preferably a pyridine ring group or a pyran ring group.

$R_3$ is preferably a linear or branched alkyl group (specifically, a methyl group, an ethyl group, a propyl group, an i-propyl group, an n-butyl group, a sec-butyl group, a tert-butyl group, a neopentyl group, a hexyl group, a 2-ethylhexyl group, or an octyl group) having 1 to 8 carbon atoms, a cycloalkyl group (specifically, a cyclopentyl group, a cyclohexyl group, a norbornyl group, or an adamantyl group) having 3 to 15 carbon atoms, or a group having 2 or more carbon atoms. $R_3$ is more preferably an ethyl group, an i-propyl group, a sec-butyl group, a tert-butyl group, a neopentyl group, a cyclohexyl group, an adamantyl group, a cyclohexyl methyl group, or an adamantane methyl group, and still more preferably a tert-butyl group, a sec-butyl group, a neopentyl group, a cyclohexyl methyl group, or an adamantane methyl group.

The abobe-described alkyl group, cycloalkyl group, aryl group, aralkyl group, alkoxy group, acyl group, and heterocyclic group may further have a substituent, and examples of substituents which the alkyl group, the cycloalkyl group, the aryl group, the aralkyl group, the alkoxy group, the acyl group, and the heterocyclic group can have include a substituent described as a substituent which each of $R_{36}$ to $R_{39}$, $R_{01}$, $R_{02}$, and Ar described above may have.

The divalent connecting group represented by $M_3$ has the same meaning as M in the structure represented by General Formula (VI-A), and the preferable range thereof is also the same. $M_3$ may have a substituent, and examples of substituents which $M_3$ can have include the same substituents as substituents which M in the group represented by General Formula (VI-A) can have.

The alkyl group, the cycloalkyl group, and the aryl group represented by $Q_3$ have the same meaning as those represented by Q in the structure represented by General Formula (VI-A), and the preferable ranges thereof are also the same.

Examples of the heterocyclic group represented by $Q_3$ include the cycloalkyl group including a heteroatom and the aryl group including a heteroatom, represented by Q in the structure represented by General Formula (VI-A), and the preferable ranges thereof are also the same.

$Q_3$ may have a substituent, and examples of substituents which $Q_3$ can have include the same substituents as substituents which Q in the group represented by General Formula (VI-A) can have.

A ring formed by bonding of at least two of $Q_3$, $M_3$, and $R_3$ to each other has the same meaning as a ring formed by bonding of at least two of Q, M, and $L_1$ to each other in General Formula (VI-A), and the preferable range thereof is also the same.

$R_3$ in General Formula (3) is more preferably a group represented by the following General Formula (3-2).

(3-2)

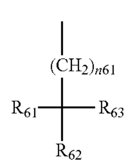

In General Formula (3-2), each of $R_{61}$, $R_{62}$, and $R_{63}$ independently represents an alkyl group, an alkenyl group, a cycloalkyl group or an aryl group. n61 represents 0 or 1.

At least two of $R_{61}$ to $R_{63}$ may be connected to each other to form a ring.

The alkyl group represented by each of $R_{61}$ to $R_{63}$ may be linear or branched, and is preferably an alkyl group having 1 to 8 carbon atoms.

The alkenyl group represented by each of $R_{61}$ to $R_{63}$ may be linear or branched, and is preferably an alkenyl group having 1 to 8 carbon atoms.

The cycloalkyl group represented by each of $R_{61}$ to $R_{63}$ has the same meaning as the cycloalkyl group represented by each of $R_{36}$ to $R_{39}$, $R_{01}$, and $R_{02}$ described above.

The aryl group represented by each of $R_{61}$ to $R_{63}$ has the same meaning as the aryl group represented by each of $R_{36}$ to $R_{39}$, $R_{01}$, and $R_{02}$ described above, and the preferable range thereof is also the same.

Each of $R_{61}$ to $R_{63}$ is preferably an alkyl group, and more preferably a methyl group.

A ring which at least two of $R_{61}$ to $R_{63}$ can form is preferably a cyclopentyl group, a cyclohexyl group, a norbornyl group, or an adamantyl group.

As preferable specific examples of the repeating unit (a), specific examples of the repeating unit represented by General Formula (VI) will be described below, but the present invention is not limited thereto.

(VI-1)

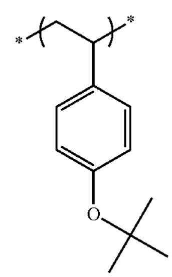

(VI-2)

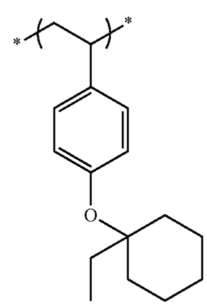

(VI-3)

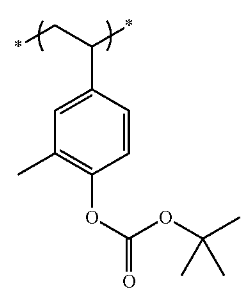

-continued
(VI-4)
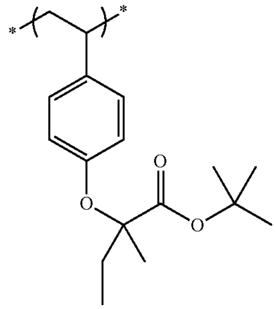
(VI-5)
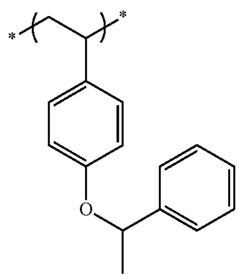
(VI-6)
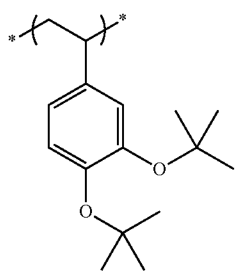
(VI-7)
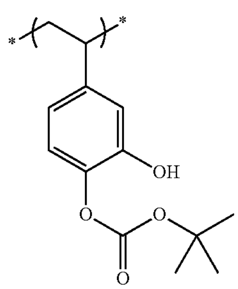
(VI-8)
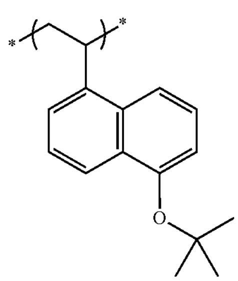
-continued
(VI-9)
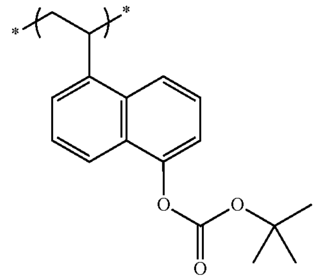
(VI-10)
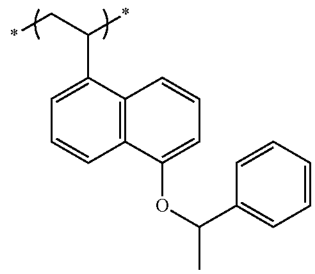
(VI-11)
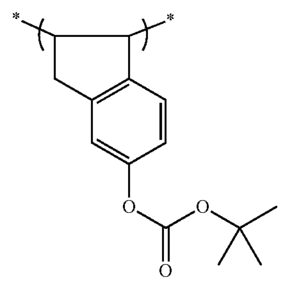
(VI-12)
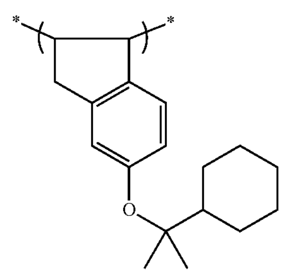
(VI-13)
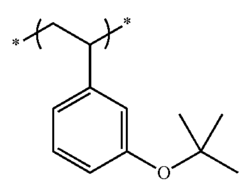
(VI-14)
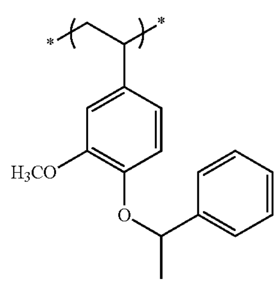

-continued
(VI-15)
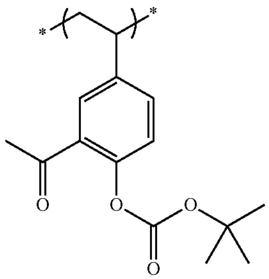
(VI-16)
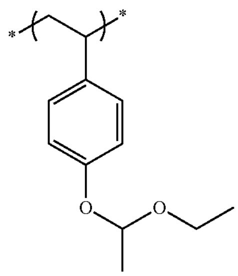
(VI-17)
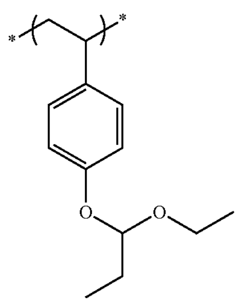
(VI-18)
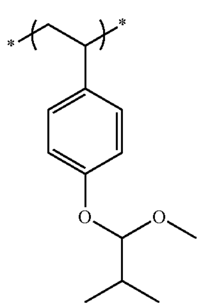
(VI-19)
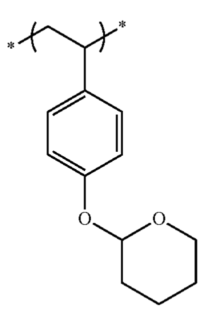
-continued
(VI-20)
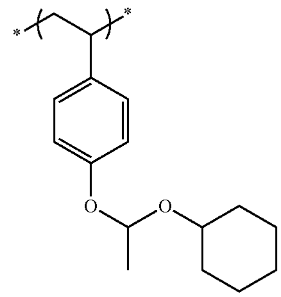
(VI-21)
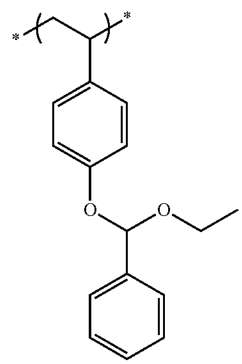
(VI-22)
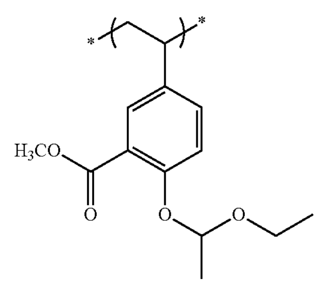
(VI-23)
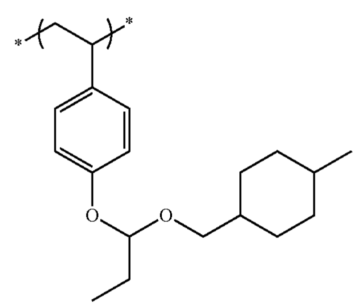
(VI-24)
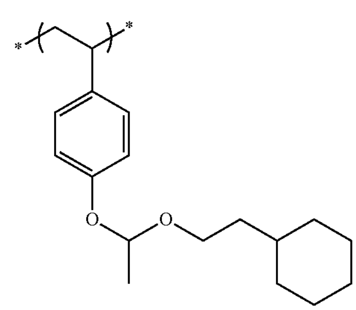

-continued
(VI-25)
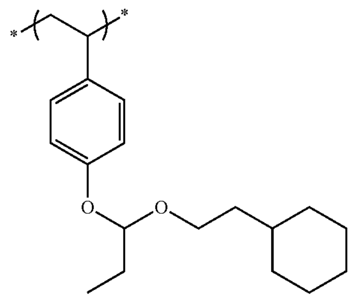
(VI-26)
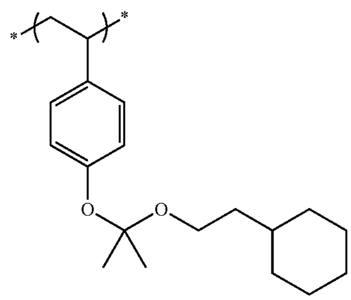
(VI-27)
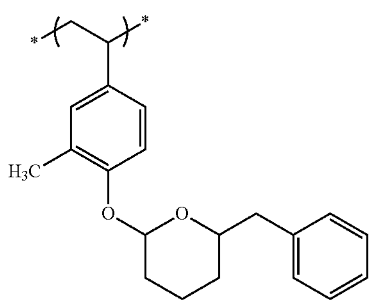
(VI-28)
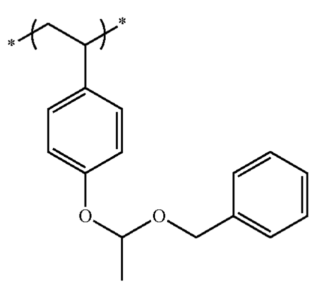
(VI-29)
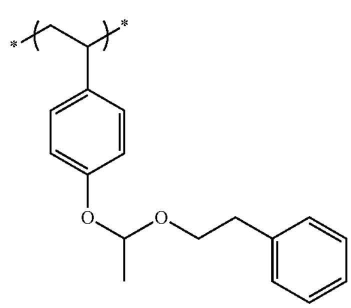
-continued
(VI-30)
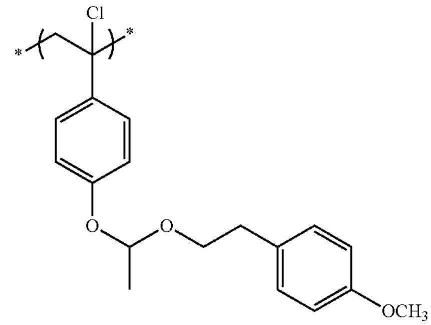
(VI-31)
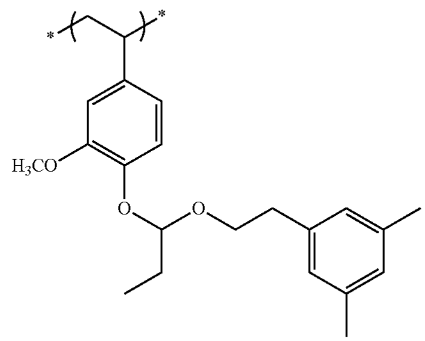
(VI-32)
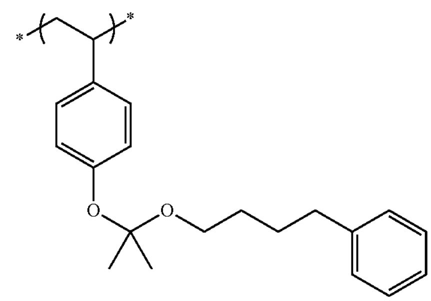
(VI-33)
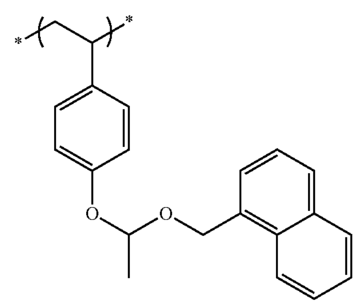
(VI-34)
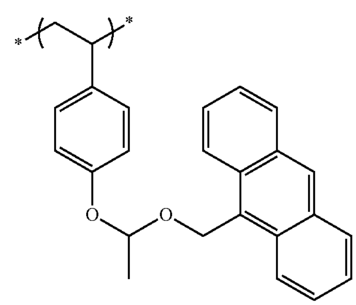

-continued
(VI-35)
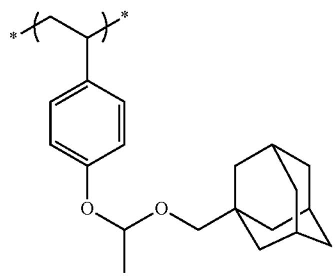
(VI-36)
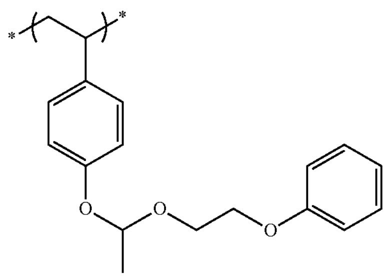
(VI-37)
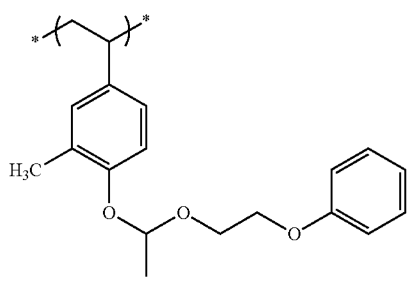
(VI-38)
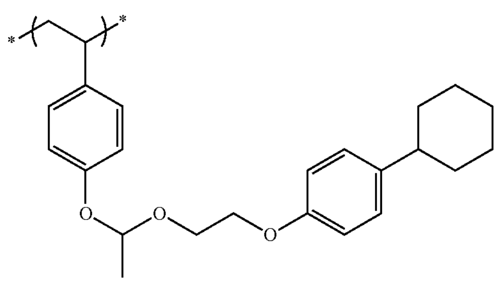
(VI-39)
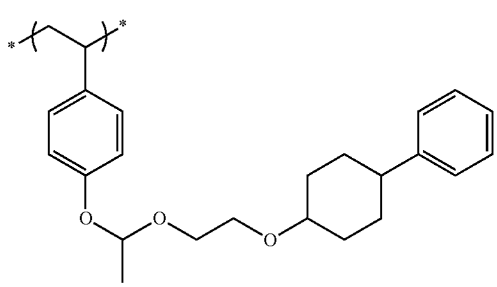
-continued
(VI-40)
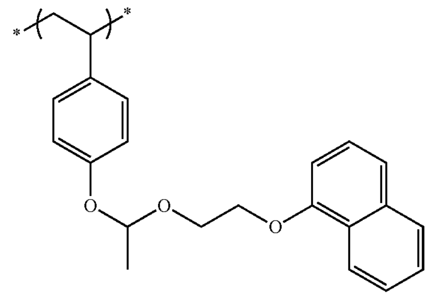
(VI-41)
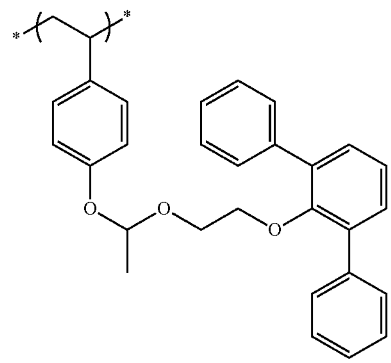
(VI-42)
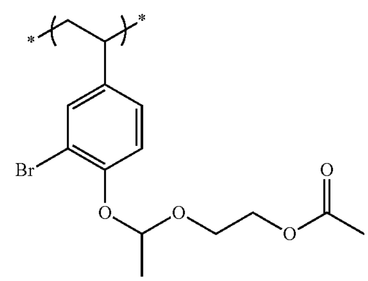
(VI-43)
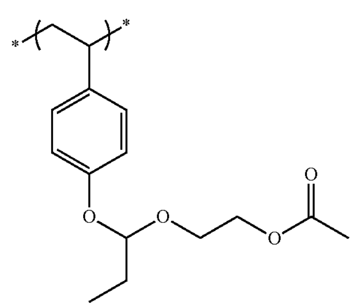
(VI-44)
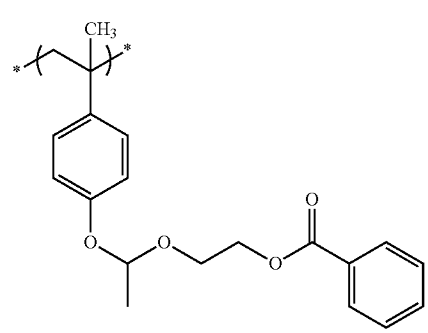

-continued
(VI-45)
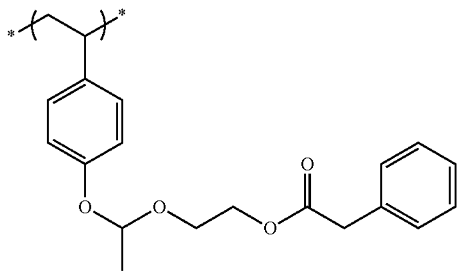
(VI-46)
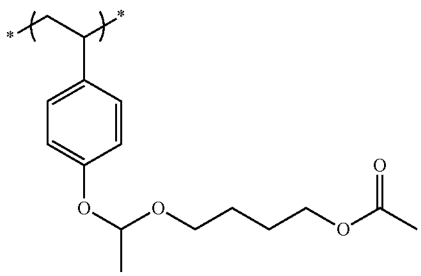
(VI-47)
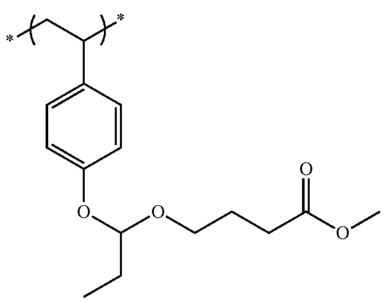
(VI-48)
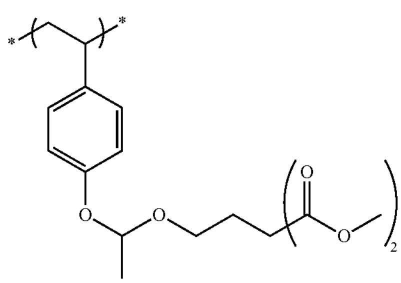
(VI-49)
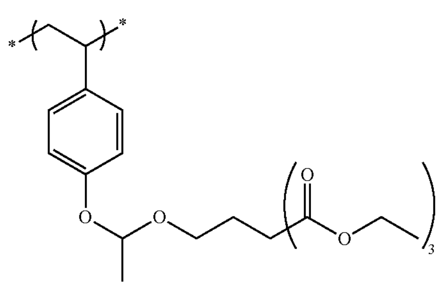
-continued
(VI-50)
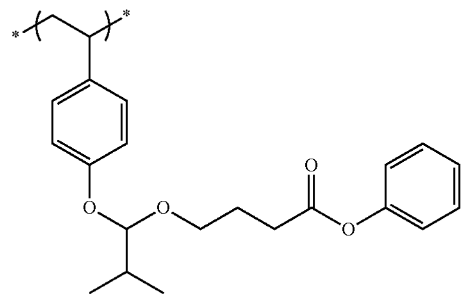
(VI-51)
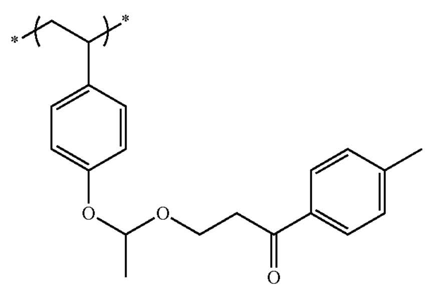
(VI-52)
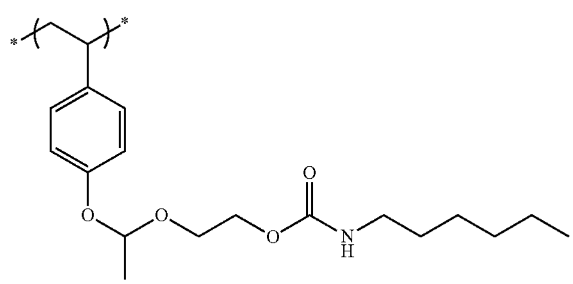
(VI-53)
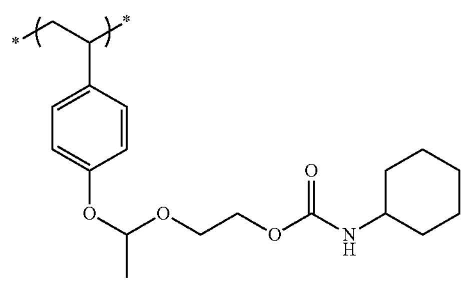
(VI-54)
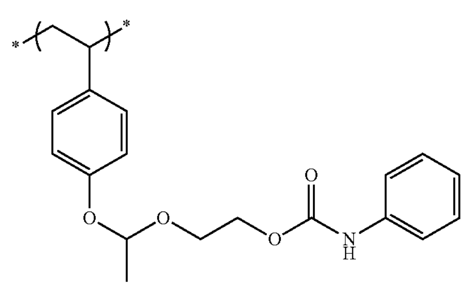

-continued
(VI-55)
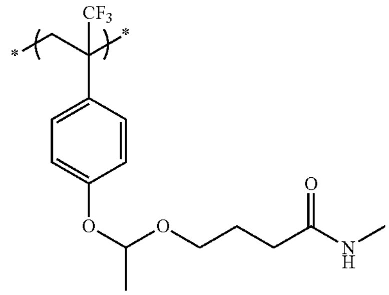
(VI-56)
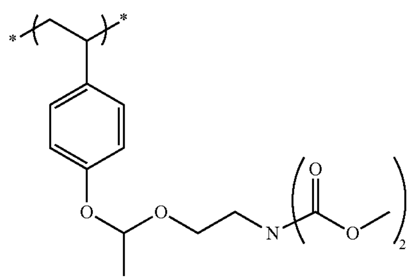
(VI-57)
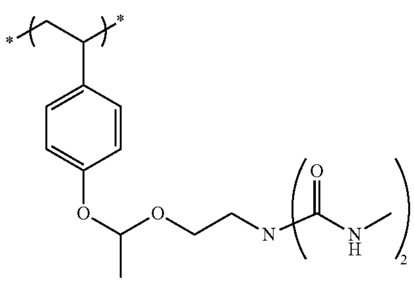
(VI-58)
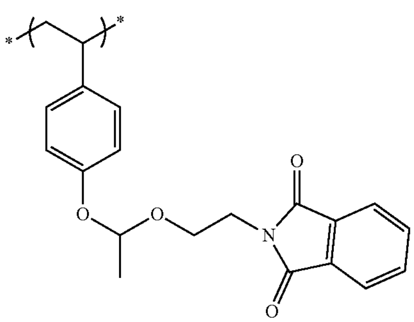
(VI-59)
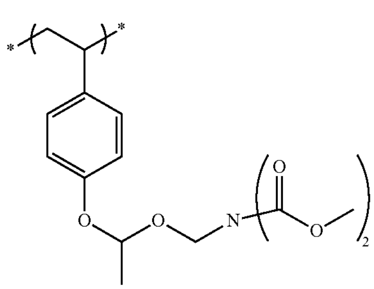
-continued
(VI-60)
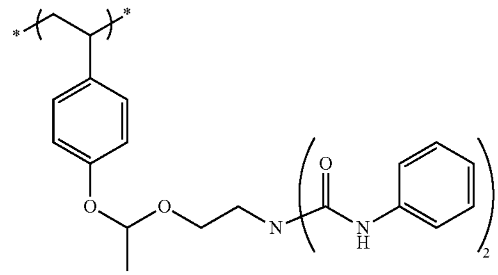
(VI-61)
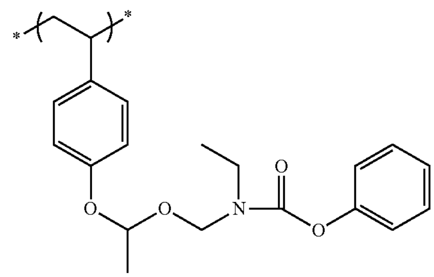
(VI-62)
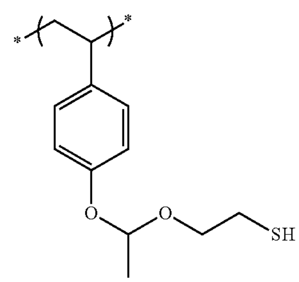
(VI-63)
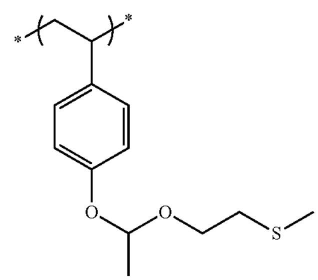
(VI-64)
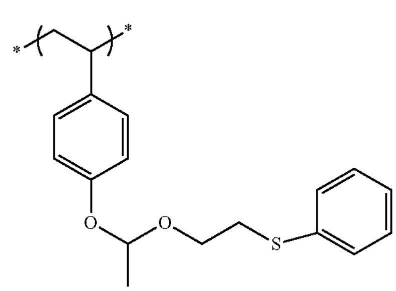

-continued
(VI-65)
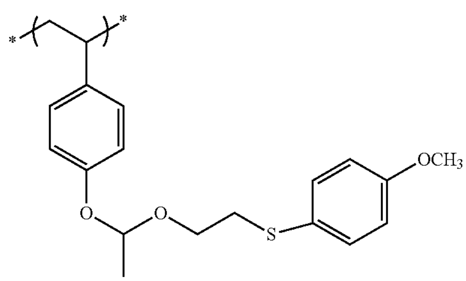
(VI-66)
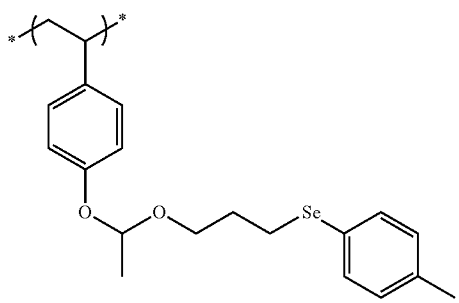
(VI-67)
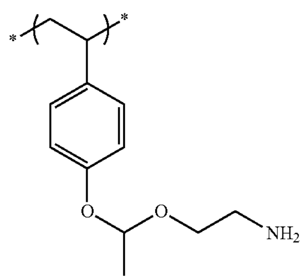
(VI-68)
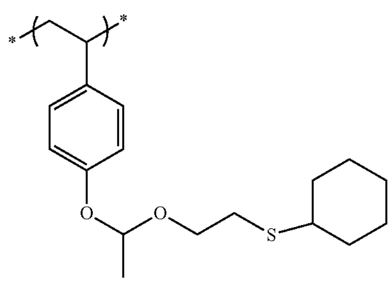
(VI-69)
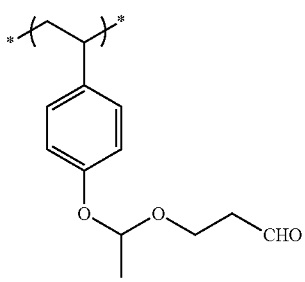
-continued
(VI-70)
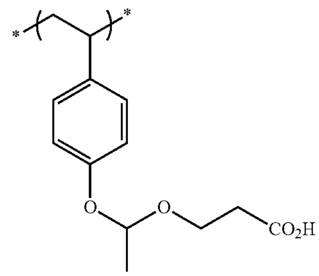
(VI-71)
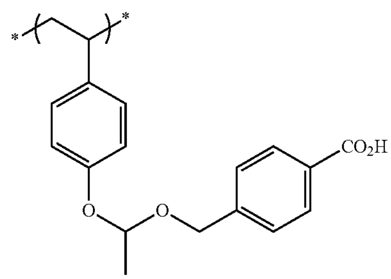
(VI-72)
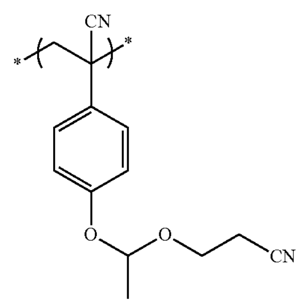
(VI-73)
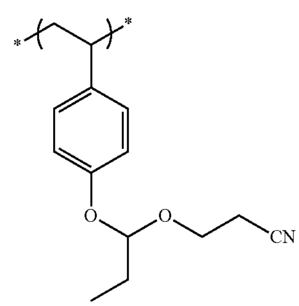
(VI-74)
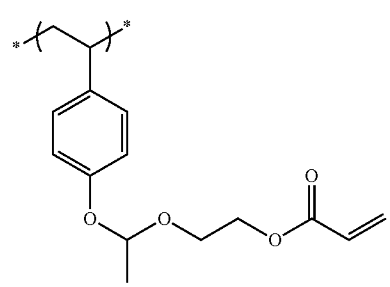

-continued
(VI-75)
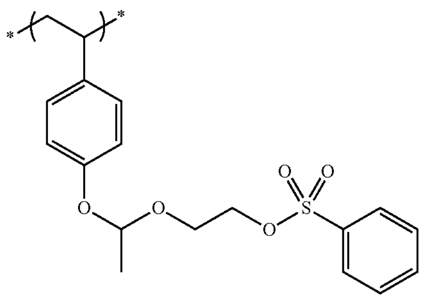
(VI-76)
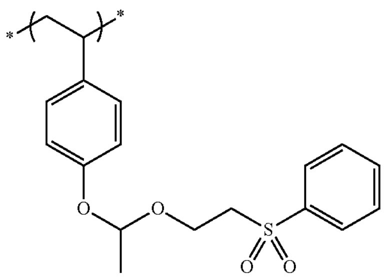
(VI-77)
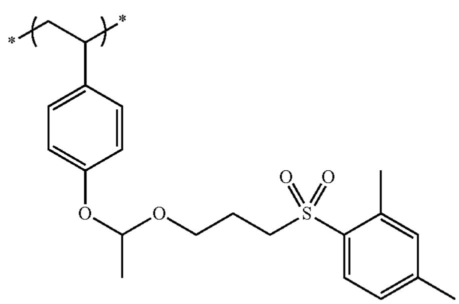
(VI-78)
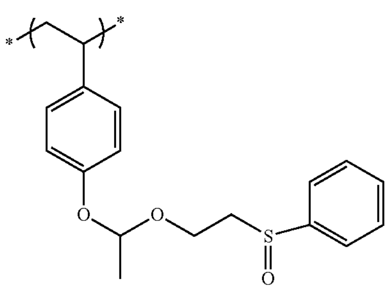
(VI-79)
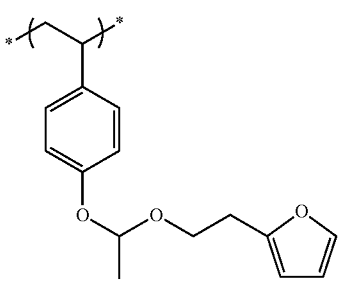
-continued
(VI-80)
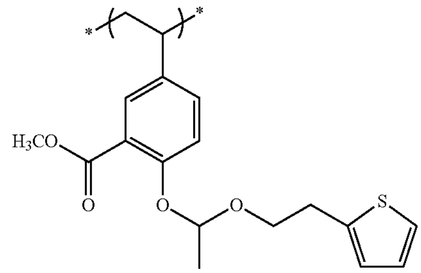
(VI-81)
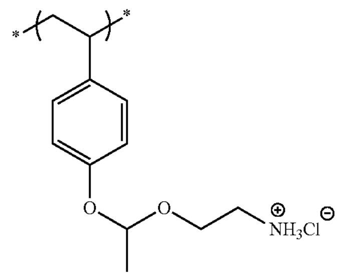
(VI-82)
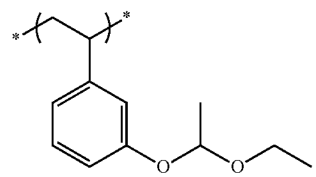
(VI-83)
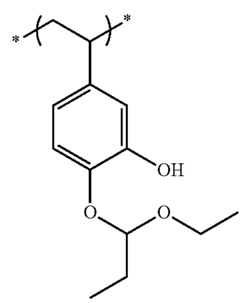
(VI-84)
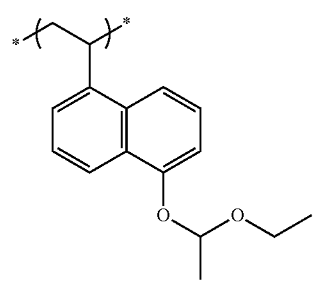
(VI-85)
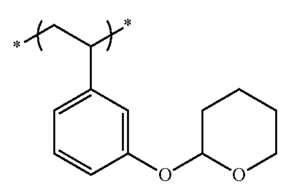

-continued
(VI-86)
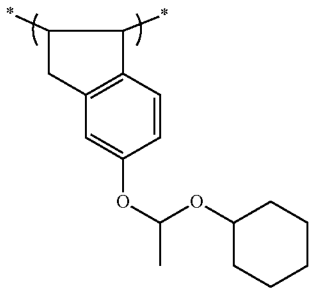
(VI-87)
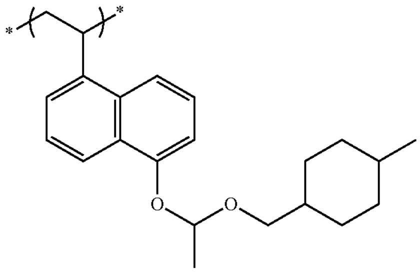
(VI-88)
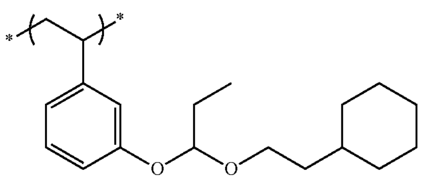
(VI-89)
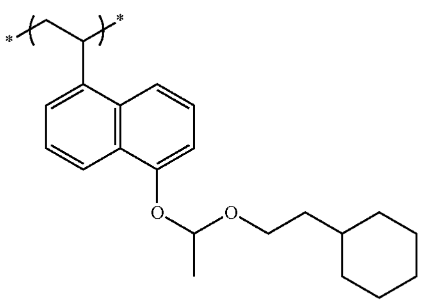
(VI-90)
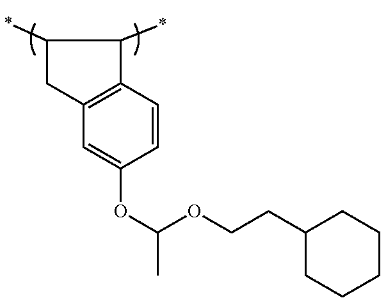
(VI-91)
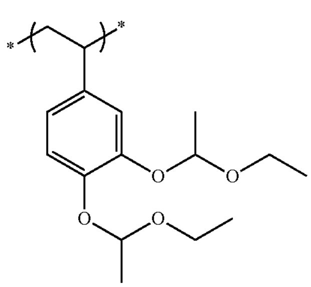
-continued
(VI-92)
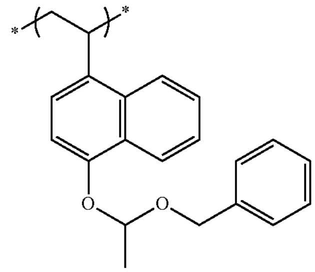
(VI-93)
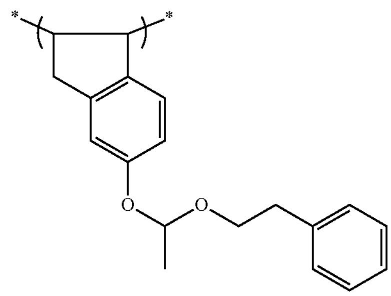
(VI-94)
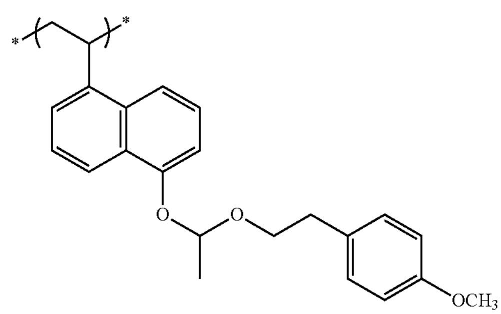
(VI-95)
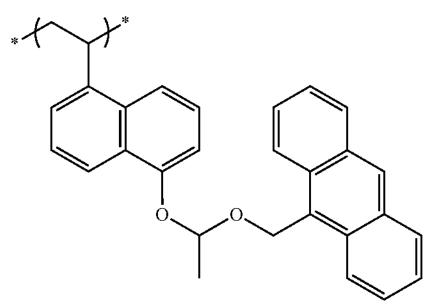
(VI-96)
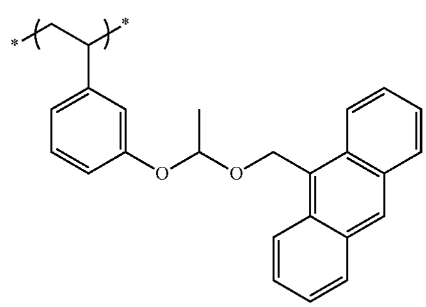

-continued
(VI-97)
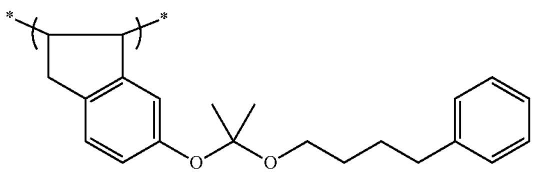
(VI-98)
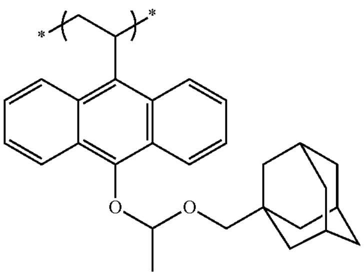
(VI-99)
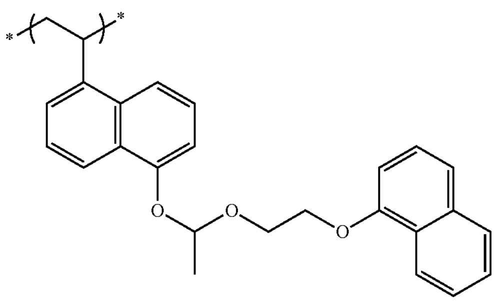
(VI-100)
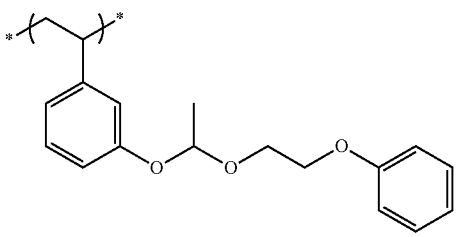
(VI-101)
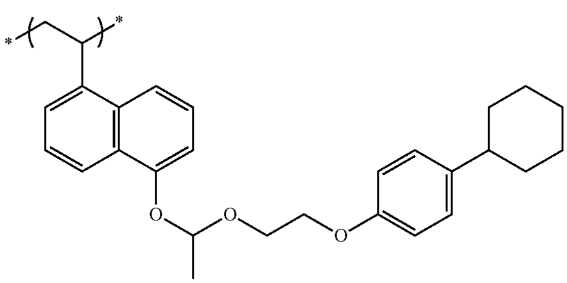
(VI-102)
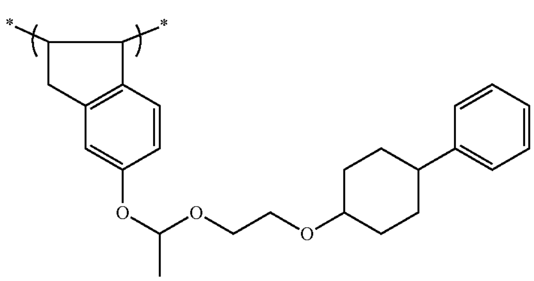
-continued
(VI-103)
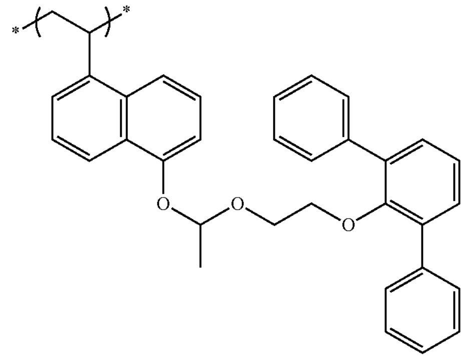
(VI-104)
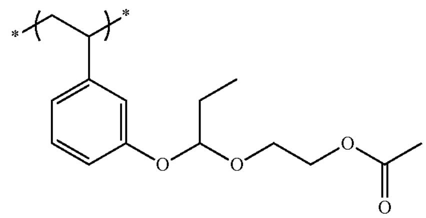
(VI-105)
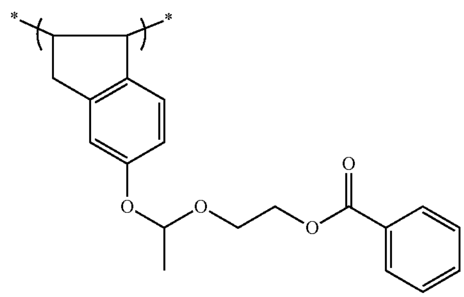
(VI-106)
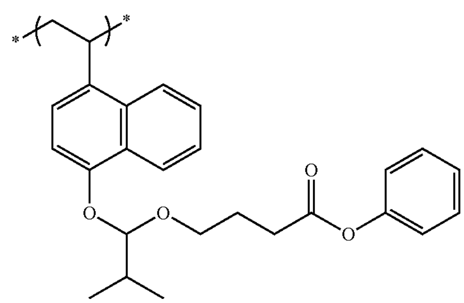
(VI-107)
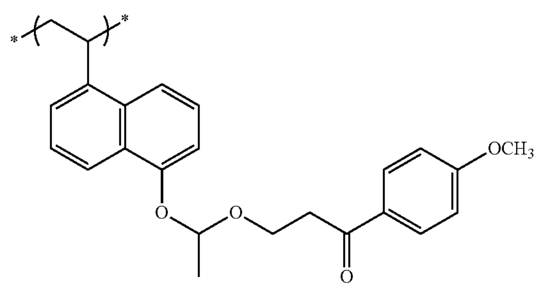

-continued
(VI-108)
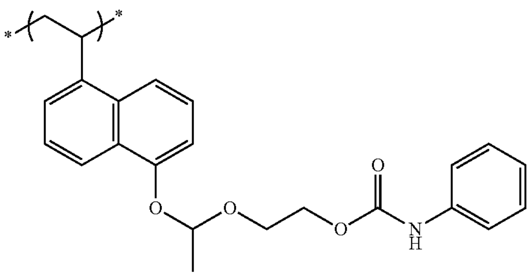
(VI-109)
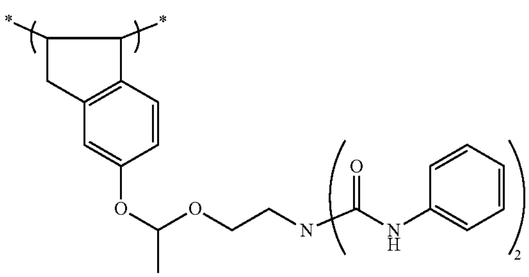
(VI-110)
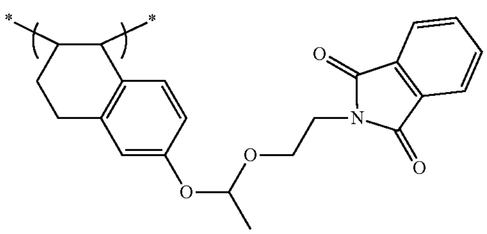
(VI-111)
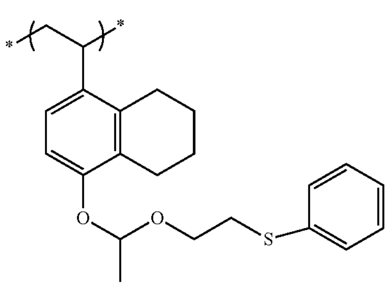
(VI-112)
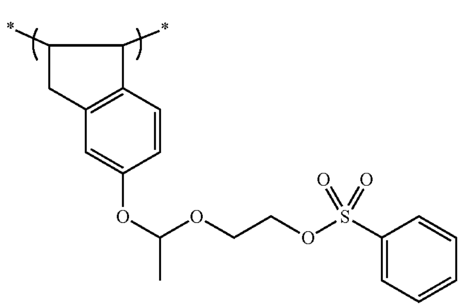
-continued
(VI-113)
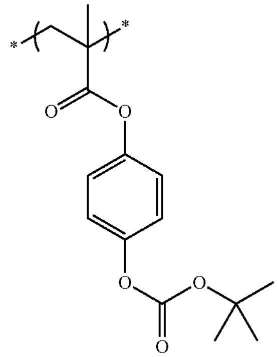
(VI-114)
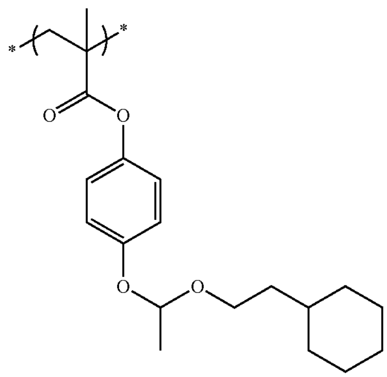
(VI-115)
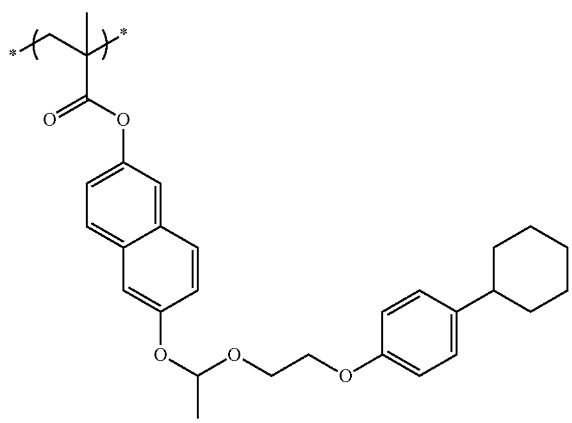
(VI-116)
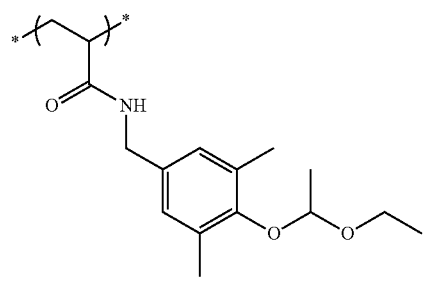

-continued
(VI-117)
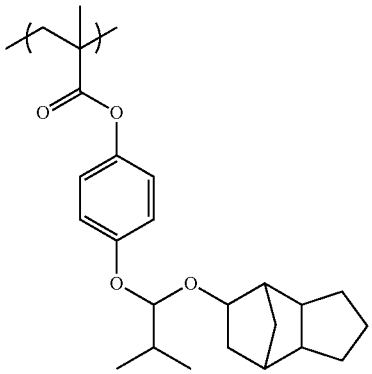
(VI-118)
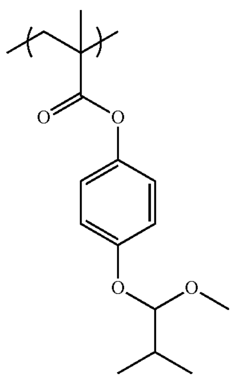
(VI-119)
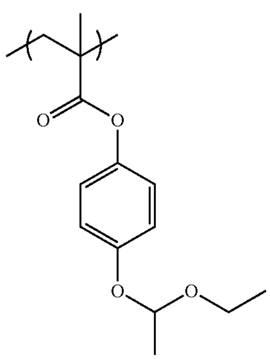
(VI-120)
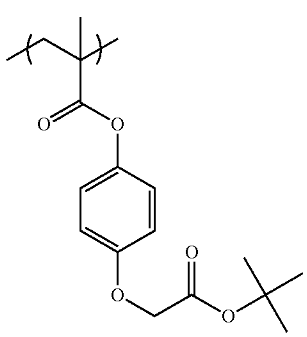
-continued
(VI-121)
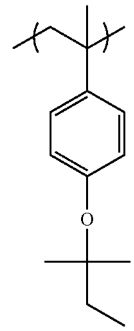
(VI-122)
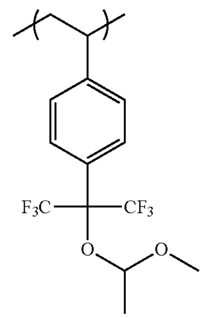
(VI-123)
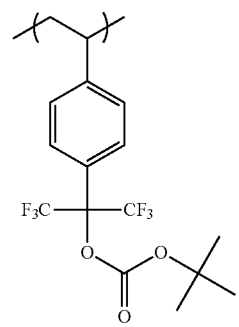
(VI-124)
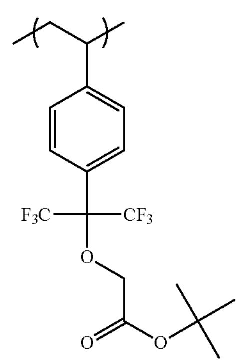

-continued
(VI-125)
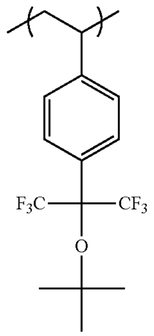
(VI-126)
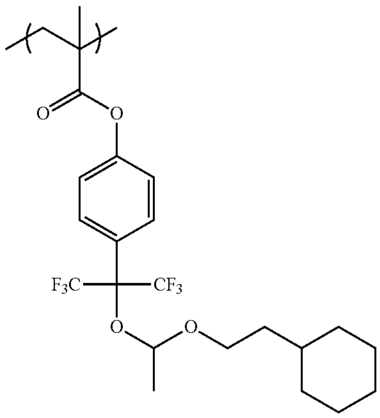
(VI-127)
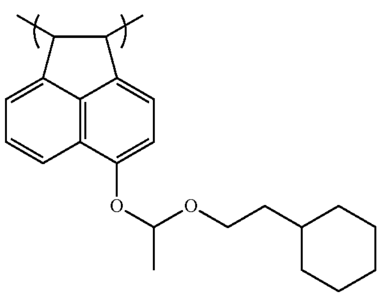
(VI-128)
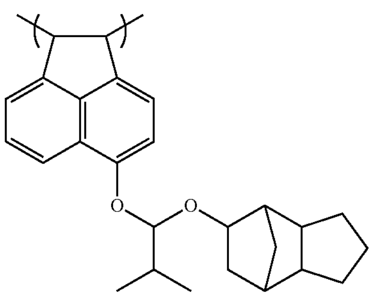
(VI-129)
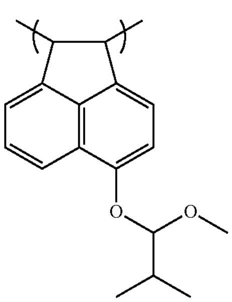
-continued
(VI-130)
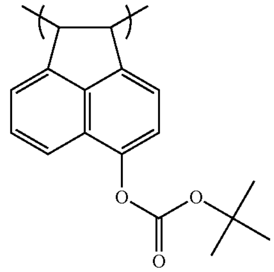
(VI-131)
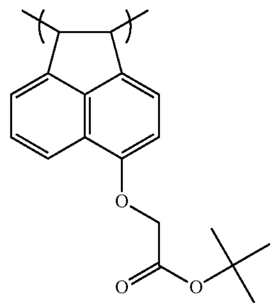
(VI-132)
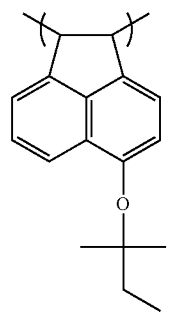
(VI-133)
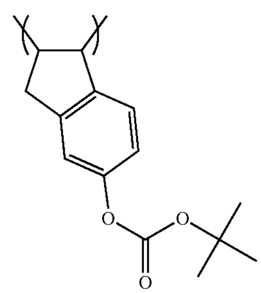
(VI-134)
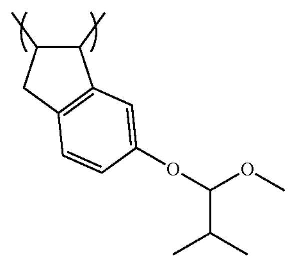

(VI-135)
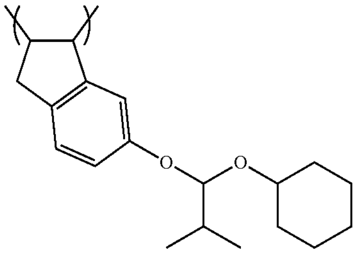
(VI-136)
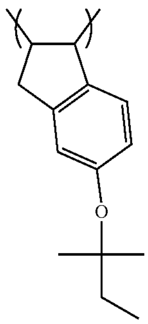
(VI-137)
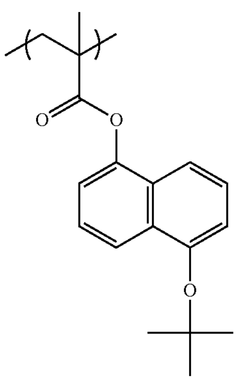
(VI-138)
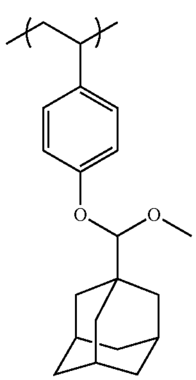
(VI-139)
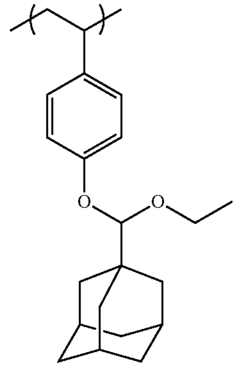
(VI-140)
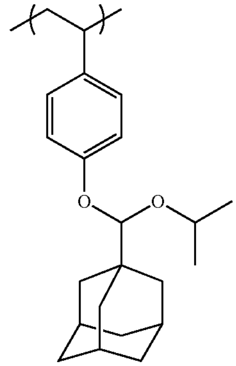
(VI-141)
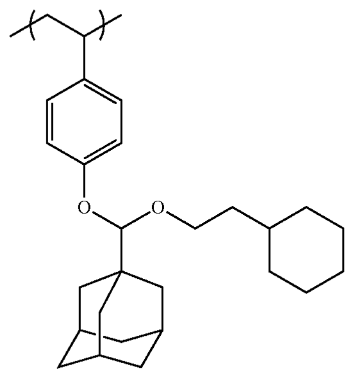
(VI-142)
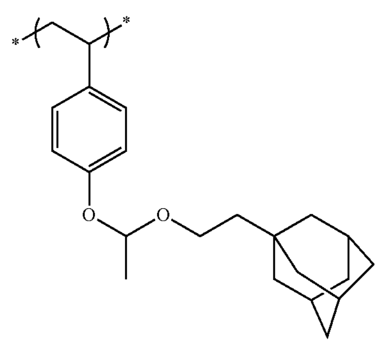

-continued
(VI-143)
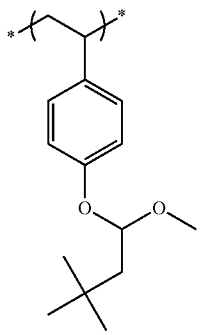
(VI-144)
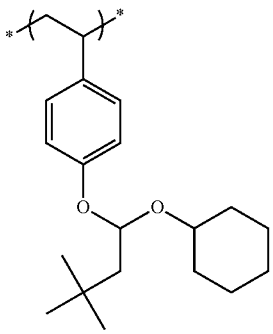
(VI-145)
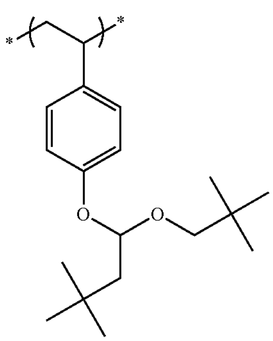
(VI-146)
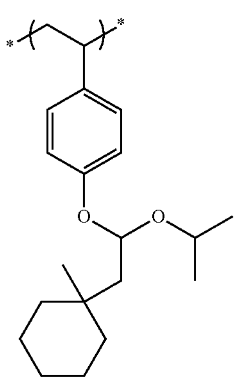
-continued
(VI-147)
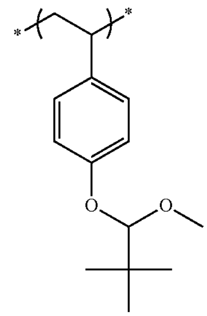
(VI-148)
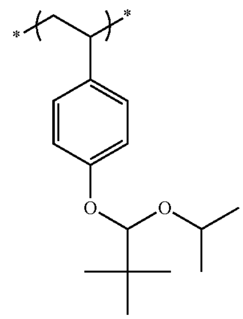
(VI-149)
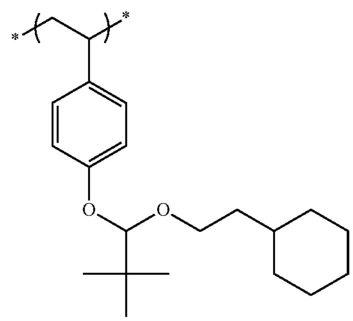
(VI-150)
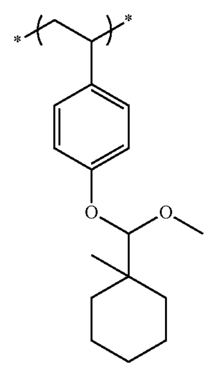
(VI-151)
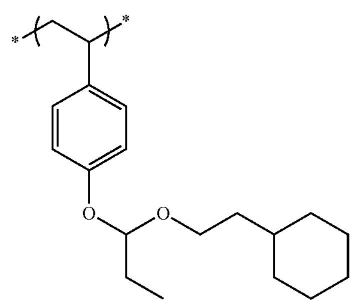

-continued (VI-152)

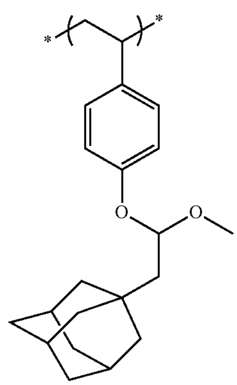

The resin (A) may further have another repeating unit (a) having an acid-decomposable group which is decomposed due to the action of an acid. As the repeating unit (a) having an acid-decomposable group, the repeating unit represented by the following General Formula (V) is preferable.

(V)

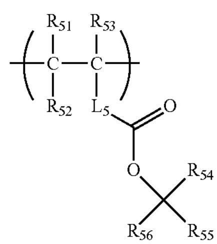

In General Formula (V), each of $R_{51}$, $R_{52}$, and $R_{53}$ independently represents a hydrogen atom, an alkyl group, a cycloalkyl group, a halogen atom, a cyano group, or an alkoxycarbonyl group.

$R_{52}$ may be bonded to $L_5$ to form a ring, and $R_{52}$ in this case represents an alkylene group.

$L_5$ represents a single bond or a divalent connecting group, and in the case of forming a ring with $R_{52}$, represents a trivalent connecting group.

$R_{54}$ represents an alkyl group, and each of $R_{55}$ and $R_{56}$ independently represents a hydrogen atom, an alkyl group, a cycloalkyl group, an aryl group, or an aralkyl group. $R_{55}$ and $R_{56}$ may be bonded to each other to form a ring. However, $R_{55}$ and $R_{56}$ do not represent a hydrogen atom at the same time in any case.

General Formula (V) will be described in more detail.

Preferable examples of the alkyl group represented by each of $R_{51}$ to $R_{53}$ in General Formula (V) include an alkyl group having 20 or less carbon atoms such as a methyl group, an ethyl group, a propyl group, an isopropyl group, an n-butyl group, a sec-butyl group, a hexyl group, a 2-ethylhexyl group, an octyl group, or a dodecyl group, which may have a substituent, and an alkyl group having 8 or less carbon atoms is more preferable, and an alkyl group having 3 or less carbon atoms is particularly preferable.

The alkyl group included in an alkoxycarbonyl group is preferably the same alkyl group as that represented by each of $R_{51}$ to $R_{53}$ described above.

The cycloalkyl group may be monocyclic or polycyclic. Preferable examples include a monocyclic cycloalkyl group having 3 to 10 carbon atoms, such as a cyclopropyl group, a cyclopentyl group, or a cyclohexyl group, which may have a substituent.

Examples of the halogen atom include a fluorine atom, a chlorine atom, a bromine atom and an iodine atom, and a fluorine atom is particularly preferable.

Examples of the preferable substituent in each group described above can include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, and nitro group, and the substituent preferably has 8 or less carbon atoms.

In a case where $R_{52}$ represents an alkylene group and forms a ring together with $L_5$, preferable examples of the alkylene group include alkylene groups having 1 to 8 carbon atoms such as a methylene group, an ethylene group, a propylene group, a butylene group, a hexylene group, and an octylene group. The alkylene more preferably has 1 to 4 carbon atoms, and particularly preferably has 1 or 2 carbon atoms. A ring formed by bonding of $R_{52}$ and $L_5$ is particularly preferably 5- or 6-membered ring.

As $R_{51}$ and $R_{53}$ in Formula (V), a hydrogen atom, an alkyl group, or a halogen atom is more preferable, and a hydrogen atom, a methyl group, an ethyl group, a trifluoromethyl group (—$CF_3$), a hydroxymethyl group (—$CH_2$—OH), a chloromethyl group (—$CH_2$—Cl), or a fluorine atom (—F) is particularly preferable. As $R_{52}$, a hydrogen atom, an alkyl group, a halogen atom, or an alkylene group (which forms a ring together with $L_5$) is more preferable, and a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F), a methylene group (which forms a ring together with $L_5$), or an ethylene group (which forms a ring together with $L_5$) is particularly preferable.

Examples of the divalent connecting group represented by $L_5$ include an alkylene group, a divalent aromatic ring group, —COO-$L_1$-, —O-$L_1$-, and a group formed by combining two or more thereof. Here, $L_1$ represents an alkylene group, a cycloalkylene group, a divalent aromatic ring group, a group obtained by combining an alkylene group and a divalent aromatic ring group.

$L_5$ is preferably a single bond, a group represented by —COO-$L_1$-, or a divalent aromatic ring group. $L_1$ is preferably an alkylene group having 1 to 5 carbon atoms, and more preferably a methylene group or a propylene group. As the divalent aromatic ring group, a 1,4-phenylene group, a 1,3-phenylene group, a 1,2-phenylene group, or a 1,4-naphthylene group is preferable, and a 1,4-phenylene group is more preferable.

In a case where $L_5$ forms a ring by bonding to $R_{52}$, suitable examples of the trivalent connecting group represented by $L_5$ can include a group obtained by excluding one arbitrary hydrogen atom from a specific example described above of the divalent connecting group represented by $L_5$.

The alkyl group represented by each of $R_{54}$ to $R_{56}$ is preferably an alkyl group having 1 to 20 carbon atoms, more preferably an alkyl group having 1 to 10 carbon atoms, and particularly preferably an alkyl group having 1 to 4 carbon atoms such as a methyl group, an ethyl group, an n-propyl group, an isopropyl group, an n-butyl group, an isobutyl group, or a t-butyl group.

The cycloalkyl group represented by $R_{55}$ or $R_{56}$ is preferably a cycloalkyl group having 3 to 20 carbon atoms, may be a cycloalkyl group which is monocyclic, such as a cyclopentyl group or a cyclohexyl group, and may be a cycloalkyl group which is polycyclic, such as a norbornyl group, an adamantyl group, a tetratricyclodecanyl group, or a tetracyclododecanyl group.

A ring formed by bonding of $R_{55}$ and $R_{56}$ to each other is preferably a ring having 3 to 20 carbon atoms, may be a monocyclic ring such as a cyclopentyl group or a cyclohexyl group, and may be a polycyclic ring such as a norbornyl group, an adamantyl group, a tetracyclodecanyl group, or a tetracyclododecanyl group. In a case where $R_{55}$ and $R_{56}$ are bonded to each other to form a ring, $R_{54}$ is preferably an alkyl group having 1 to 3 carbon atoms, and a methyl group or an ethyl group is more preferable.

The aryl group represented by $R_{55}$ or $R_{56}$ preferably has 6 to 20 carbon atoms, and may be monocyclic or polycyclic, or may have a substituent. Examples thereof include a phenyl group, a 1-naphthyl group, a 2-naphthyl group, a 4-methylphenyl group, and a 4-methoxyphenyl group. In a case where any one of $R_{55}$ and $R_{56}$ is a hydrogen atom, the other is preferably an aryl group.

The aralkyl group represented by $R_{55}$ or $R_{56}$ may be monocyclic or polycyclic, or may have a substituent. The aralkyl group preferably has 7 to 21 carbon atoms, and examples thereof include a benzyl group and a 1-naphthylmethyl group.

As the synthetic method of a monomer corresponding to the repeating unit represented by General Formula (V), a general synthetic method of a polymerizable group-containing ester can be applied, but the method is not be particularly limited.

Specific examples of the repeating unit (a) represented by General Formula (V) will be described below, but the present invention is not limited thereto.

In the specific examples, each of Rx and $Xa_1$ represents a hydrogen atom, $CH_3$, $CF_3$, or $CH_2OH$. Each of Rxa and Rxb independently represents an alkyl group having 1 to 4 carbon atoms, an aryl group having 6 to 18 carbon atoms, or an aralkyl group having 7 to 19 carbon atoms. Z represents a substituent. p represents 0 or a positive integer, and p is preferably 0 to 2, and more preferably 0 or 1. When a plurality of Z's are present, Z's may be the same as or different from each other. As Z, from the viewpoint of increasing dissolution contrast with respect to a developer including an organic solvent before and after acid decomposition, a group consisting of only hydrogen and carbon atoms is suitably exemplified, and for example, a linear or branched alkyl group or cycloalkyl group is preferable.

1

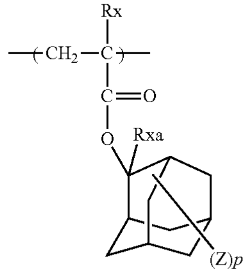

-continued

2

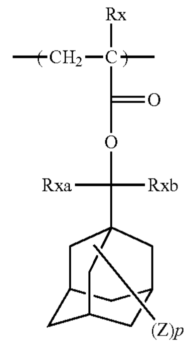

3

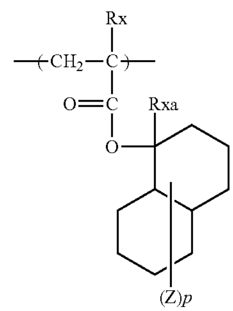

4

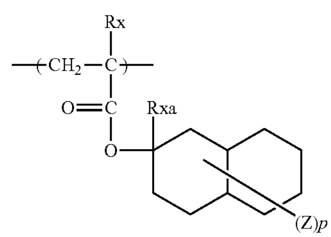

5

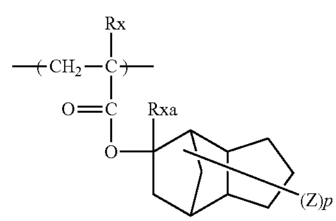

6

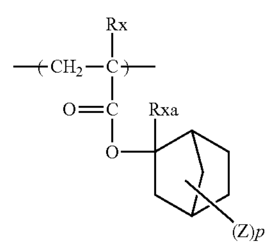

7

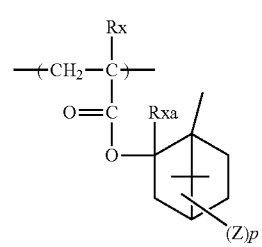

-continued
8
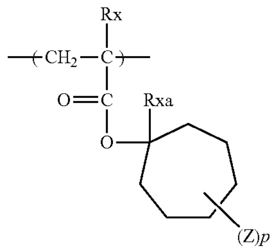
9
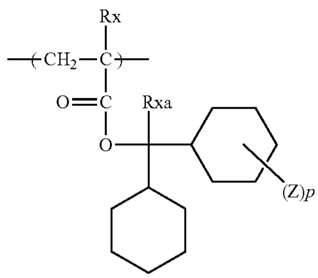
10
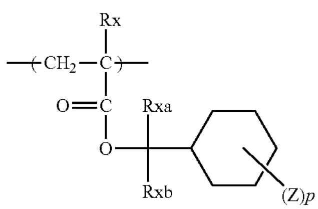
11
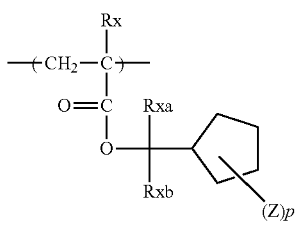
12
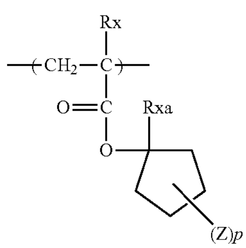
13
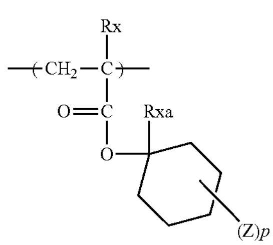
-continued
14
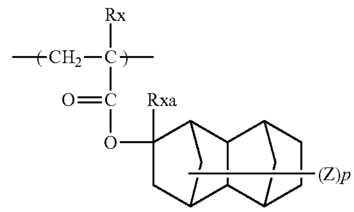
15
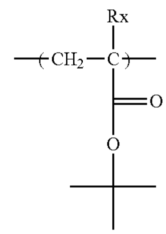
16
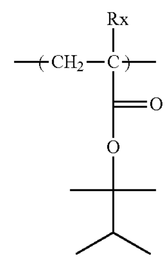
17
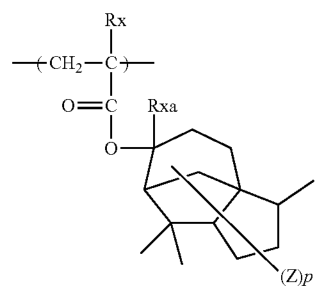
18
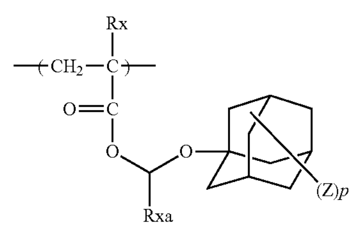
19
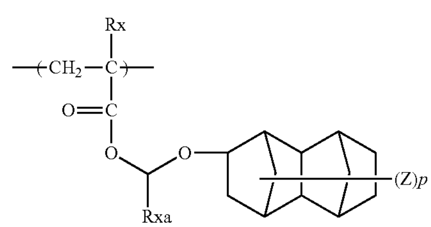

-continued
20
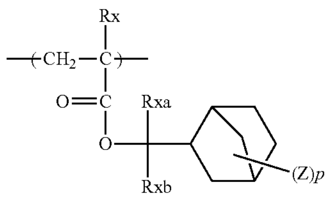
21
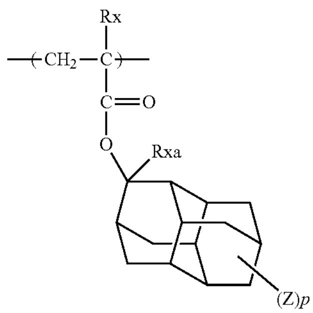
22
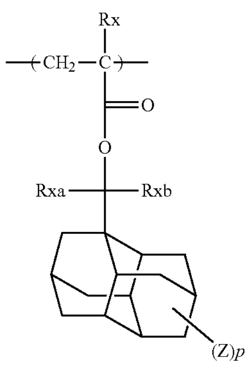
23
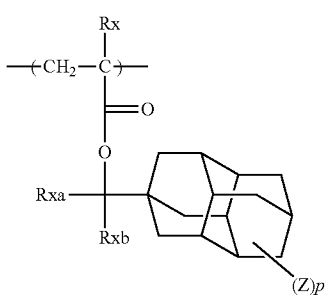
24
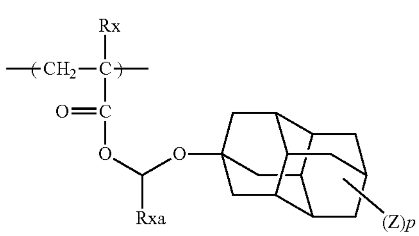
25
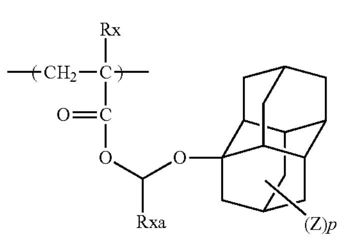
-continued
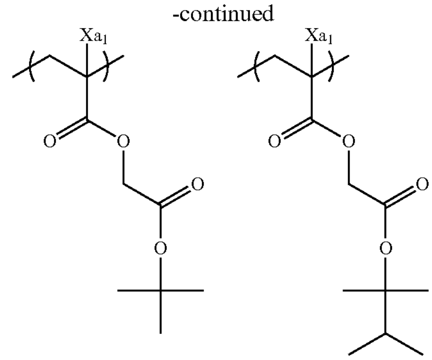
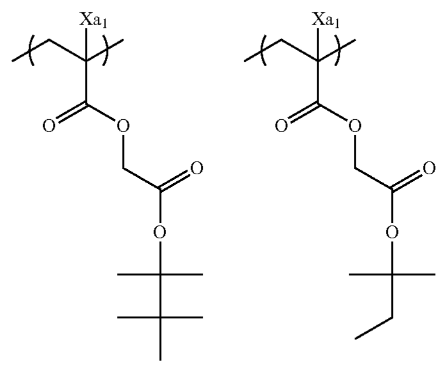
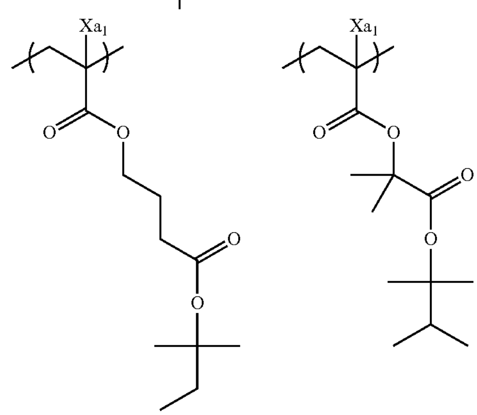
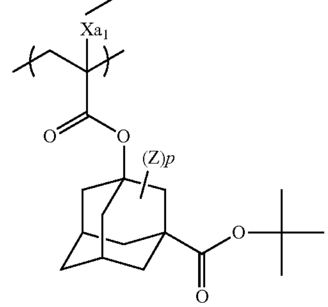
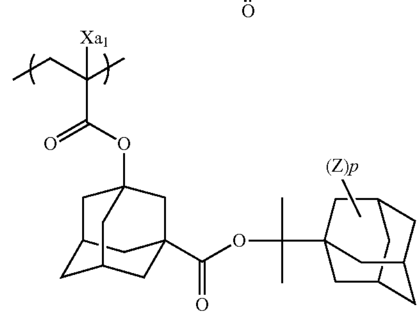

-continued
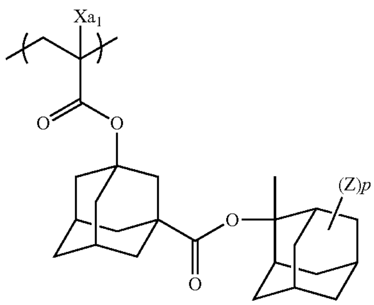
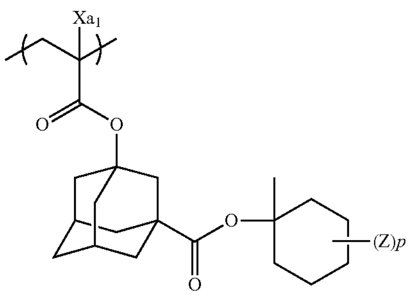
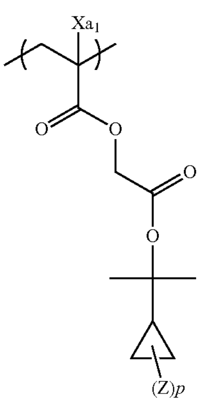
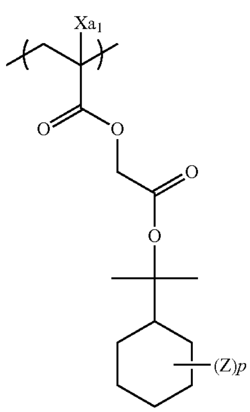
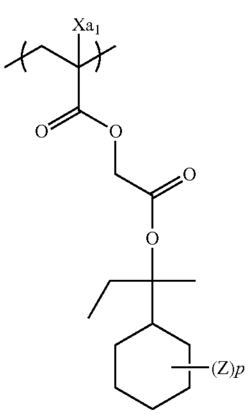
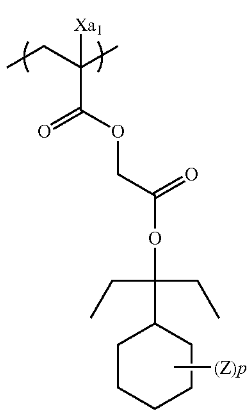
-continued
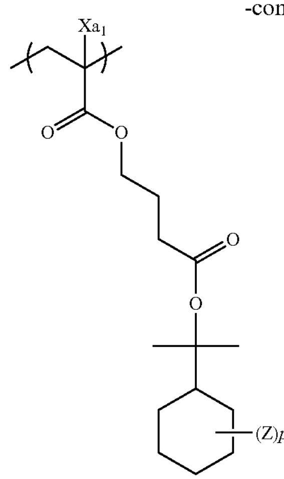
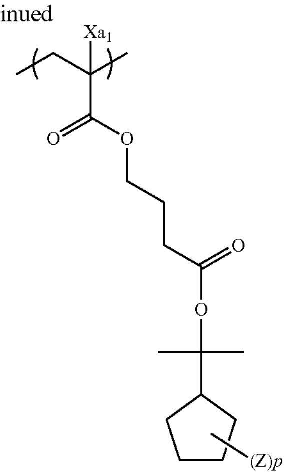
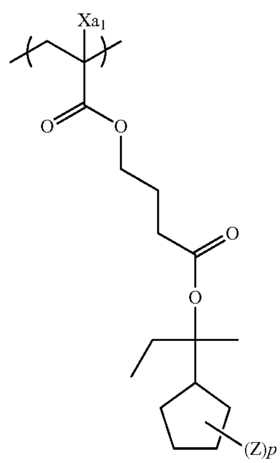
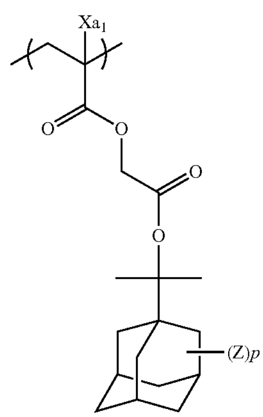
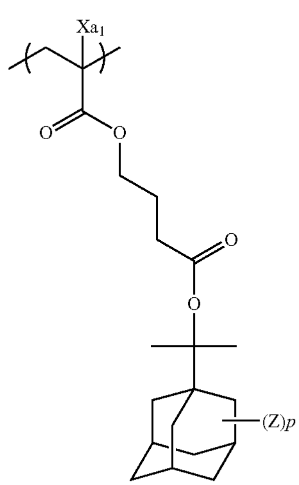
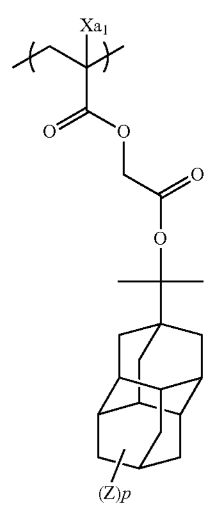

-continued
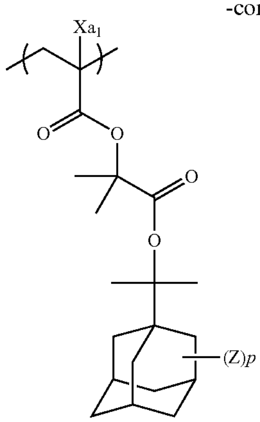
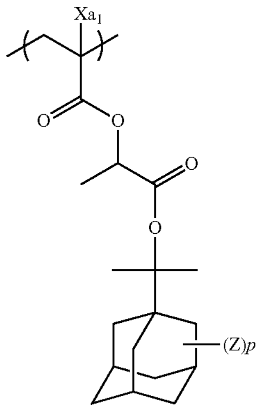
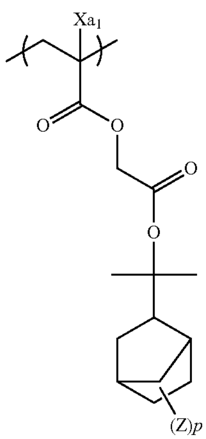
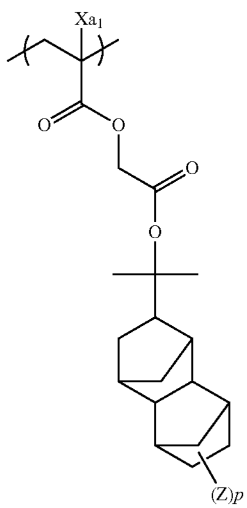
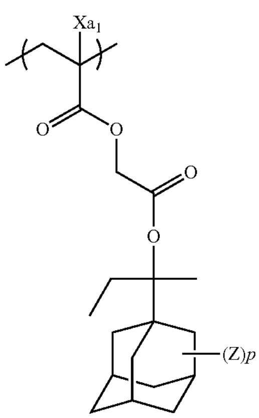
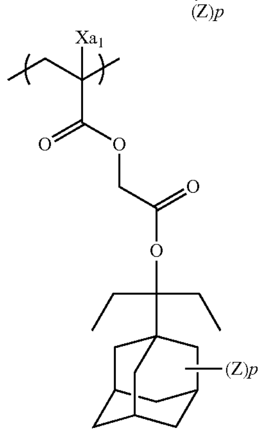
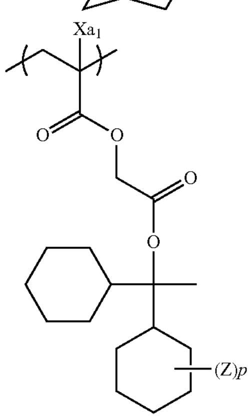
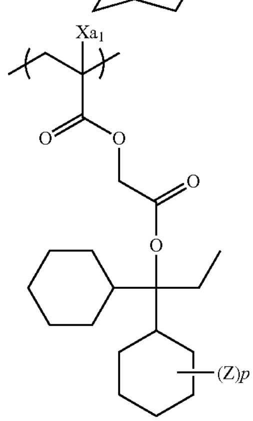
-continued
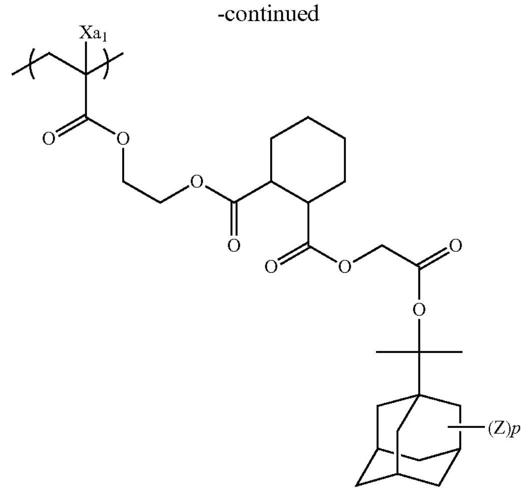
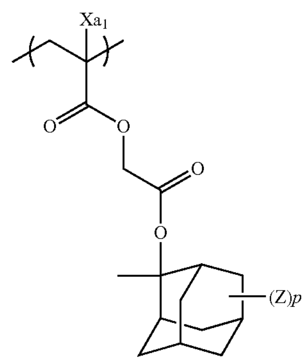
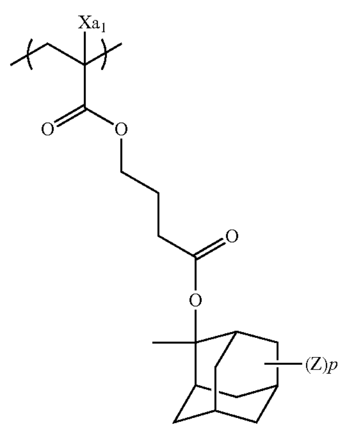
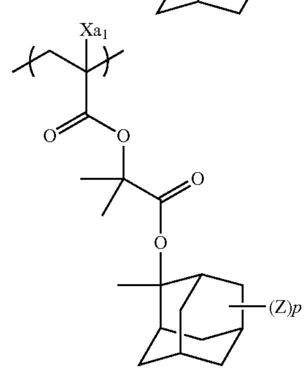

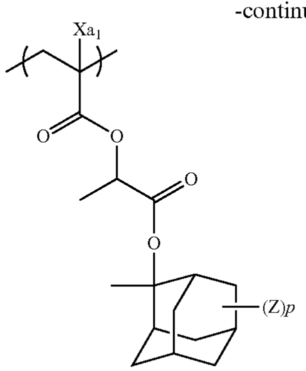
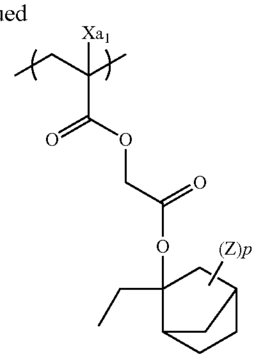
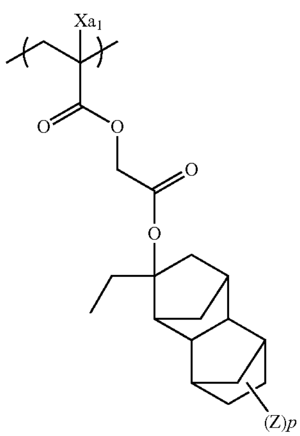
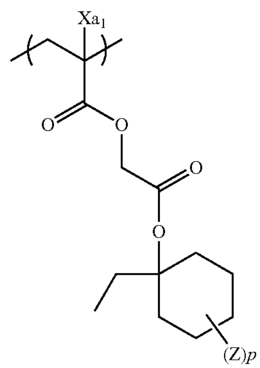
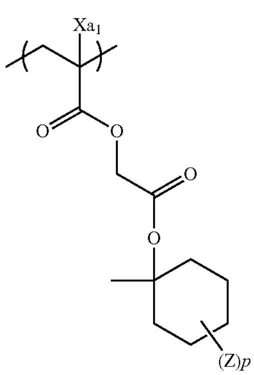
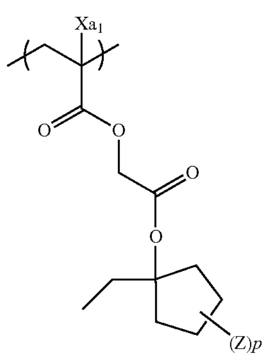
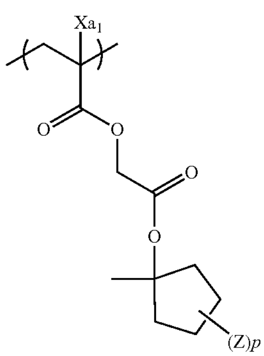
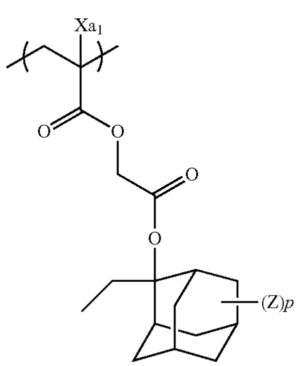
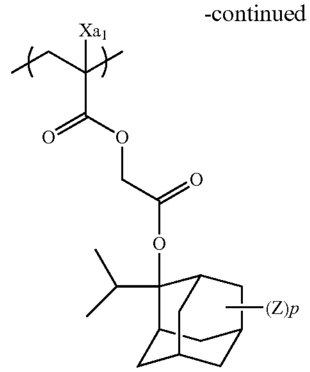
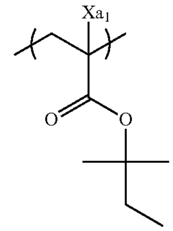
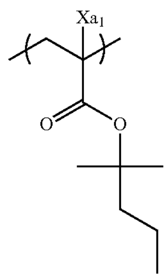
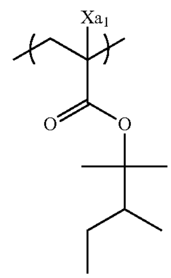
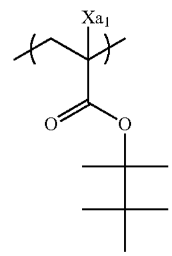
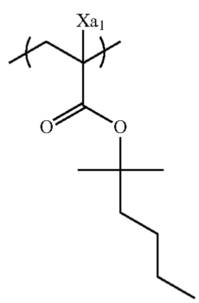
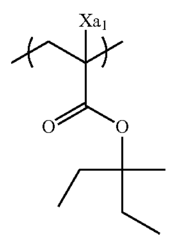
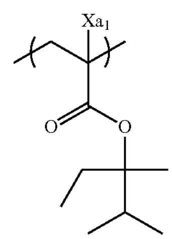
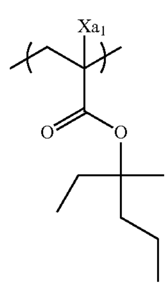
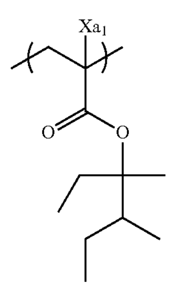
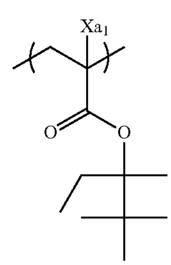
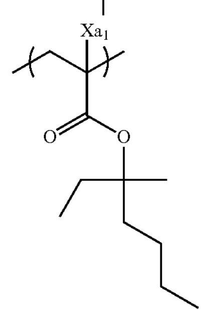
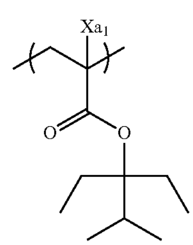

-continued
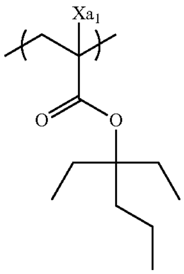
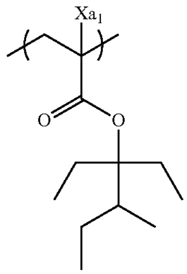
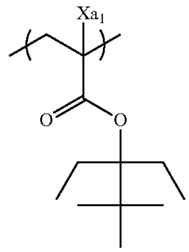
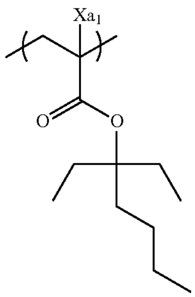
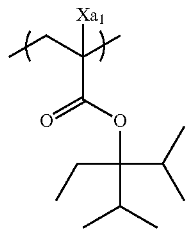
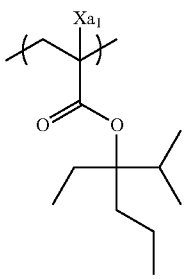
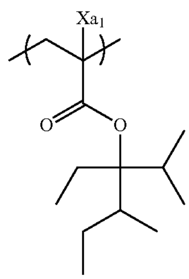
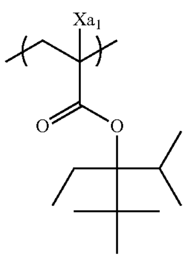
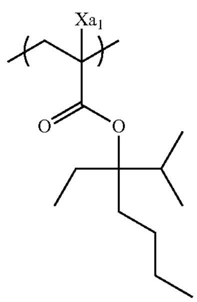
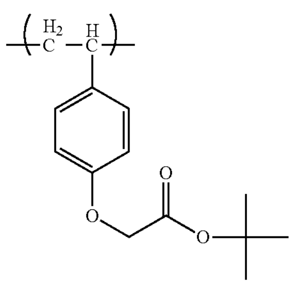
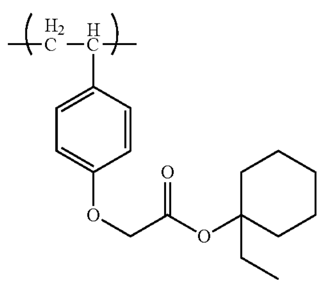
-continued
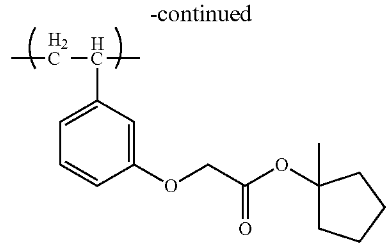
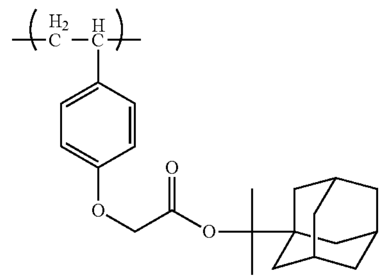
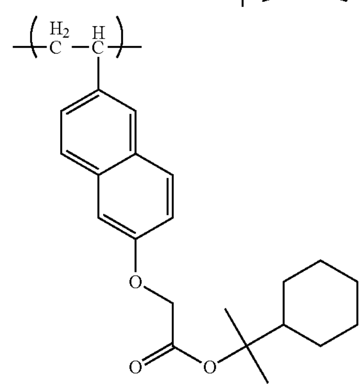
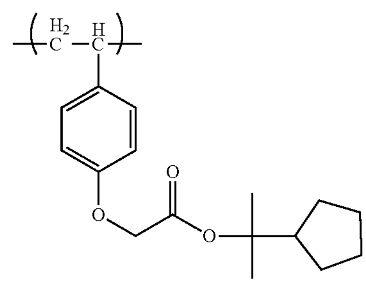
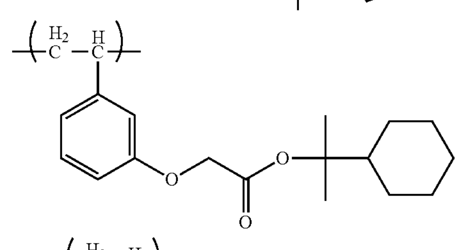
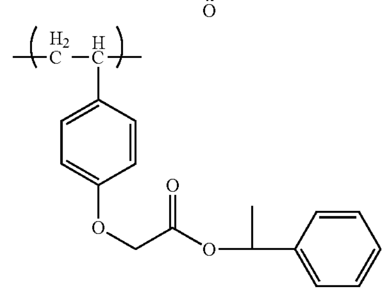

-continued

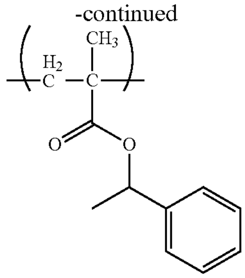

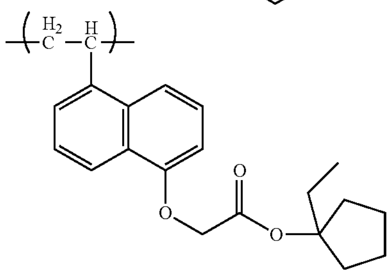

The repeating unit represented by General Formula (V) is preferably the repeating unit represented by the following General Formula (II-1), for the reason of superior effects of the present invention.

(II-1)

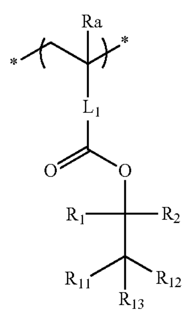

In General Formula (II-1), each of $R_1$ and $R_2$ independently represents an alkyl group, each of $R_{11}$ and $R_{12}$ independently represents an alkyl group, and $R_{13}$ represents a hydrogen atom or an alkyl group. $R_{11}$ and $R_{12}$ may be connected to each other to form a ring, and $R_{11}$ and $R_{13}$ may be connected to each other to form a ring.

Ra represents a hydrogen atom, an alkyl group, a cyano group, or a halogen atom, and $L_1$ represents a single bond or a divalent connecting group.

In General Formula (II-1), the alkyl group represented by each of $R_1$, $R_2$, and $R_{11}$ to $R_{13}$ is preferably an alkyl group having 1 to 10 carbon atoms, and examples thereof include a methyl group, an ethyl group, a propyl group, an isopropyl group, an n-butyl group, a sec-butyl group, a t-butyl group, a neopentyl group, a hexyl group, a 2-ethylhexyl group, an octyl group, and a dodecyl group.

The alkyl group represented by $R_1$ or $R_2$ is more preferably an alkyl group having 2 to 10 carbon atoms, and it is more preferable that any of $R_1$ and $R_2$ is an ethyl group, from the viewpoint of reliably achieving effects of the present invention.

The alkyl group represented by $R_{11}$ or $R_{12}$ is more preferably an alkyl group having 1 to 4 carbon atoms, still more preferably a methyl group or an ethyl group, and particularly preferably a methyl group.

$R_{13}$ is more preferably a hydrogen atom or a methyl group.

$R_{11}$ and $R_{12}$ particularly preferably form a ring by being connected to each other to form an alkylene group, and $R_{11}$ and $R_{13}$ may form a ring by being connected to each other to form an alkylene group.

The ring formed by connection of $R_{11}$ and $R_{12}$ to each other is preferably a 3- to 8-membered ring, and more preferably a 5- or 6-membered ring.

The ring formed by connection of $R_{11}$ and $R_{13}$ to each other is preferably a 3- to 8-membered ring, and more preferably a 5- or 6-membered ring.

The time when $R_{11}$ and $R_{13}$ are connected to each other to form a ring is preferably the time when $R_{11}$ and $R_{12}$ are connected to each other to form a ring.

The ring formed by connection of $R_{11}$ and $R_{12}$ (or $R_{11}$ and $R_{13}$) to each other is more preferably an alicyclic group described below as X in General Formula (1-1).

The rings formed by connection of alkyl groups represented by $R_1$, $R_2$, $R_{11}$ to $R_{13}$, or $R_{11}$ and $R_{12}$ (or $R_{11}$ and $R_{13}$) may further have substituents.

Examples of the substituents which the rings formed by connection of alkyl groups represented by $R_1$, $R_2$, $R_{11}$ to $R_{13}$, or $R_{11}$ and $R_{12}$ (or $R_{11}$ and $R_{13}$) can further have include a cycloalkyl group, an aryl group, an amino group, a hydroxy group, a carboxy group, a halogen atom, an alkoxy group, an aralkyloxy group, a thioether group, an acyl group, an acyloxy group, an alkoxycarbonyl group, a cyano group, and a nitro group. The substituents may be bonded to each other to form a ring, and examples of the ring when the substituents are bonded to each other to form a ring include a cycloalkyl group having 3 to 10 carbon atoms and a phenyl group.

The alkyl group represented by Ra may have a substituent, and is preferably an alkyl group having 1 to 4 carbon atoms.

Examples of the substituent which the alkyl group represented by Ra may have include a hydroxyl group and a halogen atom.

Examples of the halogen atom represented by Ra include a fluorine atom, a chlorine atom, a bromine atom, and an iodine atom.

Ra is preferably a hydrogen atom, a methyl group, a hydroxymethyl group, a perfluoroalkyl group having 1 to 4 carbon atoms (for example, a trifluoromethyl group), and a methyl group is particularly preferable from the viewpoint of raising the glass transition point (Tg) of the resin (A) and improving resolving power and a space width roughness.

Here, in a case where $L_1$ is a phenyl group, Ra is preferably also a hydrogen atom.

Examples of the divalent connecting group represented by $L_1$ include an alkylene group, a divalent aromatic ring group, —COO-$L_{11}$-, —O-$L_{11}$-, and a group formed by combining two or more thereof. Here, $L_{11}$ represents an alkylene group, a cycloalkylene group, a divalent aromatic ring group, a group obtained by combining an alkylene group and a divalent aromatic ring group.

Examples of the alkylene group represented by $L_1$ or $L_{11}$ include alkylene groups having 1 to 8 carbon atoms such as a methylene group, an ethylene group, a propylene group, a butylene group, a hexylene group, and an octylene group. The alkylene group more preferably has 1 to 4 carbon atoms, and particularly preferably has 1 or 2 carbon atoms.

As the cycloalkylene group represented by $L_{11}$, a cycloalkylene group having 3 to 20 carbon atoms is preferable, and examples thereof include a cyclopropylene group, a cyclobutylene group, a cyclopentylene group, a cyclohexylene group, a cycloheptylene group, a cyclooctylene group, a norbornylene group, and an adamantylene group.

In the cycloalkylene group represented by $L_{11}$, carbon atoms configuring the ring (carbon atoms which contribute to ring formation) may be carbonyl carbons, may be heteroatoms such as oxygen atoms, or may form a lactone ring containing an ester bond.

As the divalent aromatic ring group represented by $L_1$ or $L_{11}$, a phenylene group such as a 1,4-phenylene group, a 1,3-phenylene group, or a 1,2-phenylene group, or a 1,4-naphthylene group is preferable, and a 1,4-phenylene group is more preferable.

$L_1$ is preferably a single bond, a divalent aromatic ring group, a divalent group having a norbornylene group, or a divalent group having an adamantylene group, and $L_1$ is particularly preferably a single bond.

Preferable and specific examples of the divalent connecting group represented by $L_1$ are shown below, but the present invention is not limited thereto.

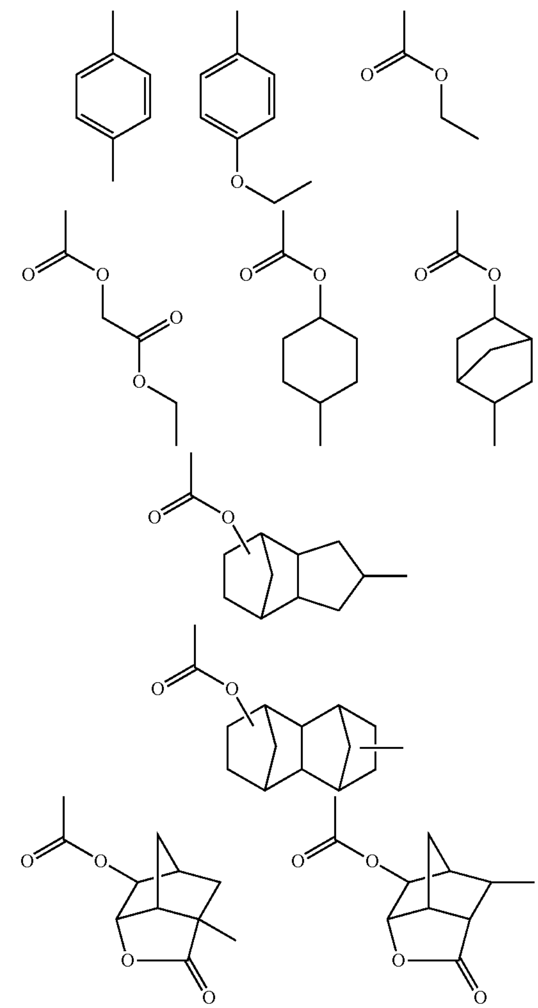

To achieve a higher contrast (high γ value), high resolution, high film loss reduction performance, and high sensitivity, the repeating unit represented by General Formula (II-1) is preferably the repeating unit represented by the following General Formula (1-1).

(1-1)

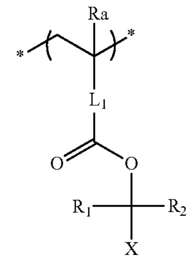

In General Formula (1-1),

X represents an alicyclic group.

$R_1$, $R_2$, Ra, and $L_1$ has the same meaning as $R_1$, $R_2$, Ra, and $L_1$ in General Formula (II-1), respectively, and $R_1$, $R_2$, Ra, and $L_1$ in the specific examples and the preferable examples has the same meaning as $R_1$, $R_2$, Ra, and $L_1$ in General Formula (II-1), respectively.

The alicyclic group represented by X may be monocyclic, polycyclic, or bridged, and preferably represents an alicyclic group having 3 to 25 carbon atoms.

In addition, the alicyclic group may have a substituent, and examples of the substituent include the same substituents as those described above as the substituents which the rings formed by connection of alkyl groups represented by $R_1$, $R_2$, $R_{11}$ to $R_{13}$, or $R_{11}$ and $R_{12}$ (or $R_{11}$ and $R_{13}$) can further have and alkyl groups (a methyl group, an ethyl group, a propyl group, a butyl group, a perfluoroalkyl group (for example, a trifluoromethyl group), and the like).

X preferably represents an alicyclic group having 3 to 25 carbon atoms, more preferably represents an alicyclic group having 5 to 20 carbon atoms, and particularly preferably a cycloalkyl group having 5 to 15 carbon atoms.

In addition, X is preferably an alicyclic group having a 3- to 8-membered ring or a fused ring group thereof, and more preferably 5- or 6-membered ring or a fused ring group thereof.

Examples of the structure of the alicyclic group represented by X are shown below.

(1)

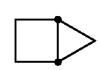

(2)

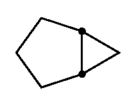

(3)

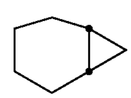

(4)

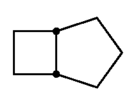

(5)

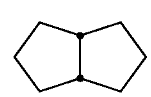

(6)

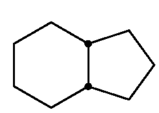

-continued
(7)
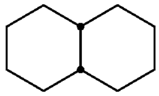
(8)
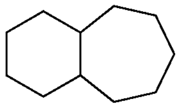
(9)
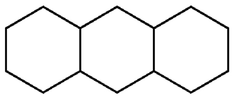
(10)
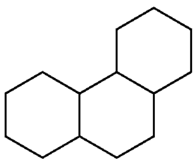
(11)
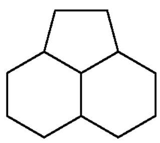
(12)
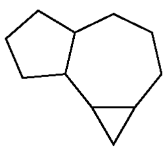
(13)
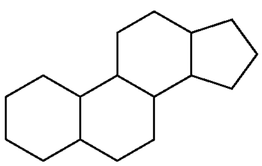
(14)
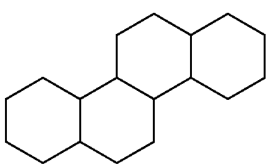
(15)
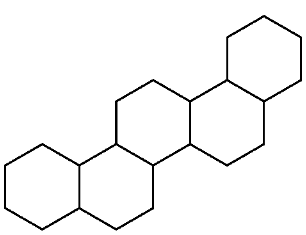
(16)
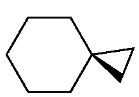
(17)
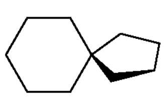
-continued
(18)
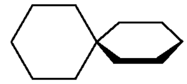
(19)
(20)
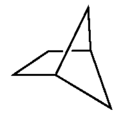
(21)
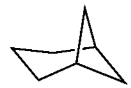
(22)
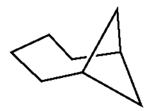
(23)
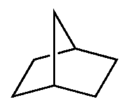
(24)
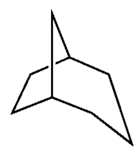
(25)
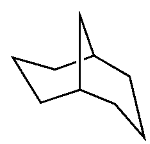
(26)
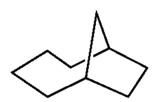
(27)
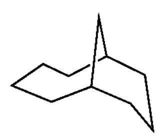
(28)
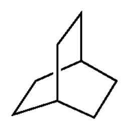
(29)
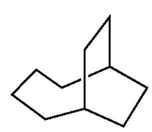
(30)
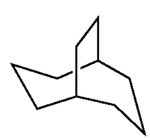

-continued (31)

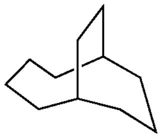

(32)

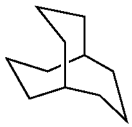

(33)

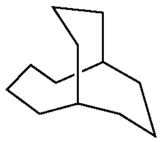

(34)

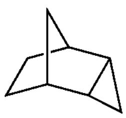

(35)

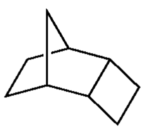

(36)

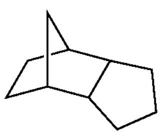

(37)

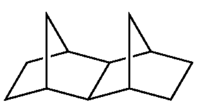

(38)

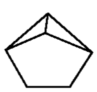

(39)

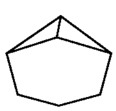

(40)

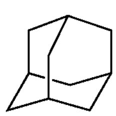

(41)

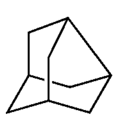

(42)

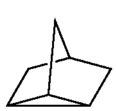

-continued (43)

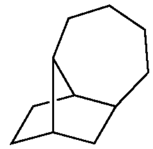

(44)

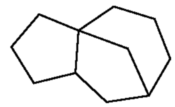

(45)

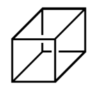

(46)

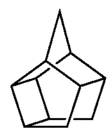

(47)

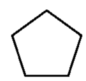

(48)

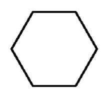

(49)

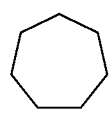

(50)

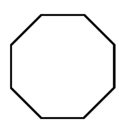

Preferable examples of the alicyclic group can include an adamantyl group, a noradamantyl group, a decalin residue, a tricyclodecanyl group, a tetracyclododecanyl group, a norbornyl group, a cedrol group, a cyclopentyl group, a cyclohexyl group, cycloheptyl group, a cyclooctyl group, a cyclodecanyl group, and a cyclododecanyl group. The alicyclic group is more preferably a cyclohexyl group, a cyclopentyl group, an adamantyl group, or a norbornyl group, still more preferably a cyclohexyl group or a cyclopentyl group, and particularly preferably a cyclohexyl group.

Specific examples of the repeating unit represented by General Formula (II-1) or (1-1) are shown below, but the present invention is not limited thereto.

-continued
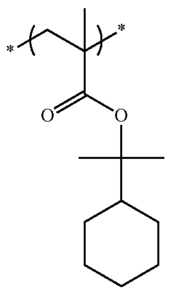
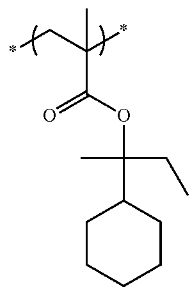
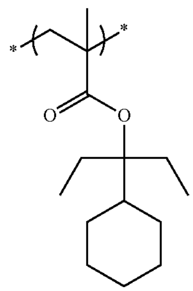
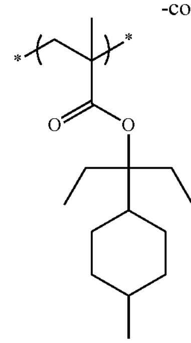
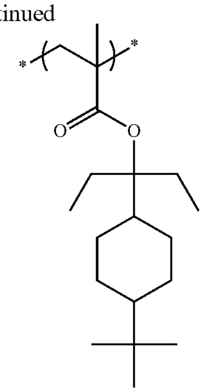
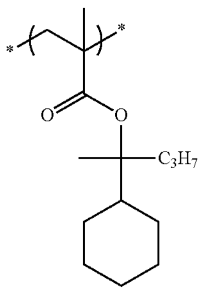
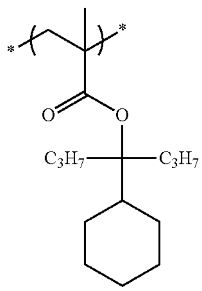
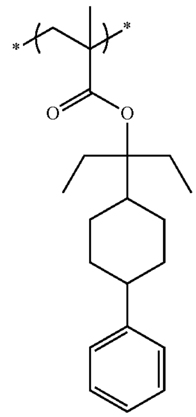
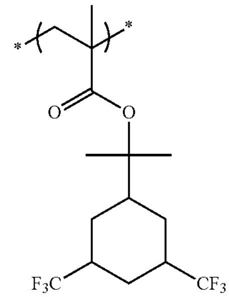
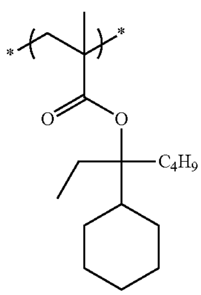
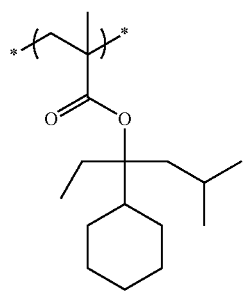
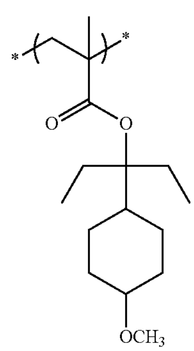
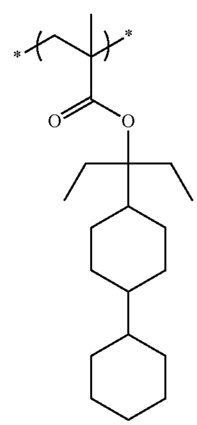
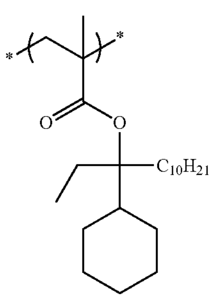
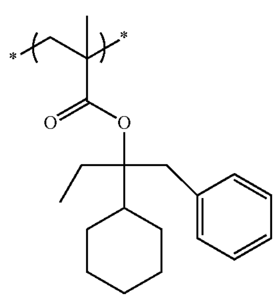
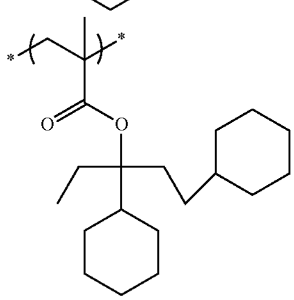
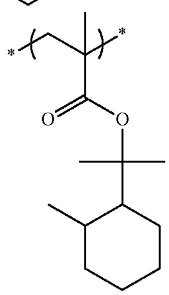
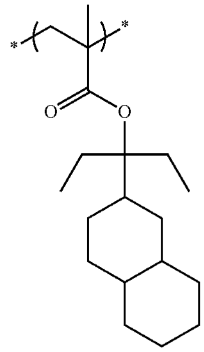
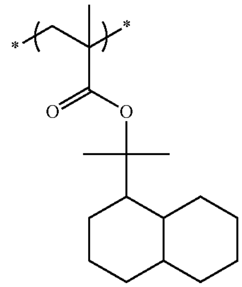

-continued
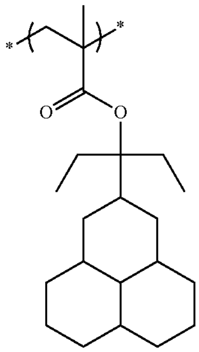
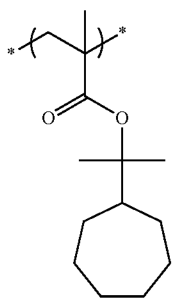
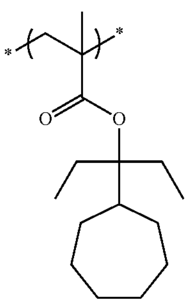
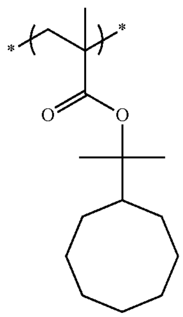
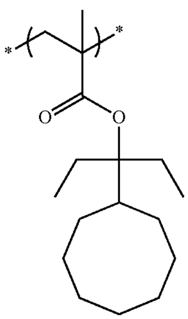
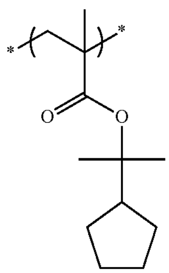
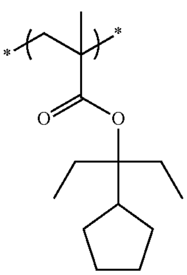
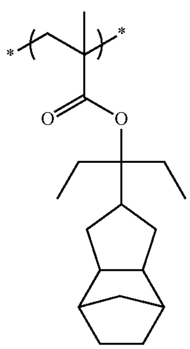
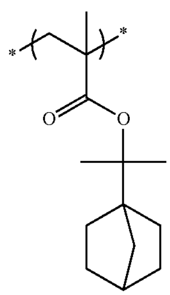
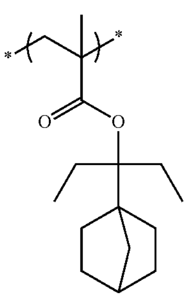
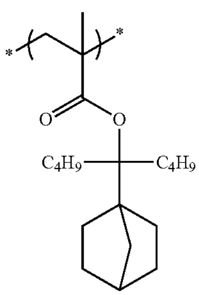
-continued
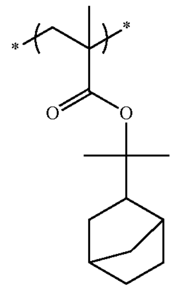
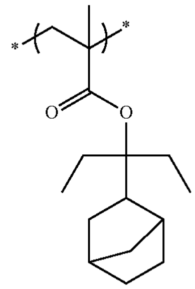
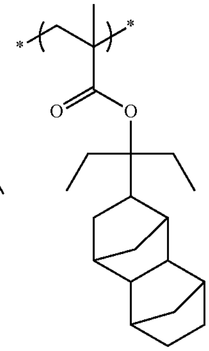
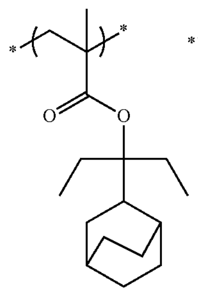
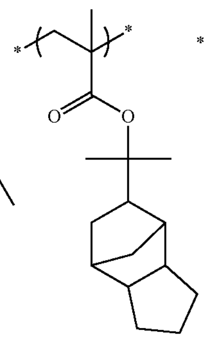
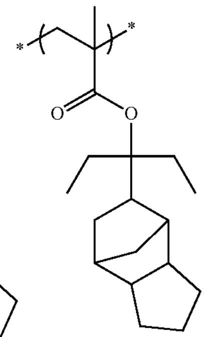
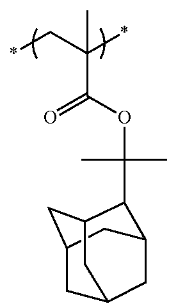
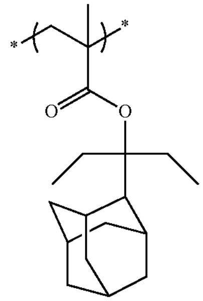
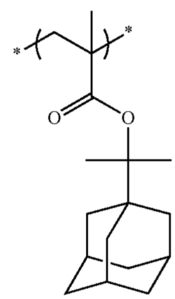
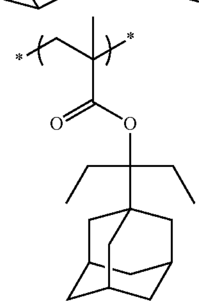
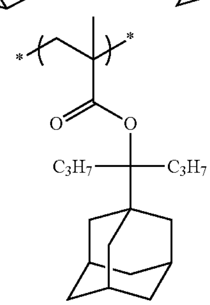
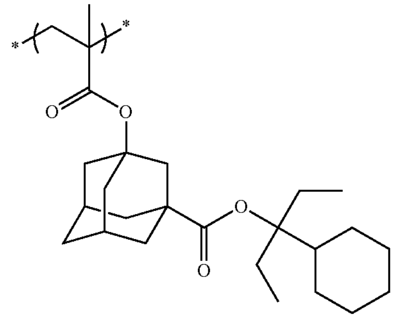

-continued
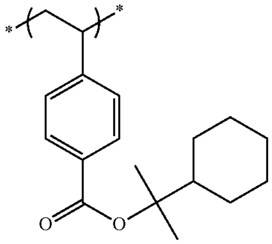
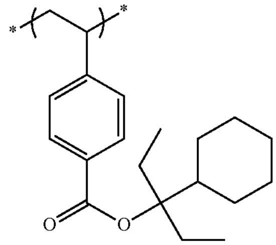
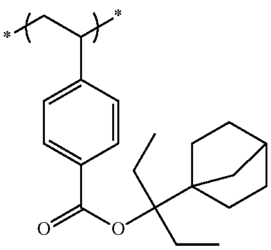
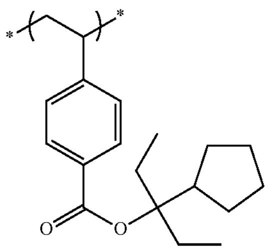
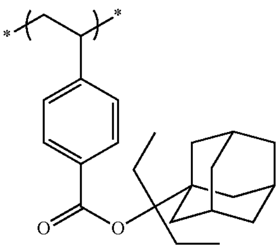
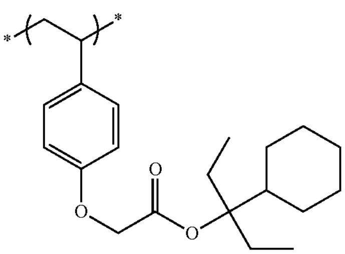
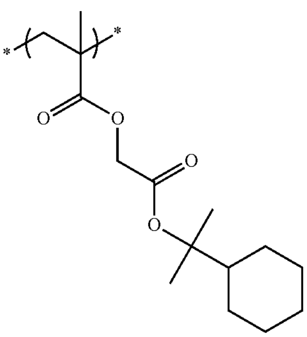
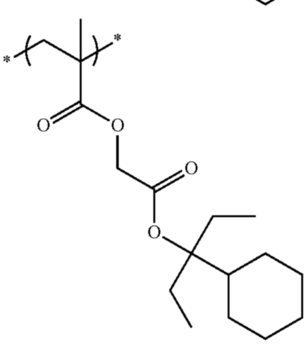
-continued
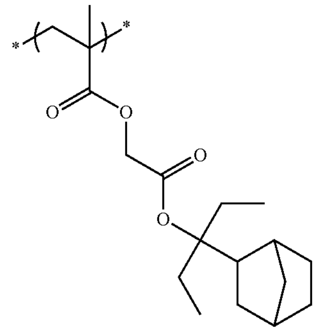
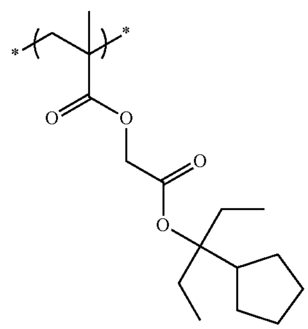
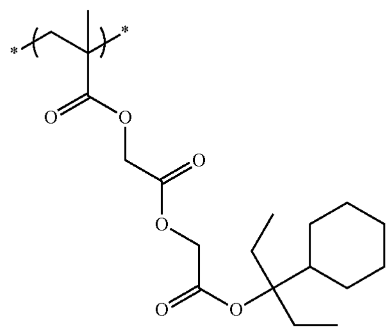
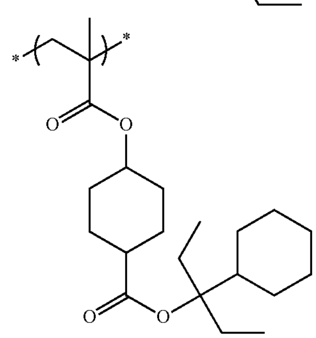
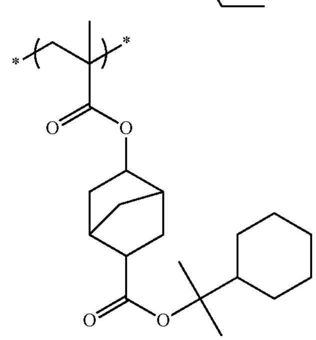

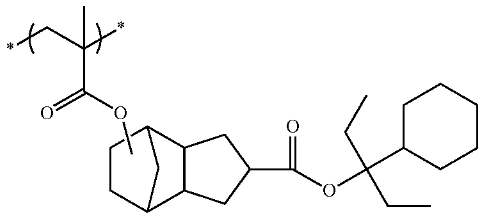
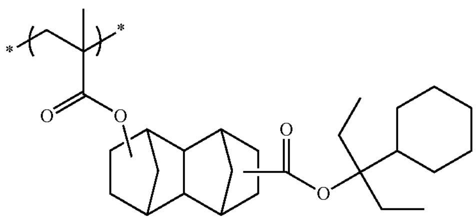
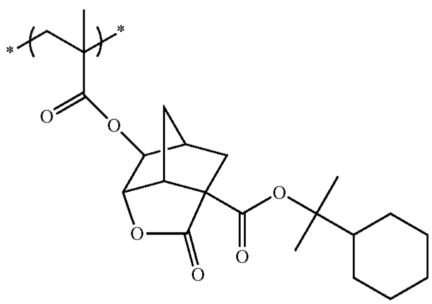
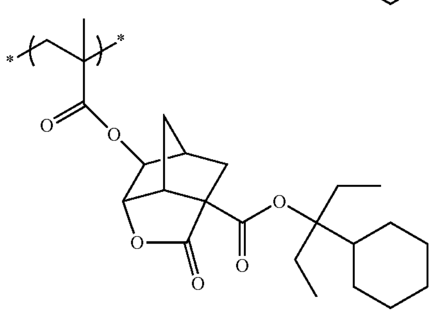
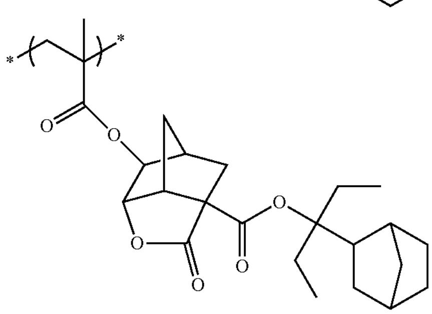
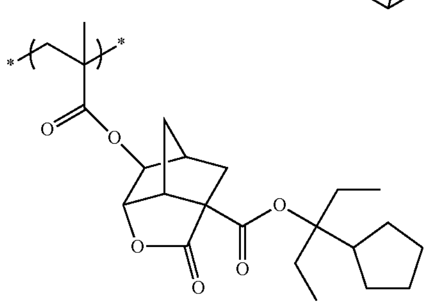
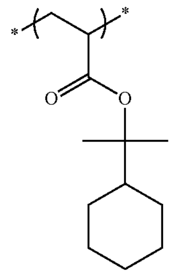
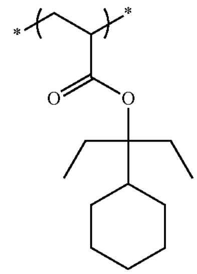
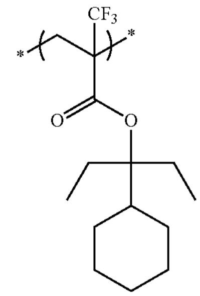
CF3
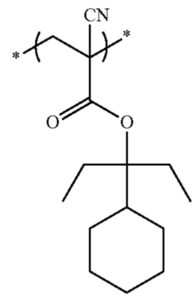
CN
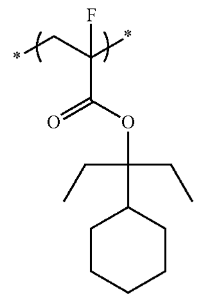
F
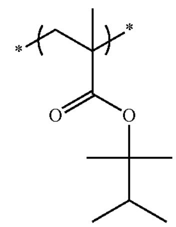
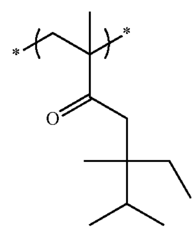
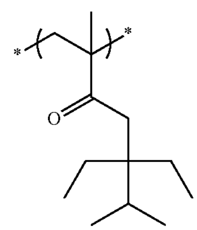
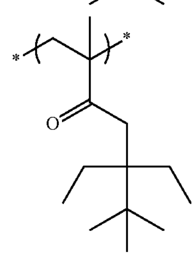
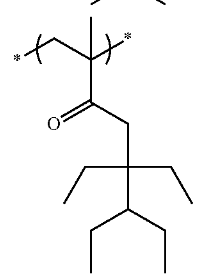
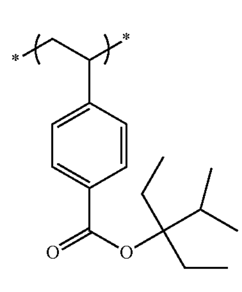
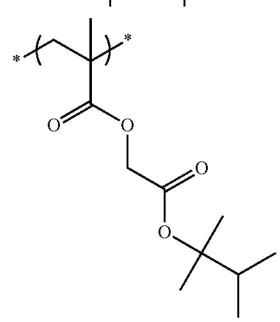
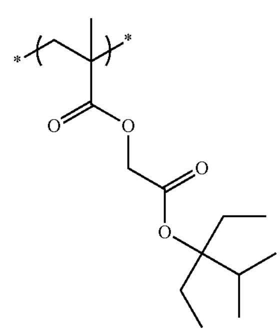

-continued

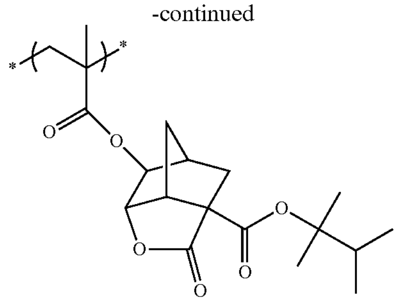

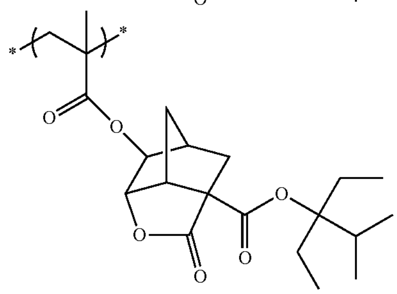

As the repeating unit (a) having an acid-decomposable group which the resin (A) may have, in addition to the repeating unit represented by General Formula (V), the repeating unit represented by the following General Formula (4) is also preferable.

(4)

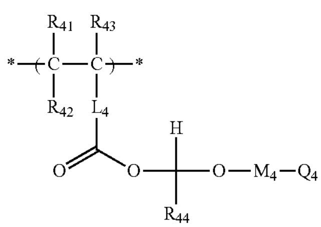

In the General Formula (4), each of $R_{41}$, $R_{42}$, and $R_{43}$ independently represents a hydrogen atom, an alkyl group, a cycloalkyl group, a halogen atom, a cyano group, or an alkoxycarbonyl group. $R_{42}$ may be bonded to $L_4$ to form a ring, and $R_{42}$ in this case represents an alkylene group.

$L_4$ represents a single bond or a divalent connecting group, and in the case of forming a ring with $R_{42}$, represents a trivalent connecting group.

$R_{44}$ represents an alkyl group, a cycloalkyl group, an aryl group, an aralkyl group, an alkoxy group, an acyl group, or a heterocyclic group.

$M_4$ represents a single bond or a divalent connecting group.

$Q_4$ represents an alkyl group, a cycloalkyl group, an aryl group, or a heterocyclic group.

At least two of $Q_4$, $M_4$, and $R_{44}$ may be bonded to each other to form a ring.

$R_{41}$, $R_{42}$, and $R_{43}$ have the same meaning as $R_{51}$, $R_{52}$, and $R_{53}$ in General Formula (V), respectively, and the preferable ranges thereof are also the same.

$L_4$ has the same meaning as $L_5$ in General Formula (V), and the preferable range thereof is also the same.

$R_{44}$ has the same meaning as $R_3$ in General Formula (3), and the preferable range thereof is also the same.

$M_4$ has the same meaning as $M_3$ in General Formula (3), and the preferable range thereof is also the same.

$Q_4$ has the same meaning as $Q_3$ in General Formula (3), and the preferable range thereof is also the same. As a ring formed by bonding of at least two of $Q_4$, $M_4$, and $R_{44}$ to each other, a ring formed by bonding of at least two of $Q_3$, $M_3$, and $R_3$ to each other is exemplified, and the preferable range thereof is also the same.

Specific examples of the repeating unit represented by General Formula (4) will be described below, but the present invention is not limited thereto.

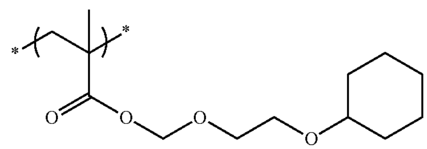

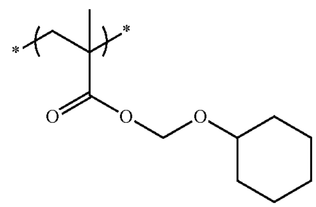

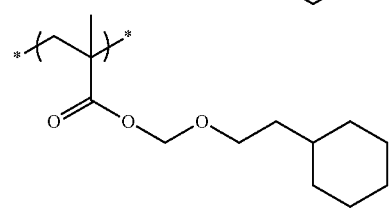

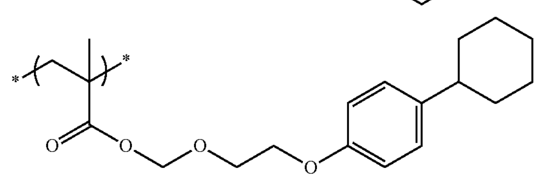

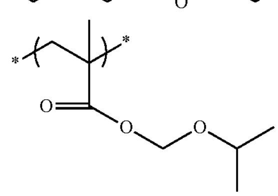

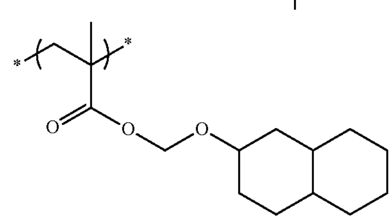

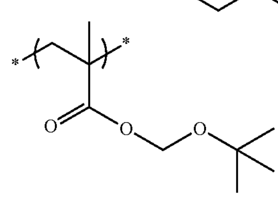

-continued
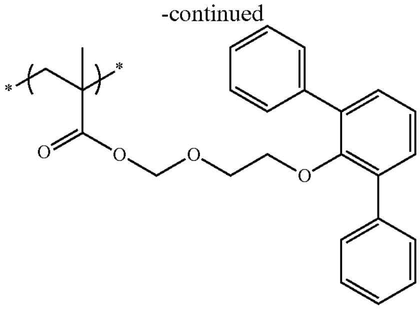
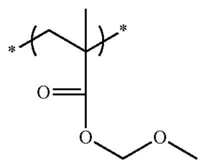
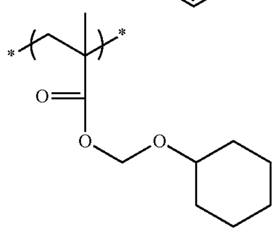
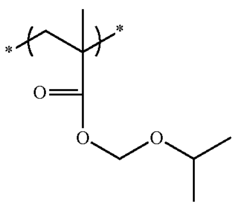
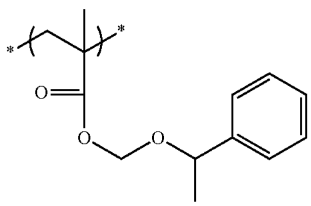
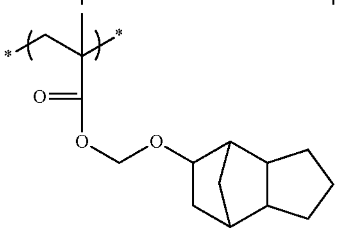
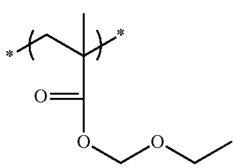
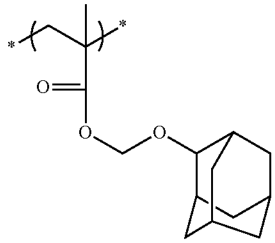
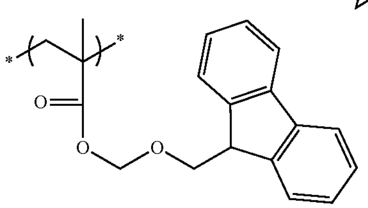
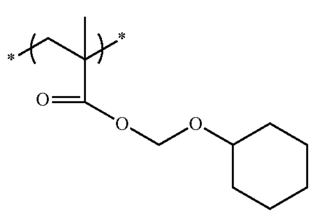
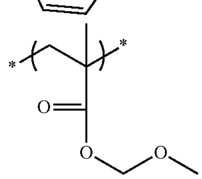
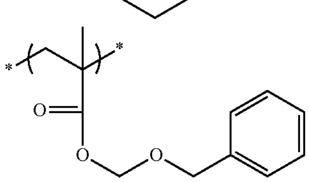
-continued
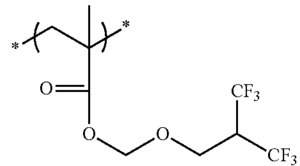
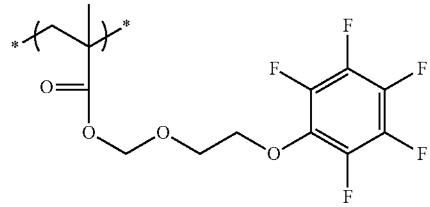
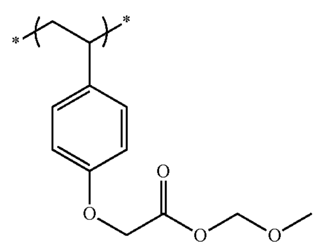
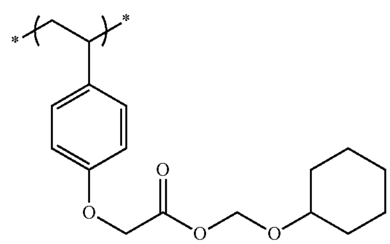
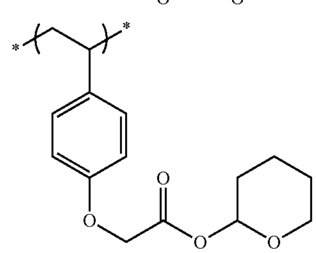
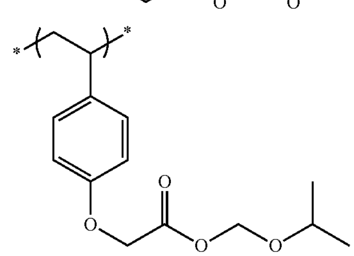
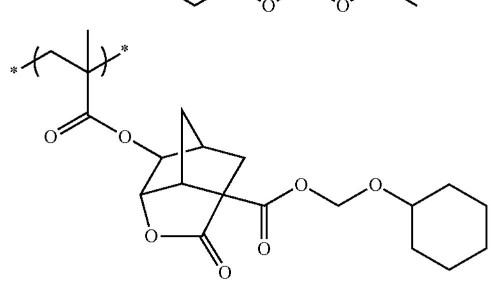

-continued
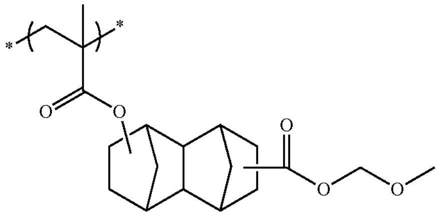
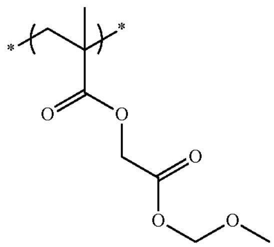
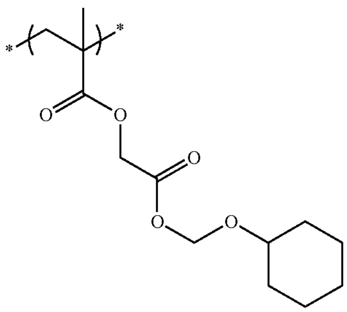
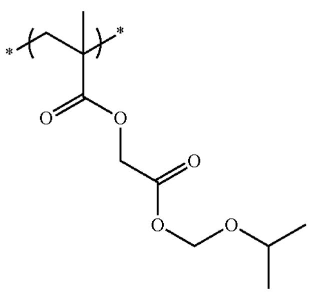
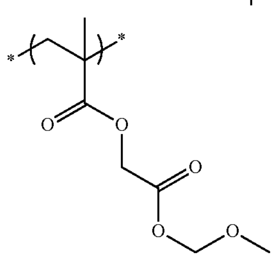
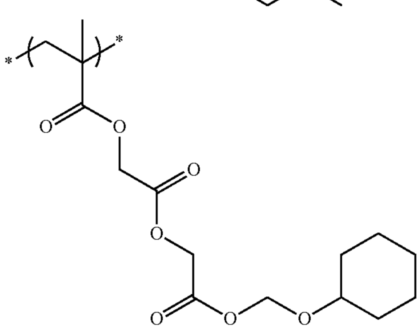
-continued
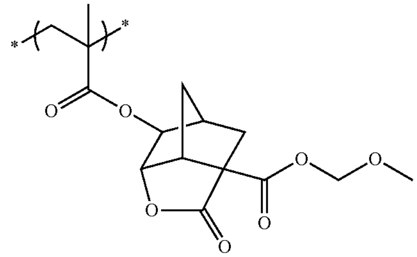
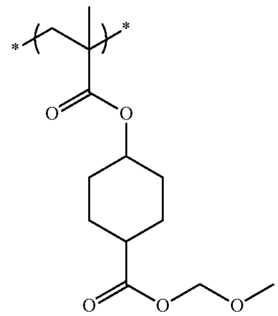
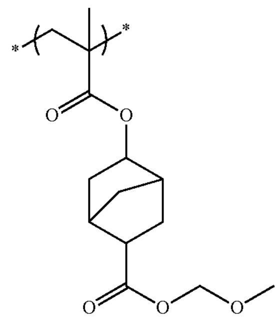
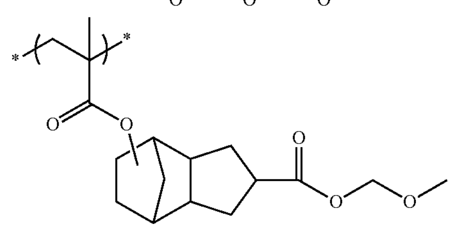
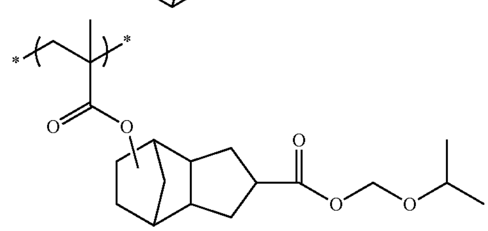
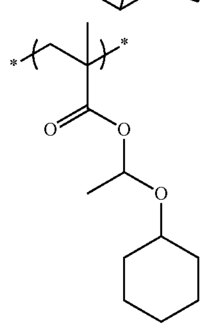
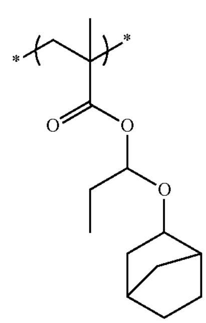

-continued

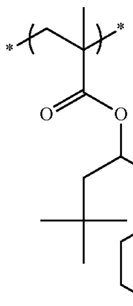
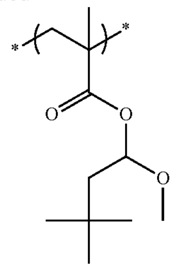
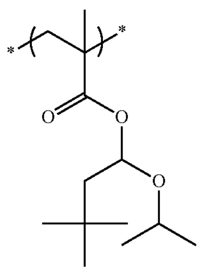
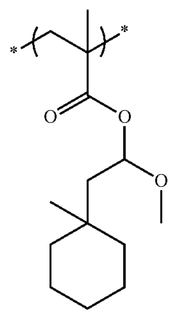
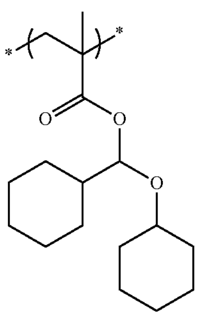
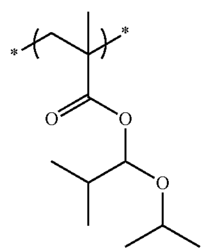
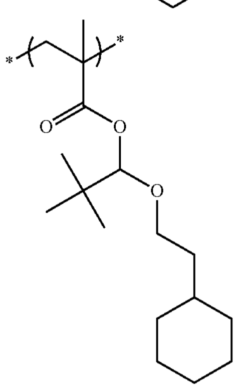
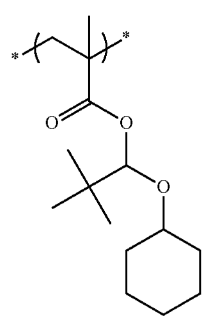
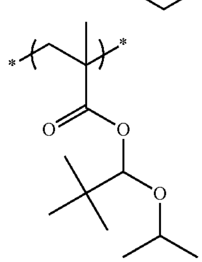
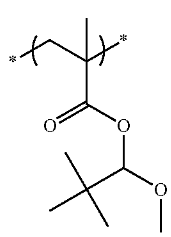

-continued

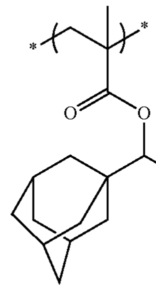
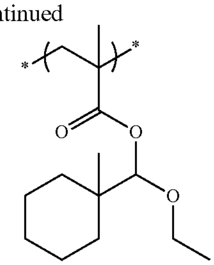
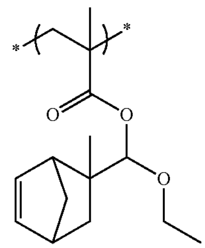

The resin (A) may include the repeating unit represented by the following General Formula (BZ) as the repeating unit (a) having an acid-decomposable group.

(BZ)

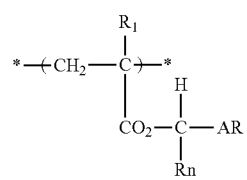

In General Formula (BZ), AR represents an aryl group. Rn represents an alkyl group, a cycloalkyl group, or an aryl group. Rn and AR may be bonded to each other to form a nonaromatic ring.

$R_1$ represents a hydrogen atom, an alkyl group, a cycloalkyl group, a halogen atom, a cyano group, or an alkyloxycarbonyl group.

Regarding the description (description of each group, specific examples of the repeating unit represented by General Formula (BZ), and the like) of the repeating unit represented by General Formula (BZ), the description of the repeating unit represented by General Formula (BZ) described in paragraphs "0101" to "0131" of JP2012-208447A can be referred to, and the contents thereof are incorporated in the present specification.

The repeating unit having the above acid-decomposable group may be one type, or two or more types thereof may be used in combination.

The content (in the case of containing plural types, the total) of the repeating unit (a) having an acid-decomposable group in the resin (A) is preferably 5 mol % to 80 mol %, more preferably 5 mol % to 75 mol %, and still more preferably 10 mol % to 65 mol %, with respect to the entirety of repeating units in the resin (A).

(c) Repeating Unit Having Polar Group Other than Repeating Unit Represented by General Formula (I')

The resin (A) preferably includes the repeating unit (c) having a polar group. When the resin (A) includes the repeating unit (c), for example, the sensitivity of a composition including the resin can be improved. The repeating unit (c) is preferably a non-acid-decomposable repeating unit (that is, a repeating unit which does not include an acid-decomposable group).

As the "polar group" which the repeating unit (c) can include, the following (1) to (4) are exemplified. Moreover, hereinafter, the term "electronegativity" means a value by Pauling.

(1) A functional group including a structure in which an oxygen atom and an atom having a difference in electronegativity with an oxygen atom of 1.1 or greater are bonded by a single bond Examples of such a polar group include a group including a structure represented by O—H of a hydroxy group or the like.

(2) A functional group including a structure in which a nitrogen atom and an atom having a difference in electronegativity with a nitrogen atom of 0.6 or greater are bonded by a single bond Examples of such a polar group include a group including a structure represented by N—H of an amino group or the like.

(3) A functional group including a structure in which two atoms having a difference in electronegativity of 0.5 or greater are bonded by a double bond or a triple bond Examples of such a polar group include a group including a structure represented by C≡N, C=O, N=O, S=O, or C=N.

(4) A functional group having an ionic portion

Examples of such a polar group include a group having a portion represented by $N^+$ or $S^+$.

Specific examples of a substructure which the "polar group" can include are described below.

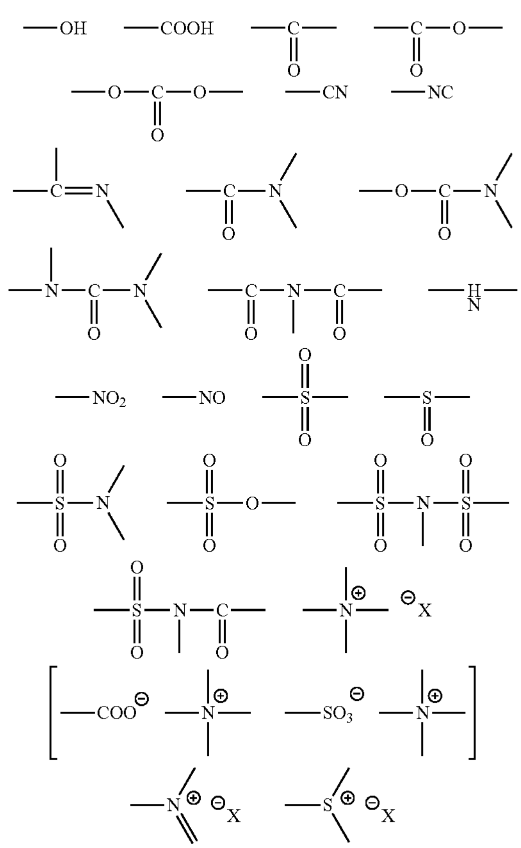

-continued

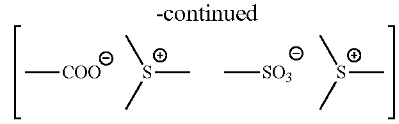

The "polar group" which the repeating unit (c) is preferably selected from a hydroxyl group, a cyano group, a lactone group, a sultone group, a carboxylic acid group, a sulfonic acid group, an amide group, a sulfonamide group, an ammonium group, a sulfonium group, a carbonate group (—O—CO—O—) (for example, a cyclic carbonic acid ester structure), and a group obtained by combining two or more thereof, and an alcoholic hydroxy group, a cyano group, a lactone group, a sultone groups, or a group including a cyano lactone structure is particularly preferable.

When the resin further contains a repeating unit having an alcoholic hydroxy group, the exposure latitude (EL) of a composition including the resin can be further improved.

When the resin further contains a repeating unit having a cyano group, the sensitivity of a composition including the resin can be further improved.

When the resin further contains a repeating unit having a lactone group, dissolution contrast with respect to a developer including an organic solvent can be further improved. By doing so, the dry etching resistance, the coating properties, the adhesion with a substrate of a composition including the resin can also be further improved.

When the resin further contains a repeating unit having a group including a lactone structure having a cyano group, dissolution contrast with respect to a developer including an organic solvent can be further improved. By doing so, the sensitivity, the dry etching resistance, the coating properties, the adhesion with a substrate of a composition including the resin can also be further improved. Additionally, by doing so, a function due to each of a cyano group and a lactone group can be burdened to a single repeating unit, and thus, flexibility of design of the resin can be further increased.

In a case where the polar group which the repeating unit (c) has is an alcoholic hydroxy group, the polar group is preferably represented by at least one selected from the group consisting of the following General Formulas (I-1H) to (I-10H). In particular, the polar group is more preferably represented by at least one selected from the group consisting of the following General Formulas (I-1H) to (I-3H), and still more preferably represented by the following General Formula (I-1H).

(I-1H)

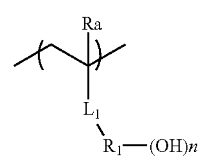

(I-2H)

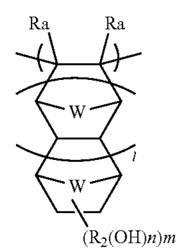

-continued (I-3H)

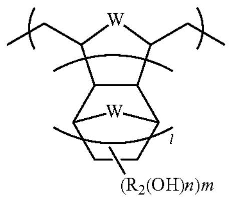

(I-4H)

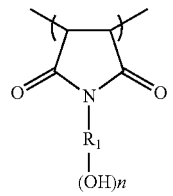

(I-5H)

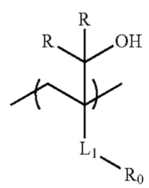

(I-6H)

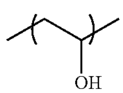

(I-7H)

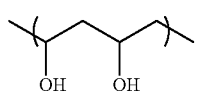

(I-8H)

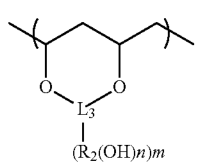

(I-9H)

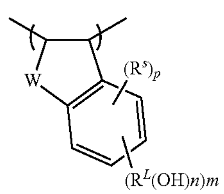

(I-10H)

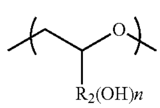

In the formula, each of Ra's independently represents a hydrogen atom, an alkyl group, or a group represented by —$CH_2$—O—$Ra_2$. Here, $Ra_2$ represents a hydrogen atom, an alkyl group, or an acyl group.

$R_1$ represents an (n+1) valent organic group.

In a case where m is 2 or greater, each of $R_2$'s independently represents a single bond or an (n+1) valent organic group.

W represents a methylene group, an oxygen atom, or a sulfur atom.

Each of n and m represents an integer of 1 or greater. In a case where $R_2$ is a single bond in General Formula (1-2H), (1-3H), or (1-8H), n is 1.

l represents an integer of 0 or greater.

$L_1$ represents a connecting group represented by —COO—, —OCO—, —CONH—, —O—, —Ar—, —$SO_3$—, or —$SO_2$NH—. Here, Ar represents a divalent aromatic ring group.

Each of R's independently represents a hydrogen atom or an alkyl group.

$R_0$ represents a hydrogen atom or an organic group.

$L^3$ represents an (m+2) valent connecting group.

In a case where m is 2 or greater, each of $R^L$'s independently represents an (n+1) valent connecting group.

In a case where p is 2 or greater, each of $R^S$'s independently represents a substituent. In a case where p is 2 or greater, a plurality of $R^S$'s may be bonded to each other to form a ring.

p represents an integer of 0 to 3.

Ra represents a hydrogen atom, an alkyl group, or a group represented by —$CH_2$—O—$Ra_2$. Ra is preferably a hydrogen atom or an alkyl group having 1 to 10 carbon atoms, and more preferably a hydrogen atom or a methyl group.

W represents a methylene group, an oxygen atom, or a sulfur atom. W is preferably a methylene group or an oxygen atom.

$R_1$ represents an (n+1) valent organic group. $R_1$ is preferably a nonaromatic hydrocarbon group. In this case, $R_1$ may be a chain hydrocarbon group or may be an alicyclic hydrocarbon group. $R_1$ is more preferably an alicyclic hydrocarbon group.

$R_2$ represents a single bond or an (n+1) valent organic group. $R_2$ is preferably a single bond or a nonaromatic hydrocarbon group. In this case, $R_2$ may be a chain hydrocarbon group or may be an alicyclic hydrocarbon group.

In a case where $R_1$ and/or $R_2$ is a chain hydrocarbon group, the hydrocarbon group may be linear or may be branched. In addition, the chain hydrocarbon group preferably has 1 to 8 carbon atoms. For example, in a case where $R_1$ and/or $R_2$ is an alkylene group, $R_1$ and/or $R_2$ is preferably a methylene group, an ethylene group, an n-propylene group, an isopropylene group, an n-butylene group, an isobutylene group, or a sec-butylene group.

In a case where $R_1$ and/or $R_2$ is an alicyclic hydrocarbon group, the alicyclic hydrocarbon group may be monocyclic or may be polycyclic. The alicyclic hydrocarbon group has, for example, a monocyclic structure, a bicyclic structure, a tricyclic structure, or a tetracyclic structure. The alicyclic hydrocarbon group typical has 5 or greater carbon atoms, preferably 6 to 30 carbon atoms, and more preferably 7 to 25 carbon atoms.

Examples of the alicyclic hydrocarbon group include an alicyclic hydrocarbon having one of substructures listed below. Each of these substructures may have a substituent. In addition, the methylene group (—$CH_2$—) in each of these substructures may be substituted with an oxygen atom (—O—), a sulfur atom (—S—), a carbonyl group [—C(═O)—], a sulfonyl group [—S(═O)$_2$—], a sulfinyl group [—S(═O)—], or an imino group [—N(R)—] (R is a hydrogen atom or an alkyl group).

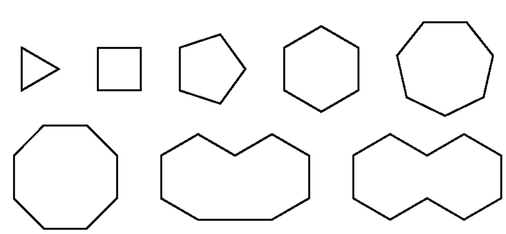

-continued

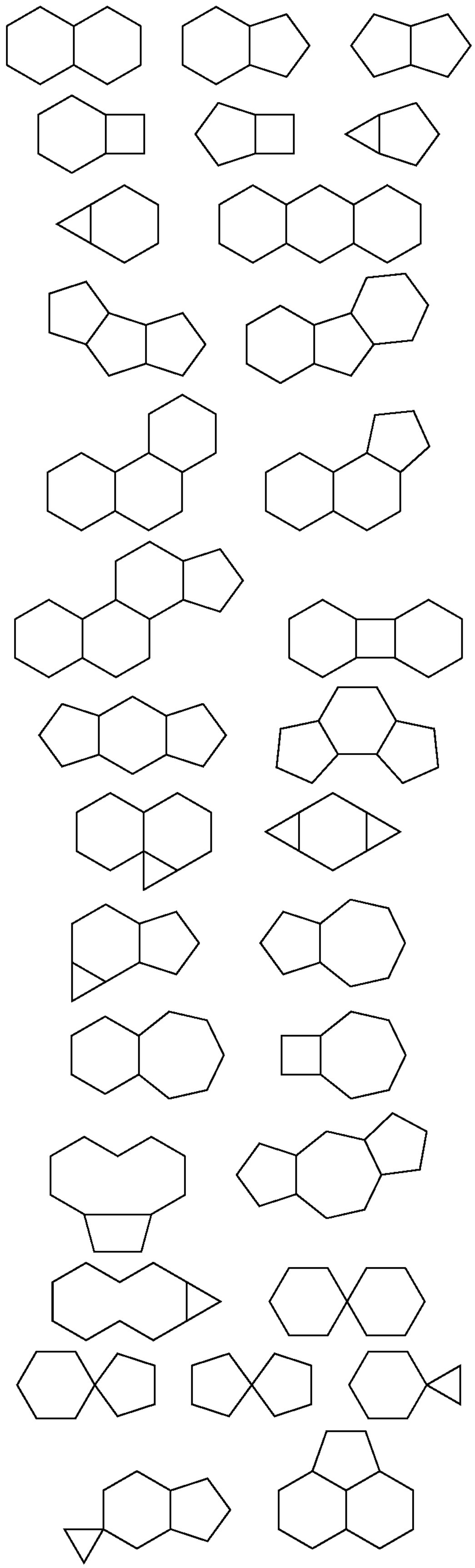

-continued

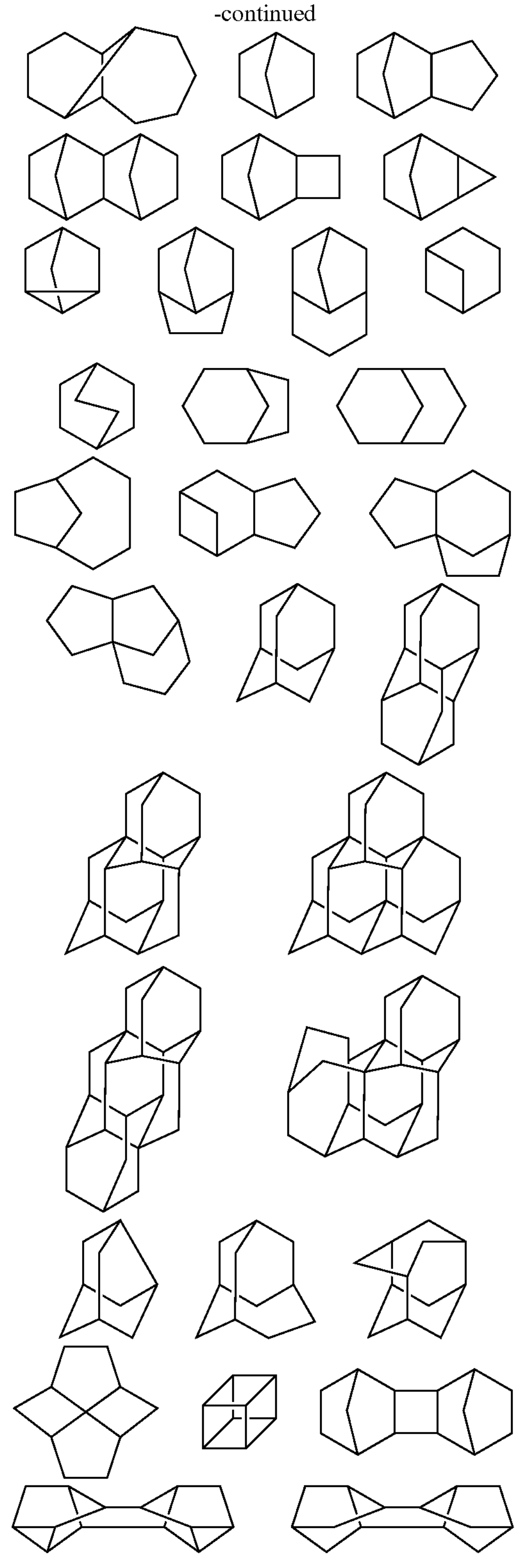

For example, in a case where $R_1$ and/or $R_2$ is a cycloalkylene group, $R_1$ and/or $R_2$ is preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group, or a cyclododecanylene group, and more preferably an adamantylene group, a norbornylene group, a cyclohexylene group, a cyclopentylene group, a tetracyclododecanylene group, or a tricyclodecanylene group.

The nonaromatic hydrocarbon group represented by $R_1$ and/or $R_2$ may have a substituent. Examples of the substituent include an alkyl group having 1 to 4 carbon atoms, a halogen atom, a hydroxy group, an alkoxy group having 1 to 4 carbon atoms, a carboxy group, and an alkoxycarbonyl group having 2 to 6 carbon atoms. The alkyl group, the alkoxy group, and the alkoxycarbonyl group described above may further have a substituent. Examples of the substituent include a hydroxy group, a halogen atom, and an alkoxy group.

$L_1$ represents a connecting group represented by —COO—, —OCO—, —CONH—, —O—, —Ar—, —$SO_3$—, or —$SO_2$NH—. Here, Ar represents a divalent aromatic ring group. $L_1$ is preferably a connecting group represented by —COO—, —CONH—, or —Ar—, and more preferably a connecting group represented by —COO— or —CONH—.

R represents a hydrogen atom or an alkyl group. The alkyl group may be linear, or may be branched. The alky group preferably has 1 to 6 carbon atoms, and more preferably 1 to 3 carbon atoms. R is preferably a hydrogen atom or a methyl group, and more preferably a hydrogen atom.

$R_0$ represents a hydrogen atom or an organic group. Examples of the organic group include an alkyl group, a cycloalkyl group, an aryl group, an alkynyl group, and an alkenyl group. $R_0$ is preferably a hydrogen atom or an alkyl group, and more preferably a hydrogen atom or a methyl group.

$L_3$ represents an (m+2) valent connecting group. That is, $L_3$ represents a tri- or higher valent connecting group. Examples of the connecting group include groups corresponding to specific examples listed below.

$R^L$ represents an (n+1) valent connecting group. That is, $R^L$ represents a di- or higher valent connecting group. Examples of the connecting group include an alkylene group, a cycloalkylene group, and groups corresponding to specific examples listed below. $R^L$'s may be bonded to each other to form a ring structure, or $R^L$ may be bonded to $R^S$ described below to form a ring structure.

$R^S$ represents a substituent. Examples of the substituent include an alkyl group, an alkenyl group, an alkynyl group, an aryl group, an alkoxy group, an acyloxy group, an alkoxycarbonyl group, and a halogen atom.

n is an integer of 1 or greater. n is preferably an integer of 1 to 3, and more preferably 1 or 2. In addition, when n is 2 or greater, dissolution contrast with respect to a developer including an organic solvent can be further improved. Accordingly, by doing this, marginal resolving power and roughness characteristics can be further improved.

m is an integer of 1 or greater. m is preferably an integer of 1 to 3, and more preferably 1 or 2.

l is an integer of 0 or greater. l is preferably 0 or 1.

p is an integer of 0 to 3.

When a repeating unit having a group which generates an alcoholic hydroxy group by being decomposed due to the action of an acid and a repeating unit represented by at least one selected from the group consisting of General Formulas (I-1H) to (I-10H) are used in combination, for example, by the suppression of acid diffusion by the alcoholic hydroxy group and the increase in sensitivity by a group which generates an alcoholic hydroxy group by being decomposed due to the action of an acid, the exposure latitude (EL) can be improved without degrading other performances.

The content of the repeating unit having an alcoholic hydroxy group is preferably 1 mol % to 60 mol %, more preferably 3 mol % to 50 mol %, and still more preferably 5 mol % to 40 mol %, with respect to the entirety of repeating units in the resin (A).

Specific examples of the repeating unit represented by any one of General Formulas (I-1H) to (I-10H) are shown below. Moreover, Ra in specific examples has the same meaning as that in General Formulas (I-1H) to (I-10H).

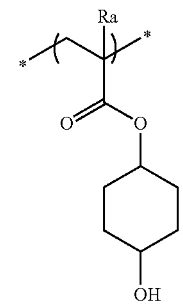
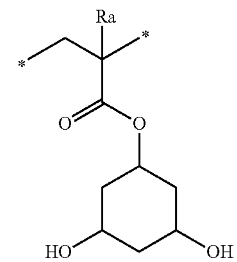
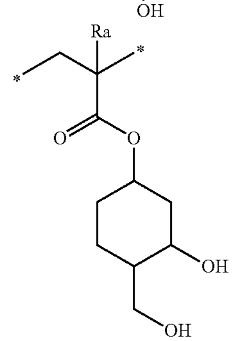
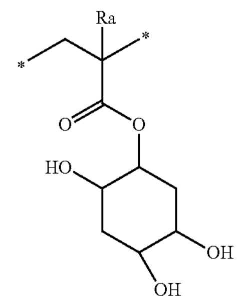
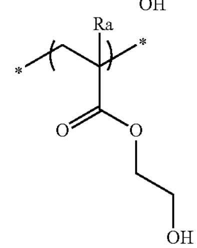
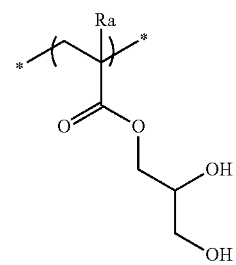
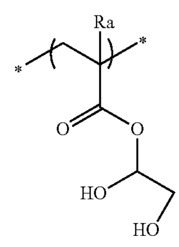
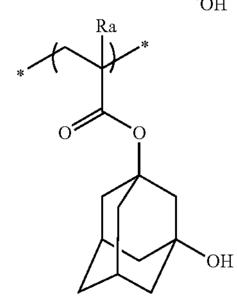
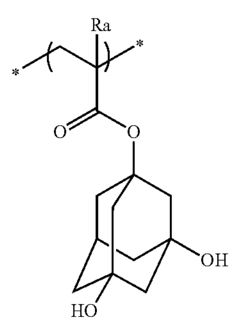
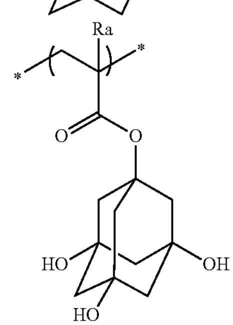

-continued

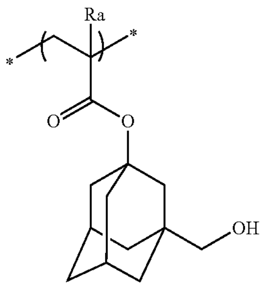

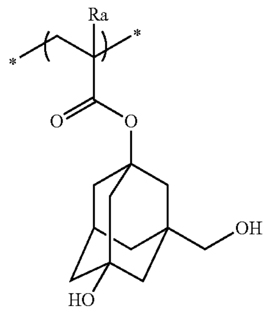

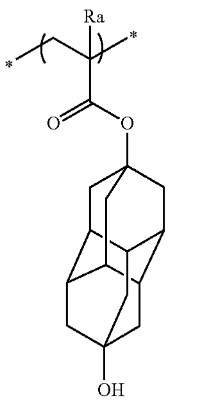

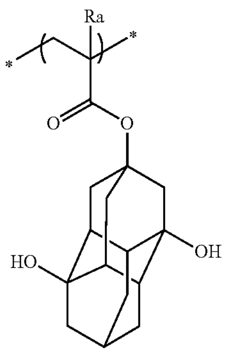

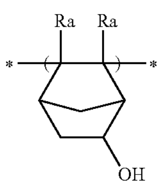

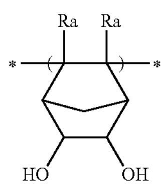

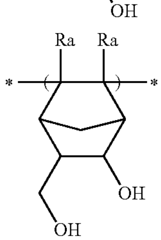

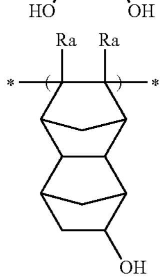

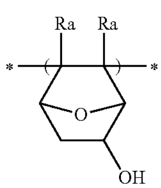

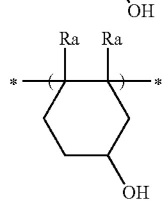

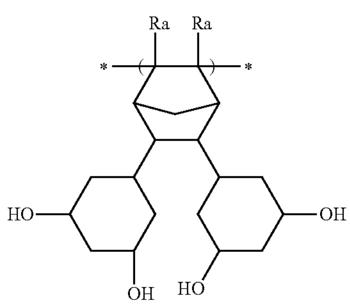

-continued

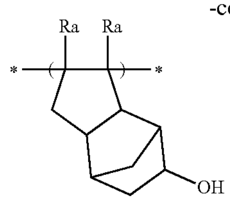

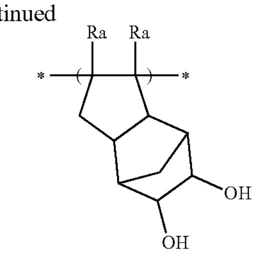

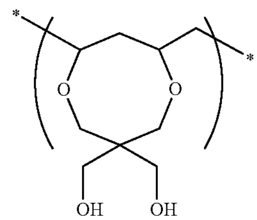

In a case where the polar group which the repeating unit (c) has is an alcoholic hydroxy group or an cyano group, as one aspect of a preferable repeating unit, a repeating unit having an alicyclic hydrocarbon structure substituted with a hydroxyl group or a cyano group is exemplified. At this time, an acid-decomposable group is not preferably included. As the alicyclic hydrocarbon structure in the alicyclic hydrocarbon structure substituted with a hydroxyl group or a cyano group, an adamantyl group, a diamantyl group, or a norbornane group is preferable. As a preferable alicyclic hydrocarbon structure substituted with a hydroxyl group or a cyano group, the substructures represented by the following General Formulas (VIIa) to (VIIc) are preferable. Thus, adhesion to substrate and developer affinity are improved.

(VIIa)

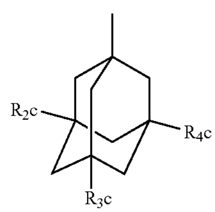

(VIIb)

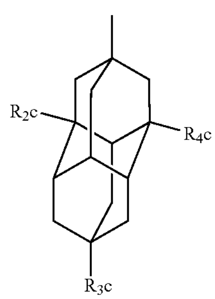

(VIIc)

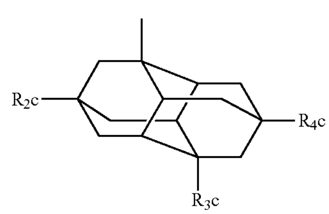

In General Formulas (VIIa) to (VIIc), each of $R_2c$ to $R_4c$ independently represents a hydrogen atom, a hydroxyl group, or a cyano group. Here, at least one of $R_2c$ to $R_4c$ is a hydroxyl group. Preferably, one or two of $R_2c$ to $R_4c$ are hydroxyl groups, and the other is a hydrogen atom. In General Formula (VIIa), more preferably, two of $R_2c$ to $R_4c$ are hydroxyl groups, and the other is a hydrogen atom.

As a repeating unit having a substructure represented by each of General Formulas (VIIa) to (VIIc), the repeating units represented by the following General Formulas (AIIa) to (AIIc) can be exemplified.

(AIIa)

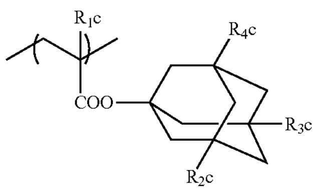

(AIIb)

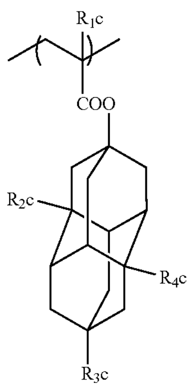

(AIIc)

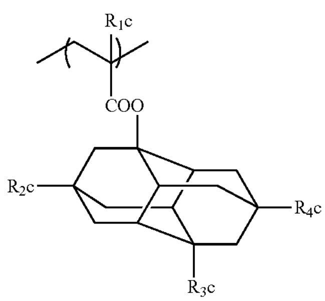

In General Formulas (AIIa) to (Mk), $R_1c$ represents a hydrogen atom, a methyl group, a trifluoromethyl group, or a hydroxymethyl group.

$R_2c$ to $R_4c$ have the same meaning as $R_2c$ to $R_4c$ in General Formulas (VIIa) to (VIIc), respectively.

Although the resin (A) may contain or may not contain a repeating unit having a hydroxyl group or a cyano group, in a case where the resin (A) contains the repeating unit, the content of the repeating unit having a hydroxyl group or a cyano group is preferably 1 mol % to 60 mol %, more preferably 3 mol % to 50 mol %, and still more preferably 5 mol % to 40 mol %, with respect to the entirety of repeating units in the resin (A).

Specific examples of the repeating unit having a hydroxyl group or a cyano group are described below, but the present invention is not limited thereto.

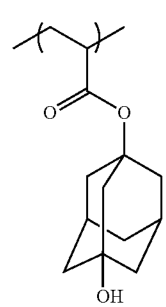

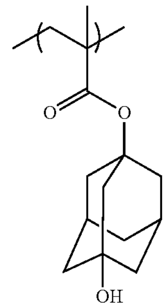

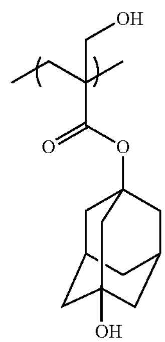

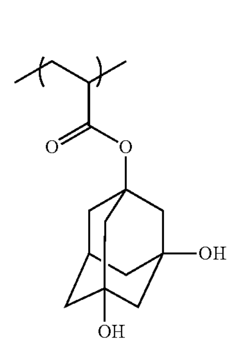

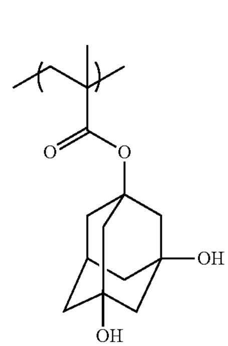

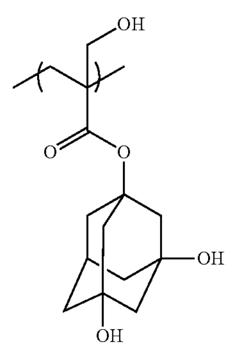

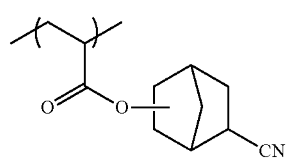

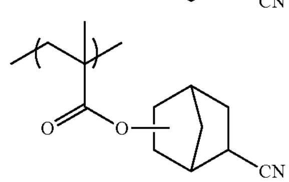

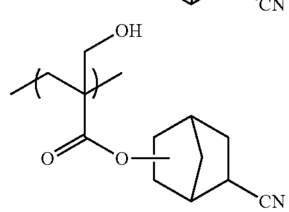

-continued

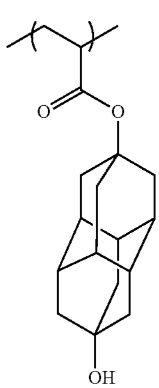

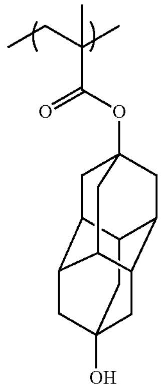

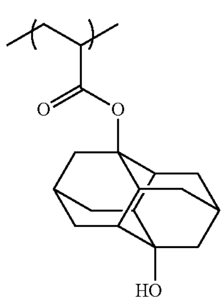

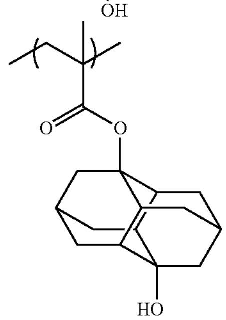

The repeating unit (c) may be a repeating unit having a lactone structure as a polar group.

As the repeating unit having a lactone structure, the repeating unit represented by the following General Formula (AII) is more preferable.

(AII)

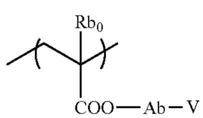

In General Formula (AII), $Rb_0$ represents a hydrogen atom, a halogen atom, or an alkyl group (preferably has 1 to 4 carbon atoms) which may have a substituent.

Preferable examples of the substituent which the alkyl group represented by $Rb_0$ may have include a hydroxyl group and a halogen atom. Examples of the halogen atom represented by $Rb_0$ include a fluorine atom, a chlorine atom, a bromine atom, and an iodine atom. $Rb_0$ is preferably a hydrogen atom, a methyl group, a hydroxymethyl group, or a trifluoromethyl group, and particularly preferably a hydrogen atom or a methyl group.

Ab represents a single bond, an alkylene group, a divalent connecting group having a monocyclic or polycyclic cycloalkyl structure, an ether bond, an ester bond, a carbonyl group, or a divalent connecting group obtained by combining these. Ab is preferably single bond or a divalent connecting group represented by $-Ab_1-CO_2-$.

$Ab_1$ is a linear or branched alkylene group or a monocyclic or polycyclic cycloalkylene group, and preferably a methylene group, an ethylene group, a cyclohexylene group, an adamantylene group, or a norbornylene group.

V represents a group having a lactone structure.

As the group having a lactone structure, any group can be used as long as the group has a lactone structure, but the group preferably has a 5- to 7-membered ring lactone structure. It is preferable that another ring structure be condensed with the 5- to 7-membered lactone structure while forming a bicyclo structure or a spiro structure. The group more preferably has a repeating unit having a lactone structure represented by any one of the following General Formulas (LC1-1) to (LC1-17). In addition, the lactone structure may be directly bonded to the main structure. A preferable lactone structure is (LC1-1), (LC1-4), (LC1-5), (LC1-6), (LC1-8), (LC1-13), or (LC1-14).

LC1-1

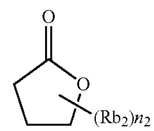

LC1-2

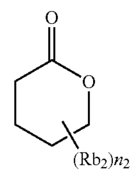

LC1-3

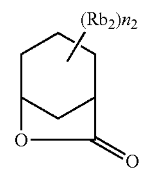

LC1-4

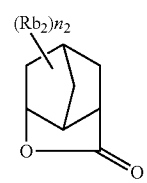

LC1-5

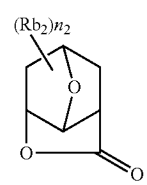

LC1-6

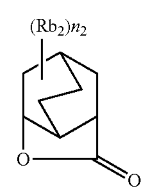

LC1-7

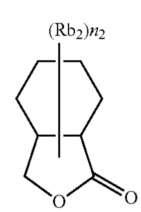

-continued

LC1-8

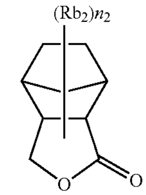

LC1-9

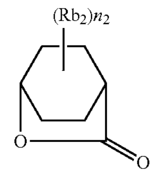

LC1-10

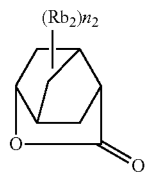

LC1-11

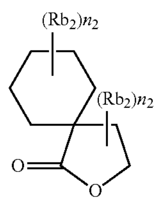

LC1-12

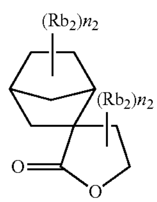

LC1-13

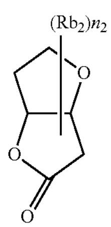

LC1-14

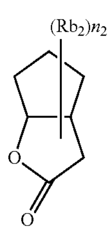

LC1-15

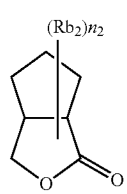

-continued

LC1-16

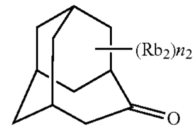

LC1-17

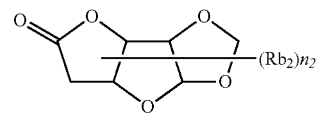

The lactone structure portion may have or may not have a substituent ($Rb_2$). Preferable examples of the substituent ($Rb_2$) include an alkyl group having 1 to 8 carbon atoms, a monovalent cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. The substituent ($Rb_2$) is more preferably an alkyl group having 1 to 4 carbon atoms, a cyano group, or an acid-decomposable group. $n_2$ represents an integer of 0 to 4. When $n_2$ is 2 or greater, plural substituents ($Rb_2$) present in a molecule may be the same as or different from each other, and plural substituents ($Rb_2$) present in a molecule may be bonded to each other to form a ring.

The repeating unit having a lactone group typically has optical isomers, and any optical isomer may be used. In addition, one type of optical isomer may be used alone, or two or more types of optical isomers may be used in combination. In a case where one type of optical isomer is mainly used, the optical purity (ee) is preferably 90% or greater, and more preferably 95% or greater.

The resin (A) may contain or may not contain a repeating unit having a lactone structure, and in a case where the resin (A) contains the repeating unit having a lactone structure, the content of the repeating unit in the resin (A) is preferably within a range of 1 mol % to 70 mol %, more preferably within a range of 3 mol % to 65 mol %, and still more preferably within a range of 5 mol % to 60 mol %, with respect to the entirety of repeating units.

Specific examples of the repeating unit having a lactone structure in the resin (A) are shown below, but the present invention is not limited thereto. In the formulas, Rx represents H, $CH_3$, $CH_2OH$, or $CF_3$.

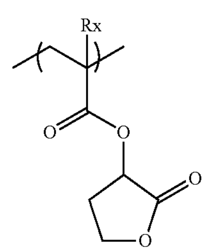

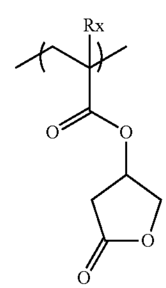

-continued

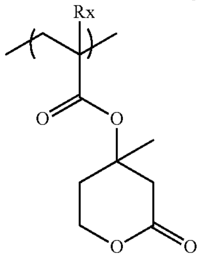

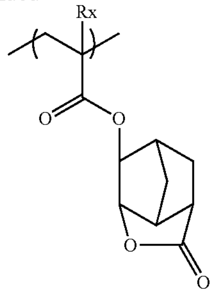

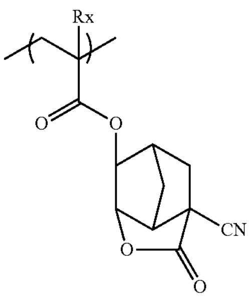

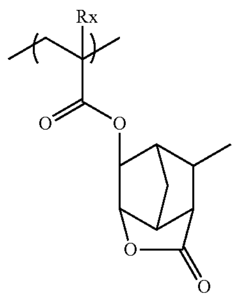

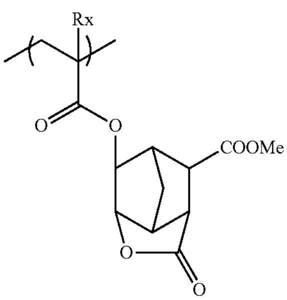

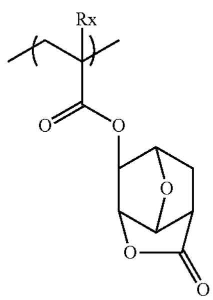

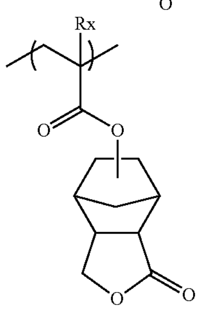

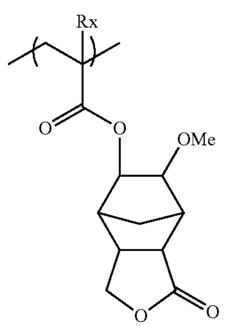

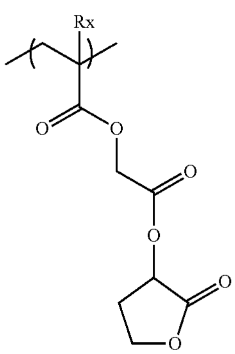

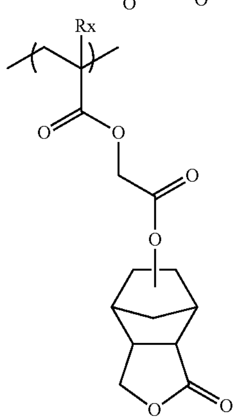

-continued

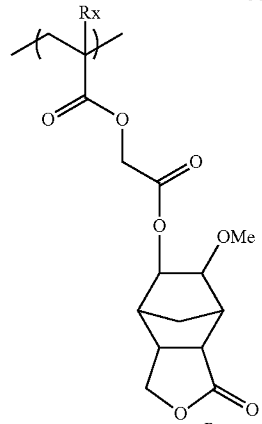

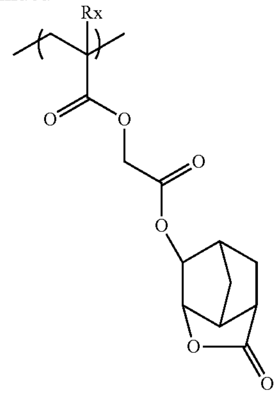

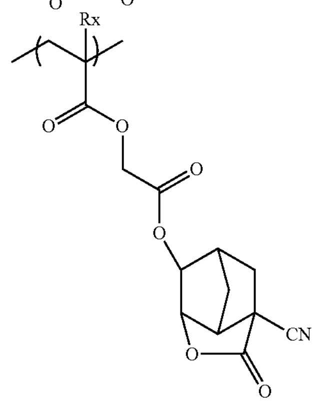

As a sultone group which the resin (A) has, the following General Formula (SL1-1) or (SL-2) is preferable. $Rb_2$ and $n_2$ in the formulas have the same meaning as those in General Formulas (LC1-1) to (LC1-17), respectively.

SL1-1

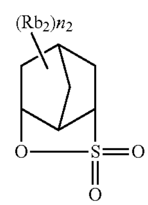

SL1-2

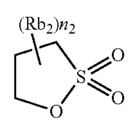

As the repeating unit including a sultone group which the resin (A) has, a repeating unit formed by substituting the lactone group in the repeating unit having an lactone group described above with a sultone group is preferable.

It is also a particularly preferable aspect that a polar group which the repeating unit (c) can have is an acidic group. Preferable examples of the acidic group include a phenolic hydroxyl group, a carboxylic acid group, a sulfonic acid group, a fluorinated alcohol group (for example, a hexafluoroisopropanol group), a sulfonamide group, a sulfonyl imide group, a (alkylsulfonyl)(alkylcarbonyl)methylene group, a (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group. Among these, the repeating unit (c) is more preferably a repeating unit having a carboxyl group. Examples of the repeating unit having an acidic group include a repeating unit of which an acidic group is directly bonded to the main chain of a resin as a repeating unit by acrylic acid or methacrylic acid and a repeating unit of which an acidic group is bonded to the main chain of a resin through a connecting group, and any repeating unit introduced to a terminal of a polymer chain using a polymerization initiator or a chain transfer agent having an acidic group at the time of polymerization is preferable. A repeating unit by acrylic acid or methacrylic acid is particularly preferable.

The acidic group which the repeating unit (c) can have may include or may not include an aromatic ring, and in a case where the acidic group has an aromatic ring, the acidic group is preferably selected from acidic groups other than a phenolic hydroxyl group. In a case where the resin (A) contains a repeating unit having an acidic group, the content of the repeating unit having an acidic group in the resin (A) is typically 1 mol % or greater.

Specific examples of the repeating unit having an acidic group are shown below, but the present invention is not limited thereto.

In the specific examples, Rx represents H, $CH_3$, $CH_2OH$, or $CF_3$.

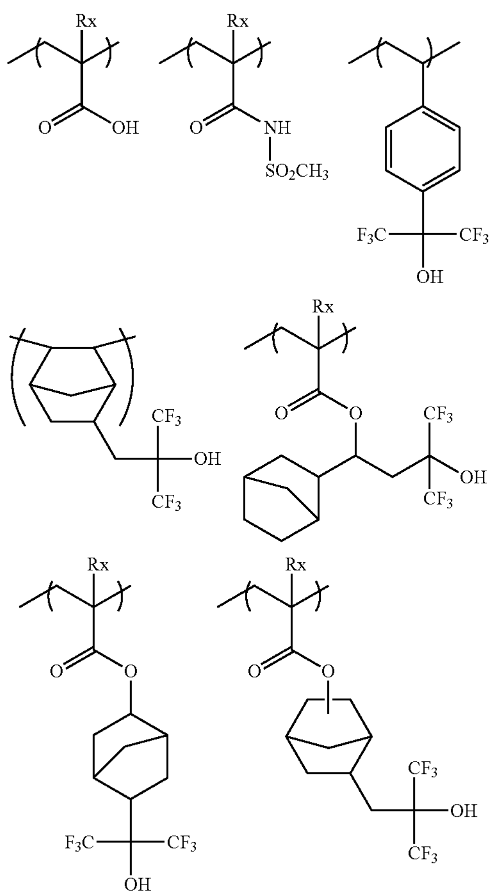

-continued

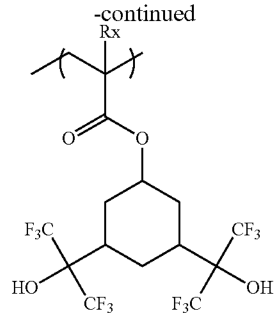

(d) Repeating Unit Having Plurality of Aromatic Rings

The resin (A) may have the repeating unit (d) having a plurality of aromatic rings. Examples of the repeating unit having such an aromatic ring can include repeating units derived from a monomer such as styrene, p-hydroxystyrene, phenyl acrylate, or phenyl methacrylate, and among these, the resin (A) preferably further has the repeating unit (d) having a plurality of aromatic rings represented by the following General Formula (c1).

(c1)

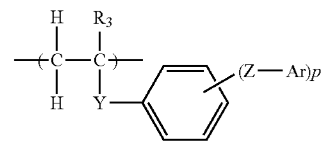

In General Formula (c1), $R_3$ represents a hydrogen atom, an alkyl group, a halogen atom, a cyano group, or a nitro group, Y represents a single bond or a divalent connecting group, Z represents a single bond or a divalent connecting group, Ar represents an aromatic ring group, and p represents an integer of 1 or greater.

The alkyl group represented by $R_3$ may be any one of a linear group and a branched group. Examples of the alkyl group represented by $R_3$ include a methyl group, an ethyl group, an n-propyl group, an i-propyl group, an n-butyl group, a sec-butyl group, a t-butyl group, an n-pentyl group, an n-hexyl group, an n-heptyl group, an n-octyl group, an n-nonyl group, an n-decanyl group, and i-butyl group, and the alkyl group may have a substituent, and preferable examples of the substituent include an alkoxy group, a hydroxyl group, a halogen atom, and a nitro group. Among these, as the alkyl group having a substituent, a $CF_3$ group, an alkyloxycarbonyl methyl group, an alkylcarbonyloxy methyl group, a hydroxymethyl group, or an alkoxymethyl group is preferable.

Examples of the halogen atom represented by $R_3$ include a fluorine atom, a chlorine atom, a bromine atom, and an iodine atom, and a fluorine atom is particularly preferable.

Y represents a single bond or a divalent connecting group, and examples of the divalent connecting group include an ether group (oxygen atom), a thioether group (sulfur atom), an alkylene group, an arylene group, a carbonyl group, a sulfide group, a sulfone group, —COO—, —CONH—, —$SO_2$NH—, —$CF_2$—, —$CF_2CF_2$—, —$OCF_2O$—, —$CF_2OCF_2$—, —SS—, —$CH_2SO_2CH_2$—, —$CH_2COCH_2$—, —$COCF_2CO$—, —COCO—, —OCOO—, —$OSO_2O$—, an amino group (nitrogen atom), an acyl group, an alkylsulfonyl group, —CH═CH—, —C≡C—, aminocarbonylamino group, aminosulfonylamino group, and a group obtained by combining these. Y preferably has 15 or less carbon atoms, and more preferably has 10 or less carbon atoms.

Y is preferably a single bond, a —COO— group, a —COS— group, or a —CONH— group, more preferably a —COO— group or a —CONH— group, and particularly preferably a —COO— group.

Z represents a single bond or a divalent connecting group, and examples of the divalent connecting group include an ether group (oxygen atom), a thioether group (sulfur atom), an alkylene group, an arylene group, a carbonyl group, a sulfide group, a sulfone group, —COO—, —CONH—, —$SO_2$NH—, an amino group (nitrogen atom), an acyl group, an alkylsulfonyl group, —CH═CH—, an aminocarbonylamino group, an aminosulfonylamino group, or a group obtained by combining these.

Z is preferably a single bond, an ether group, a carbonyl group, or a —COO—, more preferably a single bond or an ether group, and particularly preferably a single bond.

Ar represents an aromatic ring group, and specific examples thereof include a phenyl group, a naphthyl group, an anthracenyl group, a phenanthrenyl group, a quinolinyl group, a furanyl group, a thiophenyl group, a fluorenyl-9-on-yl group, an anthraquinonyl group, a phenanthraquinonyl group, and a pyrrole group, and a phenyl group is preferable. The aromatic ring group may further have a substituent, and preferable examples of the substituent include an alkyl group, an alkoxy group, a hydroxyl group, a halogen atom, a nitro group, an acyl group, an acyloxy group, an acylamino group, a sulfonylamino group, an aryl group such as a phenyl group, an aryloxy group, an arylcarbonyl group, and a heterocyclic residue. Among these, a phenyl group is preferable from the viewpoint of suppressing deterioration of exposure latitude or a pattern shape due to out band light.

p is an integer of 1 or greater, and is preferably an integer of 1 to 3.

The repeating unit (d) is more preferably a repeating unit represented by the following Formula (c2).

(c2)

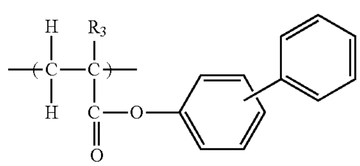

In General Formula (c2), $R_3$ represents a hydrogen atom or an alkyl group. Preferable alkyl group represented by $R_3$ is the same as the alkyl group represented by $R_3$ in General Formula (c1).

Here, regarding extreme ultraviolet rays (EUV light) exposure, leakage light (out of band light) generated in a region of ultraviolet rays having a wavelength of 100 nm to 400 nm deteriorates the surface roughness, and as a result, the resolution or the LWR performance tends to be reduced due to a bridge between patterns or disconnection of a pattern.

However, the aromatic ring in the repeating unit (d) functions as an internal filter capable of absorbing the out of band light. Accordingly, the resin (A) preferably contains the repeating unit (d) from the viewpoint of high resolution and low LWR.

The repeating unit (d) preferably does not include a phenolic hydroxyl group (hydroxyl group directly bonded to an aromatic ring) from the viewpoint of obtaining high resolution.

Specific examples of the repeating unit (d) are shown below, but the present invention is not limited thereto.

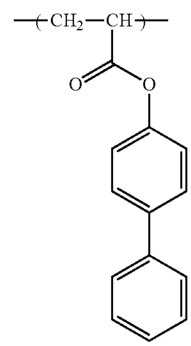

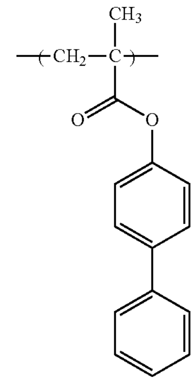

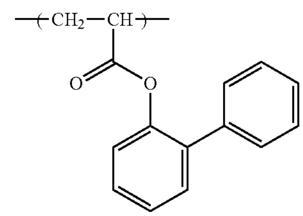

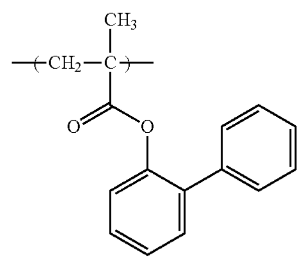

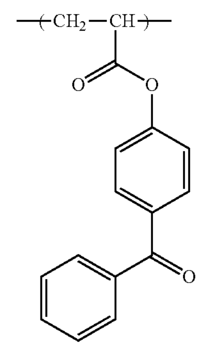

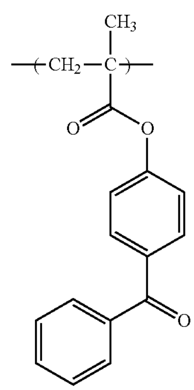

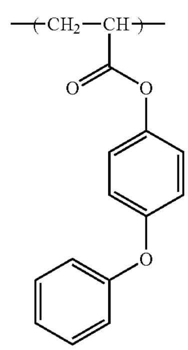

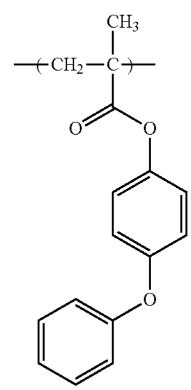

-continued
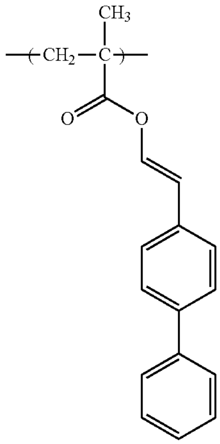
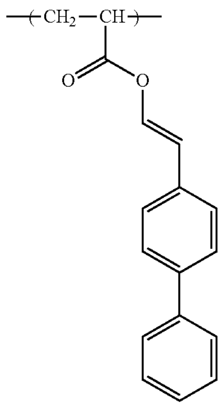
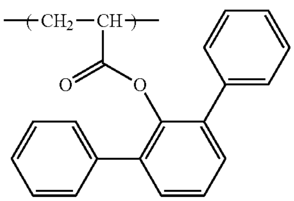
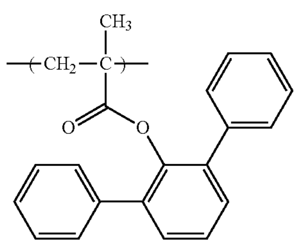
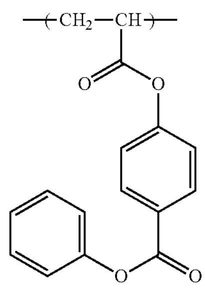
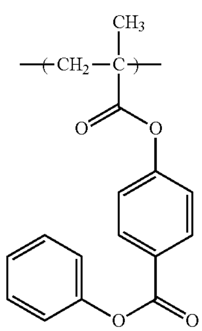
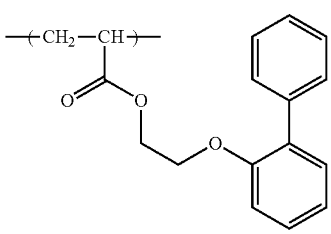
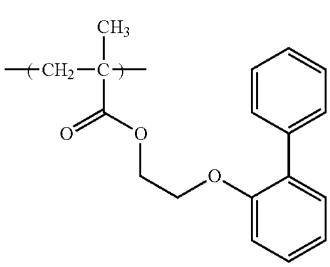
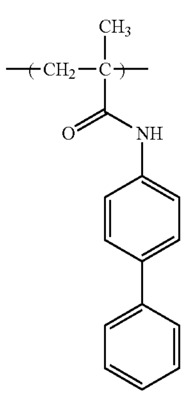
-continued
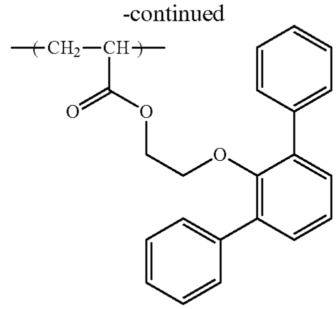
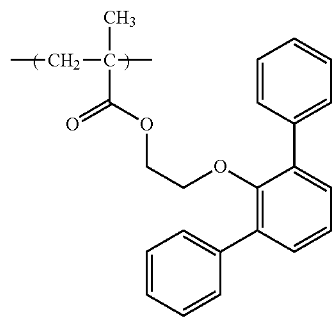
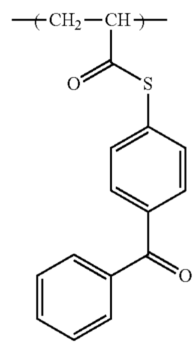
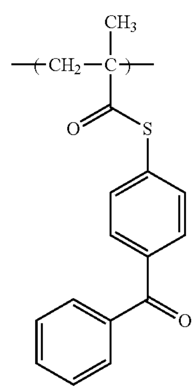
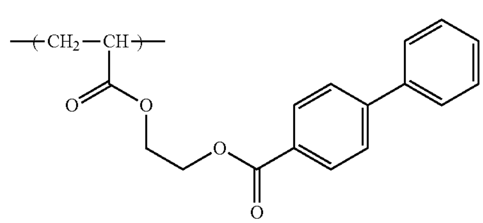
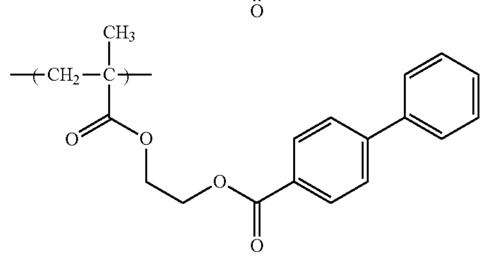

-continued
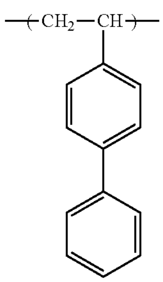
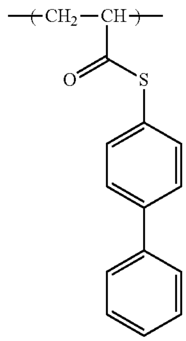
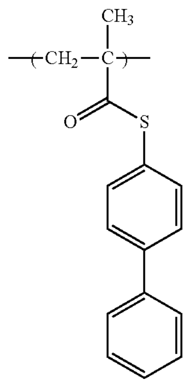
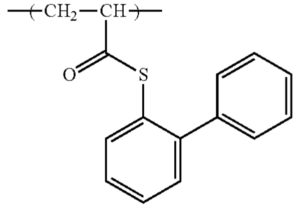
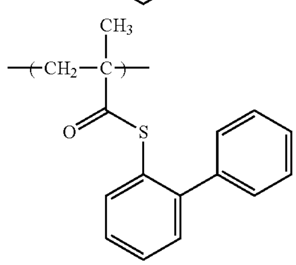
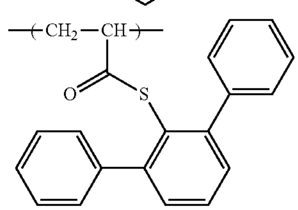
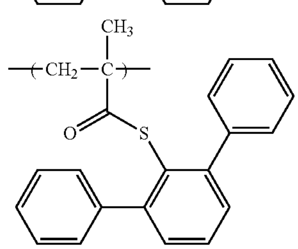
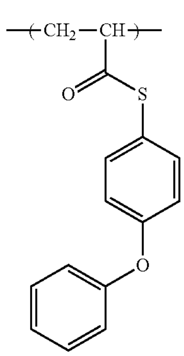
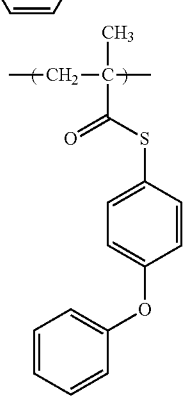
-continued
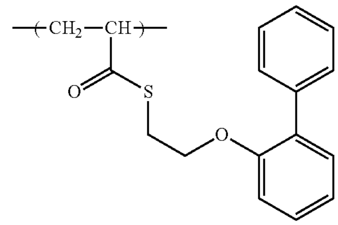
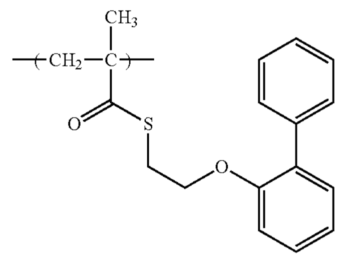
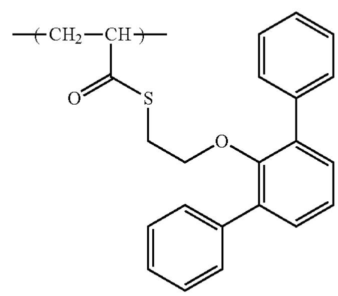
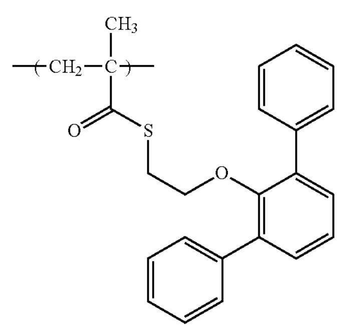
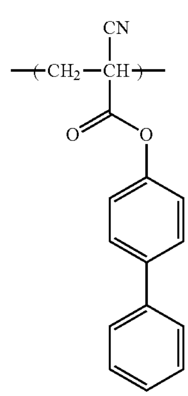
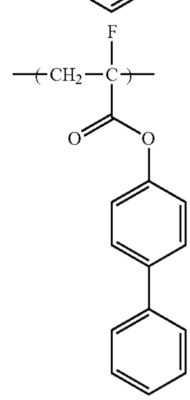
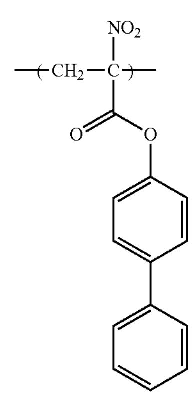

-continued

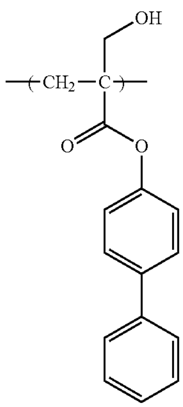

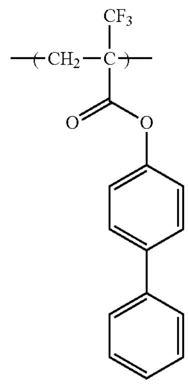

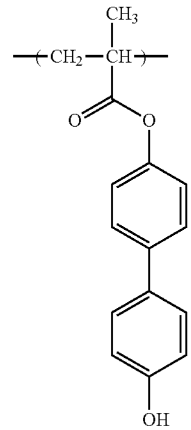

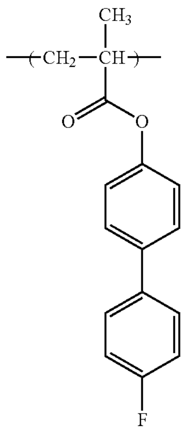

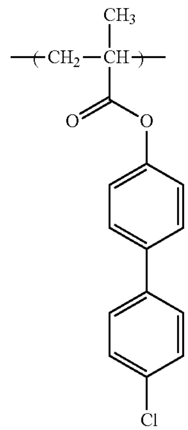

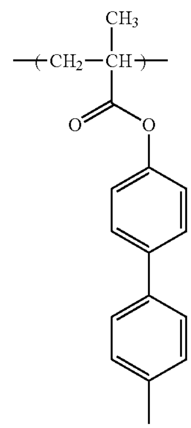

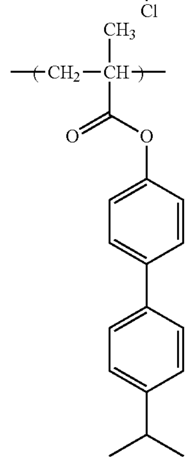

The resin (A) may contain or may not contain the repeating unit (d), and in a case where the resin (A) contains the repeating unit (d), the content of the repeating unit (d) is preferably within a range of 1 mol % to 30 mol %, more preferably within a range of 1 mol % to 20 mol %, and still more preferably within a range of 1 mol % to 15 mol %, with respect to the entirety of repeating units in the resin (A). The repeating unit (d) included in the resin (A) may be included in combination of two or more types thereof.

The resin (A) in the present invention may suitably have a repeating unit other than the repeating units (a), (c), and (d). One example of such a repeating unit is a repeating unit which has an alicyclic hydrocarbon structure without a polar group (for example, an acid group, a hydroxyl group, or a cyano group described above) and does not exhibit acid-decomposability. Thus, the solubility of a resin is suitably adjusted in development using a developer including an organic solvent. As such a repeating unit, the repeating unit represented by General Formula (IV) is exemplified.

(IV)

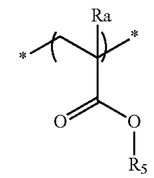

In General Formula (IV), $R_5$ has at least one ring structure, and represents a hydrocarbon group not having a polar group.

Ra represents a hydrogen atom, an alkyl group, or a —$CH_2$—O—$Ra_2$ group. In the formula, $Ra_2$ represents a hydrogen atom, an alkyl group, or an acyl group. Ra is preferably a hydrogen atom, a methyl group, a hydroxymethyl group, or a trifluoromethyl group, and particularly preferably a hydrogen atom or a methyl group.

A monocyclic hydrocarbon group or a polycyclic hydrocarbon group is included in the ring structure which $R_5$ has. Examples of the monocyclic hydrocarbon group include a cycloalkyl group having 3 to 12 carbon atoms such as a cyclopentyl group, a cyclohexyl group, a cycloheptyl group, or a cyclooctyl group, and a cycloalkenyl group having 3 to 12 carbon atoms such as a cyclohexenyl group. The monocyclic hydrocarbon group is preferably a monocyclic hydrocarbon group having 3 to 7 carbon atoms, and more preferably a cyclopentyl group or a cyclohexyl group.

A ring-aggregated hydrocarbon group or a crosslinked cyclic hydrocarbon group is included in the polycyclic hydrocarbon group, and examples of the ring-aggregated hydrocarbon group include a bicyclohexyl group and a perhydronaphthalenyl group. Examples of the crosslinked cyclic hydrocarbon ring include bicyclic hydrocarbon ring such as a pinane ring, a bornane ring, a norpinane ring, a norbornane ring, and a bicyclooctane ring (a bicyclo[2.2.2]octane ring, a bicyclo[3.2.1]octane ring, or the like), tricyclic hydrocarbon rings such as a homobledane ring, an adamantane ring, a tricyclo[5.2.1.$0^{2,6}$]decane ring, and a tricyclo[4.3.1.$1^{2,5}$]undecane ring, and tetracyclic hydrocarbon rings such as a tetracyclo[4.4.0.$1^{2,5}$.$1^{7,10}$]dodecane ring, and a perhydro-1,4-methano-5,8-methanonaphthalene ring. In addition, a condensed cyclic hydrocarbon ring, for example, a fused ring obtained by condensation of a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring, or a perhydrophenalene ring, is also included in the crosslinked cyclic hydrocarbon ring.

Preferable examples of the crosslinked cyclic hydrocarbon ring include a norbornyl group, an adamantyl group, a bicyclooctanyl group, and a tricyclo[5.2.1.$0^{2,6}$]decanyl group. More preferable examples of the crosslinked cyclic hydrocarbon ring include a norbornyl group and an adamantyl group.

The alicyclic hydrocarbon group may have a substituent, and preferable examples of the substituent include a halogen atom, an alkyl group, a hydroxyl group in which a hydrogen atom is substituted, and an amino group in which a hydrogen atom is substituted. Preferable examples of the halogen atom include a bromine atom, a chlorine atom, and a fluorine atom, and preferable examples of the alkyl group include a methyl group, an ethyl group, a butyl group, and a t-butyl group. The alkyl group may further have a substituent, and examples of the substituent which the alkyl group may further have can include a halogen atom, an alkyl group, a hydroxyl group in which a hydrogen atom is substituted, and an amino group in which a hydrogen atom is substituted.

Examples of the substituent for a hydrogen atom include an alkyl group, a cycloalkyl group, an aralkyl group, a substituted methyl group, a substituted ethyl group, an alkoxycarbonyl group, and an aralkyloxycarbonyl group. Preferable examples of the alkyl group include alkyl groups having 1 to 4 carbon atoms, preferable examples of the substituted methyl group include a methoxymethyl group, a methoxythiomethyl group, a benzyloxymethyl group, a t-butoxymethyl group, and a 2-methoxyethoxymethyl group, preferable examples of the substituted ethyl group include a 1-ethoxyethyl group and a 1-methyl-1-methoxyethyl group, preferable examples of the acyl group include aliphatic acyl groups having 1 to 6 carbon atoms such as a formyl group, an acetyl group, a propionyl group, a butyryl group, an isobutyryl group, a valeryl group, and a pivaloyl group, and examples of the alkoxycarbonyl group include alkoxycarbonyl groups having 1 to 4 carbon atoms.

Although the resin (A) may contain or may not contain a repeating unit which has an alicyclic hydrocarbon structure without a polar group and does not exhibit acid-decomposability, in a case where the resin (A) contains the repeating unit, the content of the repeating unit is preferably 1 mol % to 20 mol %, and more preferably 5 mol % to 15 mol %, with respect to the entirety of repeating units in the resin (A).

Specific examples of the repeating unit which has an alicyclic hydrocarbon structure without a polar group and does not exhibit acid-decomposability are shown below, but the present invention is not limited thereto. In the formulas, Ra represents H, $CH_3$, $CH_2OH$, or $CF_3$.

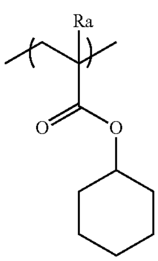
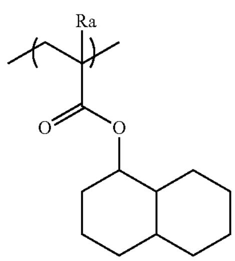
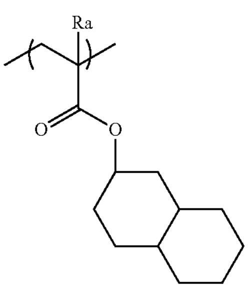
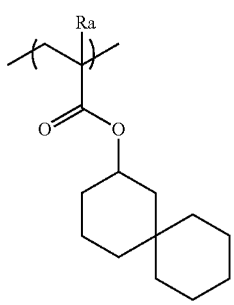

-continued

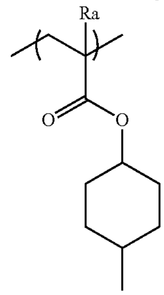
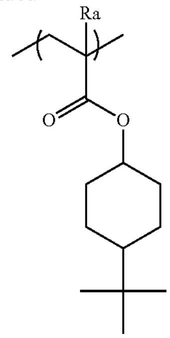
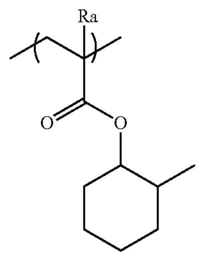
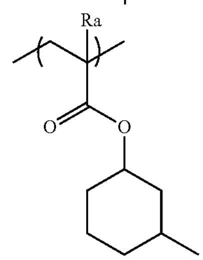
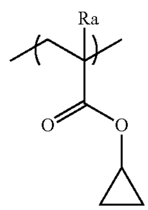
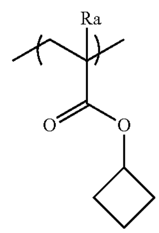
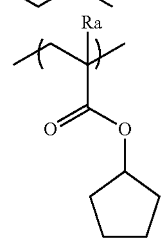
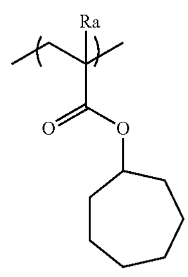
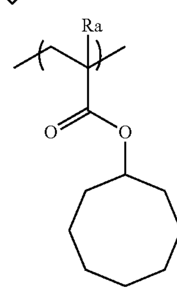
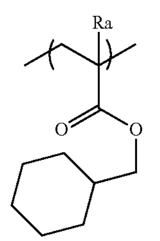
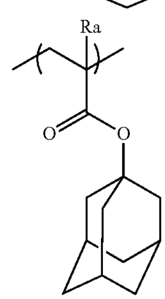
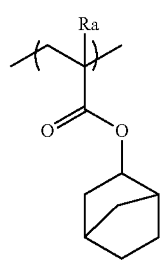
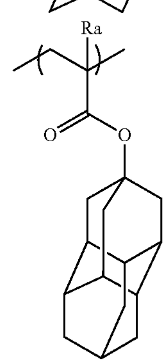

-continued

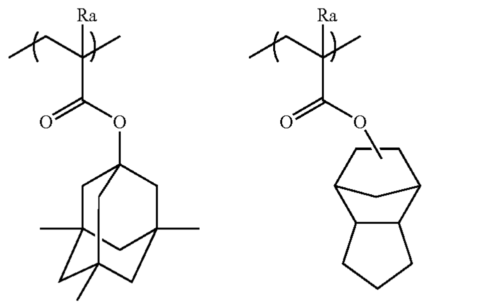

In addition, the resin (A) may include the following monomer component in consideration of rise of Tg, improvement of dry etching resistance, and effect of an internal filter with respect to the out of band light described above.

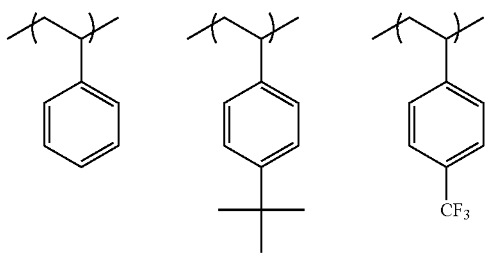

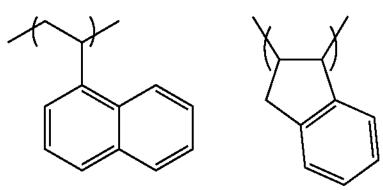

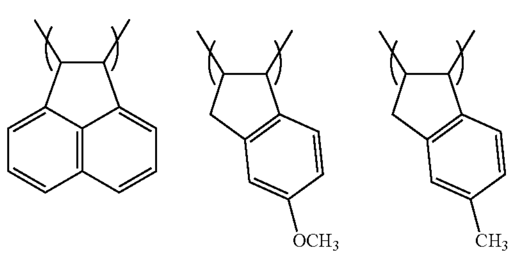

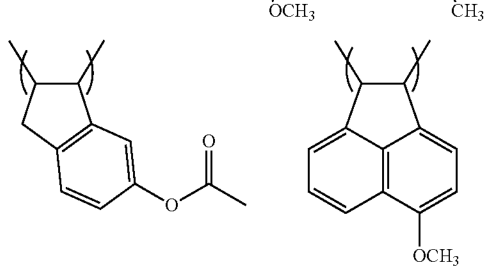

-continued

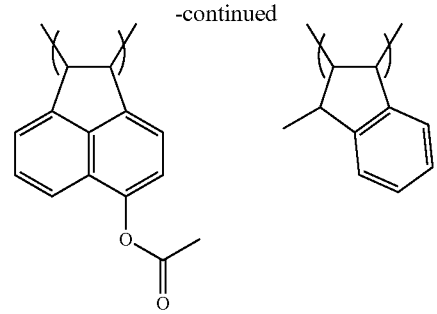

In the resin (A) used in the composition of the present invention, the content molar ratio of respective repeating structural units is suitably set to adjust dry etching resistance or standard developer suitability of a resist, adhesion to substrate, a resist profile, and resolving power, heat resistance, and sensitivity which are properties generally required for a resist.

The form of the resin (A) of the present invention may be any form of a random form, a block form, a comb form, and a star form.

The resin (A) can be synthesized by, for example, polymerizing an unsaturated monomer corresponding to each structure through radical polymerization, cationic polymerization, or anionic polymerization. In addition, by performing a polymer reaction after polymerization is performed using an unsaturated monomer corresponding to a precursor of each structure, a target resin can also be obtained.

Examples of a general synthetic method include a collective polymerization method of performing polymerization by dissolving an unsaturated monomer and a polymerization initiator in a solvent and heating the resultant product and a dropping polymerization method of adding a solution containing an unsaturated monomer and an polymerization initiator dropwise to a heated solvent over a period of 1 hour to 10 hours, and the dropping polymerization method is preferable.

Examples of the solvent used in the polymerization can include solvents which can be used in preparing an active light sensitive or radiation sensitive resin composition described below, and it is more preferable that the polymerization is performed using the same solvent as the solvent (D) used in the composition of the present invention. Thus, occurrence of particles at the time of storage can be suppressed.

The polymerization reaction is preferably performed in an inert gas atmosphere such as nitrogen or argon. The polymerization is initiated using a commercially available radical initiator as a polymerization initiator (azo-based initiator, peroxide, or the like). As the radical initiator, an azo-based initiator is preferable, and an azo-based initiator having an ester group, a cyano group, or a carboxyl group is preferable. Preferable examples of the initiator include azobisisobutyronitrile, azobisdimethylvaleronitrile, and dimethyl 2,2'-azobis(2-methylpropionate). As necessary, polymerization may be performed in the presence of a chain transfer agent (for example, alkyl mercaptan).

The concentration of the reaction is 5% by mass to 70% by mass, and preferably 10% by mass to 50% by mass. The reaction temperature is typically 10° C. to 150° C., preferably 30° C. to 120° C., and more preferably 40° C. to 100° C.

The reaction time is typically 1 hour to 48 hours, preferably 1 hour to 24 hours, and more preferably 1 hour to 12 hours.

After the reaction ends, cooling is performed to room temperature, and purification is performed. A usual method such as a liquid-liquid extraction method in which a residual monomer or an oligomer component is removed by washing with water or combining suitable solvents, a purification method in a solution state such as ultrafiltration which extracts and removes only substances having a specific molecular weight or less, a reprecipitation method in which a residual monomer or the like is removed by adding a resin solution dropwise to a poor solvent to coagulate the resin in the poor solvent, or a purification method in a solid state in which filtered resin slurry is washed with a poor solvent can be applied to the purification. For example, by bringing into contact with a solvent (poor solvent), which does poorly dissolve or does not dissolve the resin, corresponding to 10 times or less the volume amount of the reaction solution, or preferably 5 times to 10 times the volume amount of the reaction solution, the resin is solidified and precipitated.

The solvent (precipitation or reprecipitation solvent) used in precipitation or reprecipitation operation from the polymer solution may be a poor solvent for the polymer, and depending on the type of polymer, the solvent can be suitably selected from hydrocarbon, halogenated hydrocarbon, a nitro compound, ether, ketone, ester, carbonate, alcohol, carboxylic acid, water, and a mixed solvent including these solvents and used. Among these, as a precipitation or reprecipitation solvent, a solvent including at least alcohol (in particular, methanol) or water is preferable.

Although the amount of precipitation or reprecipitation solvent used can be suitably selected in consideration of efficiency or yield, the amount used is generally 100 parts by mass to 10000 parts by mass, preferably 200 parts by mass to 2000 parts by mass, and more preferably 300 parts by mass to 1000 parts by mass, with respect to 100 parts by mass of the polymer solution.

Although the temperature at the time of precipitation or reprecipitation can be suitably selected in consideration of efficiency or operability, the temperature is typically about 0° C. to 50° C., and preferably around room temperature (for example, about 20° C. to 35° C.). Precipitation or reprecipitation operation can be performed by a known method such as a batch type or a continuous type using a generally used mixing vessel such as a stirring vessel.

The precipitated or reprecipitated polymer is typically subjected to generally used solid-liquid separation such as filtration or centrifugation, dried, and then, provided for use. The filtration is preferably performed under pressure using a solvent-resistant filter medium. The drying is performed at a temperature of about 30° C. to 100° C. at normal pressure or under reduced pressure (preferably, under reduced pressure), and preferably at a temperature of about 30° C. to 50° C.

Moreover, once the resin is precipitated, and after being separated, the resin is again dissolved in a solvent, and may be brought into contact with a solvent which does poorly dissolve or does not dissolve the resin. That is, a method which includes a step of precipitating a resin by bringing into contact with solvent in which the polymer is poorly soluble or insoluble after the radical polymerization reaction ends (step a), a step of separating the resin from the solution (step b), a step of preparing a resin solution (A) by dissolving the resin in a solvent (step c), thereafter, by bringing the resin solution A into contact with a solvent in which the resin is poorly soluble or insoluble, corresponding to 10 times or less the volume amount (preferably 5 times or less the volume amount) of the resin solution A, the resin solid is precipitated (step d), and a step of separating the precipitated resin (step e) may be performed.

The polymerization reaction is preferably performed in an inert gas atmosphere such as nitrogen or argon. The polymerization is initiated using a commercially available radical initiator as a polymerization initiator (azo-based initiator, peroxide, or the like). As the radical initiator, an azo-based initiator is preferable, and an azo-based initiator having an ester group, a cyano group, or a carboxyl group is more preferable. Preferable examples of the initiator include azobisisobutyronitrile, azobisdimethylvaleronitrile, and dimethyl 2,2'-azobis(2-methylpropionate). As necessary, an initiator is additionally added or added by being divided, and after the reaction ends, the reaction product is put into a solvent, and a target polymer is recovered by a powder recovery method or a solid recovery method. The concentration of the reaction is 5% by mass to 50% by mass, and preferably 10% by mass to 30% by mass. The reaction temperature is typically 10° C. to 150° C., preferably 30° C. to 120° C., and more preferably 60° C. to 100° C.

Although the molecular weight of the resin (A) according to the present invention is not particularly limited, the weight average molecular weight is preferably within a range of 1000 to 100000, more preferably within a range of 1500 to 60000, and particularly preferably within a range of 2000 to 30000. When the weight average molecular weight is within a range of 1000 to 100000, degradation of heat resistance or dry etching resistance can be prevented, and degradation of developability or degradation of film-forming properties due to increase in viscosity can be prevented. Here, the weight average molecular weight of a resin is a molecular weight in terms of polystyrene measured by using GPC (carrier: THF or N-methyl-2-pyrrolidone (NMP)).

The dispersity (Mw/Mn) is preferably 1.00 to 5.00, more preferably 1.00 to 3.50, and still more preferably 1.00 to 2.50. As the molecular weight distribution is lower, the resolution and the resist shape become better, and the side wall of the resist pattern becomes smoother, and thus, the roughness becomes excellent.

The resin (A) can be used alone, or two or more types thereof can be used in combination. The content of the resin (A) is preferably 20% by mass to 99% by mass, more preferably 30% by mass to 99% by mass, and still more preferably 40% by mass to 99% by mass, based on the total solid content in the active light sensitive or radiation sensitive resin composition.

(B) Compound that Generates Acid by Active Light or Radiation

The composition of the present invention preferably contains a compound (B) that generates an acid by active light or radiation (hereinafter, referred to as an "acid generator").

Although the acid generator (B) is not particularly limited as long as it is a known acid generator, the acid generator is preferably a compound which generates an organic acid, for example, at least any one of sulfonic acid, bis(alkylsulfonyl) imide, and tris(alkylsulfonyl)methide by irradiation with active light or radiation, preferably an electron beam or extreme ultraviolet rays.

More preferably, the compounds represented by the following General Formula (ZI), (ZII), and (ZIII) can be exemplified.

(ZI)

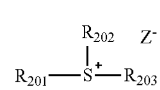

-continued

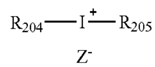

(ZII)

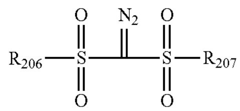

(ZIII)

In General Formula (ZI), each of $R_{201}$, $R_{202}$, and $R_{203}$ independently represents an organic group.

The organic group represented by each of $R_{201}$, $R_{202}$, and $R_{203}$ generally has 1 to 30 carbon atoms, and preferably has 1 to 20 carbon atoms.

Two of $R_{201}$ to $R_{203}$ may be bonded to each other to form a ring structure, and an oxygen atom, a sulfur atom, an ester bond, an amide bond, or a carbonyl group may be included in the ring. Examples of the group that two of $R_{201}$ to $R_{203}$ form by bonding to each other include an alkylene group (for example, a butylene group, and a pentylene group).

$Z^-$ represents a non-nucleophilic anion (anion which is significantly low in ability causing a nucleophilic reaction).

Examples of the non-nucleophilic anion include a sulfonate anion (an aliphatic sulfonate anion, an aromatic sulfonate anion, or a camphorsulfonate anion), a carboxylate anion (an aliphatic carboxylate anion, an aromatic carboxylate anion, or an aralkylcarboxylate anion), a sulfonylimide anion, a bis(alkylsulfonyl)imide anion, and a tris(alkylsulfonyl)methide anion.

The aliphatic portion in the aliphatic sulfonate anion and the aliphatic carboxylate anion, may be an alkyl group or a cycloalkyl group, and preferable examples thereof include a linear or branched alkyl group having 1 to 30 carbon atoms and a cycloalkyl group having 3 to 30 carbon atoms.

The aromatic group in the aromatic sulfonate anion and the aromatic carboxylate anion is preferably an aryl group having 6 to 14 carbon atoms, and examples thereof can include a phenyl group, a tolyl group, and a naphthyl group.

The alkyl group, the cycloalkyl group, and the aryl group described above may have a substituent. Specific examples thereof can include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). Regarding the aryl group or a ring structure which each group has, as a substituent, an alkyl group (which preferably has 1 to 15 carbon atoms) can be exemplified.

The aralkyl group in the aralkylcarboxylate anion is preferably an aralkyl group having 7 to 12 carbon atoms, and examples thereof can include a benzyl group, a phenethyl group, a naphthylmethyl group, a naphthylethyl group, and a naphthylbutyl group.

Examples of the sulfonylimide anion can include a saccharin anion.

The alkyl group in a bis(alkylsulfonyl)imide anion and a tris(alkylsulfonyl)methide anion is preferably an alkyl group having 1 to 5 carbon atoms. Examples of the substituent of the alkyl group can include a halogen atom, an alkyl group substituted with a halogen atom, an alkoxy group, an alkylthio group, an alkyloxysulfonyl group, an aryloxysulfonyl group, and a cycloalkylaryloxysulfonyl group, and a fluorine atom or an alkyl group substituted with a fluorine atom is preferable.

In addition, the alkyl groups in bis(alkylsulfonyl)imide anion may be bonded to each other to form a ring structure. As a result, the acid strength increases.

Examples of other non-nucleophilic anions can include fluorophosphate (for example, $PF_6^-$), fluoroborate (for example, $BF_4^-$), and fluoroantimonate (for example, $SbF_6^-$).

As the non-nucleophilic anion, an aliphatic sulfonate anion in which at least α-position of sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, or a tris(alkylsulfonyl)methide anion in which the alkyl group is substituted with a fluorine atom is preferable. The non-nucleophilic anion is more preferably a perfluoro aliphatic sulfonate anion (which more preferably has 4 to 8 carbon atoms) or a benzenesulfonate anion having a fluorine atom, and still more preferably a nonafluorobutanesulfonate anion, a perfluorooctanesulfonate anion, a pentafluorobenzenesulfonate anion, or a 3,5-bis(trifluoromethyl)benzenesulfonate anion.

From the viewpoint of acid strength, the pKa of the generated acid is preferably −1 or less for sensitivity enhancement.

In addition, as the non-nucleophilic anion, the anion represented by the following General Formula (AN1) is also exemplified as a preferable aspect.

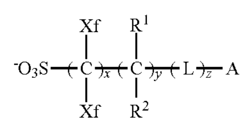

(AN1)

In the formula, each of Xf's independently represents a fluorine atom or an alkyl group substituted with at least one fluorine atom.

Each of $R^1$ and $R^2$ independently represents a hydrogen atom, a fluorine atom, or an alkyl group, and in a case where a plurality of $R^1$'s and $R^2$'s are present, $R^1$'s and $R^2$'s may be the same as or different from each other.

L represents a divalent connecting group, and in a case where a plurality of L's are present, L's may be the same as or different from each other.

A represents a cyclic organic group.

x represents an integer of 1 to 20, y represents an integer of 0 to 10, and z represents an integer of 0 to 10.

General Formula (AN1) will be described in more detail.

The alkyl group in the alkyl group substituted with a fluorine atom represented by Xf preferably has 1 to 10 carbon atoms, and more preferably 1 to 4 carbon atoms. In addition, the alkyl group substituted with a fluorine atom represented by Xf is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, a fluorine atom or $CF_3$ is preferable. In particular, both of Xf's are preferably fluorine atoms.

The alkyl group represented by $R^1$ or $R^2$ may have a substituent (preferably a fluorine atom), and the alkyl group is preferably an alkyl group having 1 to 4 carbon atoms, and more preferably a perfluoroalkyl group having 1 to 4 carbon atoms. Specific examples of the alkyl group having a substituent, represented by $R^1$ or $R^2$, include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

Each of $R^1$ and $R^2$ is preferably a fluorine atom or $CF_3$.

x is preferably 1 to 10, and more preferably 1 to 5.

y is preferably 0 to 4, and more preferably 0.

z is preferably 0 to 5, and more preferably 0 to 3.

The divalent connecting group represented by L is not particularly limited, and examples thereof can include —COO—, —OCO—, —CO—, —O—, —S—, —SO—, —$SO_2$—, an alkylene group, a cycloalkylene group, an alkenylene group, and a connecting group obtained by connecting a plurality of these, and a connecting group having 12 or less total carbon atoms is preferable. Among these, —COO—, —OCO—, —CO—, or —O— is preferable, and —COO— or —OCO— is more preferable.

The cyclic organic group represented by A is not particularly limited as long as it has a ring structure, and examples thereof include an alicyclic group, an aryl group, and a heterocyclic group (which includes not only a heterocyclic group having aromaticity but also a heterocyclic group having no aromaticity).

The alicyclic group may be monocyclic or polycyclic, and as the alicyclic group, a monocyclic cycloalkyl group such as a cyclopentyl group, a cyclohexyl group, or a cyclooctyl group, or polycyclic cycloalkyl groups such as a norbornyl group, a tricyclodecanyl group, a tetracyclodecanyl group, a tetracyclododecanyl group, or an adamantyl group is preferable. Among these, an alicyclic group with a bulky structure having 7 or greater carbon atoms such as a norbornyl group, a tricyclodecanyl group, a tetracyclodecanyl group, a tetracyclododecanyl group, or an adamantyl group is preferable from the viewpoint of being capable of suppressing in-film diffusibility in a heating step after exposure and MEEF improvement.

Examples of the aryl group include a benzene ring group, a naphthalene ring group, a phenanthrene ring group, and an anthracene ring group.

Examples of the heterocyclic group include groups derived from a furan ring, a thiophene ring, a benzofuran ring, a benzothiophene ring, a dibenzofuran ring, a dibenzothiophene ring, and a pyridine ring. Among these, a group derived from a furan ring, a thiophene ring, or a pyridine ring is preferable.

In addition, as the cyclic organic group, a lactone structure can also be exemplified, and specific examples thereof can include the lactone structures represented by General Formulas (LC1-1) to (LC1-17), which the resin (A) may have.

Examples of the cyclic organic group may have a substituent, and examples of the substituent include an alkyl group (which may be linear, branched, or cyclic, and preferably has 1 to 12 carbon atoms), a cycloalkyl group (which may be a monocycle, a polycycle, or a spiro ring, and preferably has 3 to 20 carbon atoms), an aryl group (which preferably has 6 to 14 carbon atoms), a hydroxy group, an alkoxy group, an ester group, an amide group, a urethane group, a ureido group, a thioether group, a sulfonamide group, and a sulfonic acid ester group. Moreover, the carbon (carbon which contributes to formation of a ring) configuring the cyclic organic group may be a carbonyl carbon.

Examples of the organic group represented by $R_{201}$, $R_{202}$, or $R_{203}$ include an aryl group, an alkyl group, and a cycloalkyl group.

Preferably, at least one of $R_{201}$, $R_{202}$, and $R_{203}$ is an aryl group, and more preferably, all of three are aryl groups. Examples of the aryl group include heteroaryl groups such as a indole residue and a pyrrole residue, in addition to a phenyl group and a naphthyl group. Preferable examples of the alkyl group or the cycloalkyl group represented by each of $R_{201}$ to $R_{203}$ can include a linear or branched alkyl group having 1 to 10 carbon atoms and a cycloalkyl group having 3 to 10 carbon atoms. More preferable examples of the alkyl group can include a methyl group, an ethyl group, an n-propyl group, an i-propyl group, and an n-butyl group. More preferable examples of the cycloalkyl group can include a cyclopropyl group, a cyclobutyl group, a cyclopentyl group, a cyclohexyl group, and a cycloheptyl group. These groups may further contain a substituent. Examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms), but the present invention is not limited thereto.

In addition, in a case where two of $R_{201}$ to $R_{203}$ are bonded to each other to form a ring structure, the structure represented by the following General Formula (A1) is preferable.

(A1)

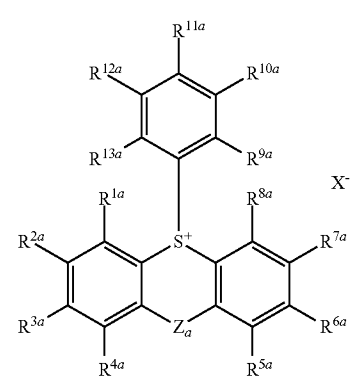

In General Formula (A1), each of $R^{1a}$ to $R^{13a}$ independently represents a hydrogen atom or a substituent.

One to three of $R^{1a}$ to $R^{13a}$ are preferably not hydrogen atoms, and any one of $R^{9a}$ to $R^{13a}$ is more preferably not a hydrogen atom.

Za represents a single bond or a divalent connecting group.

$X^-$ has the same meaning as $Z^-$ in General Formula (ZI).

Specific examples in a case where each of $R^{1a}$ to $R^{13a}$ is not a hydrogen atom include a halogen atom, a linear, branched, or cyclic alkyl group, an alkenyl group, an alkynyl group, aryl group, a heterocyclic group, a cyano group, a nitro group, carboxyl group, an alkoxy group, an aryl oxy group, a silyloxy group, a heterocyclic oxy group, an acyloxy group, a carbamoyloxy group, an alkoxycarbonyloxy group, an aryloxy carbonyloxy group, an amino group (including an anilino group), an ammonio group, an acylamino group, an aminocarbonyl amino group, an alkoxycarbonyl amino group, an aryloxy carbonyl amino group, a sulfamoyl amino group, an alkyl or arylsulfonyl amino group, a mercapto group, an alkylthio group, an arylthio group, a heterocyclic thio group, a sulfamoyl group, a sulfo group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—$B(OH)_2$), a phosphato group (—$OPO(OH)_2$), a sulfato group (—$OSO_3H$), and other known substituents.

As a case where each of $R^{1a}$ to $R^{13a}$ is not a hydrogen atom, each of $R^{1a}$ to $R^{13a}$ is preferably a linear, branched, or cyclic alkyl group substituted with a hydroxyl group.

Examples of the divalent connecting group represented by Za include an alkylene group, an arylene group, a carbonyl group, a sulfonyl group, a carbonyloxy group, a carbonylamino group, sulfonylamide group, an ether bond, a thioether bond, an amino group, a disulfide group, —$(CH_2)_n$—CO—, —$(CH_2)_n$—$SO_2$—, —CH═CH—, an aminocarbonylamino group, and an aminosulfonylamino group (n is an integer of 1 to 3).

Moreover, when at least one of $R_{201}$ to $R_{203}$ is not an aryl group, examples of a preferable structure can include cationic structures of compounds exemplified in paragraphs "0046" to "0048" of JP2004-233661A, and paragraphs "0040" to "0046" of JP2003-35948A, and exemplified as Formulas (I-1) to (I-70) in the specification of US2003/0224288A1, and compounds exemplified as Formulas (IA-1) to (IA-54), and Formulas (IB-1) to (IB-24) in the specification of US2003/0077540A1.

In General Formulas (ZII) and (ZIII), each of $R_{204}$ to $R_{207}$ independently represents an aryl group, an alkyl group, or a cycloalkyl group.

The aryl group, the alkyl group, and the cycloalkyl group represented by each of $R_{204}$ to $R_{207}$ are the same as the aryl group described as the aryl group, the alkyl group, and the cycloalkyl group represented by each of $R_{201}$ to $R_{203}$ in the compound (ZI).

The aryl group, the alkyl group, and the cycloalkyl group represented by each of $R_{204}$ to $R_{207}$ may have a substituent. Examples of the substituent include the substituents that the aryl group, the alkyl group, and the cycloalkyl group represented by each of $R_{201}$ to $R_{203}$ described above in the compound (ZI) may have.

$Z^-$ represent a non-nucleophilic anion, and as $Z^-$, the same as the non-nucleophilic anion in General Formula (ZI) can be exemplified.

As the acid generator, the compounds represented by the following General Formula (ZIV), (ZV), or (ZVI) are also exemplified.

$$Ar_3—SO_2—SO_2—Ar_4 \quad (ZIV)$$

(ZV)

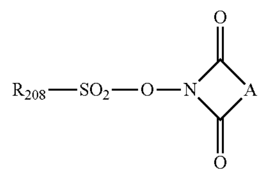

(ZVI)

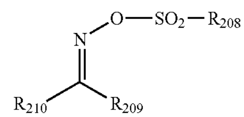

In General Formulas (ZIV) to (ZVI), each of $Ar_3$ and $Ar_4$ independently represents an aryl group.

Each of $R_{208}$, $R_{209}$, and $R_{210}$ independently represents an alkyl group, a cycloalkyl group, or an aryl group.

A represents an alkylene group, an alkenylene group, or an arylene group.

Specific examples of the aryl group represented by $Ar_a$, $Ar_4$, $R_{208}$, $R_{209}$, or $R_{210}$ include the same as the specific examples of the aryl group represented by $R_{201}$, $R_{202}$, or $R_{203}$ in General Formula (ZI).

Specific examples of the alkyl group and the cycloalkyl group represented by $R_{208}$, $R_{209}$, and $R_{210}$ respectively include the same as the specific examples of the alkyl group and the cycloalkyl group represented by $R_{201}$, $R_{202}$, and $R_{203}$ in the General Formula (ZI).

Examples of the alkylene group represented by A can include alkylene groups having 1 to 12 carbon atoms (for example, a methylene group, an ethylene group, a propylene group, an isopropylene group, a butylene group, and an isobutylene group), examples of the alkenylene group represented by A can include alkenylene groups having 2 to 12 carbon atoms (for example, an ethenylene group, a propenylene group, and a butenylene group), and examples of the arylene group represented by A can include arylene groups having 6 to 10 carbon atoms (for example, a phenylene group, a tolylene group, and a naphthylene group).

Particularly preferable examples of the acid generator are shown below.

(z1)

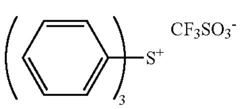

(z2)

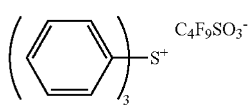

-continued
(z3)
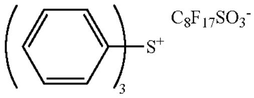
(z4)
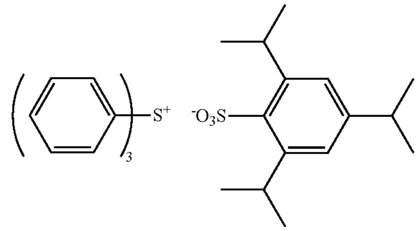
(z5)
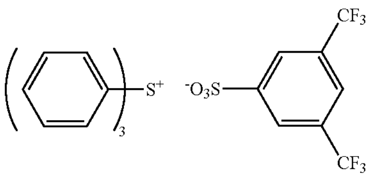
(z6)
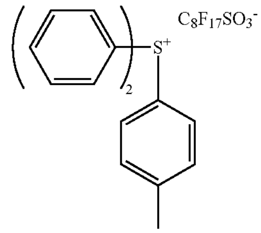
(z7)
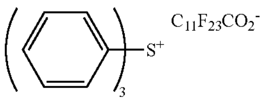
(z8)
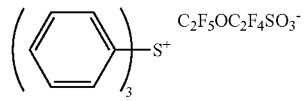
(z9)
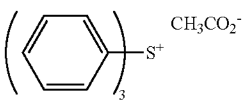
(z10)
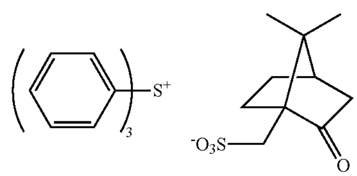
(z11)
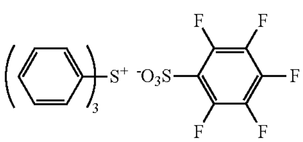
(z12)
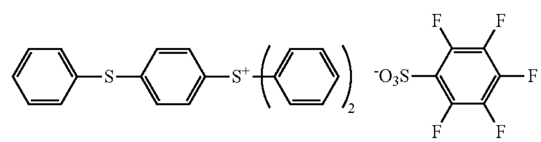
(z13)
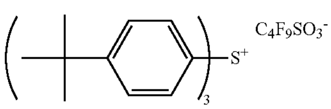
(z14)
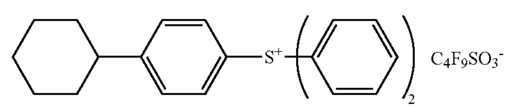
(z15)
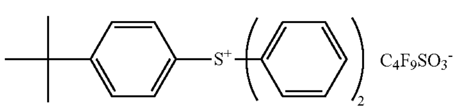
(z16)
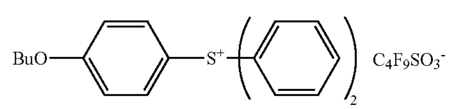
(z17)
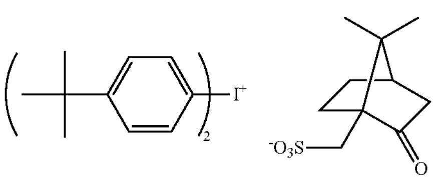
(z18)
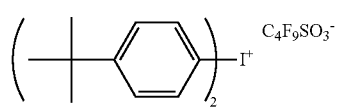
(z19)
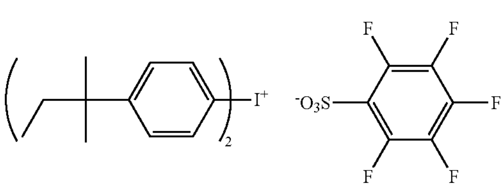
(z20)
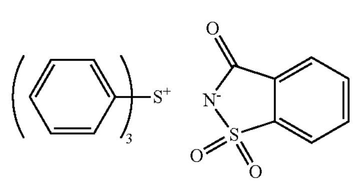
(z21)
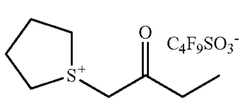
(z22)
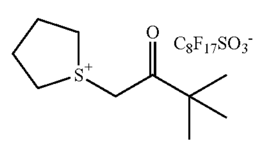

-continued
(z23)
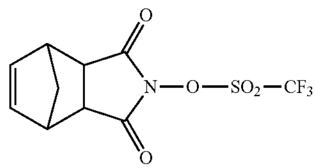
(z24)
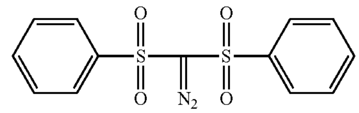
(z25)
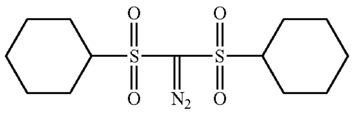
(z26)
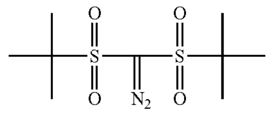
(z27)
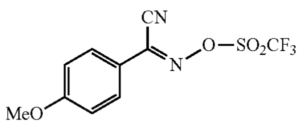
(z28)
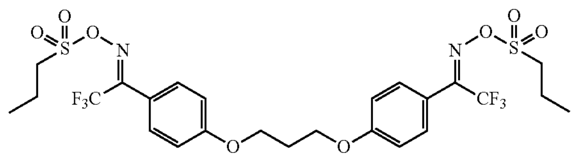
(z29)
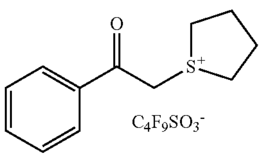
(z30)
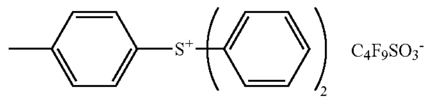
(z31)
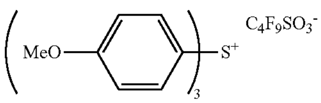
(z32)
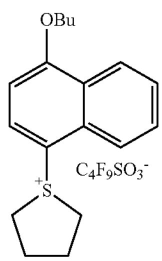
(z33)
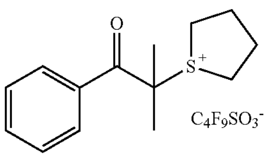
(z34)
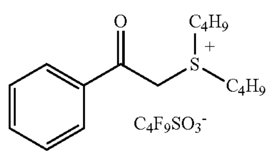
(z35)
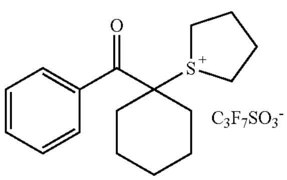
(z36)
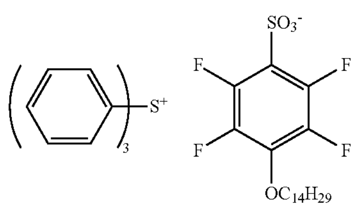
(z37)
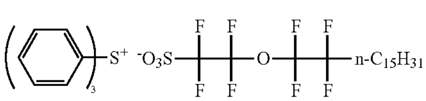
(z38)
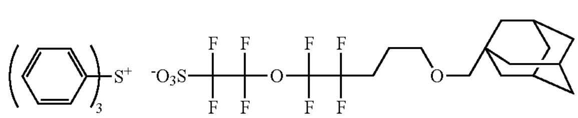
(z39)
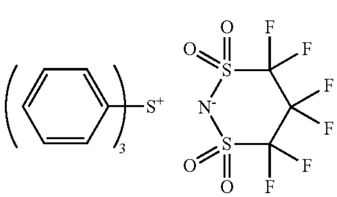
(z40)
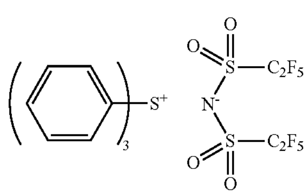

-continued
(z41)
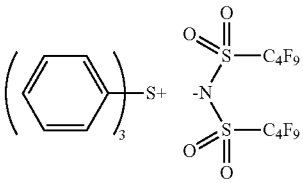
(z42)
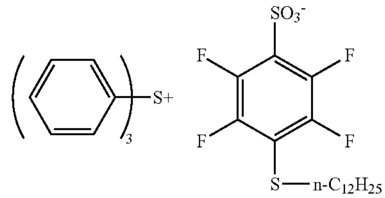
(z43)
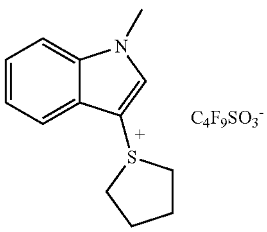
(z44)
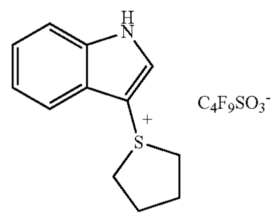
(z45)
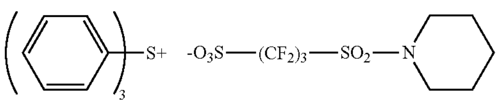
(z46)
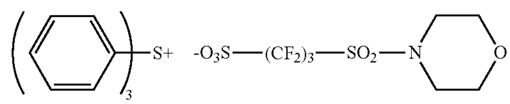
(z47)
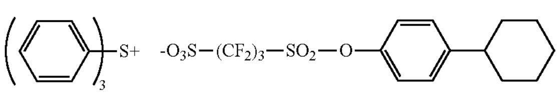
(z48)
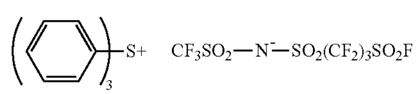
(z49)
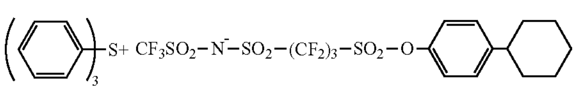
(z50)
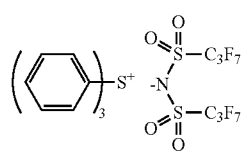
(z51)
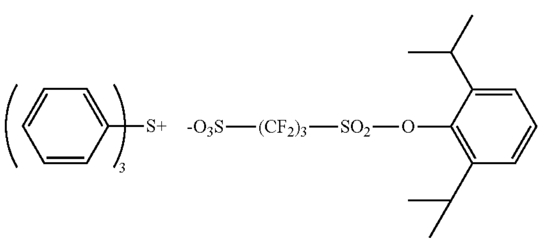
(z52)
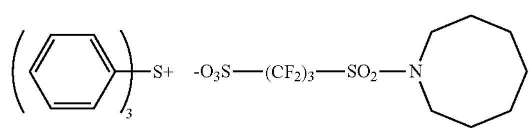
(z53)
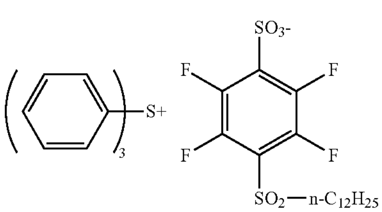
(z54)
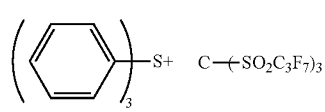
(z55)
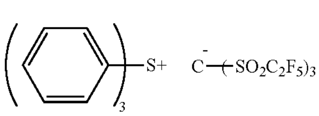
(z56)
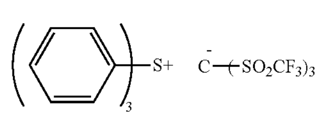

-continued
(z57)
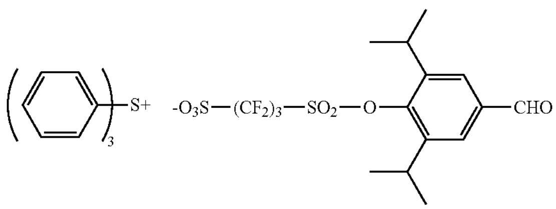
(z58)
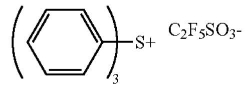
(z59)
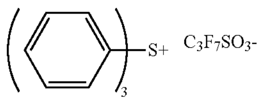
(z60)
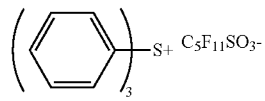
(z61)
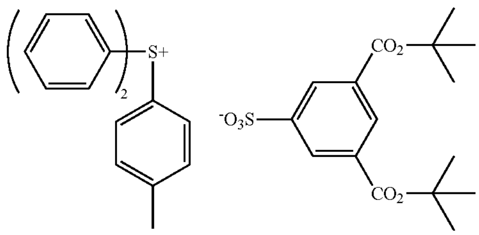
(z62)
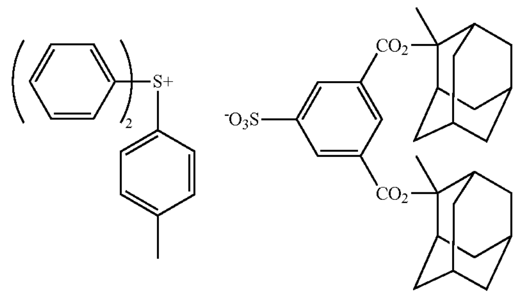
(z63)
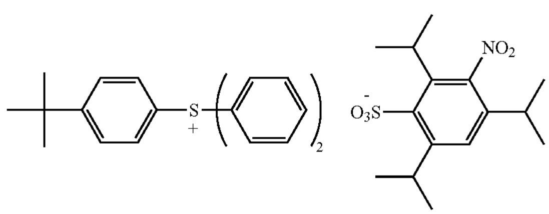
(z64)
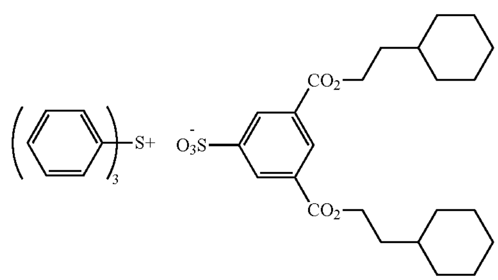
(z65)
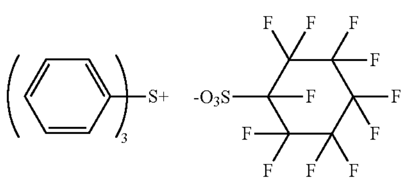
(z66)
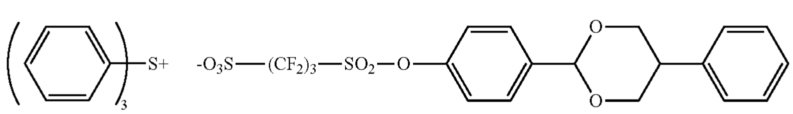
(z67)
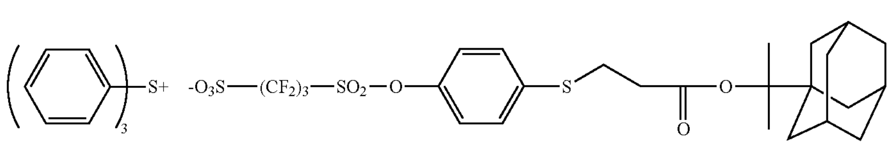
(z68)
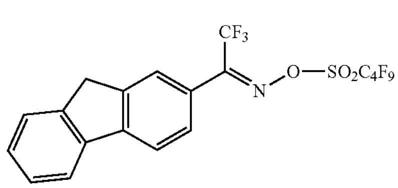
(z69)
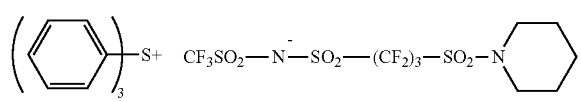

-continued
(z70)
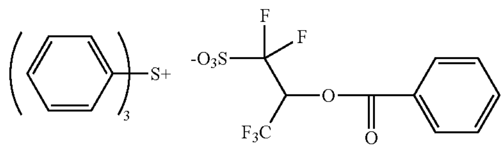
(z71)
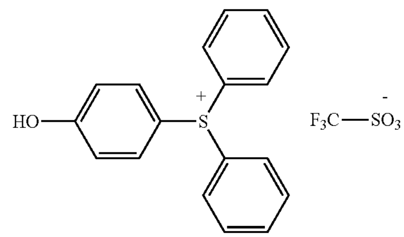
(z72)
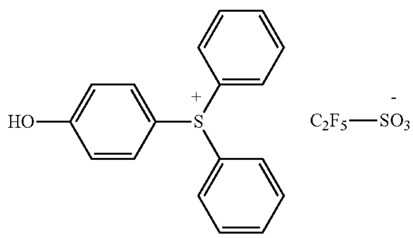
(z73)
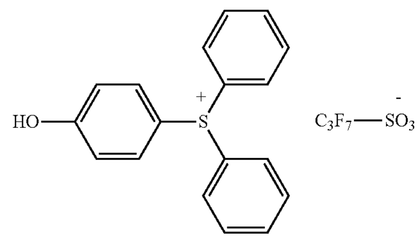
(z74)
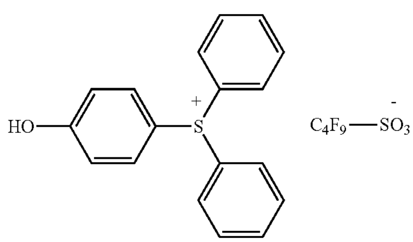
(z75)
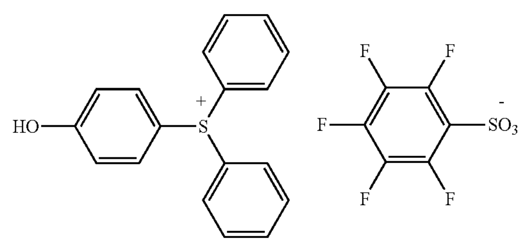
(z76)
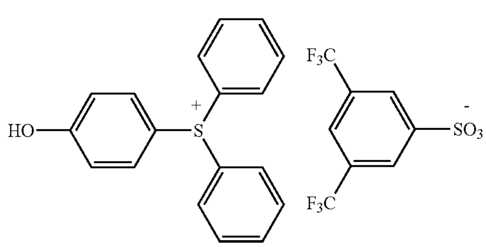
(z77)
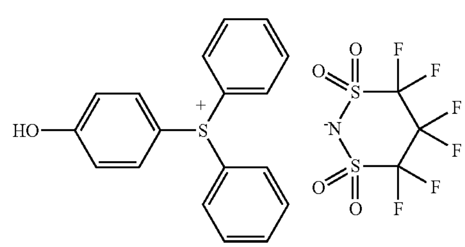
(z78)
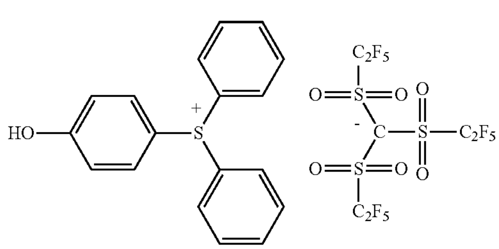
(z79)
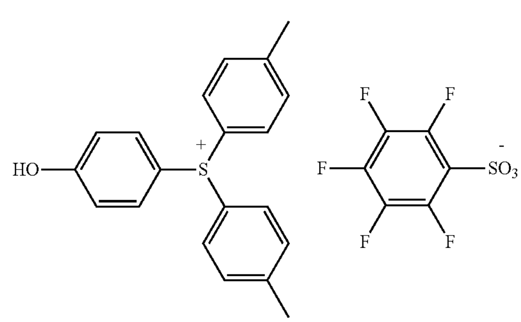

-continued
(z80)
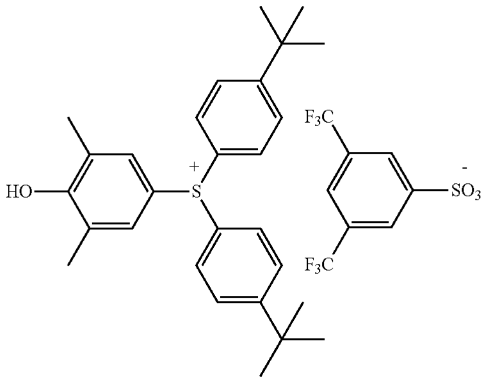
(z81)
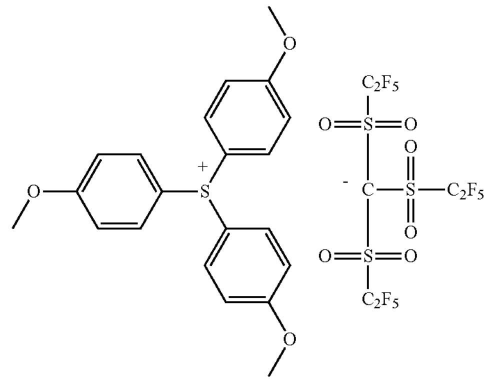
(z82)
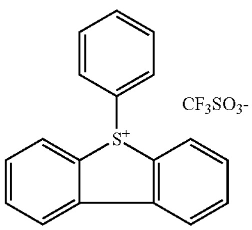
(z83)
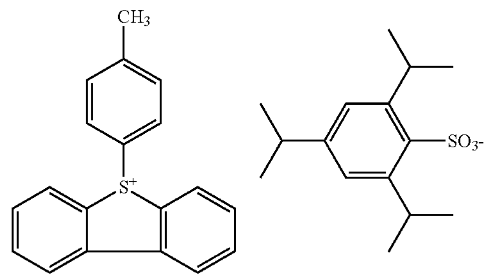
(z84)
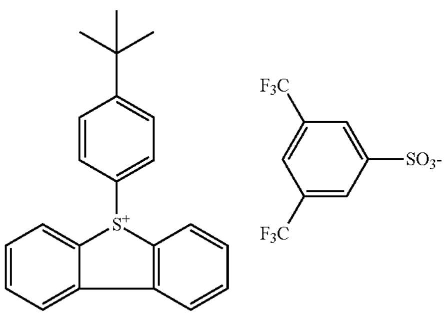
(z85)
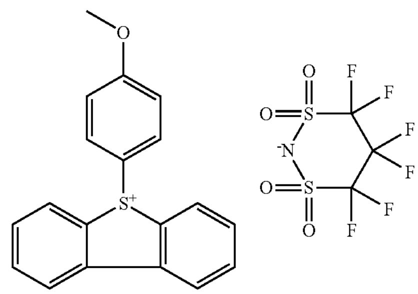
(z86)
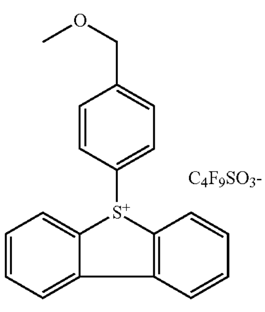
(z87)
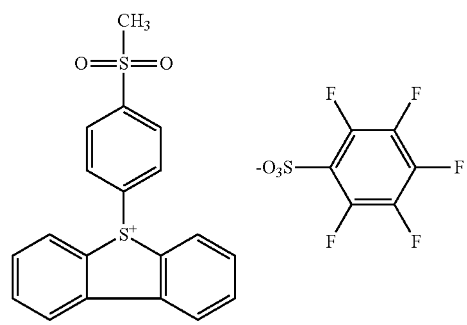
(z88)
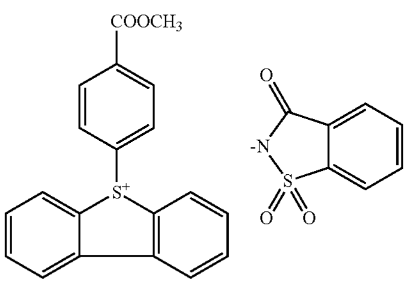
(z89)
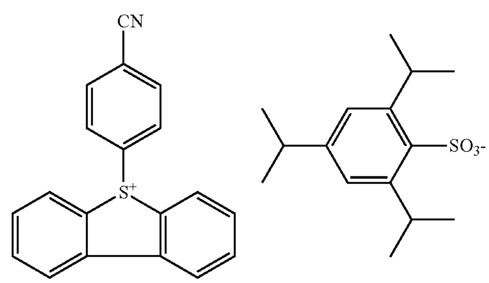

-continued
(z90)
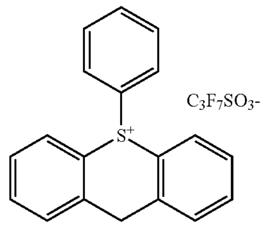
(z91)
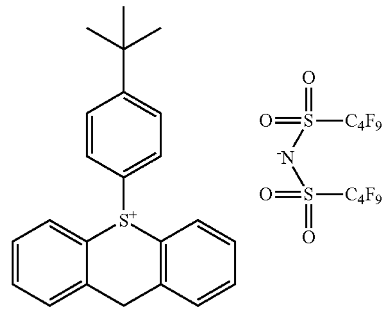
(z92)
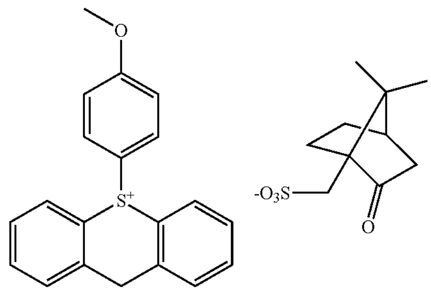
(z93)
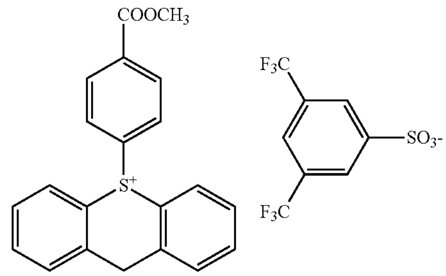
(z94)
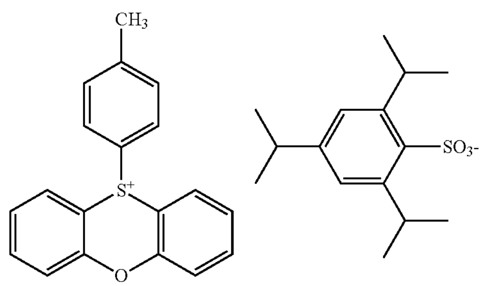
(z95)
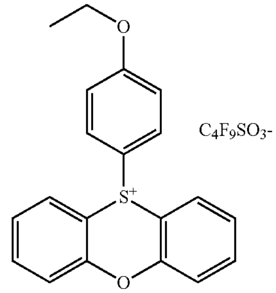
(z96)
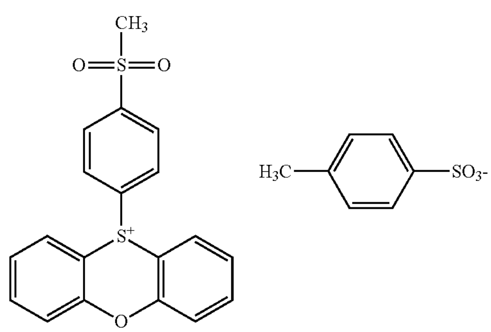
(z97)
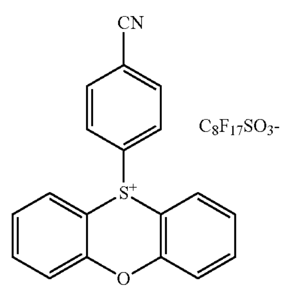
(z98)
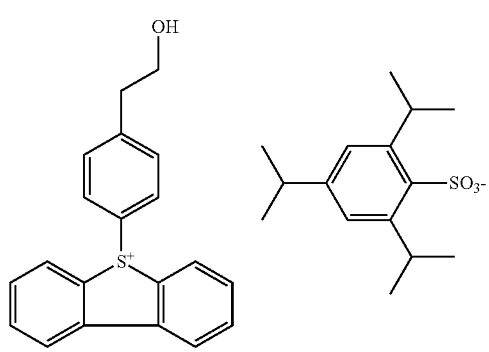
(z99)
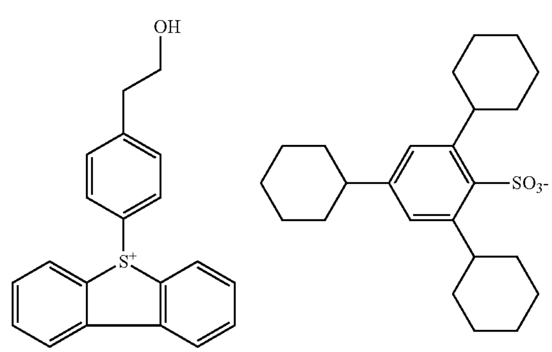

-continued
(z100)
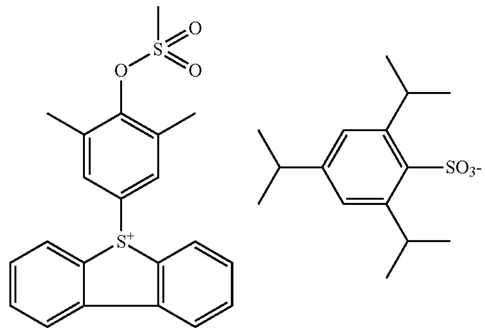
(z101)
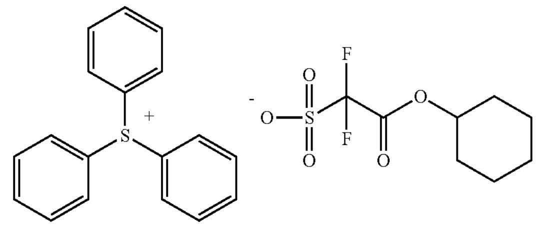
(z102)
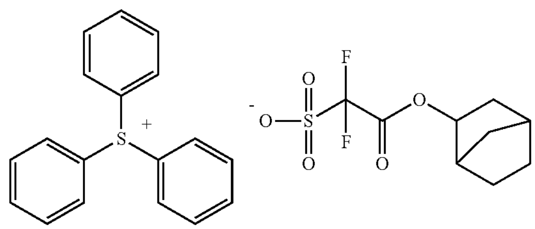
(z103)
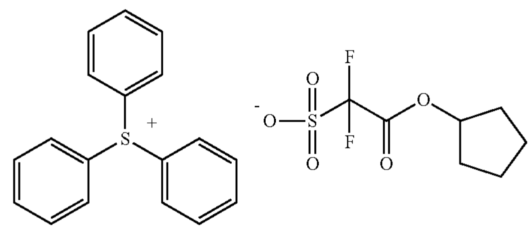
(z104)
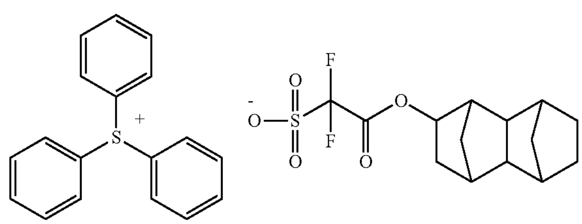
(z105)
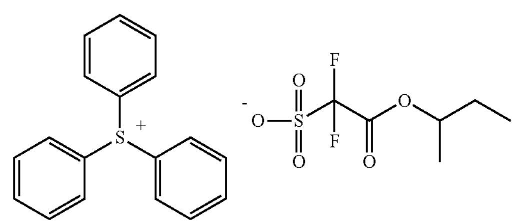
(z106)
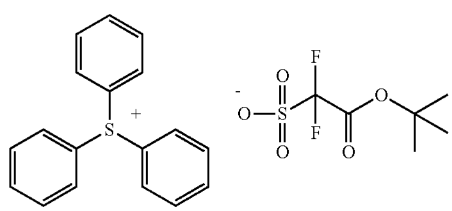
(z107)
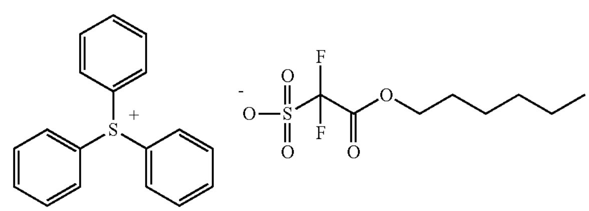
(z108)
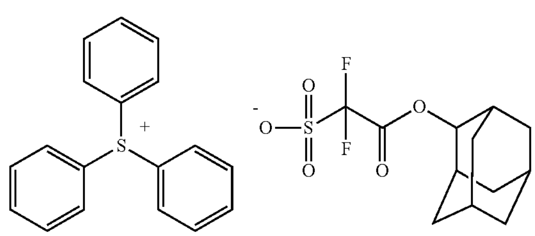
(z109)
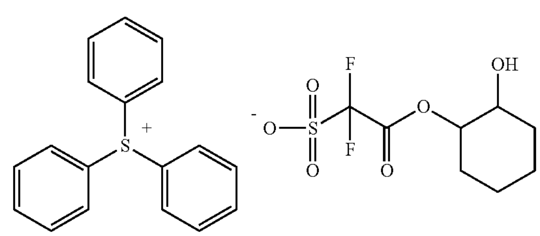
(z110)
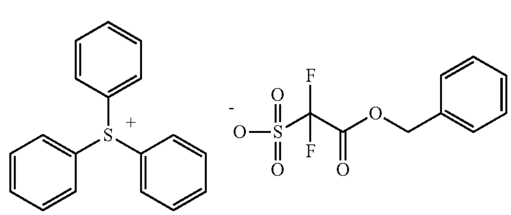
(z111)
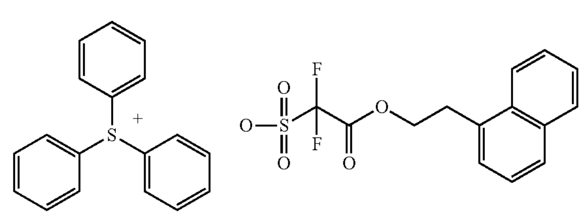

-continued
(z112)
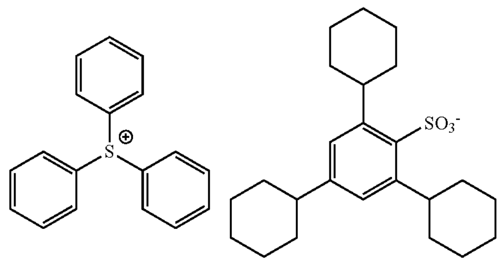
(z113)
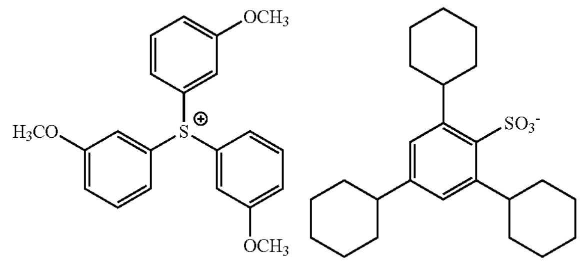
(z114)
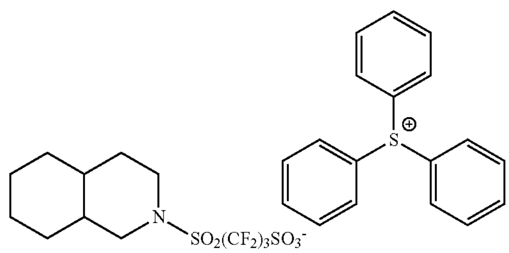
(z115)
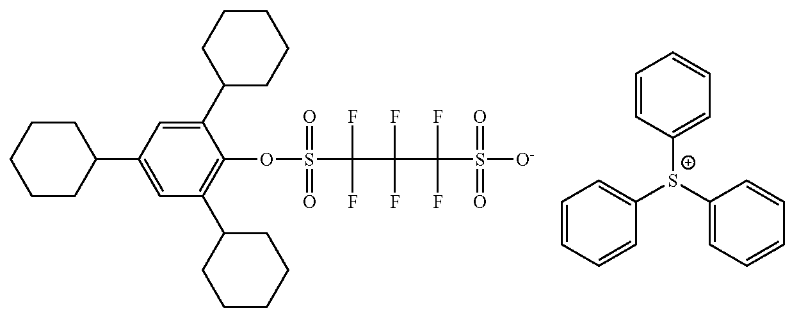
(z116)
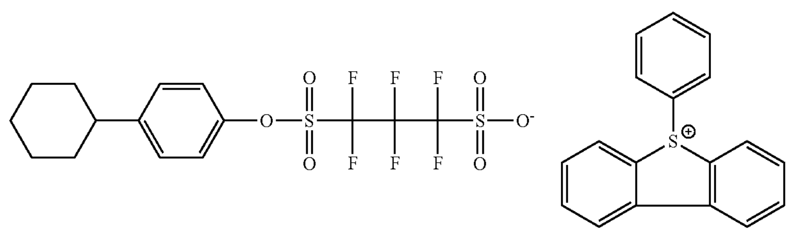
(z117)
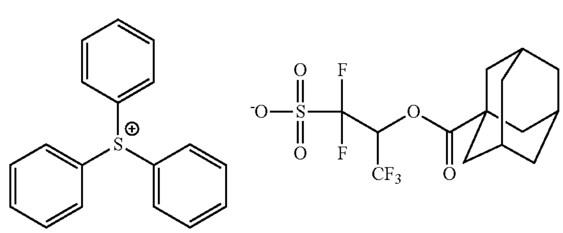
(z118)
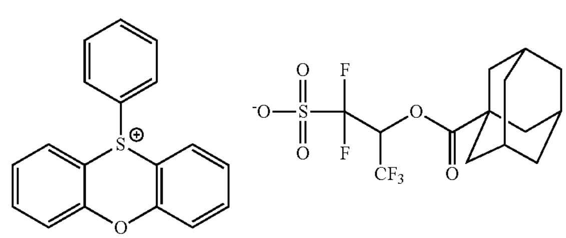
(z119)
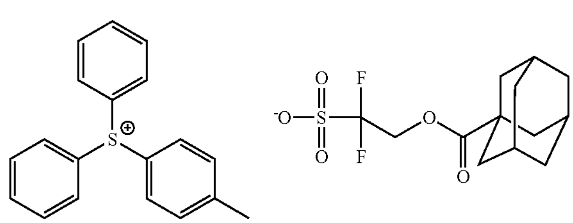
(z120)
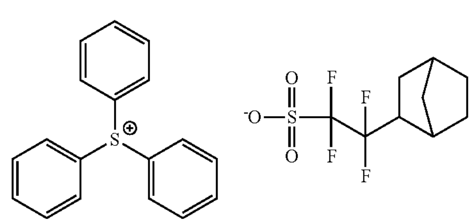

-continued
(z121)
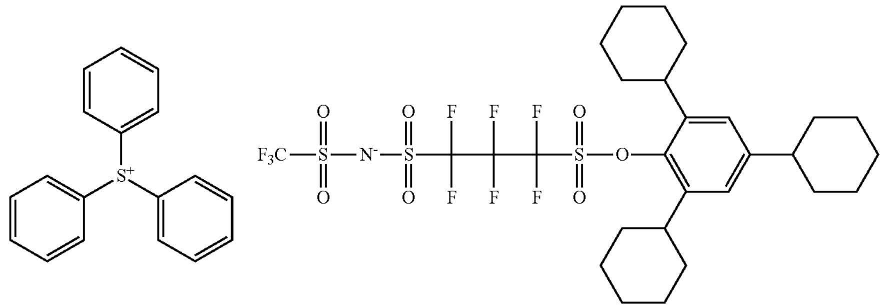
(z122)
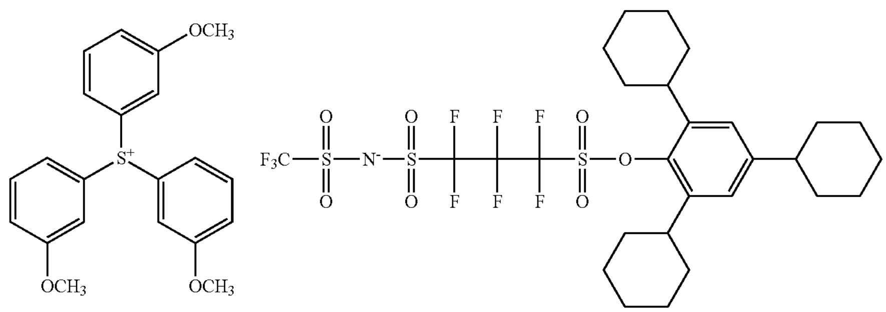
(z123)
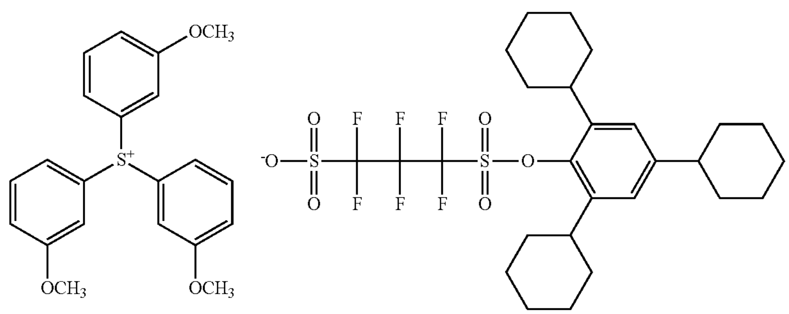
(z124)
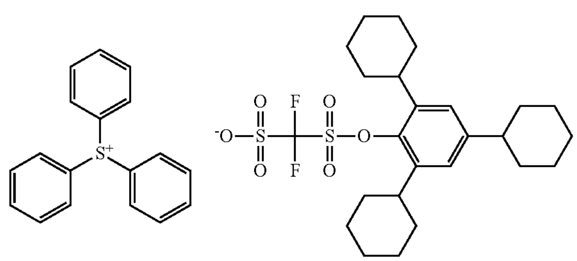
(z125)
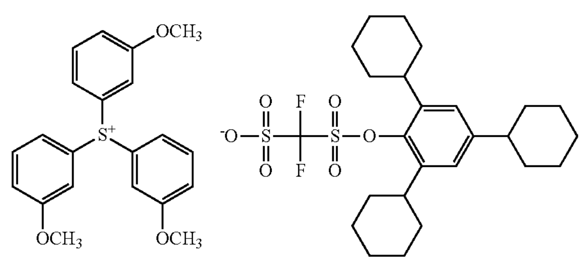
(z126)
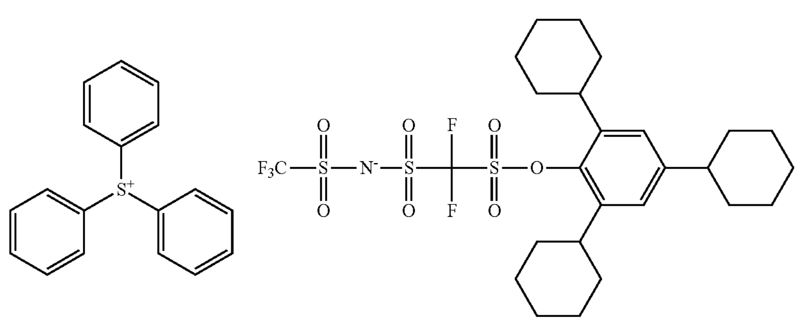

-continued
(z127)
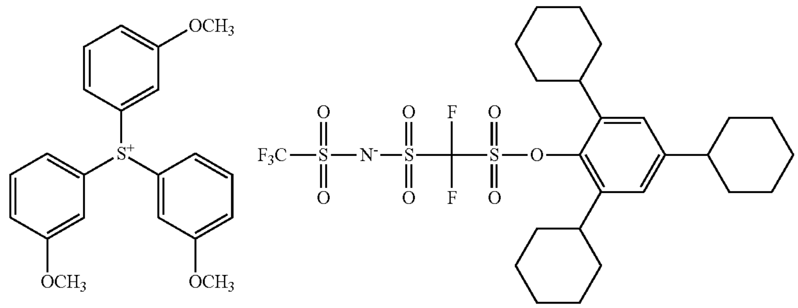
(z128)
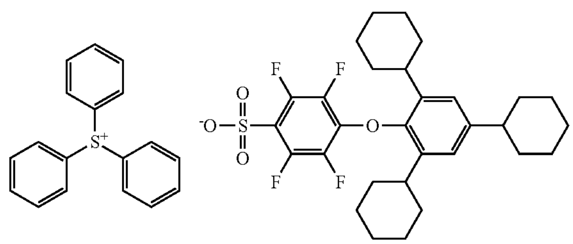
(z129)
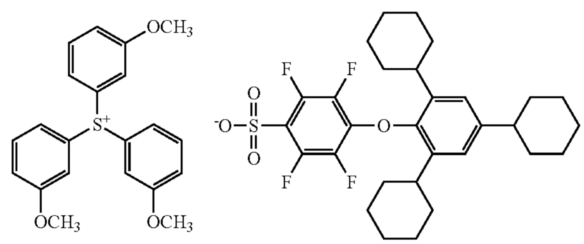
(z130)
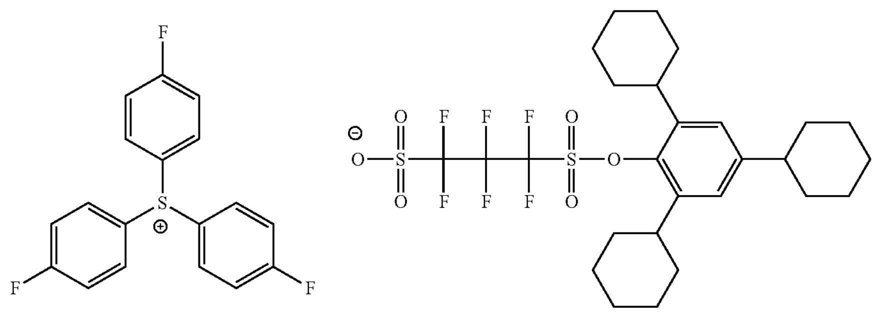
(z131)
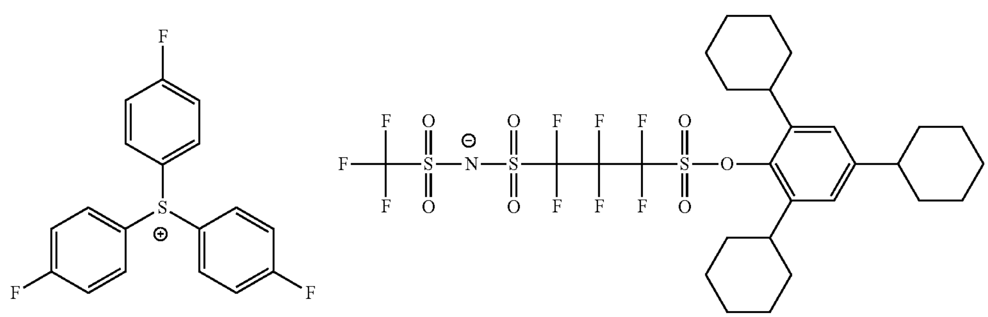
(z132)
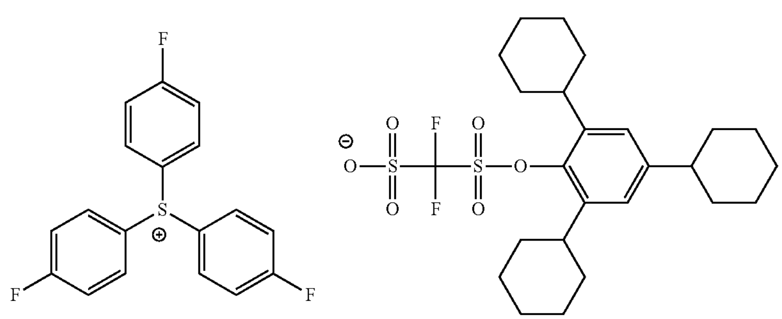

-continued
(z133)
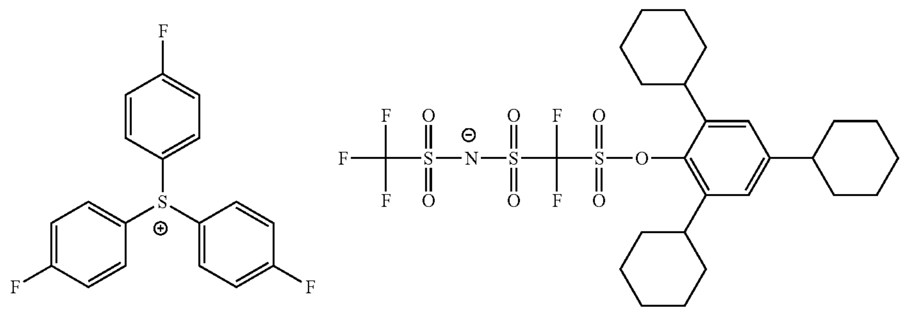
(z134)
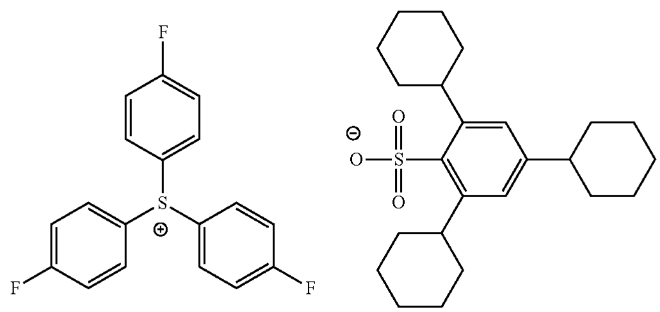
(z135)
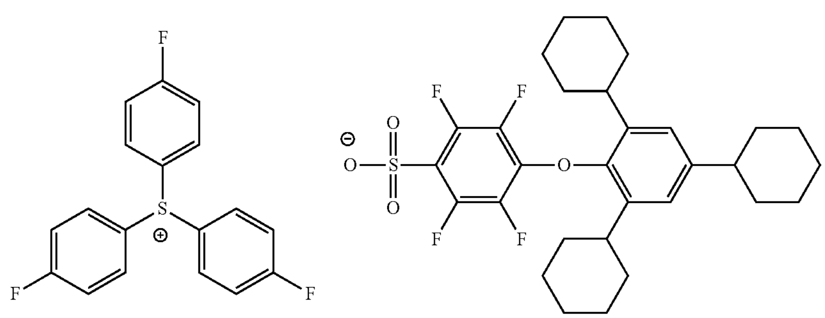
(z136)
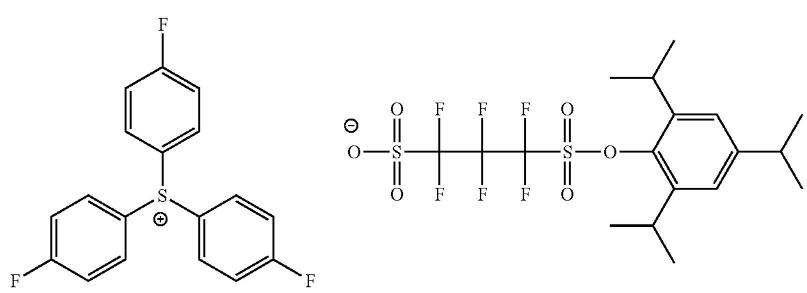
(z137)
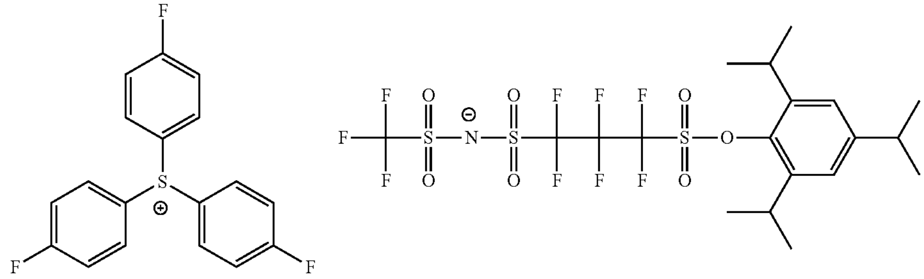

-continued (z138)

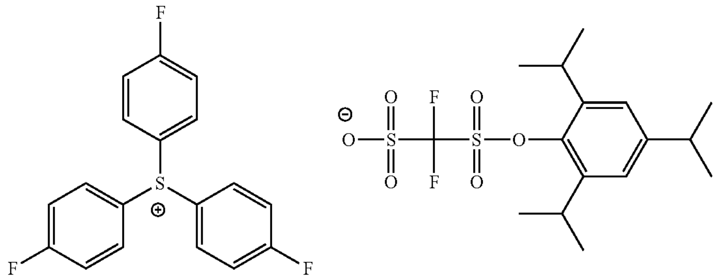

(z139)

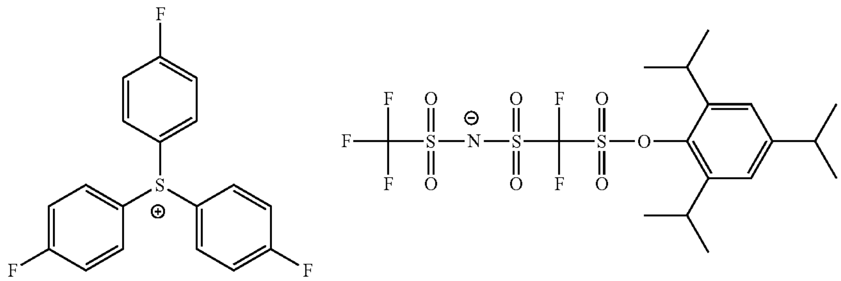

(z140)

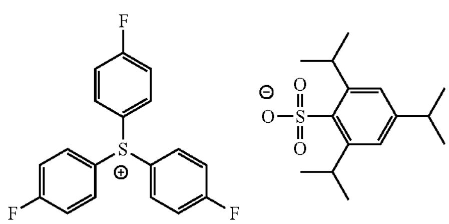

(z141)

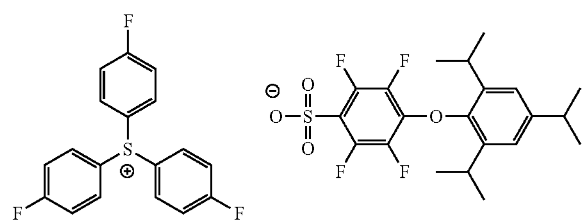

(z142)

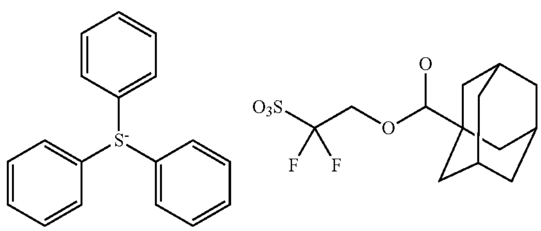

In the present invention, the compound (B) that generates an acid is preferably a compound that generates an acid having a volume of 240 Å$^3$ or greater, more preferably a compound that generates an acid having a volume of 300 Å$^3$ or greater, still more preferably a compound that generates an acid having a volume of 350 Å$^3$ or greater, and particularly preferably a compound that generates an acid having a volume of 400 Å$^3$ or greater, by irradiation with an electron beam or extreme ultraviolet rays, from the viewpoint of suppressing diffusion of the acid generated by exposure to the unexposed portion and improving resolution. Here, from the viewpoint of sensitivity and coating solvent solubility, the volume is preferably 2000 Å$^3$ or less, and more preferably 1500 Å$^3$ or less. The volume value is determined by using "WinMOPAC" manufactured by FUJITSU. That is, first, the chemical structure of the acid according to each example is input, then, using this structure as an initial structure, the most stable conformation of each acid is determined by molecular force field calculation using an MM3 method, and then, by performing molecular orbital calculation using a PM3 method on these most stable conformations, the "accessible volume" of each acid can be calculated.

In the present invention, particularly preferable acid generators are exemplified below. Calculated volume values are given to some examples (unit Å$^3$). Moreover, the calculated value determined here is a volume value of an acid in which a proton is bonded to the anionic portion.

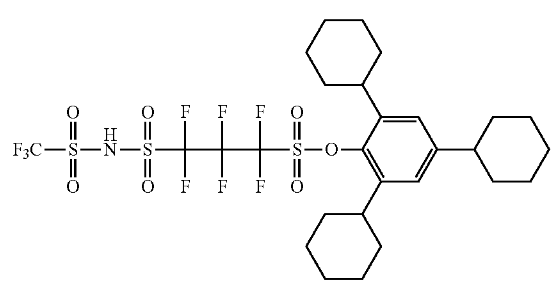

585 Å$^3$

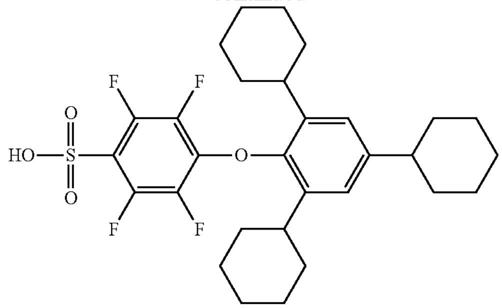
585 Å$^3$
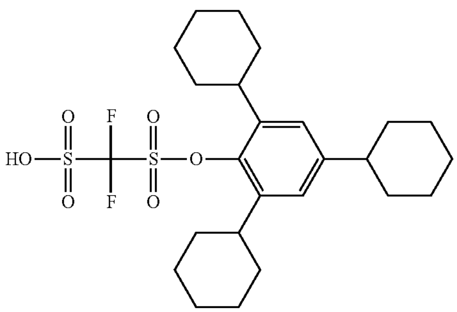
525 Å$^3$
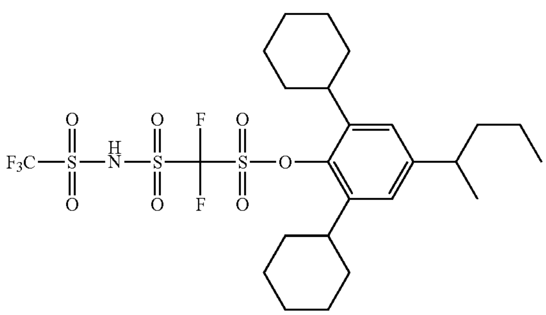
554 Å$^3$
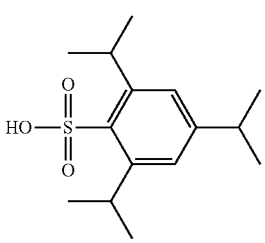
303 Å$^3$
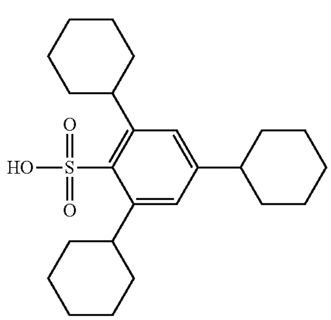
437 Å$^3$
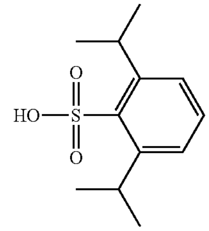
244 Å$^3$
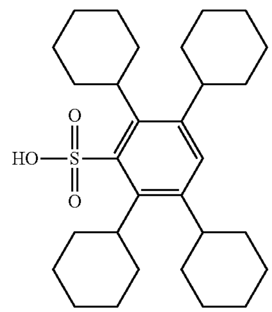
529 Å$^3$
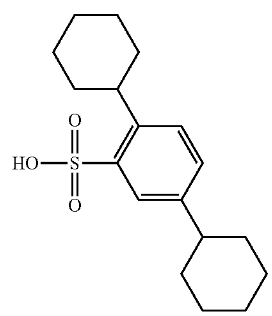
336 Å$^3$
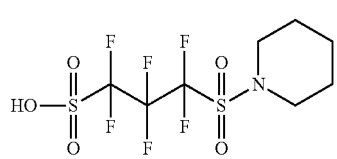
244 Å$^3$
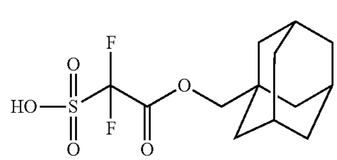
271 Å$^3$

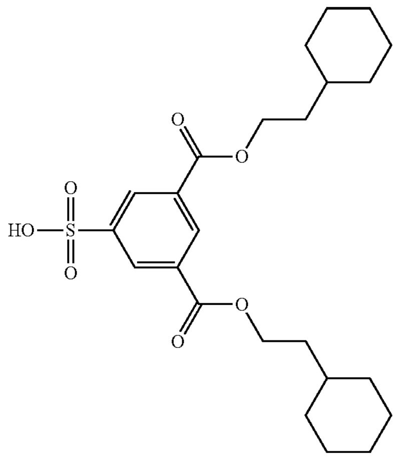
457 Å$^3$
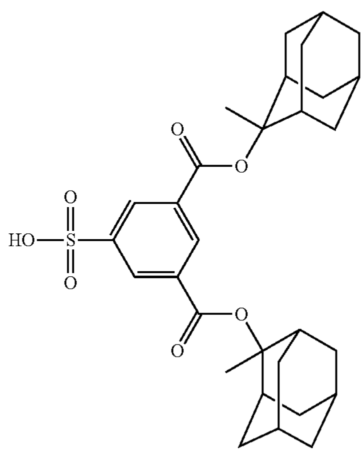
511 Å$^3$
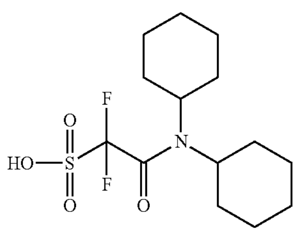
311 Å$^3$
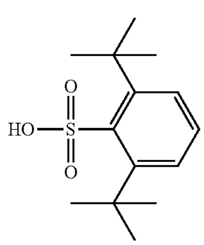
280 Å$^3$
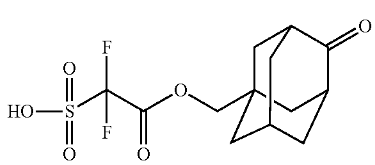
266 Å$^3$
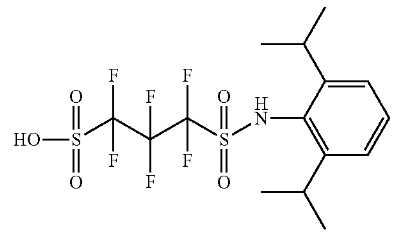
339 Å$^3$
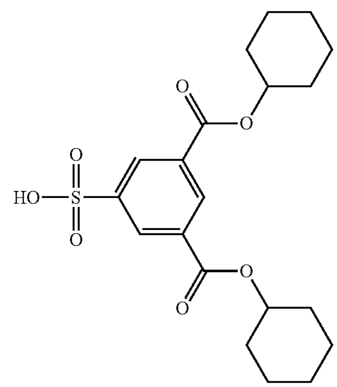
380 Å$^3$
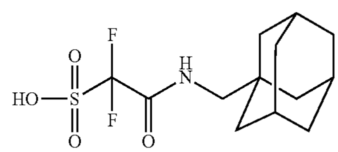
277 Å$^3$
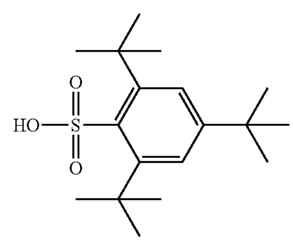
357 Å$^3$
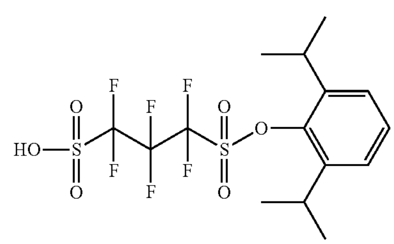
347 Å$^3$
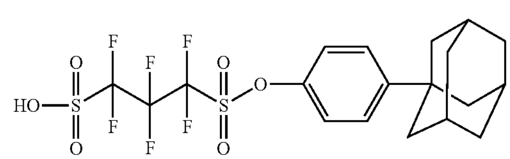
380 Å$^3$ -continued
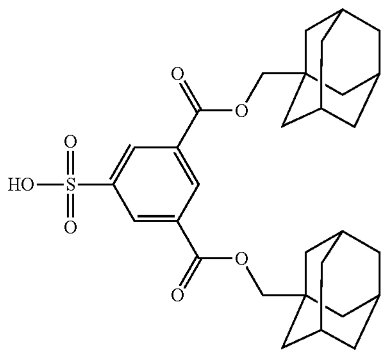
519 Å$^3$
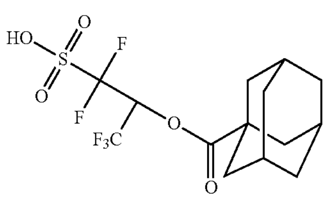
291 Å$^3$
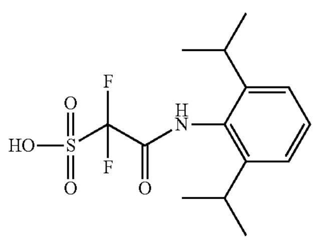
297 Å$^3$
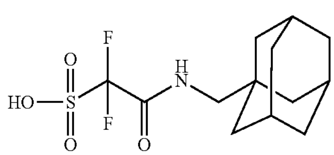
277 Å$^3$
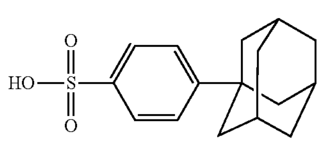
281 Å$^3$
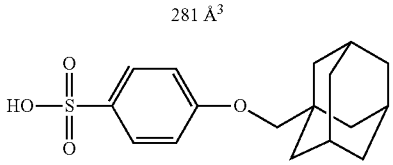
310 Å$^3$
-continued
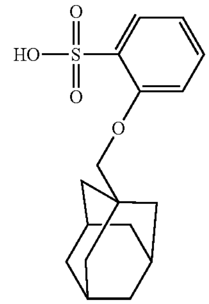
309 Å$^3$
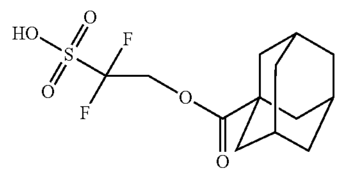
270 Å$^3$
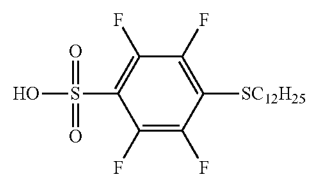
393 Å$^3$
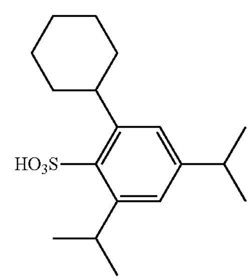
350 Å$^3$
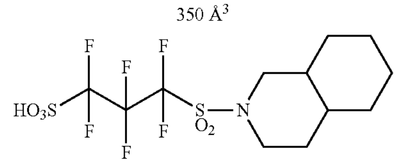
311 Å$^3$
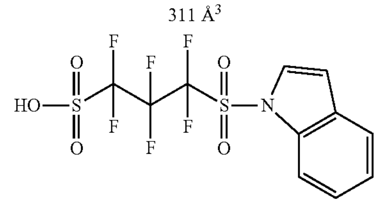
250 Å$^3$ -continued

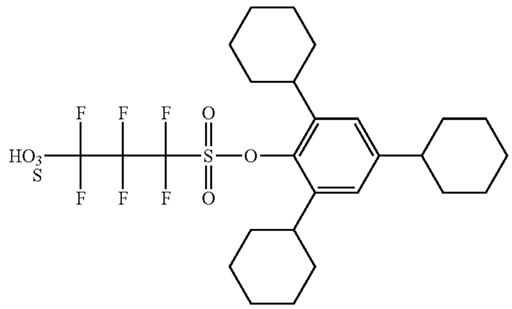

535 Å³

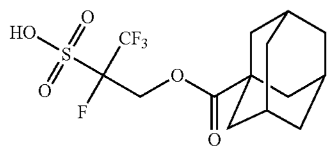

290 Å³

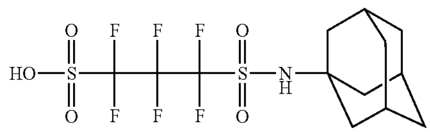

315 Å³

The acid generator can be used alone, or two or more types thereof can be used in combination.

The content of the acid generator in the composition is preferably 0.1% by mass to 50% by mass, more preferably 5% by mass to 50% by mass, and still more preferably 10% by mass to 40% by mass, based on the total solid content of the composition. In particular, to achieve both high sensitivity and high resolution when exposure is performed by an electron beam or extreme ultraviolet rays, the content of an acid generator is preferably higher, more preferably 15% by mass to 40% by mass, and most preferably 20% by mass to 40% by mass.

(C) Basic Compound

The active light sensitive or radiation sensitive resin composition according to the present invention preferably further includes a basic compound (C). The basic compound (C) is preferably a compound having stronger basicity compared to phenol. In addition, the basic compound is preferably an organic basic compound, and more preferably a nitrogen-containing basic compound.

The nitrogen-containing basic compound which is able to be used is not particularly limited, but for example, the compounds which are classified into (1) to (7) below can be used.

(1) Compound Represented by General Formula (BS-1)

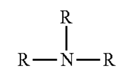

(BS-1)

In General Formula (BS-1), each of R's independently represents a hydrogen atom or an organic group. Here, at least one of three R's is an organic group. This organic group is a linear or branched alkyl group, a monocyclic or polycyclic cycloalkyl group, an aryl group, or an aralkyl group.

The number of carbon atoms in the alkyl group as R is not particularly limited, but is normally 1 to 20, and preferably 1 to 12.

The number of carbon atoms in the cycloalkyl group as R is not particularly limited, but is normally 3 to 20, and preferably 5 to 15.

The number of carbon atoms in the aryl group as R is not particularly limited, but is normally 6 to 20, and preferably 6 to 10. Specific examples thereof include a phenyl group and a naphthyl group.

The number of carbon atoms in the aralkyl group as R is not particularly limited, but is normally 7 to 20, and preferably 7 to 11. Specific examples thereof include a benzyl group.

A hydrogen atom in the alkyl group, the cycloalkyl group, the aryl group, or the aralkyl group as R may be substituted with a substituent. Examples of the substituent include an alkyl group, a cycloalkyl group, an aryl group, an aralkyl group, a hydroxy group, a carboxy group, an alkoxy group, an aryloxy group, an alkylcarbonyloxy group, and an alkyloxycarbonyl group.

At least two of R's in the compound represented by General Formula (BS-1) are preferably organic groups.

Specific examples of the compound represented by General Formula (BS-1) include tri-n-butyl amine, tri-n-pentyl amine, tri-n-octyl amine, tri-n-decyl amine, triisodecyl amine, dicyclohexyl methyl amine, tetradecyl amine, pentadecyl amine, hexadecyl amine, octadecyl amine, didecyl amine, methyl octadecyl amine, dimethyl undecyl amine, N,N-dimethyl dodecyl amine, methyl dioctadecyl amine, N,N-dibutyl aniline, N,N-dihexyl aniline, 2,6-diisopropyl aniline, and 2,4,6-tri(t-butyl)aniline.

In addition, as the preferable basic compound represented by General Formula (BS-1), an alkyl group in which at least one R is substituted with a hydroxy group is exemplified. Specific examples thereof include triethanol amine and N,N-dihydroxyethyl aniline.

The alkyl group as R may have an oxygen atom in the alkyl chain. That is, an oxyalkylene chain may be formed. As the oxyalkylene chain, —$CH_2CH_2O$— is preferable. Specific examples thereof include tris(methoxyethoxyethyl)amine and a compound disclosed after line 60 of column 3 in the specification of U.S. Pat. No. 6,040,112A.

Among basic compounds represented by General Formula (BS-1), examples of a compound having such a hydroxyl group or an oxygen atom include the followings.

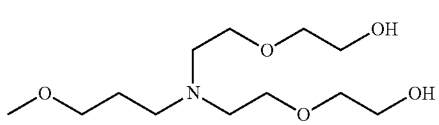

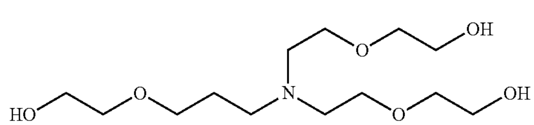

-continued

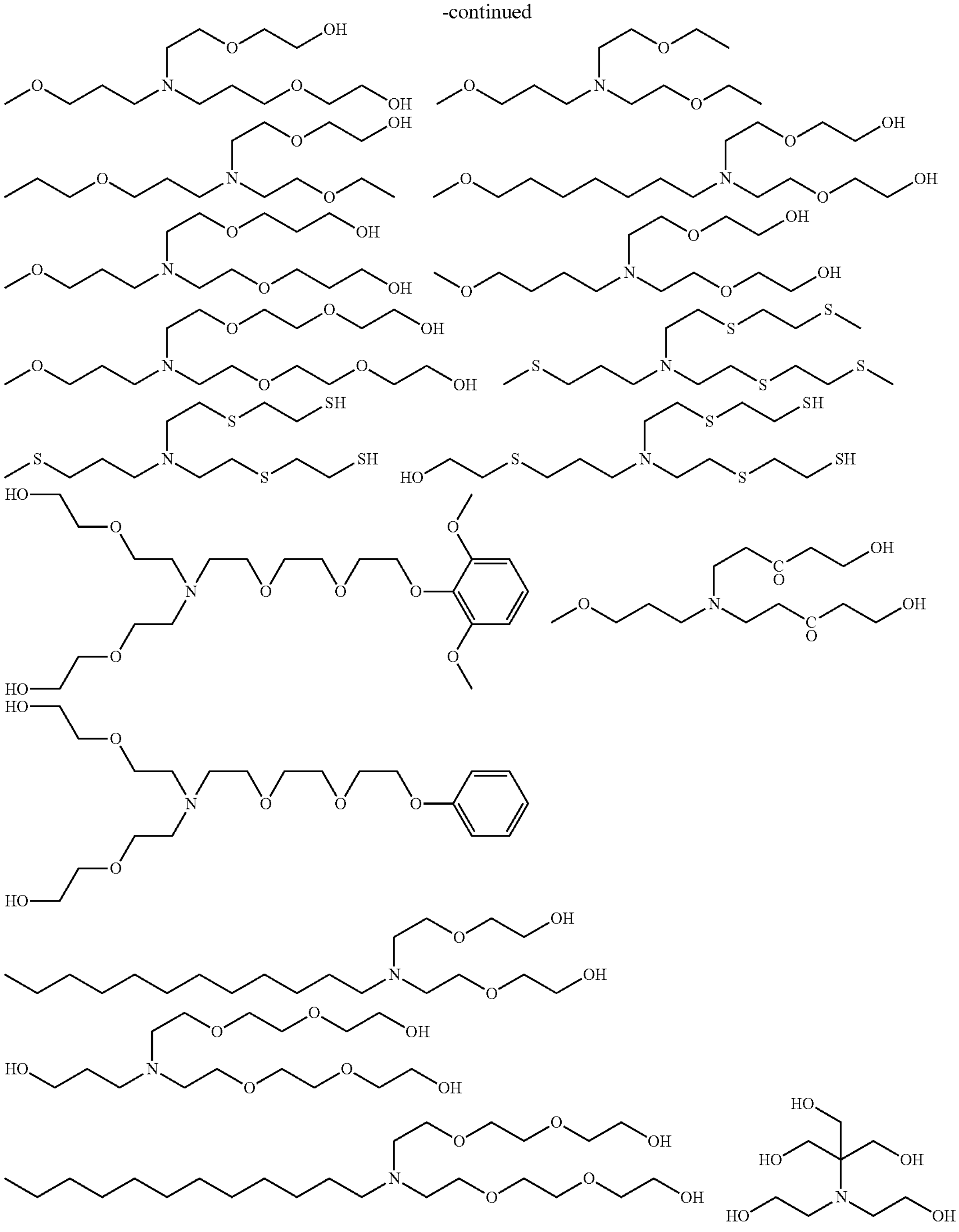

(2) Compound Having Nitrogen-Containing Heterocyclic Structure

The nitrogen-containing heterocycle may have aromatic properties, or may not have aromatic properties. The nitrogen-containing heterocycle may have a plurality of nitrogen atoms. Furthermore, the nitrogen-containing heterocycle may contain heteroatoms other than the nitrogen atom. Specific examples thereof include a compound having an imidazole structure (2-phenylbenzimidazole, 2,4,5-triphenylimidazole and the like), a compound having a piperidine structure [N-hydroxyethylpiperidine, bis(1,2,2,6,6-pentamethyl-4-piperidyl)sebacate, and the like], a compound having a pyridine structure (4-dimethylaminopyridine and the like), and a compound having an antipyrine structure (antipyrine, hydroxyantipyrine, and the like).

Examples of the preferable compound having a nitrogen-containing heterocyclic structure include guanidine, aminopyridine, aminoalkyl pyridine, aminopyrrolidine, indazole, imidazole, pyrazole, pyrazine, pyrimidine, purine, imidazoline, pyrazoline, piperazine, aminomorpholine, and aminoalkyl morpholine. These may further have a substituent.

Examples of the preferable substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Examples of the particularly preferable basic compound include imidazole, 2-methyl imidazole, 4-methyl imidazole, N-methyl imidazole, 2-phenyl imidazole, 4,5-diphenyl imidazole, 2,4,5-triphenyl imidazole, 2-amino pyridine, 3-amino pyridine, 4-amino pyridine, 2-dimethyl amino pyridine, 4-dimethyl amino pyridine, 2-diethyl amino pyridine, 2-(amino methyl) pyridine, 2-amino-3-methyl pyridine, 2-amino-4-methyl pyridine, 2-amino-5-methyl pyridine, 2-amino-6-methyl pyridine, 3-amino ethyl pyridine, 4-amino ethyl pyridine, 3-amino pyrrolidine, piperazine, N-(2-amino ethyl) piperazine, N-(2-amino ethyl) piperidine, 4-amino-2,2,6,6-tetramethyl piperidine, 4-piperidinopiperidine, 2-iminopiperidine, 1-(2-amino ethyl) pyrrolidine, pyrazole, 3-amino-5-methyl pyrazole, 5-amino-3-methyl-1-p-tolyl pyrazole, pyrazine, 2-(amino methyl)-5-methyl pyrazine, pyrimidine, 2,4-diaminopyrimidine, 4,6-dihydroxypyrimidine, 2-pyrazoline, 3-pyrazoline, N-aminomorpholine, and N-(2-aminoethyl) morpholine.

A compound having two or more ring structures can also be suitably used. Specific examples thereof include 1,5-diazabicyclo[4.3.0]non-5-ene and 1,8-diazabicyclo[5.4.0]undeca-7-ene.

(3) Amine Compound Having Phenoxy Group

An amine compound having a phenoxy group is a compound having a phenoxy group at the terminal on the opposite side to the N atom of the alkyl group which is contained in an amine compound. The phenoxy group may have a substituent such as an alkyl group, an alkoxy group, a halogen atom, a cyano group, a nitro group, a carboxy group, a carboxylic acid ester group, a sulfonic acid ester group, an aryl group, an aralkyl group, an acyloxy group, or an aryloxy group.

The compound more preferably has at least one oxyalkylene chain between the phenoxy group and the nitrogen atom. The number of oxyalkylene chains in one molecule is preferably 3 to 9, and more preferably 4 to 6. Among oxyalkylene chains, —$CH_2CH_2O$— is particularly preferable.

Specific examples thereof include 2-[2-{2-(2,2-dimethoxy-phenoxyethoxy)ethyl}-bis-(2-methoxyethyl)-amine and the compounds (C1-1) to (C3-3) exemplified in paragraph "0066" in the specification of US2007/0224539A1.

An amine compound having a phenoxy group is obtained by, for example, heating a mixture of a primary or secondary amine having a phenoxy group and an haloalkyl ether to be reacted, by adding an aqueous solution of a strong base such as sodium hydroxide, potassium hydroxide, or tetraalkylammonium thereto, and by extracting the resultant product with an organic solvent such as ethyl acetate or chloroform. In addition, an amine compound having a phenoxy group can also be obtained by heating a mixture of a primary or secondary amine and an haloalkyl ether having a phenoxy group at the terminal to be reacted, by adding an aqueous solution of a strong base such as sodium hydroxide, potassium hydroxide, or tetraalkylammonium thereto, and by extracting the resultant product with an organic solvent such as ethyl acetate or chloroform.

(4) Ammonium Salt

It is possible to suitably use an ammonium salt as the basic compound.

As the cation of the ammonium salt, a tetraalkylammonium cation in which an alkyl group having 1 to 18 carbon atoms is substituted is preferable, a tetramethylammonium cation, a tetraethylammonium cation, a tetra(n-butyl)ammonium cation, a tetra(n-heptyl)ammonium cation, a tetra(n-octyl)ammonium cation, a dimethylhexadecylammonium cation, or a benzyltrimethylammonium cation is more preferable, and tetra(n-butyl)ammonium cation is most preferable.

Examples of the anion of the ammonium salt include hydroxide, carboxylate, halide, sulfonate, borate, and phosphate. Among these, hydroxide or carboxylate is particularly preferable.

As the halide, chloride, bromide, or iodide is particularly preferable.

As the sulfonate, an organic sulfonate having 1 to 20 carbon atoms is particularly preferable. Examples of the organic sulfonate include alkyl sulfonate and aryl sulfonate having 1 to 20 carbon atoms.

The alkyl group included in the alkyl sulfonate may have a substituent. Examples of the substituent include a fluorine atom, a chlorine atom, a bromine atom, an alkoxy group, an acyl group, and an aryl group. Specific examples of the alkyl sulfonate include methanesulfonate, ethanesulfonate, butanesulfonate, hexanesulfonate, octanesulfonate, benzyl sulfonate, trifluoromethanesulfonate, pentafluoroethanesulfonate, and nonafluorobutanesulfonate.

Examples of the aryl group included in the aryl sulfonate include a phenyl group, a naphthyl group, and an anthryl group. These aryl groups may have a substituent. As the substituent, for example, a linear or branched alkyl group having 1 to 6 carbon atoms or a cycloalkyl group having 3 to 6 carbon atoms is preferable. Specifically, for example, a methyl group, an ethyl group, an n-propyl group, an isopropyl group, an n-butyl group, an i-butyl group, a t-butyl group, an n-hexyl group, or a cyclohexyl group is preferable. Examples of other substituents include an alkoxy group having 1 to 6 carbon atoms, a halogen atom, a cyano group, a nitro group, an acyl group, and an acyloxy group.

The carboxylate may be aliphatic carboxylate or aromatic carboxylate, and examples thereof include acetate, lactate, pyruvate, trifluoroacetate, adamantane carboxylate, hydroxyadamantane carboxylate, benzoate, naphthoate, salicylate, phthalate, and phenolate, and, in particular, benzoate, naphthoate, or phenolate is preferable, and benzoate is most preferable.

In this case, as the ammonium salt, tetra(n-butyl) ammonium benzoate or tetra(n-butyl) ammonium phenolate is preferable.

In the case of hydroxide, the ammonium salt is particularly preferably tetraalkylammonium hydroxide (tetraalkyl ammonium hydroxide such as tetramethyl ammonium hydroxide, tetraethyl ammonium hydroxide, or tetra-(n-butyl) ammonium hydroxide) having 1 to 8 carbon atoms.

(5) Compound (PA) which has Proton-Accepting Functional Group and Generates Compound in which Proton-Acceptibility is Reduced or Lost, or which is Changed from being Proton-Accepting to be Acidic, by being Decomposed Due to Irradiation with Active Light or Radiation.

The composition according to the present invention may further include a compound (hereinafter, referred to as "compound (PA)") which has a proton-accepting functional group and generates a compound in which the proton-acceptibility is reduced or lost, or which is changed from being proton-accepting to be acidic, by being decomposed due to irradiation with active light or radiation, as a basic compound.

Regarding the compound (PA) which has a proton-accepting functional group and generates a compound in which the proton-acceptibility is reduced or lost, or which is changed from being proton-accepting to be acidic, by being decomposed due to irradiation with active light or radiation, the description in paragraphs "0379" to "0425" of JP2012-32762A (which corresponds to paragraphs "0386" to "0435" of US2012/0003590A) can be referred to, and the contents thereof are incorporated in the present specification.

(6) Guanidine Compound

The composition of the present invention may further contain a guanidine compound having a structure represented by the following formula.

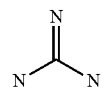

The guanidine compound exhibits strong basicity since the positive charge of the conjugate acid is dispersed and stabilized by the three nitrogen atoms.

For the basicity of the guanidine compound (A) of the present invention, the pKa of a conjugate acid is preferably 6.0 or greater, preferably 7.0 to 20.0 since neutralization reactivity with an acid is high and the roughness properties are excellent, and more preferably 8.0 to 16.0.

Due to such strong basicity, the diffusibility of an acid is suppressed, and the strong basicity can contribute to formation of an excellent pattern shape.

The "pKa" here represents pKa in an aqueous solution, and for example, it is described in Chemical Handbook (II) (revised 4th edition, 1993, edited by The Chemical Society of Japan, published by Maruzen Co., Ltd.), and a smaller value means higher acidity. Specifically, the pKa in aqueous solution can be obtained by measuring the acid dissociation constant at 25° C. using an infinite dilution aqueous solution, and a value based on the database of Hammett substituent constants and known literature values can also be determined by calculation using the following software package 1. All of pKa values described in the present specification are values determined by calculation using this software package.

Software package 1: Advanced Chemistry Development (ACD/Labs) Software V8.14 for Solaris (1994-2007 ACD/Labs).

In the present invention, log P is a logarithmic value of an n-octanol/water distribution coefficient (P), and with respect to a wide range of compounds, it is an effective parameter that can characterize the hydrophilicity/hydrophobicity. In general, the distribution coefficient is determined not by experiment but by calculation, and in the present invention, the distribution coefficient is a value calculated by a CS ChemDraw Ultra Ver. 8.0 software package (Crippen's fragmentation method).

In addition, the log P of the guanidine compound (A) is preferably 10 or less. When the log P is the above value or less, the guanidine compound can be uniformly contained in a resist film.

The log P of the guanidine compound (A) in the present invention is preferably within a range of 2 to 10, more preferably within a range of 3 to 8, and particularly preferably within a range of 4 to 8.

In addition, the guanidine compound (A) in the present invention preferably does not have a nitrogen atom other than a guanidine structure.

Specific examples of the guanidine compound are shown below, but, the present invention is not limited thereto.

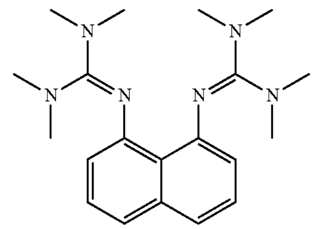

Log P: 4.26

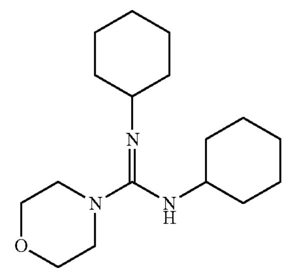

Log P: 3.32

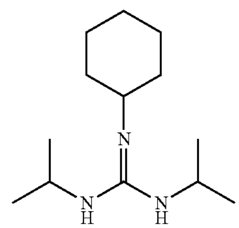

Log P: 3.1

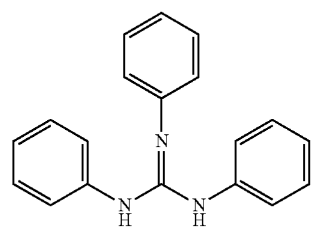

Log P: 5.24

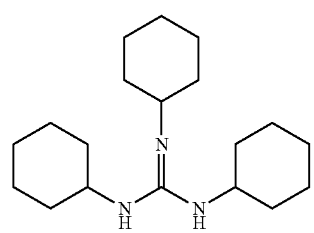

Log P: 4.89

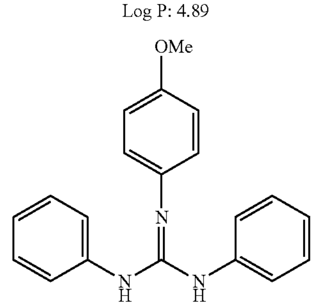

Log P: 5.11

-continued

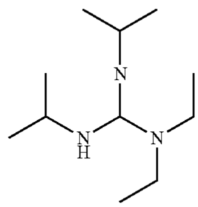

Log P: 2.61

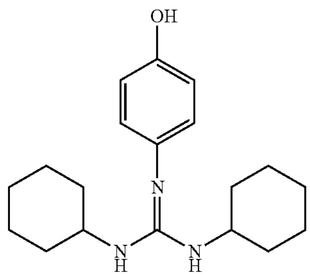

Log P: 4.61

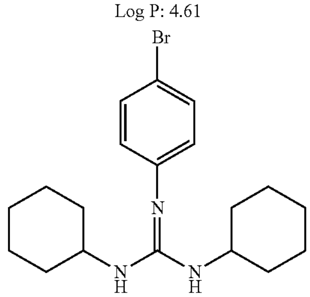

Log P: 5.83

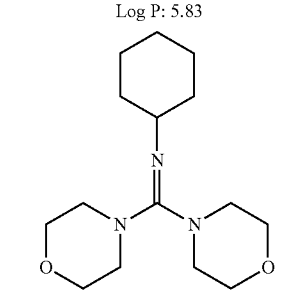

Log P: 1.75

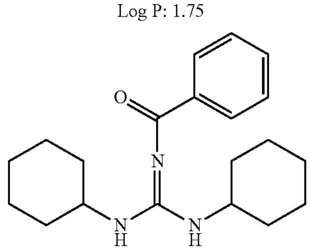

Log P: 4.95

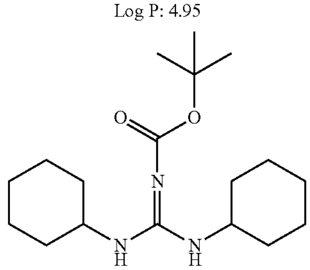

Log P: 4.51

-continued

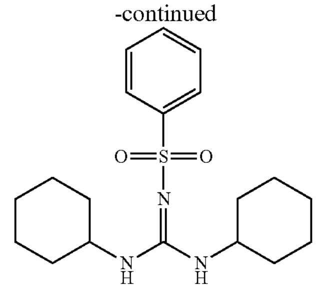

Log P: 4.55

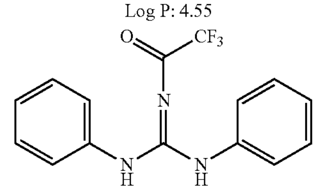

Log P: 4.43

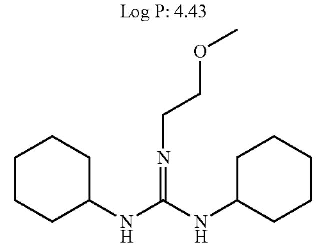

Log P: 3.18

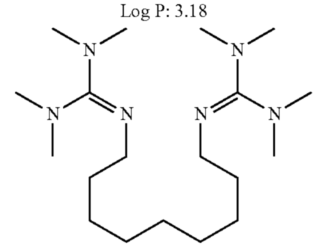

Log P: 4.4

(7) Low Molecular Weight Compound Having Nitrogen Atom and Group Leaving Due to Action of Acid The compound of the present invention can contain a low molecular weight compound (hereinafter, also referred to as a “low molecular weight compound (D)”) having a nitrogen atom and a group leaving due to the action of an acid. The low molecular weight compound (D) preferably has basicity, after a group leaving due to the action of an acid leaves. Regarding the low molecular compound (D), the description in paragraphs “0324” to “0337” of JP2012-133331A can be referred to, and the contents thereof are incorporated in the present specification.

In the present invention, the low molecular weight compound (D) may be used singly or in a mixture of two or more types thereof.

Other than this, examples of the compound according to the present invention which are able to be used include the compounds synthesized in Examples of JP2002-363146A and the compounds described in paragraph “0108” of JP2007-298569A.

As the basic compound, a photosensitive basic compound may be used. As the photosensitive basic compound, for example, the compounds described in JP2003-524799A, J. Photopolym. Sci. & Tech. Vol. 8, P. 543-553 (1995), and the like as can be used.

The molecular weight of the basic compound is usually 100 to 1500, preferably 150 to 1300, and more preferably 200 to 1000.

These basic compounds (C) may be used alone or in combination of two or more types thereof.

The content of the basic compound included in the composition of the present invention is preferably 0.01% by mass to 8.0% by mass, more preferably 0.1% by mass to 5.0% by mass, and particularly preferably 0.2% by mass to 4.0% by mass, based on the total solid content of the composition.

The molar ratio of the basic compound with respect to the photoacid generator is preferably set to 0.01 to 10, more preferably set to 0.05 to 5, and still more preferably set to 0.1 to 3. When the molar ratio is excessively large, sensitivity and/or resolution is reduced in some cases. When the molar ratio is excessively small, there is a possibility that thinning of a pattern occurs, during exposure and heating (post-baking). Moreover, the photoacid generator in the molar ratio is based on the total amount of the repeating unit (B) of the resin and the photoacid generator which the resin further may include.

(D) Solvent

The composition according to the present invention preferably includes the solvent (D). The solvent preferably includes at least one selected from the group consisting of propylene glycol monoalkyl ether carboxylate (S1), propylene glycol monoalkyl ether (S2), lactic acid ester, acetic acid ester, alkoxypropionic acid ester, chain ketone, cyclic ketone, lactone, and alkylene carbonate. The solvent may further include a component other than the component (S1) and the component (S2).

The present inventors find that when such a solvent and the resin described above are used in combination, coating properties of a composition are improved, and a pattern having a small number of development defects can be formed. The reason is not clear, but the present inventors consider that the reason is due to the fact that, since these solvents have excellent balance among solubility with respect to the resin described above, a boiling point, and viscosity, unevenness in the film thickness of the composition layer or the generation of precipitates during the spin coating can be suppressed.

As the component (S1), at least one selected from the group of consisting of propylene glycol monomethyl ether acetate, propylene glycol monomethyl ether propionate, and propylene glycol monoethyl ether acetate is preferable, and propylene glycol monomethyl ether acetate is particularly preferable.

As the component (S2), the followings are preferable.

As propylene glycol monoalkyl ether, propylene glycol monomethyl ether or propylene glycol monoethyl ether is preferable.

As lactic acid ester, ethyl lactate, butyl lactate, or propyl lactate is preferable.

As acetic acid ester, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

As alkoxypropionic acid ester, methyl 3-methoxypropionate (MMP) or ethyl 3-ethoxypropionate (EEP) is preferable.

As linear ketone, 1-octanone, 2-octanone, 1-nonanone, 2-nonanone, acetone, 4-heptanone, 1-hexanone, 2-hexanone, diisobutyl ketone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone is preferable.

As cyclic ketone, methyl cyclohexanone, isophorone, or cyclohexanone is preferable.

As lactone, γ-butyrolactone is preferable.

As alkylene carbonate, propylene carbonate is preferable.

As the component (S2), propylene glycol monomethyl ether, ethyl lactate, ethyl 3-ethoxypropionate, methyl amyl ketone, cyclohexanone, butyl acetate, pentyl acetate, γ-butyrolactone, or propylene carbonate is more preferable.

As the component (S2), a component having a flash point (hereinafter, also referred to as fp) of 37° C. or higher is preferably used. As the component (S2) as described above, propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), γ-butyrolactone (fp: 101° C.), or propylene carbonate (fp: 132° C.) is preferable. Among these, propylene glycol monoethyl ether, ethyl lactate, pentyl acetate, or cyclohexanone is more preferable, and propylene glycol monoethyl ether or ethyl lactate is particularly preferable. Moreover, the "flash point" described here means a value described in the reagent catalog of Tokyo Chemical Industry Co., Ltd. or Sigma-Aldrich Co. LLC.

The solvent preferably includes the component (S1). It is more preferable that the solvent consists of substantially only the component (S1) or is a mixed solvent of the component (S1) and other components. In the latter case, the solvent still more preferably includes both the component (S1) and the component (S2).

The mass ratio between the component (S1) and the component (S2) is preferably within a range of 100:0 to 15:85, more preferably within a range of 100:0 to 40:60, and still more preferably within a range of 100:0 to 60:40. That is, it is preferable that the solvent consists of only the component (S1), or includes both the component (S1) and the component (S2) and the mass ratio thereof is as follows. That is, in the latter case, the mass ratio of the component (S1) to the component (S2) is preferably 15/85 or greater, more preferably 40/60 or greater, and still more preferably 60/40 or greater. When such a configuration is adopted, the number of development defects can be further reduced.

Moreover, in a case where the solvent includes both the component (51) and the component (S2), the mass ratio of the component (51) with respect to the component (S2) is, for example, set to 99/1 or less.

As described above, the solvent may further include a component other than the component (S1) and the component (S2). In this case, the content of the component other than the component (S1) and the component (S2) is preferably within a range of 5% by mass to 30% by mass with respect to the total amount of the solvent.

The content of the solvent in the composition is preferably set such that the solid content concentration of all components becomes 2% by mass to 30% by mass, and more preferably set such that the solid content concentration of all components becomes 3% by mass to 20% by mass. By doing this, the coating properties of the composition can be further improved.

(E) Hydrophobic Resin

The active light sensitive or radiation sensitive resin composition of the present invention may have a hydrophobic resin (E) separately from the resin (A).

The hydrophobic resin is preferably designed to be unevenly distributed on the surface of the resist film, however, unlike a surfactant, the hydrophobic resin does not necessarily have a hydrophilic group in the molecule, and may not contribute to uniform mixing of a polar/nonpolar substance.

As effects of adding the hydrophobic resin, control of static/dynamic contact angle of the resist film surface with respect to water and suppression of outgassing can be exemplified.

From the viewpoint of view of uneven distribution to a film surface layer, the hydrophobic resin preferably has any one or more types of "a fluorine atom", "a silicon atom", and "a $CH_3$ substructure contained in the side chain portion of a resin", and more preferably has two or more types. In addition, the hydrophobic resin preferably contains a hydrocarbon group having 5 or more carbon atoms. These groups may be contained in the main chain of the resin or may be substituted in the side chain.

In a case where the hydrophobic resin includes a fluorine atom and/or a silicon atom, the fluorine atom and/or the silicon atom in the hydrophobic resin may be included in the main chain of the resin, or may be included in the side chain.

In a case where the hydrophobic resin includes a fluorine atom, a substructure having a fluorine atom is preferably a resin having an alkyl group having a fluorine atom, a cycloalkyl group having a fluorine atom, or an aryl group having a fluorine atom.

The alkyl group (preferably has 1 to 10 carbon atoms, and more preferably 1 to 4 carbon atoms) having a fluorine atom is a linear or branched alkyl group in which at least one hydrogen atom is substituted with a fluorine atom, and may have a substituent other than a fluorine atom.

The cycloalkyl group having a fluorine atom is a monocyclic or polycyclic cycloalkyl group in which at least one hydrogen atom is substituted with a fluorine atom, and may have a substituent other than a fluorine atom.

Examples of the aryl group having a fluorine atom include an aryl group in which at least one hydrogen atom of an aryl group such as a phenyl group or a naphthyl group is substituted with a fluorine atom, and the aryl group may have a substituent other than a fluorine atom.

Examples of the repeating unit having a fluorine atom or a silicon atom can include the repeating units exemplified in paragraph "0519" of US2012/0251948A1.

In addition, as described above, it is also preferable that the hydrophobic resin includes a $CH_3$ substructure in the side chain portion.

Here, a $CH_3$ substructure which an ethyl group, a propyl group, or the like has is contained in a $CH_3$ substructure which the side chain portion in the hydrophobic resin has.

On the other hand, since a methyl group (for example, an α-methyl group of a repeating unit having a methacrylic acid structure) which is directly bonded to the main chain of the hydrophobic resin does not largely contribute to the surface uneven distribution of the hydrophobic resin due to the influence of the main chain, the methyl group is not included in the $CH_3$ substructure in the present invention.

More specifically, even in a case where the hydrophobic resin includes a repeating unit derived from a monomer having a polymerizable portion having a carbon-carbon double bond, such as the repeating unit represented by the following General Formula (M), when each of $R_{11}$ to $R_{14}$ is $CH_3$ "itself", the $CH_3$ is not included in a "$CH_3$ substructure which the side chain portion has".

On the other hand, a $CH_3$ substructure which exists through any atom from the C—C main chain will be thought to correspond to the "$CH_3$ substructure". For example, in a case where $R_{11}$ is an ethyl group ($CH_2CH_3$), $R_{11}$ will be thought to have one "$CH_3$ substructure".

(M)

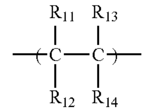

In General Formula (M), each of $R_{11}$ to $R_{14}$ independently represents a side chain portion.

Examples of $R_{11}$ to $R_{14}$ as the side chain portion include a hydrogen atom and a monovalent organic group.

Examples of the monovalent organic groups represented by $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and these group may have substituents.

The hydrophobic resin is preferably a resin having a repeating unit having a $CH_3$ substructure in the side chain portion, and as such a repeating unit, more preferably has "at least one type of repeating unit (hereinafter, simply referred to as "repeating unit (X)") of the repeating unit represented by the following General Formula (II) and the repeating unit represented by the following General Formula (III))".

The repeating unit represented by General Formula (II) will be described in detail below.

(II)

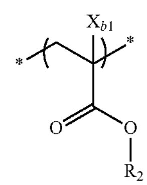

In General Formula (II), $X_{b1}$ represents a hydrogen atom, an alkyl group, a cyano group, or a halogen atom, and $R_2$ represents an organic group stable with respect to an acid, which has one or more $CH_3$ substructures. Here, more specifically, the organic group stable with respect to an acid is preferably an organic group which does not have an "acid-decomposable group" described in the resin (A).

The alkyl group represented by $X_{b1}$ preferably has 1 to 4 carbon atoms, and examples thereof include a methyl group, an ethyl group, a propyl group, a hydroxymethyl group, and a trifluoromethyl group.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ substructures. The cycloalkyl group, the alkenyl group, the cycloalkenyl group, the aryl group, and the aralkyl group described above may further have an alkyl group as a substituent.

$R_2$ is preferably an alkyl group or an alkyl-substituted cycloalkyl group, which has one or more $CH_3$ substructures.

The organic group stable with respect to an acid having one or more $CH_3$ substructures, represented by $R_2$, preferably has 2 to 10 $CH_3$ substructures, and more preferably has 2 to 8 $CH_3$ substructures.

Preferable specific examples of the repeating unit represented by General Formula (II) is described below. However, the present invention is not limited thereto.

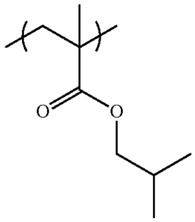
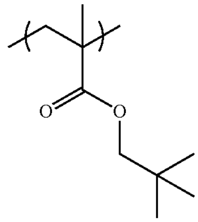
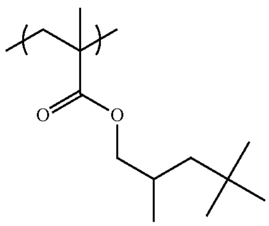
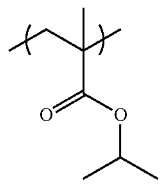
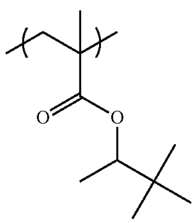
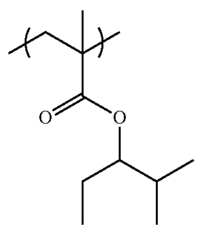
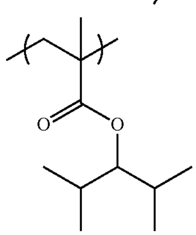
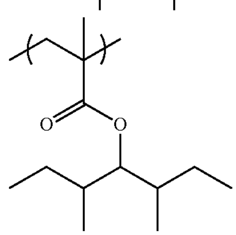
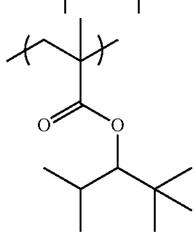
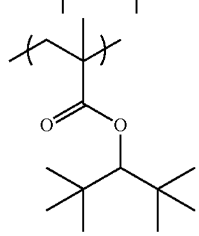
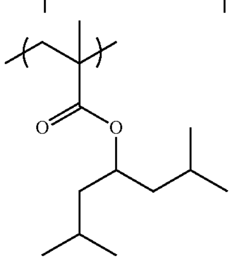
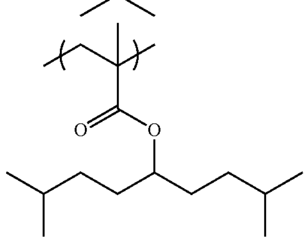
-continued
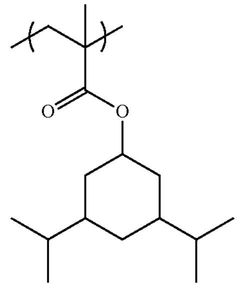
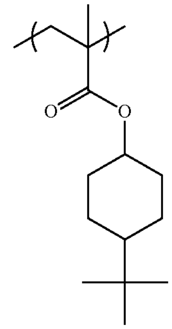
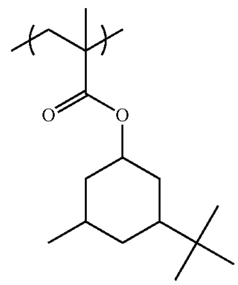
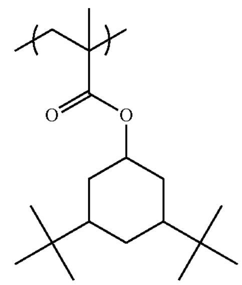
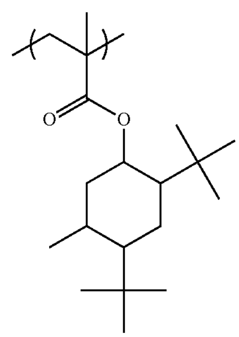
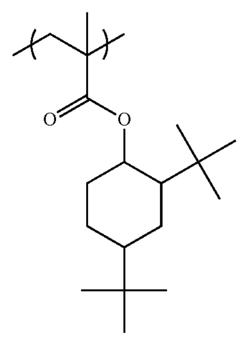
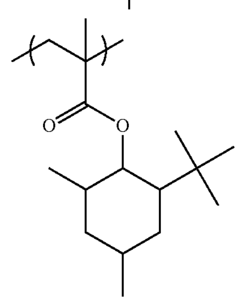
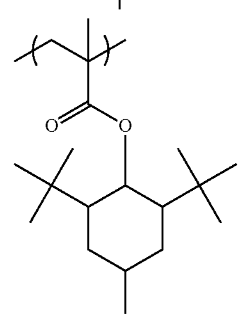
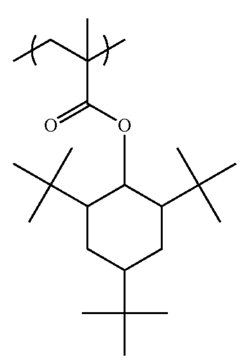

-continued

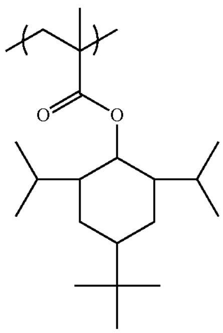
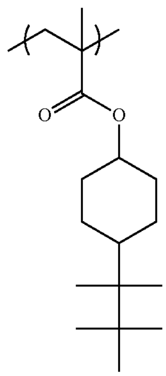
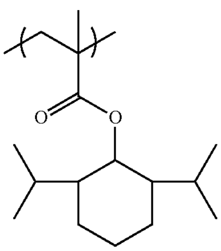
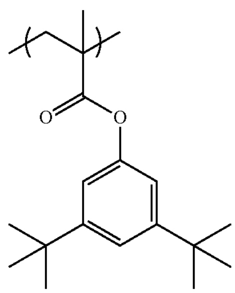
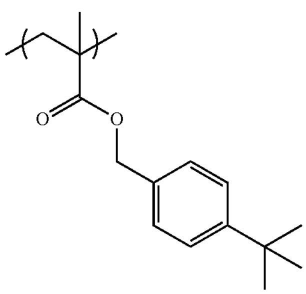

The repeating unit represented by General Formula (II) is preferably a repeating unit stable (non-acid-decomposable) with respect to an acid, and specifically, is preferably a repeating unit not having a group which generates a polar group by being decomposed due to the action of an acid.

The repeating unit represented by General Formula (III) will be described in detail below.

(III)

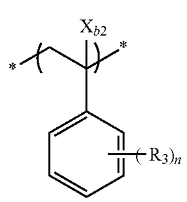

In General Formula (III), $X_{b2}$ represents a hydrogen atom, an alkyl group, a cyano group, or a halogen atom, $R_3$ represents an organic group stable with respect to an acid, which has one or more $CH_3$ substructures, and n represents an integer of 1 to 5.

The alkyl group represented by $X_{b2}$ preferably has 1 to 4 carbon atoms, and examples thereof include a methyl group, an ethyl group, a propyl group, a hydroxymethyl group, and a trifluoromethyl group.

$X_{b2}$ is preferably a hydrogen atom.

Since $R_3$ is an organic group stable with respect to an acid, more specifically, $R_3$ is preferably an organic group which does not have an "acid-decomposable group" described in the resin (A).

Examples of $R_3$ include an alkyl group which has one or more $CH_3$ substructures.

The organic group stable with respect to an acid having one or more $CH_3$ substructures, represented by $R_3$, preferably has 1 to 10 $CH_3$ substructures, more preferably has 1 to 8 $CH_3$ substructures, and still more preferably has 1 to 4 $CH_3$ substructures.

n represents an integer of 1 to 5, more preferably represents an integer of 1 to 3, and still more preferably represents 1 or 2.

Preferable specific examples of the repeating unit represented by General Formula (III) is described below. However, the present invention is not limited thereto.

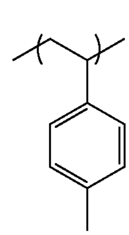
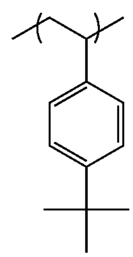
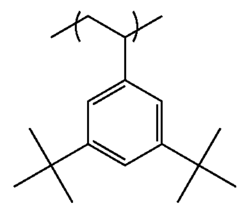
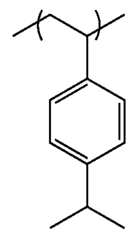
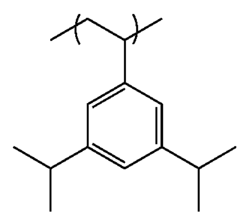
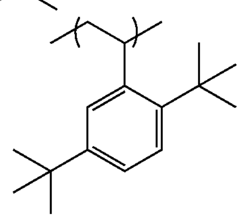

The repeating unit represented by General Formula (III) is preferably a repeating unit stable (non-acid-decomposable) with respect to an acid, and specifically, is preferably a repeating unit not having a group which generates a polar group by being decomposed due to the action of an acid.

In a case where the hydrophobic resin includes a $CH_3$ substructure in the side chain portion, in particular, in a case where the hydrophobic resin does not have a fluorine atom and a silicon atom, the content of the repeating unit (X) is preferably 90 mol % or greater, and more preferably 95 mol % or greater, with respect to the entirety of repeating units in the hydrophobic resin. The content is typically 100 mol % or less with respect to the entirety of repeating units in the hydrophobic resin.

When the hydrophobic resin includes the repeating unit (X) in 90 mol % or greater with respect to the entirety of repeating units in the hydrophobic resin, the surface free energy of the hydrophobic resin is increased. As a result, the hydrophobic resin is likely to be unevenly distributed on the surface of the resist film.

In addition, the hydrophobic resin, (i) even in a case where the hydrophobic resin includes a fluorine atom and/or a silicon atom, (ii) even in a case where the hydrophobic resin includes a $CH_3$ substructure in the side chain portion, the hydrophobic resin may have at least one group selected from the group consisting of the following (x) to (z).

(x) acid group, (y) a group having a lactone structure, an acid anhydride group, or an acid imide group, (z) a group to be decomposed due to the action of an acid Examples of the acid group (x) include a phenolic hydroxyl group, a carboxylic acid group, a fluorinated alcohol group, a sulfonic acid group, a sulfonamide group, a sulfonyl imide group, a (alkylsulfonyl)(alkylcarbonyl) methylene group, a (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferable examples of the acid group include a fluorinated alcohol group (preferably, hexafluoroisopropanol), a sulfonimide group, and a bis(alkylcarbonyl)methylene group.

Examples of the repeating unit having an acid group (x) include a repeating unit of which an acid group is directly bonded to the main chain of a resin as a repeating unit by acrylic acid or methacrylic acid and a repeating unit of which an acid group is bonded to the main chain of a resin through a connecting group, and any the repeating unit having an acid group (x) which can be introduced to a terminal of a polymer chain using a polymerization initiator or a chain transfer agent having an acid group at the time of polymerization is preferable. The repeating unit having an acid group (x) may have at least any one of a fluorine atom and a silicon atom.

The content of the repeating unit having the acid group (x) is preferably 1 mol % to 50 mol %, more preferably 3 mol % to 35 mol %, and still more preferably 5 mol % to 20 mol %, with respect to the entirety of repeating units in the hydrophobic resin.

Specific examples of the repeating unit having the acid group (x) will be described below, but the present invention is not limited thereto. In the formula, Rx represents a hydrogen atom, $CH_3$, $CF_3$, or $CH_2OH$.

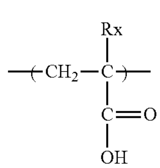

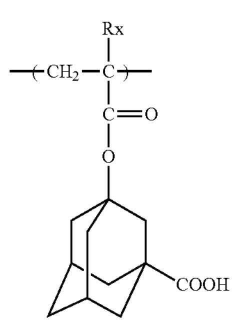

-continued

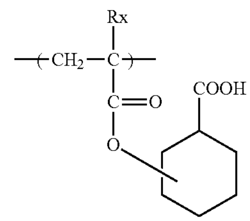

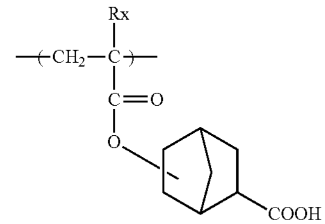

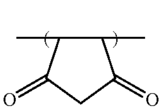

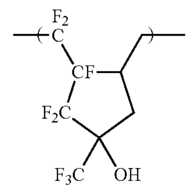

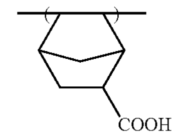

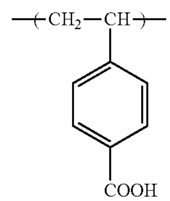

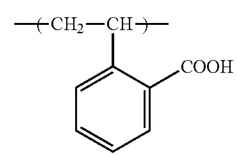

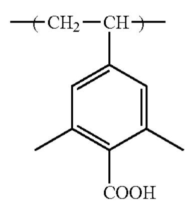

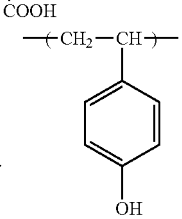

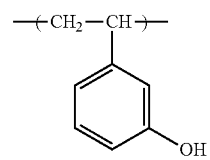

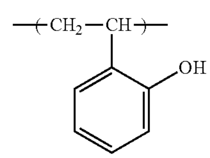

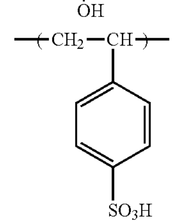

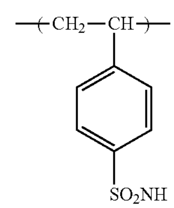

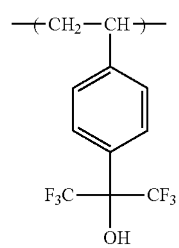

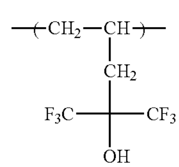

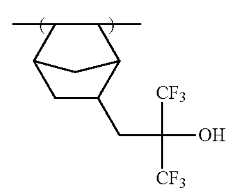

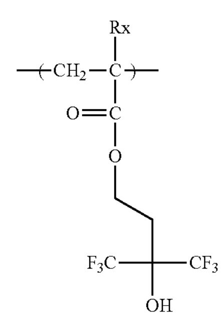

-continued

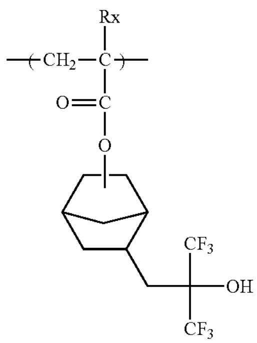

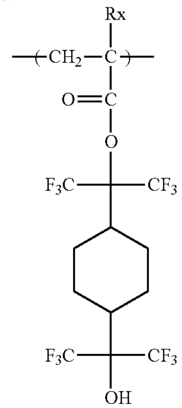

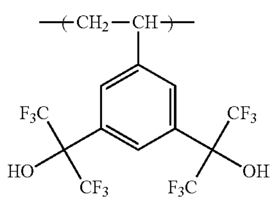

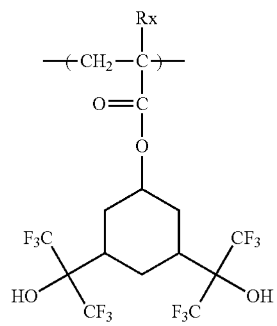

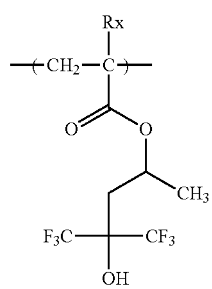

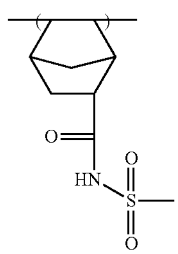

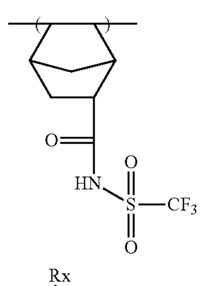

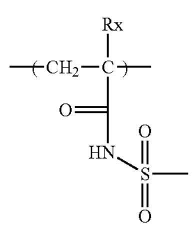

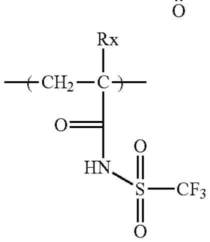

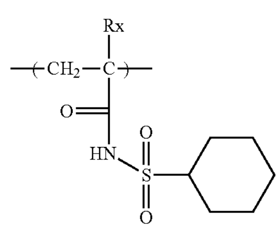

-continued

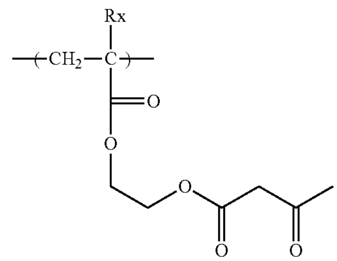

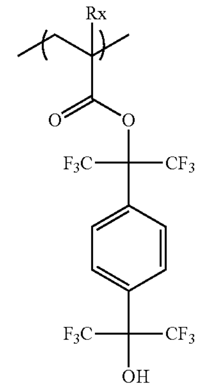

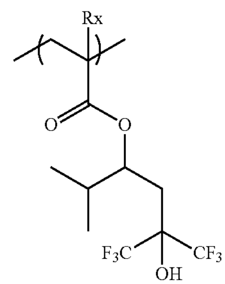

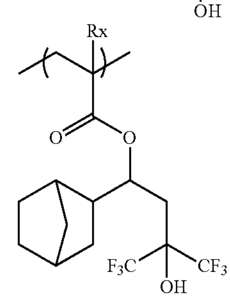

As a group having a lactone structure, an acid anhydride group, or an acid imide group (y), a group having a lactone structure is particularly preferable.

The repeating unit including the above group is a repeating unit of which the group is directly bonded to the main chain of a resin, for example, such as a repeating unit by acrylic acid ester or methacrylic acid ester. Alternatively, the repeating unit may be a repeating unit of which the group is directly bonded to the main chain of a resin through a connecting group. Alternatively, the repeating unit may be introduced to a terminal of a resin using a polymerization initiator or a chain transfer agent having the group.

Examples of the repeating unit having a group having a lactone structure include the same as the repeating unit having a lactone structure described in the section of the resin (A) in advance.

The content of the repeating unit having a group having a lactone structure, an acid anhydride group, or an acid imide group is preferably 1 mol % to 100 mol %, more preferably 3 mol % to 98 mol %, and still more preferably 5 mol % to 95 mol %, based on the entirety of repeating units in the hydrophobic resin.

Examples of the repeating unit having the group (z) to be decomposed due to the action of an acid in the hydrophobic resin include the same as the repeating unit having an acid-decomposable group exemplified in the resin (A). The repeating unit having the group (z) to be decomposed due to the action of an acid may have at least any one of a fluorine atom and a silicon atom. The content of the repeating unit having the group (z) to be decomposed due to the action of an acid in the hydrophobic resin is preferably 1 mol % to 80 mol %, more preferably 10 mol % to 80 mol %, and still more preferably 20 mol % to 60 mol %, with respect to the entirety of repeating units in the hydrophobic resin.

In addition to the above, preferable specific examples of the hydrophobic resin (E) are described below. However, the present invention is not limited thereto.

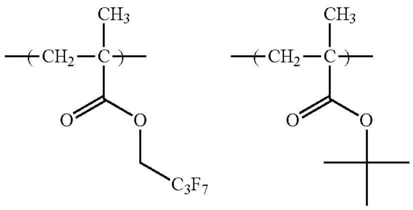
(HR-1)
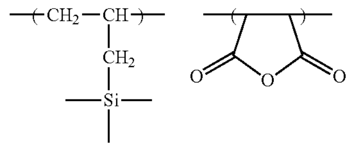
(HR-2)
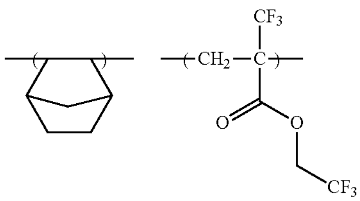
(HR-3)
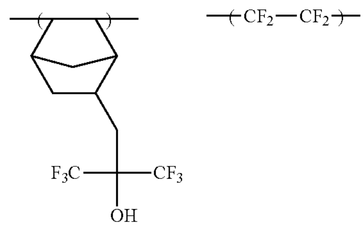
(HR-4)
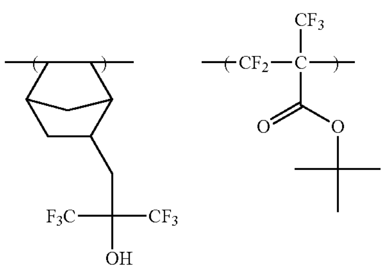
(HR-5)
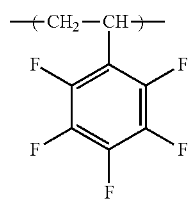
(HR-6)
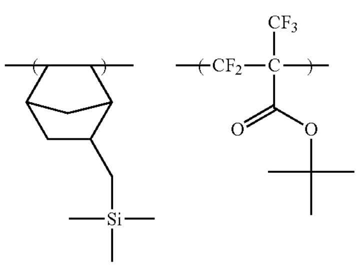
(HR-7)
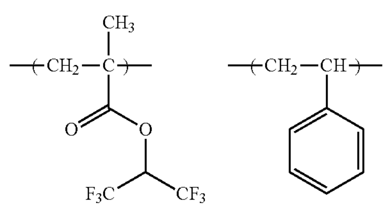
(HR-8)
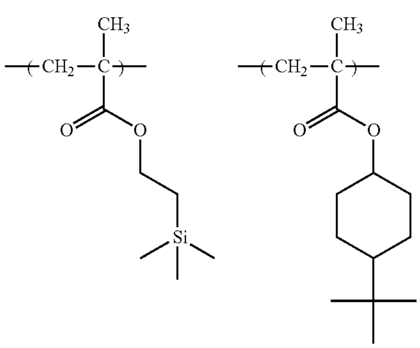
(HR-9)
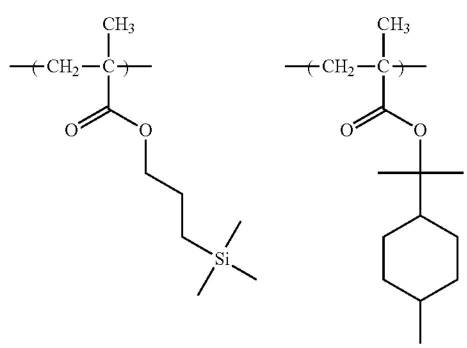
(HR-10)

-continued
(HR-11)
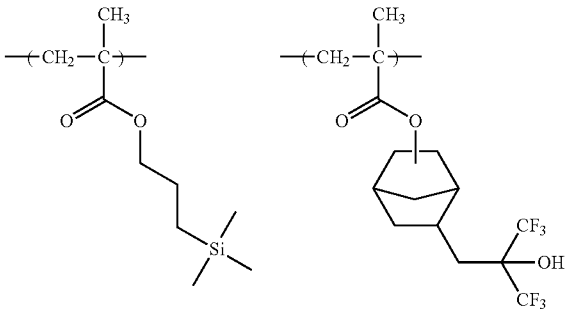
(HR-12)
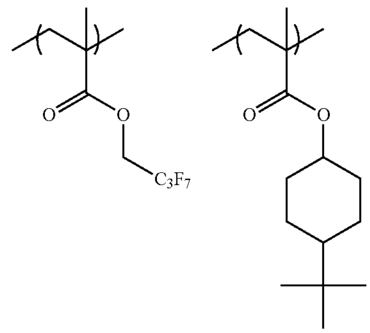
(HR-13)
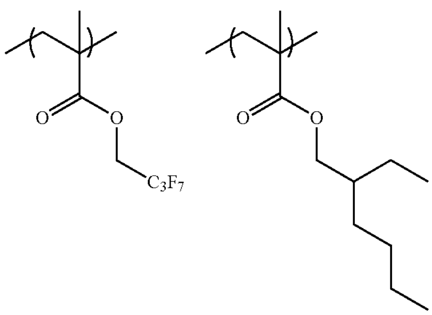
(HR-14)
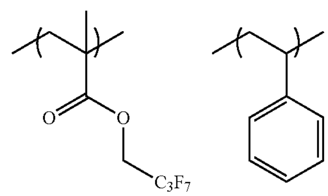
(HR-15)
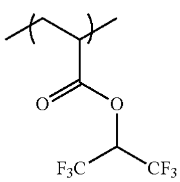
(HR-16)
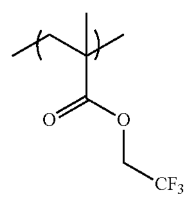
(HR-17)
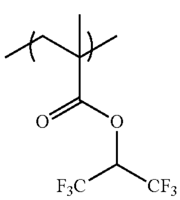
(HR-18)
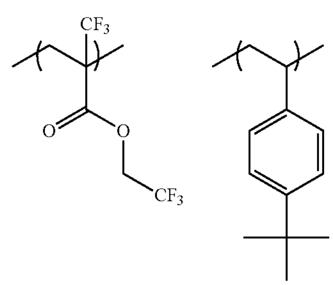
(HR-19)
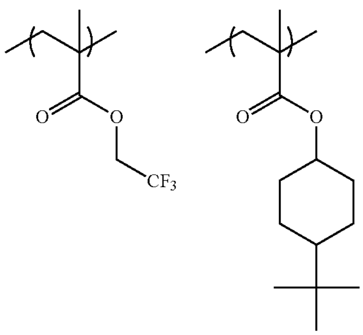
(HR-20)
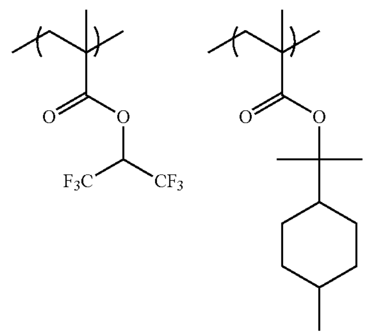

-continued
(HR-21)
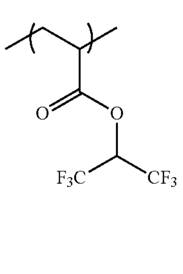
(HR-22)
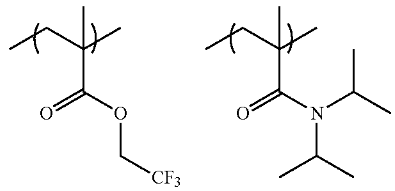
(HR-23)
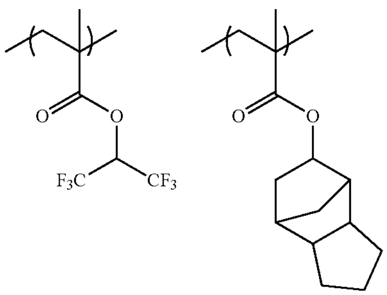
(HR-24)
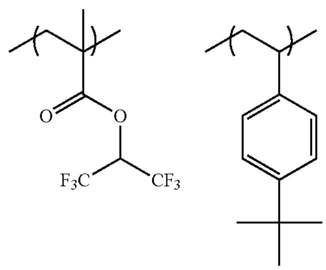
(HR-25)
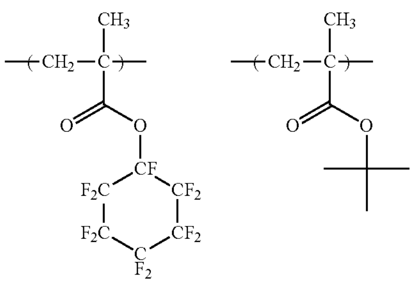
(HR-26)
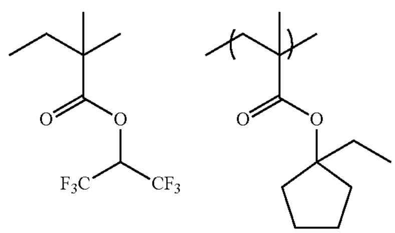
(HR-27)
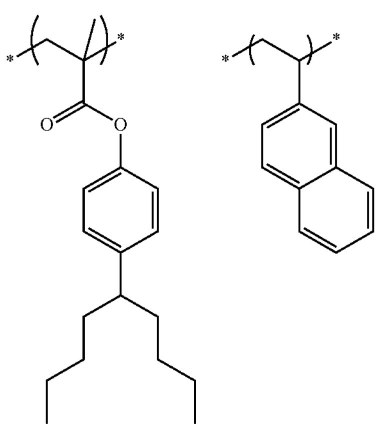
(HR-28)
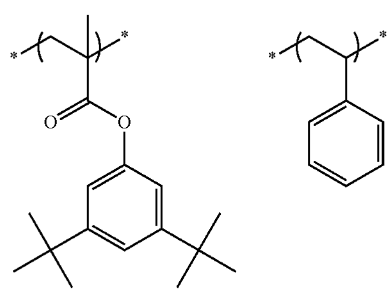
HR-29
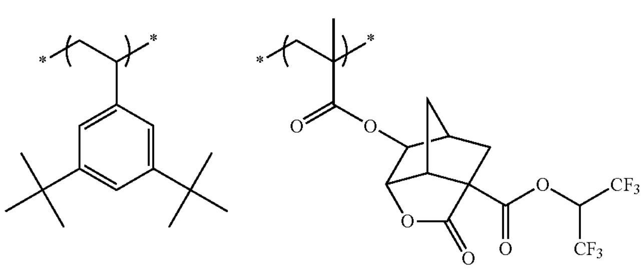

-continued

HR-30

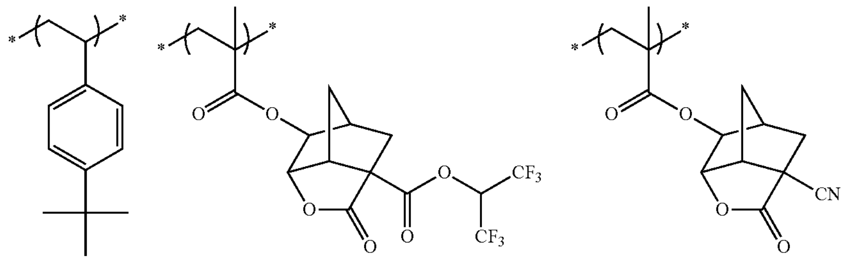

HR-31

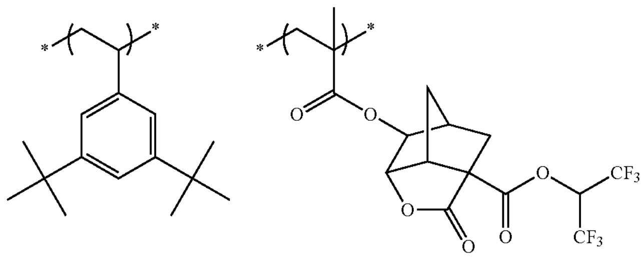

HR-32

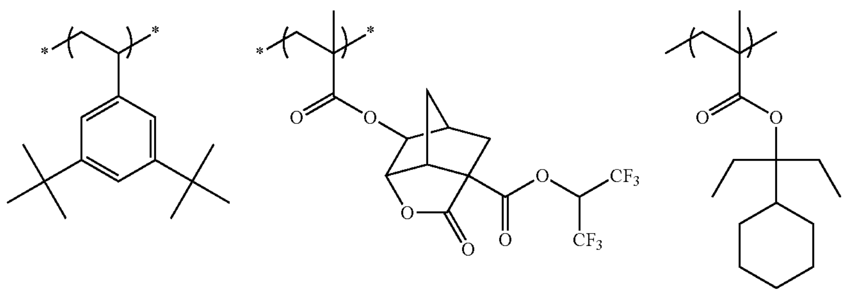

HR-33

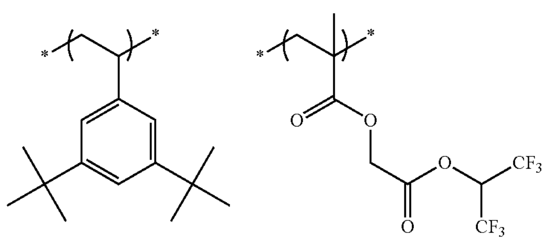

HR-34

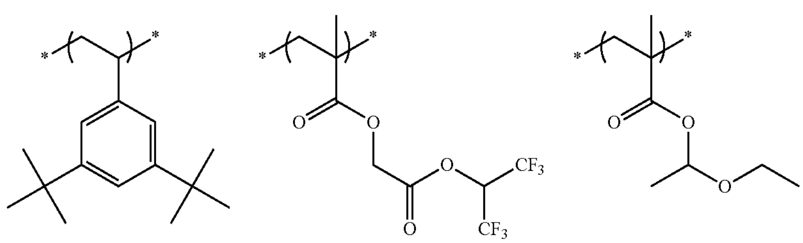

In a case where the hydrophobic resin has a fluorine atom, the content of the fluorine atom is preferably 5% by mass to 80% by mass, more preferably 10% by mass to 80% by mass, with respect to the weight average molecular weight of the hydrophobic resin. In addition, the repeating unit including a fluorine atom is preferably 10 mol % to 100 mol %, and more preferably 30 mol % to 100 mol %, in the entirety of repeating units included in the hydrophobic resin.

In a case where the hydrophobic resin has a silicon atom, the content of the silicon atom is preferably 2% by mass to 50% by mass, more preferably 2% by mass to 30% by mass, with respect to the weight average molecular weight of the hydrophobic resin. In addition, the repeating unit including a silicon atom is preferably 10 mol % to 100 mol %, and more preferably 20 mol % to 100 mol %, in the entirety of repeating units included in the hydrophobic resin.

On the other hand, in particular, in a case where the hydrophobic resin includes a $CH_3$ substructure in the side chain portion, a form in which the hydrophobic resin does not substantially contain a fluorine atom or a silicon atom is also preferable. In this case, specifically, the content of the repeating unit having a fluorine atom or a silicon atom is preferably 5 mol % or less, more preferably 3 mol % or less, and still more preferably 1 mol % or less, with respect to the entirety of repeating units in the hydrophobic resin, and it is ideal that the content is 0 mol %, that is, the repeating unit does not contain a fluorine atom and a silicon atom. In addition, it is preferable that the hydrophobic resin is substantially configured of only a repeating unit configured of only one type selected from a carbon atom, an oxygen atom, a hydrogen atom, a nitrogen atom, and a sulfur atom. More specifically, the repeating unit configured of only one type selected from a carbon atom, an oxygen atom, a hydrogen atom, a nitrogen atom, and a sulfur atom is preferably 95 mol % or greater, more preferably 97 mol % or greater, still more preferably 99 mol % or greater, and ideally 100 mol %, in the entirety of repeating units of the hydrophobic resin.

The weight average molecular weight in terms of standard polystyrene of the hydrophobic resin is preferably 1,000 to 100,000, more preferably 1,000 to 50,000, and still more preferably 2,000 to 15,000.

In addition, the hydrophobic resin may be used alone or in combination of a plurality of hydrophobic resins.

The content of the hydrophobic resin in a composition is preferably 0.01% by mass to 10% by mass, more preferably 0.05% by mass to 8% by mass, and still more preferably 0.1% by mass to 7% by mass, with respect to the total solid content in the composition of the present invention.

A small amount of impurities such as metal is naturally included in the hydrophobic resin, but, residual monomers or oligomer components are preferably 0.01% by mass to 5% by mass, more preferably from 0.01% by mass to 3% by mass, and still more preferably 0.05% by mass to 1% by mass. As a result, a composition in which there is no variation over time of foreign matters in liquid, sensitivity, or the like is obtained. In addition, from the viewpoint of resolution, a resist shape, a side wall of a resist pattern, roughness, or the like, the molecular weight distribution (Mw/Mn, also referred to as dispersity) is preferably within a range of 1 to 5, more preferably within a range of 1 to 3, and still more preferably within a range of 1 to 2.

As the hydrophobic resin, various commercially available products can also be used, or the hydrophobic resin can be synthesized according to a commonly used method in the related art (for example, radical polymerization). Examples of a general synthetic method include a collective polymerization method of performing polymerization by dissolving a monomer species and an initiator in a solvent and heating the resultant product and a dropping polymerization method of adding a solution containing a monomer species and an initiator dropwise to a heated solvent over a period of 1 hour to 10 hours, and the dropping polymerization method is preferable.

The reaction solvent, the polymerization initiator, the reaction conditions (temperature, concentration, and the like), and the purification method after the reaction, are the same as those described in the resin (A), and in the synthesis of the hydrophobic resin, the concentration of the reaction is preferably 30% by mass to 50% by mass.

In addition to the above hydrophobic resins, the hydrophobic resins described in JP2011-248019A, JP2010-175859A, or JP 2012-032544A can also be preferably used.

When the film formed of the resist composition according to the present invention is irradiated with active light or radiation, exposure (immersion exposure) may be performed in a state of being filled with liquid (liquid immersion medium) having a higher refractive index than the air between a film and a lens. Thus, the resolution can be increased. Although the liquid immersion medium used is not particularly limited as long as it is liquid having a higher refractive index than air, pure water is preferable.

The immersion liquid used in the immersion exposure will be described below.

As the immersion liquid, a liquid which is transparent at the exposure wavelength, and has as small a temperature coefficient of the refractive index as possible such that the distortion of an optical image projected on a resist film is kept to a minimum is preferable, and in addition to the above viewpoint, from the viewpoint of easy availability and ease of handling, water is preferably used.

In addition, from the viewpoint of further improving the refractive index, a medium having a refractive index of 1.5 or greater can also be used. This medium may be an aqueous solution or an organic solvent.

In a case where water is used as the immersion liquid, to reduce the surface tension of water and to increase the surface activity power, an additive (liquid) which does not dissolve the resist film on a wafer and in which influence on an optical coat on the lower surface of a lens element is negligible may be added in a small proportion. As the additive, an aliphatic alcohol having a refractive index substantially equal to that of water is preferable, and specific examples thereof include methyl alcohol, ethyl alcohol, and isopropyl alcohol. When an alcohol having a refractive index substantially equal to that of water is added, an advantage in which the change in refractive index of the entirety of liquid can be made to be extremely small is obtained even in a case where the alcohol concentration is changed due to evaporation of the alcohol component in the water. On the other hand, in a case where an impurity having a refractive index significantly different from that of water is mixed, the distortion of an optical image projected on a resist film occurs, and thus as the water to be used, distilled water is preferable. Furthermore, pure water filtered through an ion exchange filter or the like may be used.

The electrical resistance of water is desirably 18.3 MΩ cm or greater, TOC (organic material concentration) is desirably 20 ppb or less, and water is desirably subjected to a deaeration treatment.

In addition, by increasing the refractive index of the immersion liquid, the lithographic performance can be improved. From this point of view, an additive which increases a refractive index is added to water, or heavy water ($D_2O$) may be used instead of water.

An immersion liquid poorly soluble film (hereinafter, also referred to as "topcoat") may be provided between the film formed of the composition of the present invention and the immersion liquid such that the film does not come into contact with the immersion liquid. Functions required for the topcoat are coating suitability to the upper layer portion of a composition film and immersion liquid poor solubility. The topcoat is preferably a topcoat which is not mixed with the composition film, and can be uniformly applied to the upper layer of the composition film.

Specific examples of the topcoat include a hydrocarbon polymer, an acrylic acid ester polymer, polymethacrylic acid, polyacrylic acid, polyvinyl ether, a silicon-containing polymer, and a fluorine-containing polymer. The hydrophobic resin (E) described above is also suitable as the topcoat. In addition, commercial available topcoat materials can also be suitably used. From the viewpoint of contamination of an optical lens when impurities are flowed out from the topcoat to the immersion liquid, the amount of residual monomer components of the polymer included in the topcoat is preferably smaller.

When the top coat is peeled off, a developer may be used, or a separate peeling agent may be used. As the peeling agent, a solvent which hardly penetrates into a film is preferable. From the viewpoint of being capable of performing a peeling step simultaneously with a developing treatment step of a film, the topcoat can be preferably peeled off with a developer including an organic solvent.

When there is no difference in refractive index between the topcoat and the immersion liquid, the resolving power is improved. In a case where water is used as the immersion liquid, the topcoat preferably has a refractive index close to that of the immersion liquid. From the viewpoint of making the refractive index of the topcoat be close to that of the immersion liquid, a fluorine atom is preferably included in the topcoat. In addition, from the viewpoint of transparency and refractive index, a thin film is preferable.

The topcoat is preferably not mixed with the film and also not mixed with the immersion liquid. From this viewpoint, in a case where the immersion liquid is water, the solvent used in the topcoat is a preferably a medium which is poorly soluble in the solvent used in the composition of the present invention and water-insoluble. Furthermore, in a case where the immersion liquid is an organic solvent, the topcoat may be water-soluble, or may be water-insoluble.

On the other hand, when EUV exposure or EB exposure is performed, for the purpose of suppression of outgassing, suppression of blob defects, prevention of perpendicularity deterioration due to reverse taper shape improvement, prevention of LWR deterioration due to surface roughness, and the like, a topcoat layer may be formed on the upper layer of a resist film formed of the active light sensitive or radiation sensitive resin composition of the present invention. The topcoat composition used in formation of a topcoat layer will be described below.

The solvent of the topcoat composition in the present invention is preferably water or an organic solvent. Water or an alcohol-based solvent is more preferable.

In a case where the solvent is an organic solvent, the solvent is preferably a solvent which does not dissolve a resist film. As a solvent capable of being used, an alcohol-based solvent, a fluorine-based solvent, or a hydrocarbon-based solvent is preferably used, and an alcohol-based solvent which is fluorine-based is more preferably used. As the alcohol-based solvent, a primary alcohol is preferable, and a primary alcohol having 4 to 8 carbon atoms is more preferable, form the viewpoint of coating properties. Although a linear, a branched, or a cyclic alcohol can be used as a primary alcohol having 4 to 8 carbon atoms, a linear or a branched alcohol is preferable. Specific examples thereof include 1-butanol, 1-hexanol, 1-pentanol, and 3-methyl-1-butanol.

In a case where the solvent of the topcoat composition in the present invention is water or an alcohol-based solvent, the solvent preferably contains a water-soluble resin. It is considered that the uniformity of solubility in a developer can be enhanced when the solvent contains a water-soluble resin. Examples of the preferable water-soluble resin include polyacrylic acid, polymethacrylic acid, polyhydroxystyrene, polyvinyl pyrrolidone, polyvinyl alcohol, polyvinyl ether, polyvinyl acetal, polyacrylic imide, polyethylene glycol, polyethylene oxide, polyethylene imine, polyester polyol, polyether polyol, and polysaccharides. Polyacrylic acid, polymethacrylic acid, polyhydroxystyrene, polyvinyl pyrrolidone, or polyvinyl alcohol is particularly preferable. Moreover, the water-soluble resin is not limited only to a homopolymer, and may be a copolymer. For example, the water-soluble resin may be a copolymer which has a monomer corresponding to the repeating unit of the homopolymer described above and another monomer unit. Specifically, an acrylic acid-methacrylic acid copolymer or an acrylic acid-hydroxystyrene copolymer can also be used in the present invention.

In addition, as the resin for the topcoat composition, a resin having an acid group described in JP2009-134177A or JP2009-91798A can also be preferably used.

Although the weight average molecular weight of the water-soluble resin is not particularly limited, the weight average molecular weight is preferably 2000 to 100000, more preferably 5000 to 500000, and particularly preferably 10000 to 100000. Here, the weight average molecular weight of a resin is a molecular weight in terms of polystyrene measured by using GPC (carrier: THF or N-methyl-2-pyrrolidone (NMP)).

Although the pH of the topcoat composition is not particularly limited, the pH is preferably 0 to 10, more preferably 0 to 8, and particularly preferably 1 to 7.

In a case where the solvent of the topcoat composition is an organic solvent, the topcoat composition may contain a hydrophobic resin as the hydrophobic resin (E) described in the section of the active light sensitive or radiation sensitive resin composition. As the hydrophobic resin, the hydrophobic resin described in JP2008-209889A is also preferably used.

The concentration of the resin in the topcoat composition is preferably 0.1% by mass to 10% by mass, more preferably 0.2% by mass to 5% by mass, and particularly preferably 0.3% by mass to 3% by mass.

The topcoat material may include components other than a resin, and the proportion of the resin in the solid content of the topcoat composition is preferably 80% by mass to 100% by mass, more preferably 90% by mass to 100% by mass, and particularly preferably 95% by mass to 100% by mass.

The solid content concentration of the topcoat composition in the present invention is preferably 0.1% by mass to 10% by mass, more preferably 0.2% by mass to 6% by mass, and particularly preferably 0.3% by mass to 5% by mass. When the solid content concentration is within the above range, the topcoat composition can be uniformly applied to a resist film.

Examples of components other than resins capable of being added to the topcoat material include a surfactant, a photoacid generator, and a basic compound. Specific examples of the photoacid generator and the basic compound include the same compounds as compounds that generate an acid by irradiation with active light or radiation and the basic compounds described above.

In a case where a surfactant is used, the amount of the surfactant used is preferably 0.0001% by mass to 2% by mass, and more preferably 0.001% by mass to 1% by mass, with respect to the total amount of the topcoat composition.

When a surfactant is added to the topcoat composition, coating properties in a case of being coated with the topcoat composition can be improved. Examples of the surfactant include nonionic, anionic, cationic, and amphoteric surfactants.

As the nonionic surfactant, Plufarac series manufactured by BASF Corp., ELEBASE series, FINESURF series, or BLAUNON series, manufactured by Aoki Oil Industrial Co., Ltd., Adeka Pluronic P-103 manufactured by Adeka Corporation, EMULGEN series, AMIET series, AMINON PK-02S, EMANON CH-25, or LHEODOL series, manufactured by Kao Chemical Co., SURFLON S-141 manufactured by AGC SEIMI CHEMICAL CO., LTD., NOIGEN series manufactured by Dai-ichi Kogyo Seiyaku Co., Ltd., NEWKALGEN series manufactured by TAKEMOTO OIL & FAT Co., Ltd., DYNOL 604, EnviroGem AD01, OLFINE EXP series, and Surfynol series, manufactured by Nissin Chemical Industry Co., Ltd., FTERGENT 300 manufactured by Ryoko Chemical Co., Ltd., or the like can be used.

As the anionic surfactant, EMAL 20T or POIZ 532A, manufactured by Kao Chemical Co., Phosphanol ML-200 manufactured by Toho Chemical Industry Co., Ltd., EMULSOGEN series manufactured by Clariant Japan KK, SURFLON S-111N or SURFLON S-211 manufactured by AGC SEIMI CHEMICAL CO., LTD., PLYSURF series manufactured by Dai-ichi Kogyo Seiyaku Co., Ltd., PIONIN Series manufactured by TAKEMOTO OIL & FAT Co., Ltd., OLFINE PD-201 or Olfine PD-202 manufactured by Nissin Chemical Industry Co., Ltd., AKYPO RLM45 or ECT-3 manufactured by Nihon Surfactant Kogyo K.K., LIPON manufactured by Lion Corporation, or the like can be used.

As the cationic surfactant, ACETAMIN 24, ACETAMIN 86 manufactured by Kao Chemical Co., or the like can be used.

As the amphoteric surfactant, SURFLON S-131 (manufactured by AGC SEIMI CHEMICAL CO., LTD.), ENADICOL C-40H or Lipomin LA (manufactured by Kao Chemical Co., Ltd.), or the like can be used.

In addition, these surfactants can also be used in combination.

In the pattern forming method of the present invention, a resist film can be formed on a substrate by using the active light sensitive or radiation sensitive resin composition, and a topcoat layer can be formed on the resist film using the topcoat composition described above. The film thickness of the resist film is preferably 10 nm to 100 nm, and the film thickness of the topcoat layer is preferably 10 nm to 200 nm, more preferably 20 nm to 100 nm, and particularly preferably 40 nm to 80 nm.

As a method of coating the substrate with the active light sensitive or radiation sensitive resin composition, spin coating is preferable, and the rotation speed thereof is preferably 1000 rpm to 3000 rpm.

For example, a resist film is formed by applying the active light sensitive or radiation sensitive resin composition to a substrate (example: silicon/silicon dioxide coating) which is used in manufacture of precision integrated circuit elements by using a suitable coating method such as a spinner or a coater and drying the resultant product. Moreover, a known antireflection film can also be applied in advance. In addition, the resist film is preferably dried before formation of a topcoat layer.

Next, a topcoat layer can be formed by applying a topcoat composition to the obtained resist film by the same means as that in the resist film forming method and by drying the resultant product.

Development is performed by irradiating a resist film having a topcoat layer on the upper layer with an electron beam (EB), X-rays, or EUV light typically through a mask and by, preferably, baking (heating) the resultant product. Thus, an excellent pattern can be obtained.

(F) Surfactant

The composition according to the present invention may further include the surfactant (F). By a surfactant being contained, in a case where an exposure light source having a wavelength of 250 nm or less is used, in particular, 220 nm or less, a pattern having smaller adhesion and development defect can be formed with a favorable sensitivity and resolution.

As the surfactant, a fluorine-based surfactant and/or a silicon-based surfactant is particularly preferable.

Examples of the fluorine-based surfactant and/or the silicon-based surfactant include surfactants described in paragraph "0276" in the specification of US2008/0248425A. In addition, F Top EF301 or EF303 (manufactured by Shin-Akita Kasei Co., Ltd.); Fluorad FC430, 431, or 4430 manufactured by Sumitomo 3M Ltd.); Megafac F171, F173, F176, F189, F113, F110, F177, F120, or R08 (manufactured by DIC Corporation); Surflon S-382, SC101, 102, 103, 104, 105, or 106 (manufactured by Asahi Glass Co., Ltd.); Troysol S-366 (manufactured by Troy Chemical Corp.); GF-300 or GF-150 (manufactured by Toagosei Chemical Industry Co., Ltd.), Surflon S-393 (manufactured by AGC Seimi Chemical Co., Ltd.); Eftop EF121, EF122A, EF122B, RF122C, EF125M, EF135M, EF351, EF352, EF801, EF802, or EF601 ((manufactured by Jemco Co., Ltd); PF636, PF656, PF6320, or PF6520 (manufactured by OMNOVA Solutions Inc.); or FTX-204G, 208G, 218G, 230G, 204D, 208D, 212D, 218D, or 222D (manufactured by Neos Company Limited) may be used. Moreover, a polysiloxane polymer KP-341 (manufactured by Shin-Etsu Chemicals Co., Ltd.) can also be used as a silicon-based surfactant.

In addition, in addition to the known surfactants as described above, the surfactant may be synthesized using a fluoroaliphatic compound prepared by a telomerization method (also referred to as a telomer method) or an oligomerization method (also referred to as an oligomer method). Specifically, a polymer having a fluoroaliphatic group derived from the fluoroaliphatic compound may be used as a surfactant. The fluoroaliphatic compound can be synthesized by the method described in JP2002-90991A.

As the polymer having a fluoroaliphatic group, a copolymer of a monomer having a fluoroaliphatic group and (poly(oxyalkylene))acrylate or methacrylate and/or (poly(oxyalkylene))methacrylate is preferable, and the polymer may be irregularly distributed, or may be a block copolymer.

Examples of the poly(oxyalkylene) group include a poly(oxyethylene) group, a poly(oxypropylene) group, and a poly(oxybutylene) group. In addition, the poly(oxyalkylene) group may be a unit having alkylenes having different chain lengths in the same chain, such as poly(block connector of oxyethylene, oxypropylene and oxyethylene) and poly(block connector of oxyethylene and oxypropylene).

Furthermore, a copolymer of a monomer having a fluoroaliphatic group and (poly(oxyalkylene))acrylate or methacrylate may be a ternary or higher compound system copolymer formed by copolymerizing a monomer having two or more types of fluoroaliphatic group and two or more types of (poly(oxyalkylene))acrylate or methacrylate at the same time.

For example, examples of a commercially available surfactant include Megafac F178, F-470, F-473, F-475, F-476, and F-472 (manufactured by DIC Corporation). Furthermore, examples of a commercially available surfactant include a copolymer of acrylate or methacrylate having a $C_6F_{13}$ group and (poly(oxyalkylene))acrylate or methacrylate, a copolymer of acrylate or methacrylate having a $C_6F_{13}$ group, (poly(oxyethylene))acrylate or methacrylate, and (poly(oxypropylene))acrylate or methacrylate, a copolymer of acrylate or methacrylate having a $C_8F_{17}$ group and (poly(oxyalkylene))acrylate or methacrylate, and a copolymer of acrylate or methacrylate having a $C_8F_{17}$ group, (poly(oxyethylene))acrylate or methacrylate, and (poly(oxypropylene))acrylate or methacrylate.

In addition, surfactants other than the fluorine-based surfactant and/or the silicon-based surfactant described in paragraph "0280" in the specification of US2008/0248425A may be used.

These surfactants may be used alone or in combination of two or more types thereof.

In a case where the composition according to the present invention includes a surfactant, the content thereof is preferably 0% by mass to 2% by mass, more preferably 0.0001% by mass to 2% by mass, and still more preferably 0.0005% by mass to 1% by mass, based on the total solid content of the composition.

(G) Other Additives

The composition according to the present invention may further include a compound (for example, a phenol compound having a molecular weight of 1000 or less, or an alicyclic or aliphatic compound including a carboxy group) promoting solubility with respect to a dissolution inhibiting compound, a dye, a plasticizer, a photosensitizer, a light absorber, and/or a developer.

The composition according to the present invention may further include a dissolution inhibiting compound. Here, the "dissolution inhibiting compound" is a compound having a molecular weight of 3000 or less, of which the degree of solubility in an organic-based developer is decreased by being decomposed due to the action of an acid.

As the dissolution inhibiting compound, an alicyclic or aliphatic compound which contains an acid-decomposable group such as a cholic acid derivative which includes an acid-decomposable group described in the Proceeding of SPIE, 2724, 355 (1996) is preferable since the transparency with respect to light having a wavelength of 220 nm or less is not reduced. Examples of the acid-decomposable group and the alicyclic structure include the same as those exemplified above.

In a case where the resist composition according to the present invention is exposed to a KrF excimer laser or irradiated with an electron beam, the dissolution inhibiting compound is preferably a compound including a structure where the phenolic hydroxyl group of a phenol compound is substituted with an acid-decomposable group. As the phenol compound, a compound containing 1 to 9 phenol skeletons is preferable, and more preferably 2 to 6 phenol skeletons.

In a case where the composition according to the present invention includes a dissolution inhibiting compound, the amount is preferably 3% by mass to 50% by mass, and more preferably 5% by mass to 40% by mass, based on the total solid content of the composition.

Specific examples of the dissolution inhibiting compound are described below.

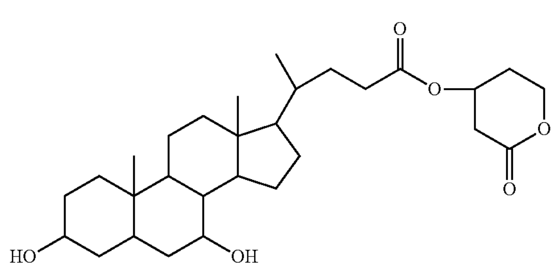

-continued

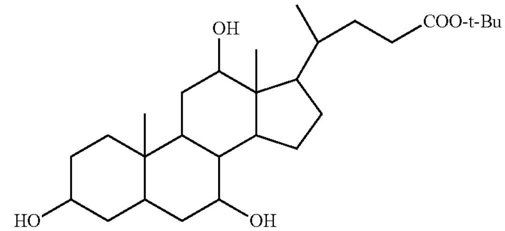

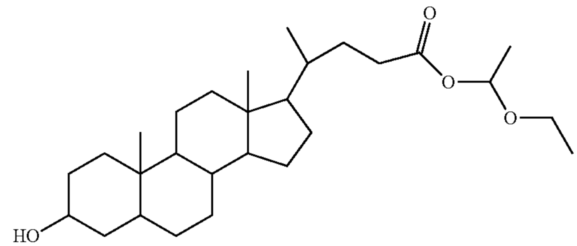

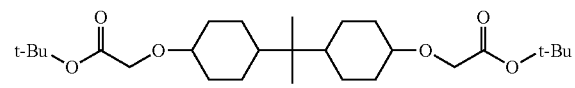

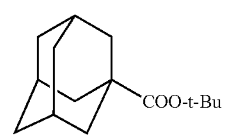

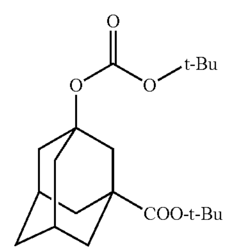

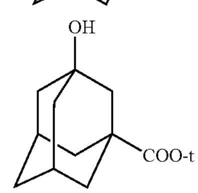

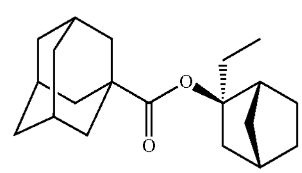

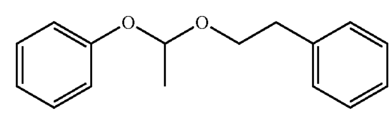

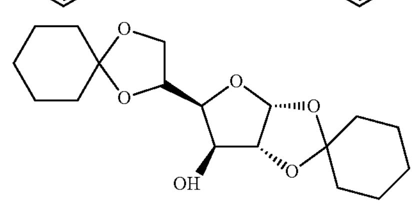

The phenol compound having a molecular weight of 1000 or less can be easily synthesized by referencing, for example, JP1992-122938A (JP-H04-122938A), JP1990-28531A (JP-H02-28531A), U.S. Pat. No. 4,916,210A, and EP219294B.

Examples of the alicyclic or aliphatic compound including a carboxy group include carboxylic acid derivatives including a steroid structure, such as chloic acid, deoxycholic acid, and lithocholic acid, adamantane carboxylic acid derivatives, adamantane dicarboxylic acid, cyclohexanecarboxylic acid, and cyclohexanedicarboxylic acid.

EXAMPLES

Resin

Synthesis Example 1

Synthesis of Resin (P-1)

20 g of poly(p-hydroxystyrene) (VP-2500, manufactured by Nippon Soda Co., Ltd.) was dissolved in 80.0 g of propylene glycol monomethyl ether acetate (PGMEA). To this solution, 10.3 g of 2-cyclohexylethyl vinyl ether and 10 mg of camphorsulfonic acid were added, followed by stirring at room temperature (25° C.) for 3 hours. 84 mg of triethylamine was added thereto, after stirring for a while, the reaction liquid was transferred to a separatory funnel that contains 100 mL of ethyl acetate. This organic layer was washed with 50 mL of distilled water three times, and the organic layer was concentrated using an evaporator. After the obtained polymer was dissolved in 300 mL of acetone, the resultant product was added dropwise to 3000 g of hexane to precipitate, and the precipitate was filtered, whereby (P-1) was obtained.

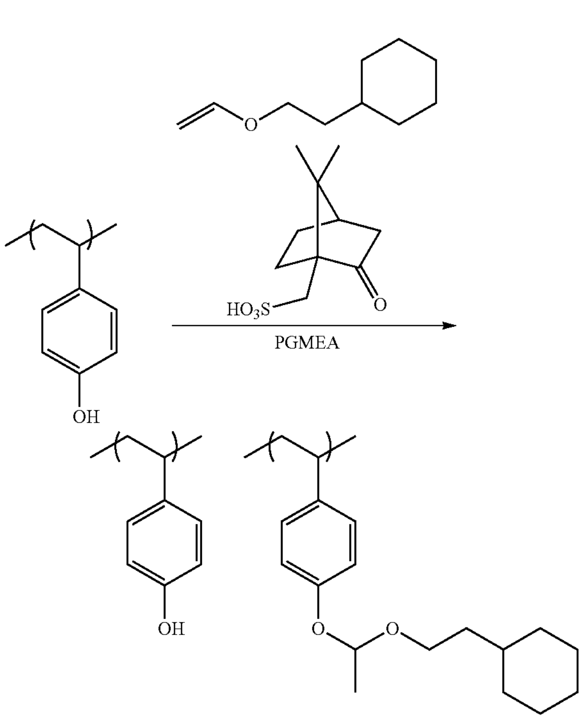

(P-1)

Synthesis Example 2

Synthesis of Resin (P-11)

10.00 g of p-acetoxystyrene was dissolved in 40 g of ethyl acetate, then, the mixture was cooled to 0° C., and 4.76 g of sodium methoxide (28% by mass methanol solution) was added dropwise thereto over 30 minutes, followed by stirring at room temperature for 5 hours. After ethyl acetate was added thereto, the organic layer was washed with distilled water three times, then, dried over anhydrous sodium sulfate, and the solvent was distilled off, whereby 13.17 g of p-hydroxystyrene (a compound represented by the following Formula (1), a 54% by mass ethyl acetate solution) was obtained. 8.89 g (in which 3.6 g of p-hydroxystyrene (1) was contained) of the 54% by mass ethyl acetate solution of the obtained p-hydroxystyrene (1), 14.3 g of the compound represented by the following Formula (2) (manufactured by KNC Laboratories Co., Ltd.), 2.2 g of the compound represented by the following Formula (3) (manufactured by Daicel Corporation), and 2.3 g of a polymerization initiator V-601 (manufactured by Wako Pure Chemical Industries, Ltd.) were dissolved in 14.2 g of propylene glycol monomethyl ether (PGME). 3.6 g of PGME was put into a reaction vessel, and the solution prepared in advance was added dropwise thereto at 85° C. over a period of 4 hours in a nitrogen gas atmosphere. The reaction solution was heated and stirred for 2 hours, and cooled to room temperature. The obtained reaction solution was added dropwise to 889 g of a mixed solution of hexane/ethyl acetate (8/2 (mass ratio)) to precipitate, and the precipitate was filtered, whereby (P-11) was obtained.

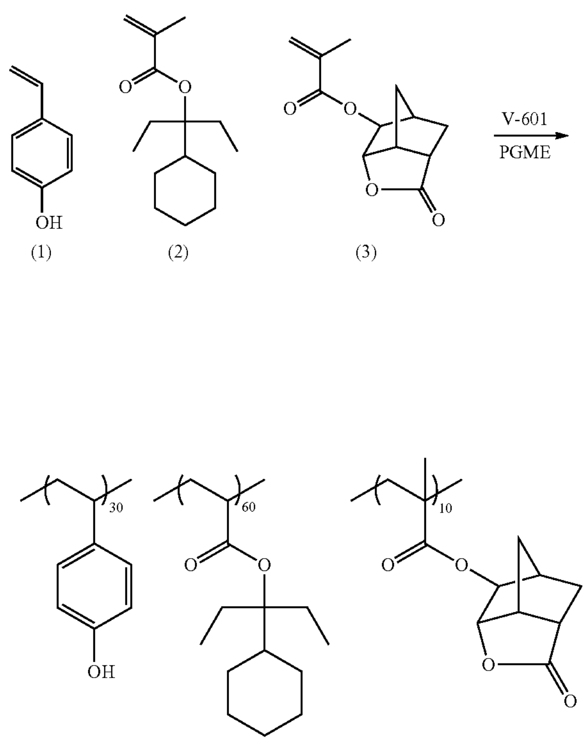

P-11

Hereinafter, in the same manner as in Synthesis Examples 1 and 2, resins P-2 to P-10 and P-12 to P-26 were synthesized.

Hereinafter, the polymer structures, weight average molecular weights (Mw), and dispersities (Mw/Mn) of the resins P-1 to P-27 are shown. In addition, the compositional ratio of each repeating unit of the following polymer structures is shown in a molar ratio.

P-1
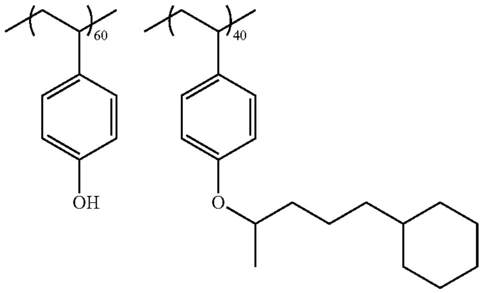
Mw: 4800
Mw/Mn: 1.20
P-2
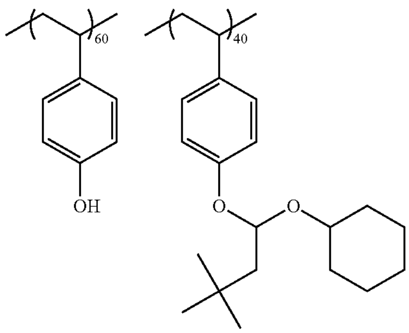
Mw: 4800
Mw/Mn: 1.18
P-3
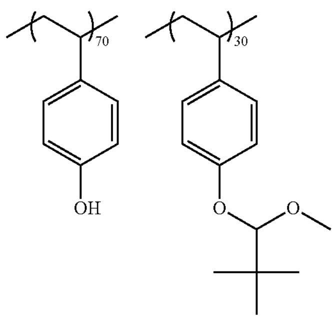
Mw: 4600
Mw/Mn: 1.18
P-4
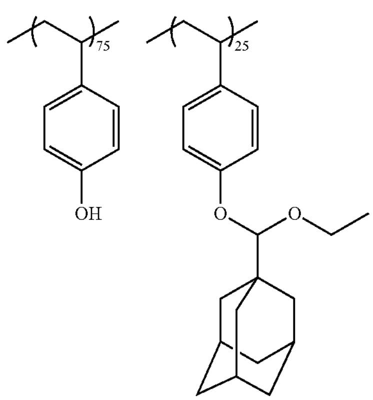
Mw: 9500
Mw/Mn: 1.21
-continued
P-5
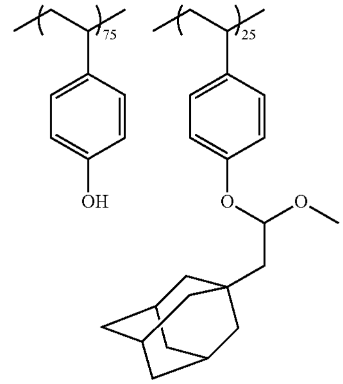
Mw: 6700
Mw/Mn: 1.18
P-6
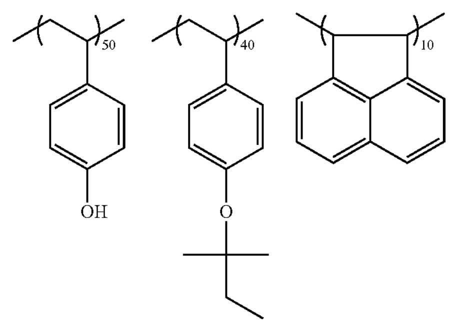
Mw: 13500
Mw/Mn: 1.61
P-7
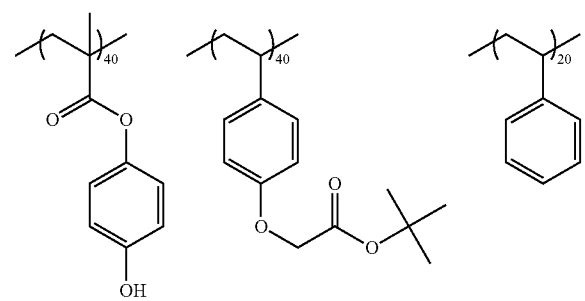
Mw: 19500
Mw/Mn: 1.91
P-8
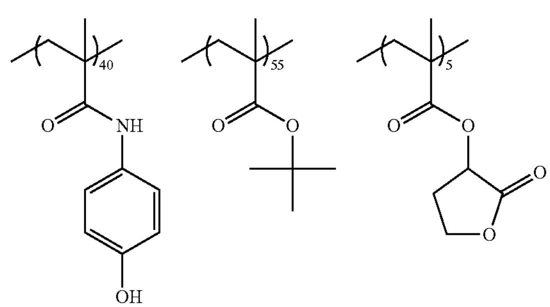
Mw: 11200
Mw/Mn: 1.74

-continued
P-9
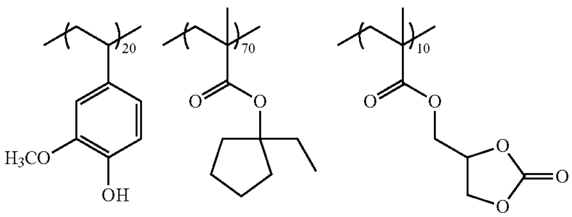
Mw: 13200
Mw/Mn: 1.75
P-10
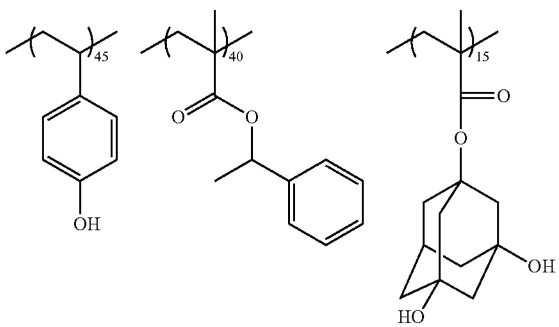
Mw: 15600
Mw/Mn: 1.72
P-11
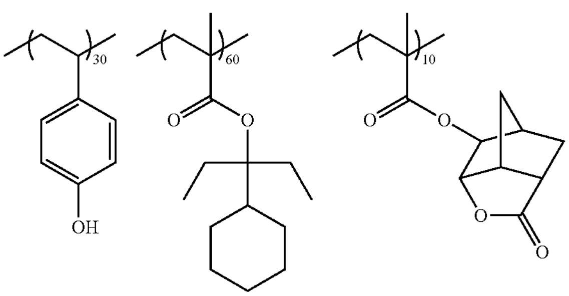
Mw: 13400
Mw/Mn: 1.57
P-12
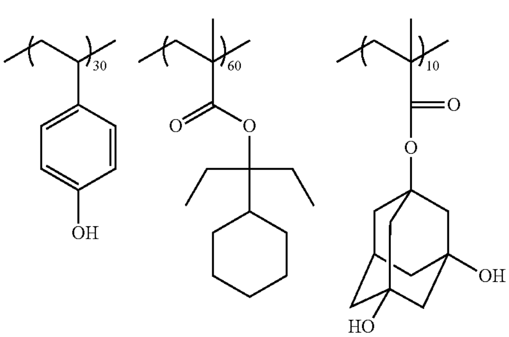
Mw: 14400
Mw/Mn: 1.53
-continued
P-13
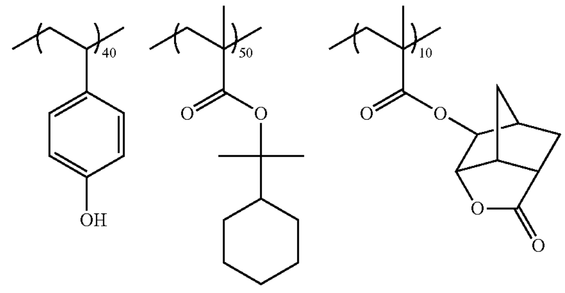
Mw: 12000
Mw/Mn: 1.64
P-14
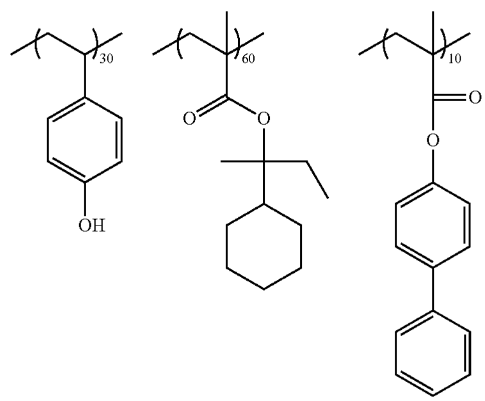
Mw: 8000
Mw/Mn: 1.70
P-15
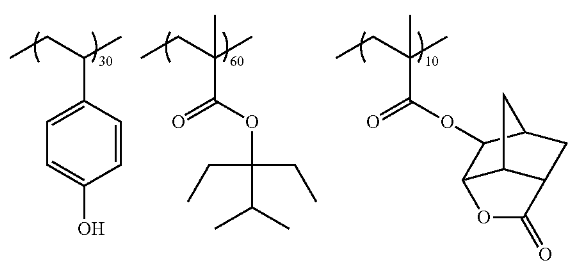
Mw: 11400
Mw/Mn: 1.48
P-16
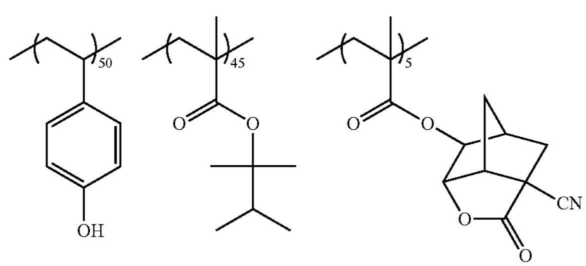
Mw: 15400
Mw/Mn: 1.67

-continued
P-17
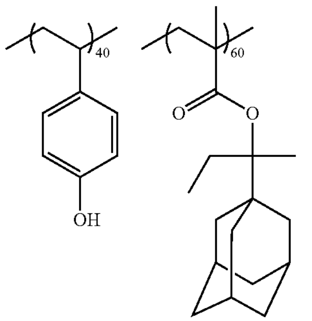
Mw: 6000
Mw/Mn: 1.53
P-18
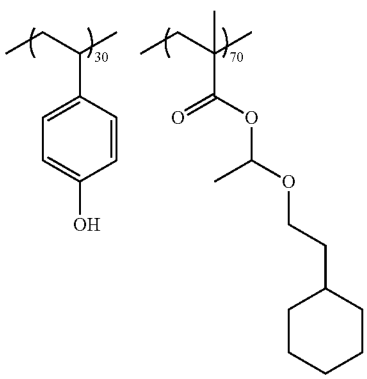
Mw: 10200
Mw/Mn: 1.42
P-19
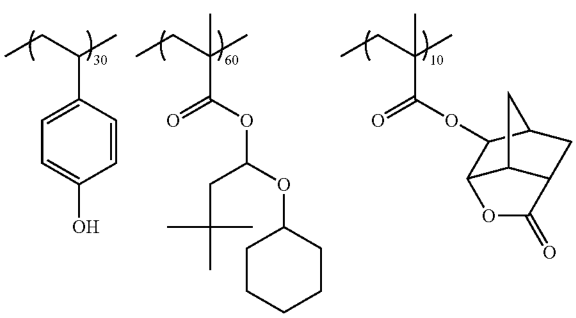
Mw: 12000
Mw/Mn: 1.38
P-20
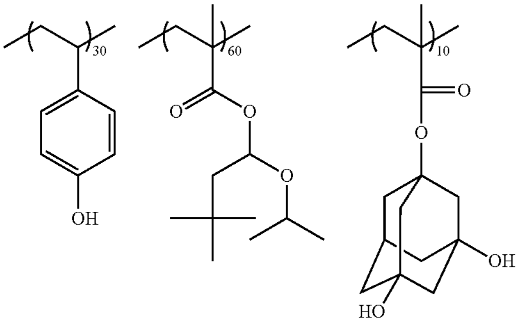
Mw: 14800
Mw/Mn: 1.43
-continued
P-21
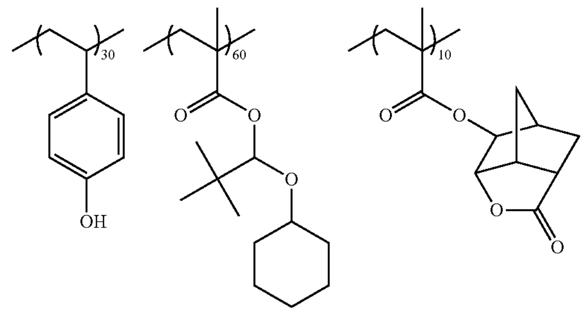
Mw: 13000
Mw/Mn: 1.47
P-22
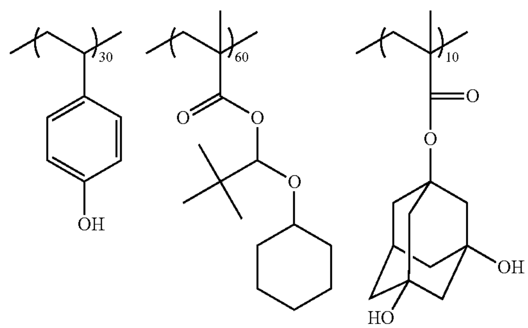
Mw: 12500
Mw/Mn: 1.56
P-23
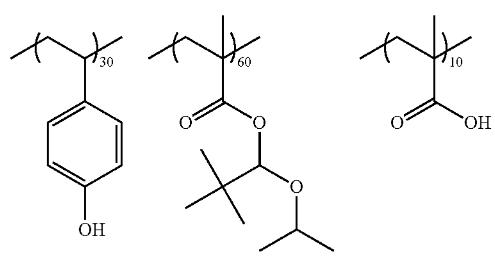
Mw: 13500
Mw/Mn: 1.47
P-24
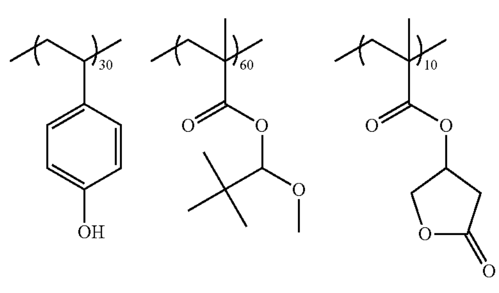
Mw: 11000
Mw/Mn: 1.46

-continued

P-25

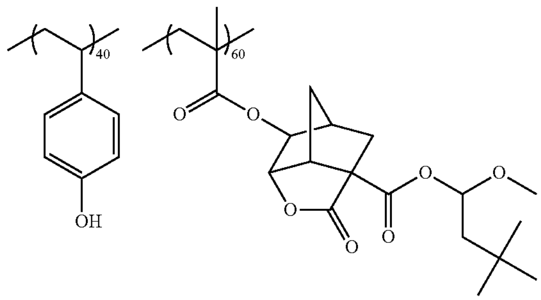

Mw: 9000
Mw/Mn: 1.50

P-26

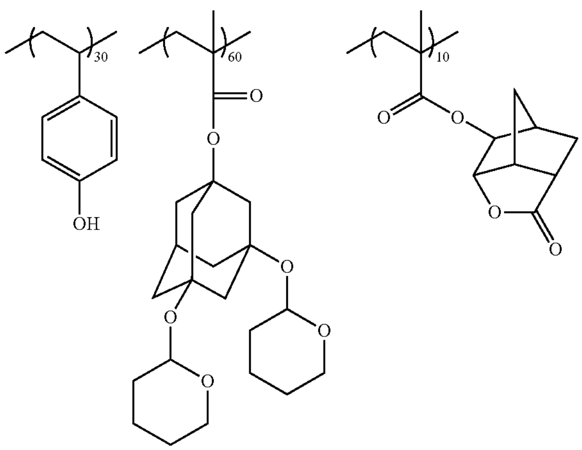

Mw: 12000
Mw/Mn: 1.46

P-27

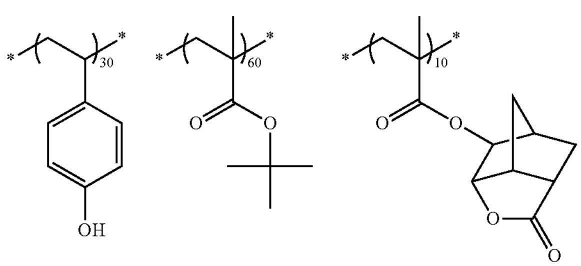

Mw: 9000
Mw/Mn: 1.51

<Polymer for Comparison and Acid Generator for Comparison>

In Comparative Examples 2-1, 2-3, 3-1, and 3-3, the following resin and acid generator were used. The weight average molecular weight (Mw) and the dispersity (Mw/Mn) of the resin is described below. In addition, the compositional ratio of each repeating unit of the resin is shown in a molar ratio.

RA-1

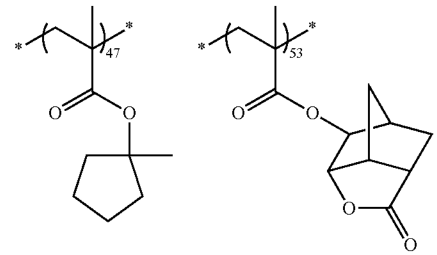

Mw 7120
Mw/Mn - 1.51

Z-10

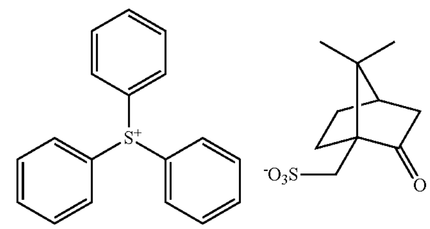

[Photoacid Generator]

As a photoacid generator, an acid generator suitably selected from the above described acid generators z1 to z141 was used.

<Basic Compound>

As a basic compound, any of the following Compounds (N-1) to (N-11) was used.

N-1

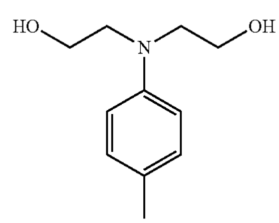

N-2

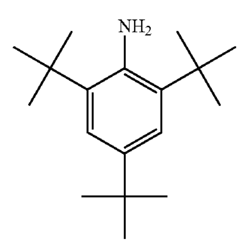

N-3

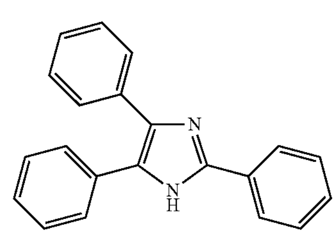

-continued

N-4

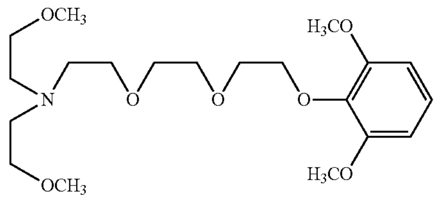

N-5

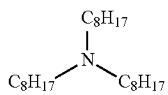

N-6

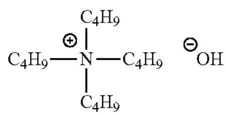

N-7

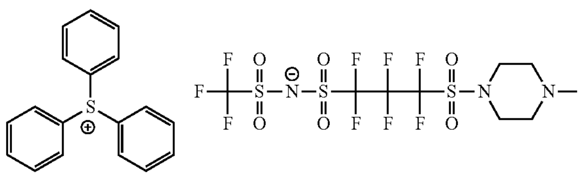

N-8

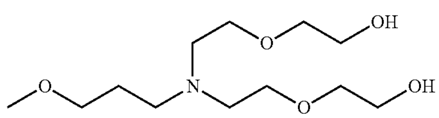

N-9

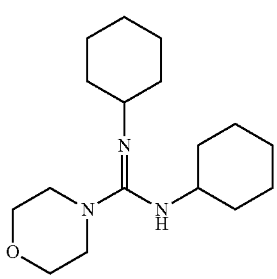

N-10

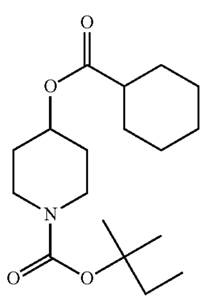

N-11

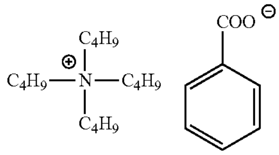

<Surfactant>

As a surfactant, the following W-1 to W-4 were used.

W-1: Megafac R08 (manufactured by DIC Corporation; fluorine-based surfactant or silicon-based surfactant)

W-2: Polysiloxane polymer KP-341 (manufactured by Shin-Etsu Chemicals Co., Ltd.; silicon-based surfactant)

W-3: Troysol S-366 (manufactured by Troy Chemical Corp.; fluorine-based surfactant)

W-4: PF6320 (manufactured by OMNOVA Solutions Inc.; fluorine-base surfactant)

<Coating Solvent>

As a coating solvent, the following were used.

S1: propylene glycol monomethyl ether acetate (PGMEA)

S2: propylene glycol monomethyl ether (PGME)

S3: ethyl lactate

S4: cyclohexanone

<Developer>

As an organic solvent used in a developer, the following were used.

SG-1: anisole

SG-2: methyl amyl ketone (2-heptanone)

SG-3: butyl acetate

As an “additive which forms at least one interaction of an ionic bond, a hydrogen bond, a chemical bond, and a dipole interaction with a polar group” (hereinafter, sometimes referred to as “additive of the embodiment”) contained in a developer, the followings were used.

(F-1): tri-n-octyl amine (F-2): di-n-octyl amine (F-3): 1-amino decane (F-4): N,N-dibutyl aniline (F-5): proline (F-6): tetramethyl ethylene diamine (F-7)

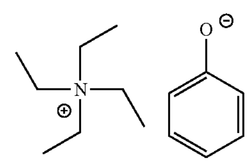

(F-8)

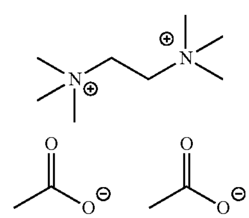

(F-9)

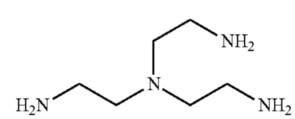

Example 1-1

0.1 g of the additive (F-1) (0.1% by mass) was added to 99.9 g of butyl acetate (99.9% by mass), and the mixture was stirred, whereby a developer (G-1) was obtained.

Examples 1-2 to 1-17 and Comparative Example 1-1

Developers (G-2) to (G-17) and (g-1) were obtained in the same operation as in Example 1 except that a predetermined amount of the organic solvent and the additive described Table 1 was mixed.

TABLE 1

| | Developer | Organic solvent Type | Organic solvent Amount used (% by mass) | Additive Type | Additive Amount used (% by mass) |
|---|---|---|---|---|---|
| Example 1-1 | G-1 | SG-3: butyl acetate | 99.9 | F-1 | 0.1 |
| Example 1-2 | G-2 | SG-3: butyl acetate | 98 | F-1 | 2 |
| Example 1-3 | G-3 | SG-3: butyl acetate | 90 | F-1 | 10 |
| Example 1-4 | G-4 | SG-3: butyl acetate | 98 | F-2 | 2 |
| Example 1-5 | G-5 | SG-3: butyl acetate | 98 | F-3 | 2 |
| Example 1-6 | G-6 | SG-3: butyl acetate | 98 | F-4 | 2 |
| Example 1-7 | G-7 | SG-3: butyl acetate | 98 | F-5 | 2 |
| Example 1-8 | G-8 | SG-3: butyl acetate | 98 | F-6 | 2 |
| Example 1-9 | G-9 | SG-2: methyl amyl ketone | 98 | F-1 | 2 |
| Example 1-10 | G-10 | SG-2: methyl amyl ketone | 98 | F-3 | 2 |
| Example 1-11 | G-11 | SG-2: methyl amyl ketone | 98 | F-4 | 2 |
| Example 1-12 | G-12 | SG-1: anisol | 98 | F-1 | 2 |
| Example 1-13 | G-13 | " | 98 | F-3 | 2 |
| Example 1-14 | G-14 | " | 98 | F-4 | 2 |
| Example 1-15 | G-15 | SG-3: butyl acetate | 98 | F-7 | 2 |
| Example 1-16 | G-16 | SG-3: butyl acetate | 98 | F-8 | 2 |
| Example 1-17 | G-17 | SG-3: butyl acetate | 98 | F-9 | 2 |
| Comparative Example 1-1 | g-1 | SG-3: butyl acetate | 100 | | |

<Rinse Liquid>

In the case of using a rinse liquid, the followings were used.

SR-1: 4-methyl-2-pentanol

SR-2: 1-hexanol

SR-3: methylisobutylcarbinol

Examples 2-1 to 2-31 and Comparative Examples 2-1 to 2-3

Electron Beam (EB) Exposure (1) Coating Liquid Preparation and Application of Active Light Sensitive or Radiation Sensitive Resin Composition A coating liquid composition having the composition ratio shown in the following Table 2 was microfiltered using a membrane filter having a pore size of 0.1 μm, whereby an active light sensitive or radiation sensitive resin composition (resist composition) solution was obtained.

This active light sensitive or radiation sensitive resin composition solution was applied to a 6-inch Si wafer subjected to a hexamethyldisilazane (HMDS) treatment in advance using a spin coater Mark 8 manufactured by Tokyo Electron Limited, and dried on a hot plate at 100° C. for 60 seconds, whereby a resist film having a thickness of 50 nm was obtained.

(2) EB Exposure and Development

Pattern irradiation was performed on the wafer applied with the resist film obtained in the above (1) using an electron beam lithography device (HL 750, manufactured by Hitachi, Ltd., acceleration voltage of 50 KeV). At this time, lithography was performed such that a line and a space were formed in a ratio of 1:1. After the electron beam lithography, the wafer applied with the resist film was heated on the hot plate at 110° C. for 60 seconds, and developed by paddling the organic-based developer described in the following table for 30 seconds, and depending on the conditions, the wafer applied with the resist film was rinsed by paddling the rinse liquid described in the following Table 2 for 30 seconds. (In Table 2, an example in which a rinse liquid was not described means that rinsing was not performed in the example) the wafer was rotated for 30 seconds at a rotation speed of 4000 rpm, and heating was performed at 90° C. for 60 seconds, whereby a resist pattern of a line and space pattern in a ratio of 1:1 having a line width of 50 nm was obtained.

(3) Evaluation of Resist Pattern

The sensitivity and the resolving power of the obtained resist pattern were evaluated by the following method using a scanning electron microscope (S-9220 manufactured by Hitachi, Ltd.). In addition, the amount of film loss was also evaluated. The results are shown in the following Table.

(3-1) Sensitivity

The irradiation energy when the line and space pattern in a ratio of 1:1 having a line width of 50 nm was resolved was taken as sensitivity (Eop). A smaller value indicates a better performance.

(3-2) Resolving Power

In the Eop, the minimum line width of the line and space pattern of (1:1) separated was taken as resolving power. A smaller value indicates a better performance.

(3-3) Amount of Film Loss

After a series of steps were completed, the film thickness of the remaining resist film was measured, and the value obtained by subtracting the residual film thickness from the initial film thickness was taken as the amount (nm) of film loss. Moreover, an optical interference film thickness determination device (Lambda Ace, manufactured by SCREEN Holdings Co., Ltd.) was used in the film thickness measurement.

TABLE 2

| Evaluation result in EB exposure | | | | | | | | |
|---|---|---|---|---|---|---|---|---|
| | Resin | Concentration | Acid generator | Concentration | Basic compound | Concentration | Organic solvent (D) (mass ratio) | Surfactant (mass ratio) |
| Example 2-1 | P-1 | 67.95 | Z-113 | 30 | N-6 | 2 | S1/S2 (40/60) | W-1 |
| Example 2-2 | P-2 | 72.95 | Z-112 | 25 | N-11 | 2 | S1/S2 (40/60) | W-1 |
| Example 2-3 | P-3 | 67.95 | Z-134 | 30 | N-11 | 2 | S1/S2 (40/60) | W-1 |
| Example 2-4 | P-4 | 62.95 | Z-134 | 35 | N-11 | 2 | S1/S2 (40/60) | W-1 |

TABLE 2-continued

| Evaluation result in EB exposure | | | | | | | | |
|---|---|---|---|---|---|---|---|---|
| Example 2-5 | P-5 | 57.95 | Z-128 | 40 | N-6 | 2 | S1/S2 (40/60) | W-2 |
| Example 2-6 | P-6 | 78.95 | Z-118 | 20 | N-8 | 1 | S1/S2 (40/60) | W-4 |
| Example 2-7 | P-7 | 87.95 | Z-29 | 10 | N-1 | 2 | S1/S3 (40/60) | W-4 |
| Example 2-8 | P-8 | 82.95 | Z-2 | 15 | N-2 | 2 | S1/S2 (40/60) | W-1/W-2 (1/1) |
| Example 2-9 | P-9 | 73 | Z-108 | 25 | N-5 | 2 | S1/S2/S3 (30/60/10) | Absent |
| Example 2-10 | P-10 | 77.95 | Z-117 | 20 | N-4 | 2 | S1/S2 (20/80) | W-3 |
| Example 2-11 | P-11 | 67.95 | Z-124 | 30 | N-11 | 2 | S1/S2 (40/60) | W-1 |
| Example 2-12 | P-11 | 67.95 | Z-126 | 30 | N-11 | 2 | Sl/S2 (40/60) | W-1 |
| Example 2-13 | P-12 | 62.95 | Z-135 | 35 | N-8 | 2 | S1/S2 (40/60) | W-3 |
| Example 2-14 | P-13 | 67.95 | Z-132 | 30 | N-11 | 2 | S1/S2 (40/60) | W-1 |
| Example 2-15 | P-14 | 77 | Z-4/ Z-112 = 1:1 | 20 | N-4 | 3 | Sl/S2/S3 (30/60/10) | Absent |
| Example 2-16 | P-15 | 72.95 | Z-115 | 25 | N-11 | 2 | S1/S4 (40/60) | W-1 |
| Example 2-17 | P-16 | 82.95 | Z-99 | 15 | N-10 | 2 | S1/S4 (40/60) | W-1 |
| Example 2-18 | P-17 | 58.95 | Z-130 | 40 | N-9 | 1 | S1/S4 (40/60) | W-1 |
| Example 2-19 | P-18 | 71.95 | Z-124 | 25 | N-6 | 3 | S1/S4 (40/60) | W-2 |
| Example 2-20 | P-19 | 66.95 | Z-113 | 30 | N-6 | 3 | S1/S2 (40/60) | W-2 |
| Example 2-21 | P-19 | 67.95 | Z-137 | 30 | N-11 | 2 | S1/S2 (40/60) | W-1 |
| Example 2-22 | P-20 | 62.95 | Z-128 | 35 | N-9 | 2 | S1/S3 (40/60) | W-3 |
| Example 2-23 | P-21 | 67.95 | Z-124 | 30 | N-11 | 2 | S1/S2 (40/60) | W-1 |
| Example 2-24 | P-21 | 62.95 | Z-135 | 35 | N-11 | 2 | S1/S2 (40/60) | W-1 |
| Example 2-25 | P-22 | 62.95 | Z-134 | 35 | N-11 | 2 | S1/S2 (40/60) | W-1 |
| Example 2-26 | P-23 | 66.95 | Z-133 | 30 | N-7 | 3 | S1/S2 (40/60) | W-1 |
| Example 2-27 | P-24 | 67.95 | Z-125 | 30 | N-3 | 2 | S1/S2 (40/60) | W-1 |
| Example 2-28 | P-25 | 72.95 | Z-108 | 25 | N-10 | 2 | S1/S2 (40/60) | W-1 |
| Example 2-29 | P-26 | 72.95 | Z-121 | 25 | N-11 | 2 | S1/S2 (40/60) | W-1 |
| Example 2-30 | P-27 | 62 | Z-142 | 35 | N-3 | 3 | S1/S2 (40/60) | Absent |
| Example 2-31 | P-2/ P-3 | 36.48/ 36.47 | Z-112 | 25 | N-3/ N-11 | 1/1 | S1/S2 (40/60) | W-1 |
| Comparative Example 2-1 | RA-1 | 89.95 | Z-10 | 8 | N-11 | 2 | S1/S2 (40/60) | W-1 |
| Comparative Example 2-2 | P-13 | 67.95 | Z-132 | 30 | N-11 | 2 | S1/S2 (40/60) | W-1 |
| Comparative Example 2-3 | RA-1 | 89.95 | Z-10 | 8 | N-11 | 2 | S1/S2 (40/60) | W-1 |

| | Concen-tration | Developer | Rinse liquid | Sensitivity ($\mu C/cm^2$) | Resolving power (nm) | Amount of film loss (nm) |
|---|---|---|---|---|---|---|
| Example 2-1 | 0.05 | G-8 | SR-3 | 29.5 | 35 | 10.1 |
| Example 2-2 | 0.05 | G-2 | SR-3 | 29.0 | 34 | 9.5 |
| Example 2-3 | 0.05 | G-2 | SR-3 | 29.0 | 34 | 9.3 |
| Example 2-4 | 0.05 | G-3 | SR-3 | 29.0 | 34 | 9.6 |
| Example 2-5 | 0.05 | G-4 | SR-3 | 29.0 | 34 | 9.7 |

TABLE 2-continued

| Evaluation result in EB exposure | | | | | | |
|---|---|---|---|---|---|---|
| Example 2-6 | 0.05 | G-9 | | 30.0 | 36 | 10.5 |
| Example 2-7 | 0.05 | G-1 | | 31.0 | 38 | 11.5 |
| Example 2-8 | 0.05 | G-10 | SR-2 | 31.0 | 38 | 11.4 |
| Example 2-9 | | G-11 | | 30.5 | 37 | 10.9 |
| Example 2-10 | 0.05 | G-14 | SR-1 | 30.0 | 36 | 10.4 |
| Example 2-11 | 0.05 | G-2 | SR-3 | 27.0 | 30 | 7.3 |
| Example 2-12 | 0.05 | G-2 | SR-3 | 27.0 | 30 | 7.5 |
| Example 2-13 | 0.05 | G-15 | SR-3 | 27.0 | 30 | 7.4 |
| Example 2-14 | 0.05 | G-2 | SR-3 | 29.0 | 34 | 9.5 |
| Example 2-15 | | G-8 | SR-3 | 29.0 | 34 | 9.6 |
| Example 2-16 | 0.05 | G-2 | SR-3 | 27.5 | 31 | 8.1 |
| Example 2-17 | 0.05 | G-12 | SR-3 | 29.0 | 34 | 9.7 |
| Example 2-18 | 0.05 | G-7 | SR-3 | 28.0 | 32 | 8.6 |
| Example 2-19 | 0.05 | G-16 | SR-3 | 28.0 | 32 | 8.3 |
| Example 2-20 | 0.05 | G-2 | SR-3 | 27.5 | 31 | 7.8 |
| Example 2-21 | 0.05 | G-8 | SR-3 | 27.5 | 31 | 8.1 |
| Example 2-22 | 0.05 | G-7 | SR-3 | 27.5 | 31 | 8.0 |
| Example 2-23 | 0.05 | G-2 | SR-3 | 27.0 | 30 | 7.1 |
| Example 2-24 | 0.05 | G-15 | SR-3 | 27.0 | 30 | 7.1 |
| Example 2-25 | 0.05 | G-16 | SR-3 | 27.0 | 30 | 7.2 |
| Example 2-26 | 0.05 | G-17 | SR-3 | 27.0 | 30 | 7.3 |
| Example 2-27 | 0.05 | G-5 | SR-3 | 28.0 | 32 | 8.3 |
| Example 2-28 | 0.05 | G-6 | SR-3 | 28.5 | 33 | 8.9 |
| Example 2-29 | 0.05 | G-13 | SR-3 | 30.0 | 36 | 10.7 |
| Example 2-30 | 0 | G-1 | | 28.0 | 30 | 7.2 |
| Example 2-31 | 0.05 | G-2 | | 29.0 | 34 | 9.4 |
| Comparative Example 2-1 | 0.05 | g-1 | SR-3 | 38.5 | 46 | 21.0 |
| Comparative Example 2-2 | 0.05 | g-1 | SR-3 | 32.5 | 39 | 12.3 |
| Comparative Example 2-3 | 0.05 | G-2 | SR-3 | 37.0 | 44 | 17.0 |

The concentration of each component represents a concentration (% by mass) in the total solid content.

As can be seen from Table 2, Examples 2-1 to 2-31 could satisfy high sensitivity, high resolution, and film loss reduction performance at the same time to a very high level.

Here, it was found that, in Comparative Example 2-3 using an organic-based developer including an additive of the embodiment, some improvement of film loss reduction performance, resolution, and sensitivity was seen compared to Comparative Example 2-1 using the comparative polymer RA-1 and a low molecular acid generator Z-10 described in the example of JP5056974B and using a typical organic-based developer including no additive of the embodiment, however, the effects are not so significant.

In contrast, it was found that, in Comparative Example 2-2 using "the resin (A) having a repeating unit including phenol" (hereinafter, sometimes referred to as "the resin (A) of the embodiment") used in one embodiment of the present invention and a typical organic-based developer including no additive of the embodiment, resolution, sensitivity, and film loss reduction performance were respectively excellent compared to Comparative Example 2-1. It is probable that this is based on the fact that secondary electrons are greatly generated by phenol, and as a result, acid is greatly generated, and deprotection of an acid decomposition group quickly and greatly proceeds. Furthermore, it was found that, in Examples 2-1 to 2-31 using an organic-based developer including an additive of the embodiment, including Example 2-14 using the same composition as in Comparative Example 2-2 and an organic-based developer including an additive of the embodiment, film loss reduction performance, resolution, and sensitivity were significantly improved.

The reason for this seems to be as follows. In a case where the additive of the embodiment, in particular, a nitrogen-containing compound (an amine) is included in the organic-based developer, due to the interaction such as salt formation between an acidic group such as a carboxylic acid generated in the exposed portion and a nitrogen-containing compound in the organic-based developer, the exposed portion becomes more insoluble with respect to the organic-based developer. As a result, film loss can be reduced or contrast is improved, and due to this, resolution is improved or sensitivity is increased. In addition, the contact angle of the resist side surface is increased by the interaction such as salt formation, and due to this, collapse of the pattern is prevented, and the resolution is improved. It is probable that, even in the additive of the embodiment other than the nitrogen-containing compound, effects by basically the same action are exhibited.

However, it is probable that, in Comparative Example 2-3, only the interaction between an acidic group such as a carboxylic acid present in the polymer and the additive of the embodiment in the organic developer contributes to the improvement of the film loss reduction performance, the resolution, and the sensitivity, and thus, the improvement effects are not so great. In contrast, it is probable that in Examples 2-1 to 2-31 using the resin (A) of the embodiment, phenol and the additive of the embodiment in an organic-based developer further interact with each other, and thus, the film loss reduction, the resolution improvement, and the high sensitivity can be more significantly achieved.

From comparison of Example 2-7 or 2-8 with other Comparative Examples, it was also found that the effects are more significant at a hydroxystyrene portion rather than at a hydroxyphenyl methacrylate portion or a hydroxyphenylmethacryl amide portion among the same phenol portions, and this is preferable.

Furthermore, it was also found that a polymer having the acid-decomposable group (for example, Examples 2-19 to 2-27) represented by General Formula (4) or the acid-decomposable group (for example, Examples 2-11 to 2-18) represented by General Formula (II-1) was excellent in terms of all of resolution, sensitivity, and film loss reduction performance compared to a polymer (for example, Examples 2-7 to 2-10) having no acid-decomposable group represented by General Formula (4) or (II-1). It is probable that this is because the deprotection activation energy of the acid-decomposable group is low, and thus, carboxylic acid can be easily generated with a small amount of an acid.

In addition, it was found that a case where rinsing was performed using methyl isobutyl carbinol or the like was excellent in terms of resolution compared to a case where rinsing was not performed. It is probable that this is because the polymer, which is formed by interacting carboxylic acid or a phenol group present at the unexposed portion or the side wall portion and a nitrogen-containing compound, can be dissolved.

When a pattern formation was performed in the same manner as in Examples 2-3, 2-11, and 2-23 except that the additive used in the developer in Examples 2-3, 2-11, and 2-23 was changed to the additive represented by the following Formula (F-10) or (F-11), also in these, pattern formation could be performed. That is, it was found that, when evaluation was performed in the same manner as in Examples 2-3, 2-11, and 2-23, significant improved effects in resolution, sensitivity, and film loss reduction performance were obtained.

(F-10)

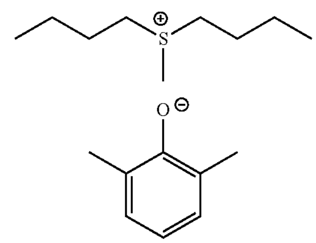

(F-11)

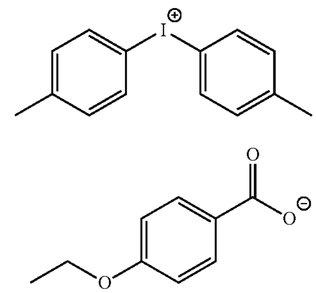

Examples 3-1 to 3-31 and Comparative Examples 3-1 to 3-3

Extreme Ultraviolet Rays (EUV) Exposure (4) Coating Liquid Preparation and Application of Active Light Sensitive or Radiation Sensitive Resin Composition A coating liquid composition having the composition ratio shown in the following Table 3 was microfiltered using a membrane filter having a pore size of 0.05 μm, whereby an active light sensitive or radiation sensitive resin composition (resist composition) solution was obtained.

This active light sensitive or radiation sensitive resin composition solution was applied to a 6-inch Si wafer subjected to a hexamethyldisilazane (HMDS) treatment in advance using a spin coater Mark 8 manufactured by Tokyo Electron Limited, and dried on a hot plate at 100° C. for 60 seconds, whereby a resist film having a thickness of 50 nm was obtained.

(5) EUV Exposure and Development

Using an EUV exposure device (Micro Exposure Tool, manufactured by Exitech Corpoation, NA0.3, Quadrupole, outer sigma of 0.68, inner sigma of 0.36), pattern exposure was performed on the wafer applied with the resist film obtained in the above (4) using an exposure mask (line/space=1/1). After irradiation, the wafer applied with the resist film was heated on the hot plate at 110° C. for 60 seconds, and developed by paddling the organic developer described in the following Table 3 for 30 seconds, and depending on the conditions, the wafer applied with the resist film was rinsed by paddling the rinse liquid described in the following Table 3 for 30 seconds.

(In Table 3, an example in which a rinse liquid was not described means that rinsing was not performed in the example) the wafer was rotated for 30 seconds at a rotation speed of 4000 rpm, and baking was performed at 90° C. for 60 seconds, whereby a resist pattern of a line and space pattern in a ratio of 1:1 having a line width of 50 nm was obtained.

(6) Evaluation of Resist Pattern

The sensitivity and the resolving power of the obtained resist pattern were evaluated by the following method using a scanning electron microscope (S-9380II, manufactured by Hitachi, Ltd.). In addition, the amount of film loss was also evaluated. The results are shown in the following Table 3.

(6-1) Sensitivity

The exposure amount when the line and space pattern in a ratio of 1:1 having a line width of 50 nm was resolved was taken as sensitivity (Eop). A smaller value indicates a better performance.

(6-2) Resolving Power

In the Eop, the minimum line width of the line and space pattern of (1:1) separated was taken as resolving power. A smaller value indicates a better performance.

(6-3) Amount of Film Loss

After a series of processes were completed, the film thickness of the remaining resist film was measured, and the value obtained by subtracting the residual film thickness from the initial film thickness was taken as the amount (nm) of film loss. Moreover, an optical interference film thickness determination device (Lambda Ace, manufactured by SCREEN Holdings Co., Ltd.) was used in the film thickness measurement.

TABLE 3

Evaluation results in EUV exposure

| | Resin | Concentration | Acid generator | Concentration | Basic compound | Concentration | Organic solvent (D) (mass ratio) | Surfactant (mass ratio) |
|---|---|---|---|---|---|---|---|---|
| Example 3-1 | P-1 | 67.95 | Z-113 | 30 | N-6 | 2 | S1/S2 (40/60) | W-1 |
| Example 3-2 | P-2 | 72.95 | Z-112 | 25 | N-11 | 2 | S1/S2 (40/60) | W-1 |
| Example 3-3 | P-3 | 67.95 | Z-134 | 30 | N-11 | 2 | S1/S2 (40/60) | W-1 |
| Example 3-4 | P-4 | 62.95 | Z-134 | 35 | N-11 | 2 | S1/S2 (40/60) | W-1 |
| Example 3-5 | P-5 | 57.95 | Z-128 | 40 | N-6 | 2 | S1/S2 (40/60) | W-2 |
| Example 3-6 | P-6 | 78.95 | Z-118 | 20 | N-8 | 1 | S1/S2 (40/60) | W-4 |
| Example 3-7 | P-7 | 87.95 | Z-29 | 10 | N-1 | 2 | S1/S3 (40/60) | W-4 |
| Example 3-8 | P-8 | 82.95 | Z-2 | 15 | N-2 | 2 | S1/S2 (40/60) | W-1/W-2 (1/1) |
| Example 3-9 | P-9 | 73 | Z-108 | 25 | N-5 | 2 | S1/S2/S3 (30/60/10) | Absent |
| Example 3-10 | P-10 | 77.95 | Z-117 | 20 | N-4 | 2 | S1/S2 (20/80) | W-3 |
| Example 3-11 | P-11 | 67.95 | Z-124 | 30 | N-11 | 2 | Sl/S2 (40/60) | W-1 |
| Example 3-12 | P-11 | 67.95 | Z-126 | 30 | N-11 | 2 | S1/S2 (40/60) | W-1 |
| Example 3-13 | P-12 | 62.95 | Z-135 | 35 | N-8 | 2 | S1/S2 (40/60) | W-3 |
| Example 3-14 | P-13 | 67.95 | Z-132 | 30 | N-11 | 2 | S1/S2 (40/60) | W-1 |
| Example 3-15 | P-14 | 77 | Z-4/ Z-112 = 1:1 | 20 | N-4 | 3 | Sl/S2/S3 (30/60/10) | Absent |
| Example 3-16 | P-15 | 72.95 | Z-115 | 25 | N-11 | 2 | S1/S4 (40/60) | W-1 |
| Example 3-17 | P-16 | 82.95 | Z-99 | 15 | N-10 | 2 | S1/S4 (40/60) | W-1 |
| Example 3-18 | P-17 | 58.95 | Z-130 | 40 | N-9 | 1 | S1/S4 (40/60) | W-1 |
| Example 3-19 | P-18 | 71.95 | Z-124 | 25 | N-6 | 3 | S1/S4 (40/60) | W-2 |
| Example 3-20 | P-19 | 66.95 | Z-113 | 30 | N-6 | 3 | S1/S2 (40/60) | W-2 |
| Example 3-21 | P-19 | 67.95 | Z-137 | 30 | N-11 | 2 | S1/S2 (40/60) | W-1 |
| Example 3-22 | P-20 | 62.95 | Z-128 | 35 | N-9 | 2 | S1/S3 (40/60) | W-3 |
| Example 3-23 | P-21 | 67.95 | Z-124 | 30 | N-11 | 2 | S1/S2 (40/60) | W-1 |
| Example 3-24 | P-21 | 62.95 | Z-135 | 35 | N-11 | 2 | S1/S2 (40/60) | W-1 |
| Example 3-25 | P-22 | 62.95 | Z-134 | 35 | N-11 | 2 | S1/S2 (40/60) | W-1 |
| Example 3-26 | P-23 | 66.95 | Z-133 | 30 | N-7 | 3 | S1/S2 (40/60) | W-1 |
| Example 3-27 | P-24 | 67.95 | Z-125 | 30 | N-3 | 2 | S1/S2 (40/60) | W-1 |
| Example 3-28 | P-25 | 72.95 | Z-108 | 25 | N-10 | 2 | S1/S2 (40/60) | W-1 |

TABLE 3-continued

Evaluation results in EUV exposure

| | | | | | | | | |
|---|---|---|---|---|---|---|---|---|
| Example 3-29 | P-26 | 72.95 | Z-121 | 25 | N-11 | 2 | S1/S2 (40/60) | W-1 |
| Example 3-30 | P-27 | 62 | Z-142 | 35 | N-3 | 3 | S1/S2 (40/60) | Absent |
| Example 3-31 | P-2/ P-3 | 36.48/ 36.47 | Z-112 | 25 | N-3/ N-11 | 1/1 | S1/S2 (40/60) | W-1 |
| Comparative Example 3-1 | RA-1 | 89.95 | Z-10 | 8 | N-11 | 2 | Sl/S2 (40/60) | W-1 |
| Comparative Example 3-2 | P-13 | 67.95 | Z-132 | 30 | N-11 | 2 | S1/S2 (40/60) | W-1 |
| Comparative Example 3-3 | RA-1 | 89.95 | Z-10 | 8 | N-11 | 2 | S1/S2 (40/60) | W-1 |

| | Concen-tration | Developer | Rinse liquid | Sensitivity ($\mu C/cm^2$) | Resolving power (nm) | Amount of film loss (nm) |
|---|---|---|---|---|---|---|
| Example 3-1 | 0.05 | G-8 | SR-3 | 16.5 | 25 | 10.3 |
| Example 3-2 | 0.05 | G-2 | SR-3 | 16.0 | 24 | 9.8 |
| Example 3-3 | 0.05 | G-2 | SR-3 | 16.0 | 24 | 9.6 |
| Example 3-4 | 0.05 | G-3 | SR-3 | 16.0 | 24 | 9.9 |
| Example 3-5 | 0.05 | G-4 | SR-3 | 16.0 | 24 | 9.9 |
| Example 3-6 | 0.05 | G-9 | | 17.0 | 26 | 10.7 |
| Example 3-7 | 0.05 | G-1 | | 18.0 | 28 | 12.0 |
| Example 3-8 | 0.05 | G-10 | SR-2 | 18.0 | 28 | 11.9 |
| Example 3-9 | | G-11 | | 17.5 | 27 | 11.3 |
| Example 3-10 | 0.05 | G-14 | SR-1 | 17.0 | 26 | 10.6 |
| Example 3-11 | 0.05 | G-2 | SR-3 | 13.5 | 20 | 7.4 |
| Example 3-12 | 0.05 | G-2 | SR-3 | 13.5 | 20 | 7.6 |
| Example 3-13 | 0.05 | G-15 | SR-3 | 13.5 | 20 | 7.6 |
| Example 3-14 | 0.05 | G-2 | SR-3 | 16.0 | 24 | 9.6 |
| Example 3-15 | | G-8 | SR-3 | 16.0 | 24 | 9.8 |
| Example 3-16 | 0.05 | G-2 | SR-3 | 14.0 | 21 | 8.4 |
| Example 3-17 | 0.05 | G-12 | SR-3 | 16.0 | 24 | 10.0 |
| Example 3-18 | 0.05 | G-7 | SR-3 | 15.0 | 22 | 8.8 |
| Example 3-19 | 0.05 | G-16 | SR-3 | 15.0 | 22 | 8.5 |
| Example 3-20 | 0.05 | G-2 | SR-3 | 14.0 | 21 | 8.0 |
| Example 3-21 | 0.05 | G-8 | SR-3 | 14.0 | 21 | 8.2 |
| Example 3-22 | 0.05 | G-7 | SR-3 | 14.0 | 21 | 8.1 |
| Example 3-23 | 0.05 | G-2 | SR-3 | 13.0 | 20 | 7.3 |
| Example 3-24 | 0.05 | G-15 | SR-3 | 13.0 | 20 | 7.2 |
| Example 3-25 | 0.05 | G-16 | SR-3 | 13.5 | 20 | 7.3 |
| Example 3-26 | 0.05 | G-17 | SR-3 | 13.5 | 20 | 7.4 |
| Example 3-27 | 0.05 | G-5 | SR-3 | 15.0 | 22 | 8.5 |
| Example 3-28 | 0.05 | G-6 | SR-3 | 15.5 | 23 | 9.1 |
| Example 3-29 | 0.05 | G-13 | SR-3 | 17.0 | 26 | 11.0 |
| Example 3-30 | 0 | G-1 | | 15.0 | 22 | 7.1 |

TABLE 3-continued

| Evaluation results in EUV exposure | | | | | | |
|---|---|---|---|---|---|---|
| Example 3-31 | 0.05 | G-2 | | 16.0 | 24 | 9.7 |
| Comparative Example 3-1 | 0.05 | g-1 | SR-3 | 23.0 | 35 | 21.5 |
| Comparative Example 3-2 | 0.05 | g-1 | SR-3 | 19.0 | 29 | 14.0 |
| Comparative Example 3-3 | 0.05 | G-2 | SR-3 | 22.0 | 33 | 19.0 |

The concentration of each component represents a concentration (% by mass) in the total solid content.

As can be seen from Table 3, Examples 3-1 to 3-31 could satisfy high sensitivity, high resolution, and film loss reduction performance at the same time to a very high level. In particular, in the present example, evaluation was performed on the film loss reduction performance under the severer conditions compared to those in JP2010-217884A. Specifically, whereas, in JP2010-217884A, evaluation was performed under the mild conditions of surface exposure (lithography is not performed), in the present invention, line and space of around 20 nm half pit was resolved. In spite of this, it is worth noting that the amount of film loss in the present example is smaller than that in JP2010-217884A.

Here, it was found that, in Comparative Example 3-3 using an organic-based developer including an additive of the embodiment, some improvement of film loss reduction performance, resolution, and sensitivity was seen compared to Comparative Example 3-1 using the comparative polymer RA-1 and a low molecular acid generator Z-10 described in the example of JP5056974B and using a typical organic-based developer including no additive of the embodiment, however, the effects are not so significant.

In contrast, it was found that, in Comparative Example 3-2 using the resin (A) of the embodiment and a typical organic-based developer including no additive of the embodiment, resolution, sensitivity, and film loss reduction performance were respectively excellent compared to Comparative Example 3-1. It is probable that this is based on the fact that secondary electrons are greatly generated by phenol, and as a result, acid is greatly generated, and deprotection of an acid decomposition group quickly and greatly proceeds. Furthermore, it was found that, in Examples 3-1 to 3-31 using an organic-based developer including an additive of the embodiment, including Example 3-14 using the same composition as in Comparative Example 3-2 and an organic-based developer including an additive of the embodiment, film loss reduction performance, resolution, and sensitivity were significantly improved.

The reason for this seems to be as follows. In a case where the additive of the embodiment, in particular, a nitrogen-containing compound (an amine) is included in the organic-based developer, due to the interaction such as salt formation or the like between an acidic group such as a carboxylic acid generated in the exposed portion and a nitrogen-containing compound in the organic-based developer, the exposed portion becomes more insoluble with respect to the organic-based developer. As a result, film loss can be reduced or contrast is improved, and due to this, resolution can be improved or sensitivity can be increased. In addition, the contact angle of the resist side surface is increased by the interaction such as salt formation, and due to this, collapse of the pattern is prevented, and the resolution is improved. It is probable that, even in the additive of the embodiment other than the nitrogen-containing compound, effects by basically the same action are exhibited.

However, it is probable that, in Comparative Example 3-3, only the interaction between an acidic group such as a carboxylic acid present in the polymer and the additive of the embodiment in the organic developer contributes to the improvement of the film loss performance, resolution, and sensitivity, and thus, the improvement effects are not so great. In contrast, it is probaple that in Examples 3-1 to 3-31 using the resin (A) of the embodiment, phenol and the additive of the embodiment in an organic-based developer further interact with each other, and thus, the film loss reduction, the resolution improvement, and the high sensitivity can be more significantly achieved.

From comparison of Example 3-7 or 3-8 with other Comparative Examples, it was also found that the effects are more significant at a hydroxystyrene portion rather than at a hydroxyphenyl methacrylate portion or a hydroxyphenylmethacryl amide portion among the same phenol portions, and this was preferable.

Furthermore, it was also found that a polymer having the acid-decomposable group (for example, Examples 3-19 to 3-27) represented by General Formula (4) or the acid-decomposable group (for example, Examples 3-11 to 3-18) represented by General Formula (II-1) was excellent in terms of all of resolution, sensitivity, and film loss reduction performance compared to a polymer (for example, Examples 3-7 to 3-10) having no acid-decomposable group represented by General Formula (4) or (II-1). It is probable that this is because the deprotection activation energy of the acid-decomposable group is low, and thus, carboxylic acid can be easily generated with a small amount of an acid.

In addition, it was found that a case where rinsing was performed using methyl isobutyl carbinol or the like was excellent in terms of resolution compared to a case where rinsing was not performed. It is probable that this is because the polymer, which is formed by interacting carboxylic acid or a phenol group present at the unexposed portion or the side wall portion and a nitrogen-containing compound, can be dissolved.

When a pattern formation was performed in the same manner as in Examples 3-3, 3-11, and 3-23 except that the additive used in the developer in Examples 2-3, 2-11, and 2-23 was changed to the additive represented by Formula (F-10) or (F-11), also in these, pattern could be formed. That is, it was found that, when evaluation was performed in the same manner as in Examples 3-3, 3-11, and 3-23, significant improved effects in resolution, sensitivity, and film loss reduction performance were obtained.

Furthermore, when evaluation was performed in the same manner as in Examples 3-3, 3-11, and 3-23 except that the exposure amount and the development time with an organic-based developer in Examples 3-3, 3-11, and 3-23 were suitably adjusted, and after developing with the organic-based developer, development was performed with 2.38% by mass tetramethylammonium hydroxide, a pattern of ½ of the spatial frequency of the mask pattern could be formed.

What is claimed is:

1. A pattern forming method, comprising:

(1) forming a film using an active light sensitive or radiation sensitive resin composition;

(2) exposing the film to active light or radiation; and (3) developing the exposed film using a developer including an organic solvent, wherein the active light sensitive or radiation sensitive resin composition contains a resin (A) having a group which generates a polar group by being decomposed due to the action of an acid, wherein the resin (A) has a repeating unit represented by the following General Formula (I), wherein the developer including the organic solvent contains an additive which forms at least one interaction of an ionic bond, a hydrogen bond, a chemical bond, and a dipole interaction, with the polar group,

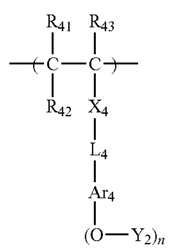

(I)

wherein, in General Formula (I), each of $R_{41}$, $R_{42}$, and $R_{43}$ independently represents a hydrogen atom, an alkyl group, a halogen atom, a cyano group, or an alkoxycarbonyl group; $R_{42}$ may be bonded to $Ar_4$ to form a ring, and $R_{42}$ in this case represents a single bond or an alkylene group;

$X_4$ represents a single bond, —COO—, or —$CONR_{64}$—, and, in the case of forming a ring with $R_{42}$, $X_4$ represents a trivalent connecting group; $R_{64}$ represents a hydrogen atom or an alkyl group;

$L_4$ represents a single bond or an alkylene group;

$Ar_4$ represents an (n+1) valent aromatic ring group, and, in the case of being bonded to $R_{42}$ to form a ring, $Ar_4$ represents an (n+2) valent aromatic ring group;

n represents an integer of 2 or greater; and $Y_2$ represents a hydrogen atom.

2. The pattern forming method according to claim 1, wherein the resin (A) has a repeating unit represented by the following Formula (B-1),

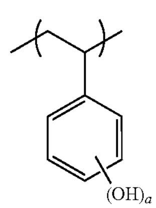

(B-1)

wherein, in Formula (B-1), a represents 2.

3. The pattern forming method according to claim 2, wherein each of $X_4$ and $L_4$ in General Formula (I) is a single bond.

4. The pattern forming method according to claim 2, wherein the content of the repeating unit represented by General Formula (I) in which all of $Y_2$'s are hydrogen atoms is 10 mol % to 40 mol % of the entirety of repeating units in the resin (A).

5. The pattern forming method according to claim 1, wherein the resin (A) further has a repeating unit having a group which is decomposed due to the action of an acid, and the repeating unit is a repeating unit represented by any one of the following General Formulas (V) and (4);

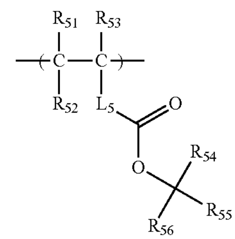

(V)

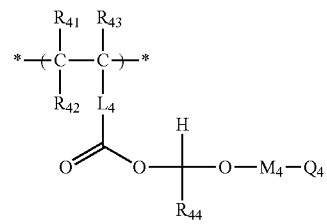

(4)

wherein, in General Formula (V), each of $R_{51}$, $R_{52}$, and $R_{53}$ independently represents a hydrogen atom, an alkyl group, a cycloalkyl group, a halogen atom, a cyano group, or an alkoxycarbonyl group;

$R_{52}$ may be bonded to $L_5$ to form a ring, and $R_{52}$ in this case represents an alkylene group;

$L_5$ represents a single bond or a divalent connecting group, and in the case of forming a ring with $R_{52}$, $L_5$ represents a trivalent connecting group;

$R_{54}$ represents an alkyl group, and each of $R_{55}$ and $R_{56}$ independently represents a hydrogen atom, an alkyl group, a cycloalkyl group, an aryl group, or an aralkyl group; $R_{55}$ and $R_{56}$ may be bonded to each other to form a ring; $R_{55}$ and $R_{56}$ do not represent a hydrogen atom at the same time in any case; and wherein, in General Formula (4), each of $R_{41}$, $R_{42}$, and $R_{43}$ independently represents a hydrogen atom, an alkyl group, a cycloalkyl group, a halogen atom, a cyano group, or an alkoxycarbonyl group;

$R_{42}$ may be bonded to $L_4$ to form a ring, and $R_{42}$ in this case represents an alkylene group;

$L_4$ represents a single bond or a divalent connecting group, and in the case of forming a ring with $R_{42}$, $L_4$ represents a trivalent connecting group;

$R_{44}$ represents an alkyl group, a cycloalkyl group, an aryl group, an aralkyl group, an alkoxy group, an acyl group, or a heterocyclic group;

$M_4$ represents a single bond or a divalent connecting group;

$Q_4$ represents an alkyl group, a cycloalkyl group, an aryl group, or a heterocyclic group; and at least two of $Q_4$, $M_4$, and $R_{44}$ may be bonded to each other to form a ring.

6. The pattern forming method according to claim 5, wherein the repeating unit represented by General Formula (V) is a repeating unit represented by the following General Formula (II-1); and (II-1)

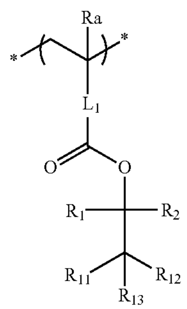

wherein, in General Formula (II-1), each of $R_1$ and $R_2$ independently represents an alkyl group, each of $R_{11}$ and $R_{12}$ independently represents an alkyl group or an alkyl group; $R_{13}$ represents a hydrogen atom; $R_{11}$ and $R_{12}$ may be connected to each other to form a ring; $R_{11}$ and $R_{13}$ may be connected to each other to form a ring;

Ra represents a hydrogen atom, an alkyl group, a cyano group, or a halogen atom; and $L_1$ represents a single bond or a divalent connecting group.

7. The pattern forming method according to claim 6, wherein $R_{11}$ and $R_{12}$ in General Formula (II-1) are connected to each other to form a ring.

8. The pattern forming method according to claim 7, wherein each of between $X_4$ and $L_4$ in General Formula (I) is a single bond.

9. The pattern forming method according to claim 6, wherein each of $X_4$ and $L_4$ in General Formula (I) is a single bond.

10. The pattern forming method according to claim 1, wherein the resin (A) has a repeating unit represented by the following General Formula (I') in addition to the repeating unit of formula (I):

(I')

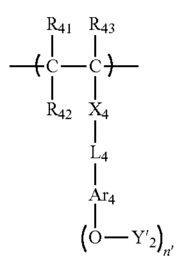

wherein, in General Formula (I'), n' represents an integer of 1 to 4;

$Y_2'$ represents a group leaving due to the action of an acid, $R_{41}$, $R_{42}$, $R_{43}$, $X_4$, $L_4$, and $Ar_4$ have the same meanings as $R_{41}$, $R_{42}$, $R_{43}$, $X_4$, $L_4$, and $Ar_4$ in General Formula (I), respectively, wherein a part of the repeating unit represented by General Formula (I') is a repeating unit represented by the following General Formula (3); and (3)

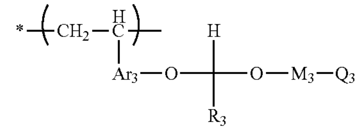

wherein, in General Formula (3), $Ar_3$ represents an aromatic ring group;

$R_3$ represents an alkyl group, a cycloalkyl group, an aryl group, an aralkyl group, an alkoxy group, an acyl group, or a heterocyclic group;

$M_3$ represents a single bond or a divalent connecting group;

$Q_3$ represents an alkyl group, a cycloalkyl group, an aryl group, or a heterocyclic group; and at least two of $Q_3$, $M_3$, and $R_3$ may be bonded to each other to form a ring.

11. The pattern forming method according to claim 10, wherein $R_3$ in General Formula (3) is a group having 2 or more carbon atoms.

12. The pattern forming method according to claim 10, wherein $R_3$ in General Formula (3) is a group represented by the following General Formula (3-2); and (3-2)

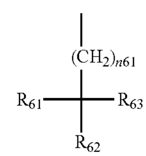

wherein, in General Formula (3-2), each of $R_{61}$, $R_{62}$, and $R_{63}$ independently represents an alkyl group, an alkenyl group, a cycloalkyl group, or an aryl group;

n61 represents 0 or 1; and at least two of $R_{61}$ to $R_{63}$ may be connected to each other to form a ring.

13. The pattern forming method according to claim 1, wherein the active light sensitive or radiation sensitive resin composition further includes a compound (B) that generates an acid by active light or radiation.

14. The pattern forming method according to claim 13, wherein the compound (B) that generates an acid by active light or radiation is a compound that generates an acid having a volume of 240 $Å^3$ or greater.

15. The pattern forming method according to claim 1, wherein an electron beam or extreme ultraviolet rays are used as the active light or radiation.

16. The pattern forming method according to claim 1, wherein, in General Formula (I), n represents an integer of 2 to 4.

17. A resist film which is formed of the active light sensitive or radiation sensitive resin composition according to claim 14.

18. A pattern forming method, comprising:

(1) forming a film using an active light sensitive or radiation sensitive resin composition;

(2) exposing the film to active light or radiation; and (3) developing the exposed film using a developer including an organic solvent, wherein the active light sensitive or radiation sensitive resin composition contains a resin (A) having a group which generates a polar group by being decomposed due to the action of an acid, wherein the resin (A) has a repeating unit represented by the following General Formula (VI), wherein the developer including the organic solvent contains an additive which forms at least one interaction of an ionic bond, a hydrogen bond, a chemical bond, and a dipole interaction, with the polar group:

(I')

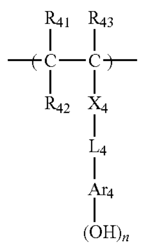

wherein, in General Formula (VI), each of $R_{61}$, $R_{62}$, and $R_{63}$ independently represents a hydrogen atom, an alkyl group, a cycloalkyl group, a halogen atom, a cyano group, or an alkoxycarbonyl group, $L_6$ represents a single bond or an alkylene group, $X_6$ represents —COO—, $Ar_6$ represents a phenylene group, n represents an integer of 1 to 4, and when n is 1, $Y_2$ is a group leaving due to the action of an acid, and when n is 2 or greater, each of $Y_2$'s independently represents a hydrogen atom or a group leaving due to the action of an acid, provided that at least one of $Y_2$'s represents a group leaving due to the action of an acid.

19. The pattern forming method according to claim 18, wherein the resin (A) has a repeating unit represented by the following General Formula (I'):

(I')

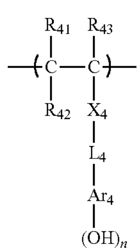

wherein, in General Formula (I'), each of $R_{41}$, $R_{42}$, and $R_{43}$ independently represents a hydrogen atom, an alkyl group, a halogen atom, a cyano group, or an alkoxycarbonyl group, $L_4$ represents a single bond or an alkylene group, $X_4$ represents —COO—, $Ar_4$ represents a phenylene group, and n represents an integer of 1 to 4.

20. The pattern forming method according to claim 18, wherein the resin (A) further has a repeating unit having a group which is decomposed due to the action of an acid, and the repeating unit is a repeating unit represented by any one of the following General Formulas (V) and (4):

(V)

(4)

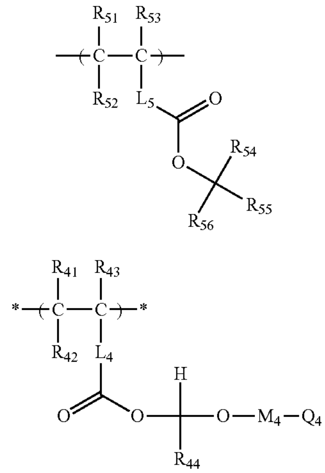

wherein, in General Formula (V), each of $R_{51}$, $R_{52}$, and $R_{53}$ independently represents a hydrogen atom, an alkyl group, a cycloalkyl group, a halogen atom, a cyano group, or an alkoxycarbonyl group;

$R_{52}$ may be bonded to $L_5$ to form a ring, and $R_{52}$ in this case represents an alkylene group;

$L_5$ represents a single bond or a divalent connecting group, and in the case of forming a ring with $R_{52}$, $L_5$ represents a trivalent connecting group;

$R_{54}$ represents an alkyl group, and each of $R_{55}$ and $R_{56}$ independently represents a hydrogen atom, an alkyl group, a cycloalkyl group, an aryl group, or an aralkyl group; $R_{55}$ and $R_{56}$ may be bonded to each other to form a ring; $R_{55}$ and $R_{56}$ do not represent a hydrogen atom at the same time in any case; and wherein, in General Formula (4), each of $R_{41}$, $R_{42}$, and $R_{43}$ independently represents a hydrogen atom, an alkyl group, a cycloalkyl group, a halogen atom, a cyano group, or an alkoxycarbonyl group;

$R_{42}$ may be bonded to $L_4$ to form a ring, and $R_{42}$ in this case represents an alkylene group;

$L_4$ represents a single bond or a divalent connecting group, and in the case of forming a ring with $R_{42}$, $L_4$ represents a trivalent connecting group;

$R_{44}$ represents an alkyl group, a cycloalkyl group, an aryl group, an aralkyl group, an alkoxy group, an acyl group, or a heterocyclic group;

$M_4$ represents a single bond or a divalent connecting group;

$Q_4$ represents an alkyl group, a cycloalkyl group, an aryl group, or a heterocyclic group; and at least two of $Q_4$, $M_4$, and $R_{44}$ may be bonded to each other to form a ring.

21. The pattern forming method according to claim 20, wherein the repeating unit represented by General Formula (V) is a repeating unit represented by the following General Formula (II-1):

(II-1)

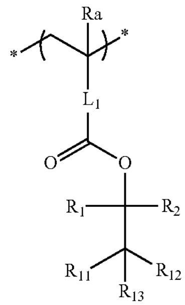

wherein, in General Formula (II-1), each of $R_1$ and $R_2$ independently represents an alkyl group, each of $R_{11}$ and $R_{12}$ independently represents an alkyl group or an alkyl group; $R_{13}$ represents a hydrogen atom; $R_{11}$ and $R_{12}$ may be connected to each other to form a ring; $R_{11}$ and $R_{13}$ may be connected to each other to form a ring;

Ra represents a hydrogen atom, an alkyl group, a cyano group, or a halogen atom; and $L_1$ represents a single bond or a divalent connecting group.

22. The pattern forming method according to claim 21, wherein $R_{11}$ and $R_{12}$ in General Formula (II-1) are connected to each other to form a ring.

* * * * *